(12) United States Patent
Devlin et al.

(10) Patent No.: US 12,276,807 B2
(45) Date of Patent: *Apr. 15, 2025

(54) POLARIZATION SORTING METASURFACE MICROLENS ARRAY DEVICE

(71) Applicant: Metalenz, Inc., Boston, MA (US)

(72) Inventors: Robert C. Devlin, Concord, MA (US); Pawel Latawiec, Cambridge, MA (US); John W. Graff, Swampscott, MA (US); Anne Janet Milliez, Cambridge, MA (US); Seyedali Forouzmand, Malden, MA (US); Dalia P. Ornelas Huerta, Cambridge, MA (US); Hao Zhou, Mooresville, NC (US); Harris Miller, Sharon, MA (US)

(73) Assignee: Metalenz, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/601,842

(22) Filed: Mar. 11, 2024

(65) Prior Publication Data

US 2024/0210715 A1 Jun. 27, 2024

Related U.S. Application Data

(63) Continuation of application No. 18/194,359, filed on Mar. 31, 2023, now Pat. No. 11,927,769.

(Continued)

(51) Int. Cl.
*G02B 27/28* (2006.01)
*B82Y 20/00* (2011.01)
(Continued)

(52) U.S. Cl.
CPC ............ *G02B 27/285* (2013.01); *B82Y 20/00* (2013.01); *G02B 1/002* (2013.01); *G02B 27/4261* (2013.01)

(58) Field of Classification Search
None
See application file for complete search history.

(56) References Cited

U.S. PATENT DOCUMENTS

| 3,877,034 A | 4/1975 | Nelson |
| 4,777,116 A | 10/1988 | Kawatsuki et al. |

(Continued)

FOREIGN PATENT DOCUMENTS

| CA | 3006173 A1 | 6/2017 |
| CA | 3020261 A1 | 10/2017 |

(Continued)

OTHER PUBLICATIONS

Extended European Search Report for European Application No. 20213372.4, Search Completed Mar. 26, 2021, Mailed Jul. 28, 2021, 10 pgs.

(Continued)

*Primary Examiner* — Derek S. Chapel
(74) *Attorney, Agent, or Firm* — KPPB LLP

(57) ABSTRACT

Disclosed herein are systems and methods including polarization sorting metasurface microlens array devices. In certain embodiments, a polarization imaging device is provided. The polarization imaging device includes: a source of image light; a metasurface lenslet array comprising a plurality of repeating metasurface lenslets, where the plurality of repeating metasurface lenslets comprise a plurality of first metasurface lenslets configured to diffract the image light into a first polarization light in a first direction and a second polarization light in a second direction; an image sensor positioned in the optical path of the first polarization light and the second polarization light, and where the image sensor includes a plurality of image sensing units including a first image sensing unit positioned to sense the first (Continued)

polarization light and a second image sensing unit positioned to sense the second polarization light.

22 Claims, 58 Drawing Sheets

Related U.S. Application Data

(60) Provisional application No. 63/362,285, filed on Mar. 31, 2022.

(51) Int. Cl.
*G02B 1/00* (2006.01)
*G02B 27/42* (2006.01)

(56) References Cited

U.S. PATENT DOCUMENTS

| | | | |
|---|---|---|---|
| 4,856,899 A | 8/1989 | Iwaoka et al. |
| 5,085,496 A | 2/1992 | Yoshida et al. |
| 5,245,466 A | 9/1993 | Burns et al. |
| 5,337,146 A | 8/1994 | Azzam |
| 5,452,126 A | 9/1995 | Johnson |
| 5,620,792 A | 4/1997 | Challener, IV |
| 6,097,856 A | 8/2000 | Hammond, Jr. |
| 6,643,065 B1 | 11/2003 | Silberman |
| 6,669,803 B1 | 12/2003 | Kathman et al. |
| 6,731,839 B2 | 5/2004 | Bhagavatula et al. |
| 6,825,986 B2 | 11/2004 | Ashkinazy et al. |
| 6,834,027 B1 | 12/2004 | Sakaguchi et al. |
| 6,924,457 B2 | 8/2005 | Koyama et al. |
| 6,927,922 B2 | 8/2005 | George et al. |
| 6,958,207 B1 | 10/2005 | Khusnatdinov et al. |
| 7,057,151 B2 | 6/2006 | Lezec et al. |
| 7,061,612 B2 | 6/2006 | Johnston |
| 7,061,693 B2 | 6/2006 | Zalevsky |
| 7,171,078 B2 | 1/2007 | Sasaki et al. |
| 7,171,084 B2 | 1/2007 | Izumi et al. |
| 7,186,969 B2 | 3/2007 | Altendorf et al. |
| 7,241,988 B2 | 7/2007 | Gruber et al. |
| 7,324,210 B2 | 1/2008 | De et al. |
| 7,327,468 B2 | 2/2008 | Maznev et al. |
| 7,402,131 B2 | 7/2008 | Mueth et al. |
| 7,450,618 B2 | 11/2008 | Dantus et al. |
| 7,547,874 B2 | 6/2009 | Liang |
| 7,561,264 B2 | 7/2009 | Treado et al. |
| 7,576,899 B2 | 8/2009 | Kanesaka et al. |
| 7,679,830 B2 | 3/2010 | Dowski, Jr. |
| 7,684,097 B2 | 3/2010 | Fukumoto et al. |
| 7,773,307 B2 | 8/2010 | Shih |
| 7,800,683 B2 | 9/2010 | Zalevsky et al. |
| 7,812,295 B2 | 10/2010 | Zalevsky et al. |
| 7,928,900 B2 | 4/2011 | Fuller et al. |
| 7,929,220 B2 | 4/2011 | Sayag |
| 7,965,607 B2 | 6/2011 | Fukumoto et al. |
| 8,009,358 B2 | 8/2011 | Zalevsky et al. |
| 8,040,604 B2 | 10/2011 | Zalevsky et al. |
| 8,107,705 B2 | 1/2012 | Dowski, Jr. et al. |
| 8,152,307 B2 | 4/2012 | Duelli et al. |
| 8,169,703 B1 | 5/2012 | Mossberg et al. |
| 8,192,022 B2 | 6/2012 | Zalevsky |
| 8,212,866 B2 | 7/2012 | Lemmer et al. |
| 8,318,386 B2 | 11/2012 | Kobrin |
| 8,328,396 B2 | 12/2012 | Capasso et al. |
| 8,351,048 B2 | 1/2013 | Millerd |
| 8,351,120 B2 | 1/2013 | Deng et al. |
| 8,390,932 B2 | 3/2013 | Jia et al. |
| 8,400,494 B2 | 3/2013 | Zalevsky et al. |
| 8,430,513 B2 | 4/2013 | Chang et al. |
| 8,451,368 B2 | 5/2013 | Sung et al. |
| 8,472,797 B2 | 6/2013 | Ok et al. |
| 8,481,948 B2 | 7/2013 | Frach et al. |
| 8,558,873 B2 | 10/2013 | Mceldowney |
| 8,587,474 B2 | 11/2013 | Fuller et al. |
| 8,649,631 B2 | 2/2014 | Islam et al. |
| 8,681,428 B1 | 3/2014 | Brown |
| 8,687,040 B2 | 4/2014 | Silveira |
| 8,716,677 B2 | 5/2014 | Cui |
| 8,734,033 B2 | 5/2014 | Walters et al. |
| 8,743,923 B2 | 6/2014 | Geske et al. |
| 8,816,460 B2 | 8/2014 | Kalevo et al. |
| 8,848,273 B2 | 9/2014 | Yu et al. |
| 8,876,289 B2 | 11/2014 | Dorronsoro Diaz et al. |
| 8,908,149 B2 | 12/2014 | Freimann |
| 8,912,973 B2 | 12/2014 | Werner et al. |
| 8,981,337 B1 | 3/2015 | Burckel et al. |
| 9,007,451 B2 | 4/2015 | Rogers et al. |
| 9,116,302 B2 | 8/2015 | Mccarthy et al. |
| 9,151,891 B2 | 10/2015 | Ma et al. |
| 9,212,899 B2 | 12/2015 | Johnson et al. |
| 9,298,060 B2 | 3/2016 | Shen et al. |
| 9,309,274 B2 | 4/2016 | Van Der Boom et al. |
| 9,310,535 B1 | 4/2016 | Greiner et al. |
| 9,329,484 B1 | 5/2016 | Markle et al. |
| 9,330,704 B2 | 5/2016 | Nishimura et al. |
| 9,367,036 B2 | 6/2016 | Pyun et al. |
| 9,369,621 B2 | 6/2016 | Malone et al. |
| 9,391,700 B1 | 7/2016 | Bruce et al. |
| 9,392,153 B2 | 7/2016 | Myhre et al. |
| 9,411,103 B2 | 8/2016 | Astratov |
| 9,482,796 B2 | 11/2016 | Arbabi et al. |
| 9,500,771 B2 | 11/2016 | Liu et al. |
| 9,536,362 B2 | 1/2017 | Sarwar et al. |
| 9,553,423 B2 | 1/2017 | Chen et al. |
| 9,557,585 B1 | 1/2017 | Yap et al. |
| 9,606,415 B2 | 3/2017 | Zheludev et al. |
| 9,609,190 B2 | 3/2017 | Lee et al. |
| 9,704,250 B1 | 7/2017 | Shah et al. |
| 9,739,918 B2 * | 8/2017 | Arbabi ............... G02B 5/021 |
| 9,766,463 B2 | 9/2017 | Border et al. |
| 9,778,404 B2 | 10/2017 | Divliansky et al. |
| 9,825,074 B2 | 11/2017 | Tian et al. |
| 9,829,700 B2 | 11/2017 | Parent et al. |
| 9,835,870 B2 | 12/2017 | Astratov et al. |
| 9,836,122 B2 | 12/2017 | Border |
| 9,869,580 B2 | 1/2018 | Grossinger et al. |
| 9,880,377 B1 | 1/2018 | Safrani et al. |
| 9,885,859 B2 | 2/2018 | Harris |
| 9,891,393 B2 | 2/2018 | Reece |
| 9,939,129 B2 | 4/2018 | Byrnes et al. |
| 9,947,118 B2 | 4/2018 | Khare et al. |
| 9,952,096 B2 | 4/2018 | Kats et al. |
| 9,958,251 B1 | 5/2018 | Brock et al. |
| 9,967,541 B2 | 5/2018 | Piestun |
| 9,978,801 B2 | 5/2018 | Park et al. |
| 9,989,680 B2 | 6/2018 | Arbabi et al. |
| 9,992,474 B2 | 6/2018 | Grunnet-jepsen et al. |
| 9,995,859 B2 | 6/2018 | Kamali et al. |
| 9,995,930 B2 | 6/2018 | Arbabi et al. |
| 10,007,118 B2 | 6/2018 | Border |
| 10,054,859 B2 | 8/2018 | Ye et al. |
| 10,084,239 B2 | 9/2018 | Shaver et al. |
| 10,108,085 B2 | 10/2018 | Peters et al. |
| 10,126,466 B2 | 11/2018 | Lin et al. |
| 10,132,465 B2 | 11/2018 | Byrnes et al. |
| 10,149,612 B2 | 12/2018 | Muyo et al. |
| 10,155,846 B2 | 12/2018 | Fuji et al. |
| 10,234,383 B2 | 3/2019 | Wang et al. |
| 10,254,454 B2 | 4/2019 | Klug et al. |
| 10,267,957 B2 | 4/2019 | Kamali et al. |
| 10,310,148 B2 | 6/2019 | Stewart et al. |
| 10,310,387 B2 | 6/2019 | Palmer et al. |
| 10,315,951 B2 | 6/2019 | Toussaint et al. |
| 10,317,667 B2 | 6/2019 | Waller et al. |
| 10,324,314 B2 | 6/2019 | Czaplewski et al. |
| 10,338,275 B1 | 7/2019 | Acosta et al. |
| 10,341,640 B2 | 7/2019 | Shechtman et al. |
| 10,345,246 B2 | 7/2019 | Tian et al. |
| 10,345,519 B1 | 7/2019 | Miller et al. |
| 10,365,416 B2 | 7/2019 | Zhan et al. |
| 10,371,936 B2 | 8/2019 | Didomenico |
| 10,386,620 B2 | 8/2019 | Astratov et al. |
| 10,388,805 B2 | 8/2019 | Engel et al. |

(56) References Cited

U.S. PATENT DOCUMENTS

| | | |
|---|---|---|
| 10,402,993 B2 | 9/2019 | Han et al. |
| 10,408,416 B2 | 9/2019 | Khorasaninejad et al. |
| 10,408,419 B2 | 9/2019 | Aieta et al. |
| 10,416,565 B2 | 9/2019 | Ahmed et al. |
| 10,435,814 B2 | 10/2019 | Plummer et al. |
| 10,440,244 B2 | 10/2019 | Rosenblatt et al. |
| 10,440,300 B2 | 10/2019 | Rephaeli et al. |
| 10,466,394 B2 | 11/2019 | Lin et al. |
| 10,468,447 B2 | 11/2019 | Akselrod et al. |
| 10,481,317 B2 | 11/2019 | Peroz et al. |
| 10,514,296 B2 | 12/2019 | Han et al. |
| 10,527,832 B2 | 1/2020 | Schwab et al. |
| 10,527,851 B2 | 1/2020 | Lin et al. |
| 10,536,688 B2 | 1/2020 | Haas et al. |
| 10,539,723 B2 | 1/2020 | Iazikov et al. |
| 10,545,323 B2 | 1/2020 | Schwab et al. |
| 10,591,643 B2 | 3/2020 | Lin et al. |
| 10,670,782 B2 | 6/2020 | Arbabi et al. |
| 10,725,290 B2 | 7/2020 | Fan et al. |
| 10,795,168 B2 | 10/2020 | Riley, Jr. et al. |
| 10,816,704 B2 | 10/2020 | Arbabi et al. |
| 10,816,815 B2 | 10/2020 | Aieta et al. |
| 10,915,737 B2 | 2/2021 | Hu et al. |
| 10,916,060 B2 | 2/2021 | West et al. |
| 11,092,717 B2 | 8/2021 | Capasso et al. |
| 11,169,311 B2 | 11/2021 | Rubin et al. |
| 11,231,544 B2 | 1/2022 | Lin et al. |
| 11,298,052 B2 | 4/2022 | Palikaras et al. |
| 11,353,626 B2 | 6/2022 | You et al. |
| 11,366,296 B2 | 6/2022 | Devlin et al. |
| 11,385,104 B2 | 7/2022 | Yao et al. |
| 11,385,516 B2 | 7/2022 | Didomenico |
| 11,578,968 B1 | 2/2023 | Capasso et al. |
| 11,579,456 B2 | 2/2023 | Riley et al. |
| 11,604,364 B2 | 3/2023 | Rubin et al. |
| 11,733,535 B2 | 8/2023 | Aieta et al. |
| 11,815,668 B2 | 11/2023 | Devlin et al. |
| 11,835,680 B2 | 12/2023 | Groever et al. |
| 11,835,681 B2 | 12/2023 | Lin et al. |
| 11,867,937 B2 | 1/2024 | Rubin et al. |
| 11,927,769 B2 * | 3/2024 | Devlin ............ G02B 27/4261 |
| 11,978,752 B2 | 5/2024 | Devlin et al. |
| 2002/0048727 A1 | 4/2002 | Zhou et al. |
| 2002/0118903 A1 | 8/2002 | Cottrell et al. |
| 2002/0181126 A1 | 12/2002 | Nishioka |
| 2003/0077983 A1 | 4/2003 | Hagan et al. |
| 2003/0107787 A1 | 6/2003 | Bablumyan |
| 2004/0173738 A1 | 9/2004 | Mizuno |
| 2004/0184752 A1 | 9/2004 | Aoki et al. |
| 2004/0190116 A1 | 9/2004 | Lezec et al. |
| 2004/0258128 A1 | 12/2004 | Johs et al. |
| 2005/0151698 A1 | 7/2005 | Mohamadi |
| 2005/0161589 A1 | 7/2005 | Kim et al. |
| 2005/0211665 A1 | 9/2005 | Gao et al. |
| 2005/0220162 A1 | 10/2005 | Nakamura |
| 2005/0239003 A1 | 10/2005 | Chiodini et al. |
| 2006/0042322 A1 | 3/2006 | Mendoza et al. |
| 2006/0127829 A1 | 6/2006 | Deng et al. |
| 2007/0024975 A1 | 2/2007 | McGrew |
| 2007/0026585 A1 | 2/2007 | Wong et al. |
| 2007/0030870 A1 | 2/2007 | Bour et al. |
| 2007/0273957 A1 | 11/2007 | Zalevsky et al. |
| 2008/0014632 A1 | 1/2008 | Cunningham et al. |
| 2009/0128908 A1 | 5/2009 | Nakazawa et al. |
| 2009/0135086 A1 | 5/2009 | Fuller et al. |
| 2009/0230333 A1 | 9/2009 | Eleftheriades |
| 2009/0296223 A1 | 12/2009 | Werner et al. |
| 2010/0033701 A1 | 2/2010 | Lee et al. |
| 2010/0055621 A1 | 3/2010 | Hatakeyama et al. |
| 2010/0072170 A1 | 3/2010 | Wu et al. |
| 2010/0091224 A1 | 4/2010 | Cho et al. |
| 2010/0110430 A1 | 5/2010 | Ebbesen et al. |
| 2010/0110433 A1 | 5/2010 | Nedelcu et al. |
| 2010/0134869 A1 | 6/2010 | Bernet et al. |
| 2010/0177164 A1 | 7/2010 | Zalevsky et al. |
| 2010/0187658 A1 | 7/2010 | Wei |
| 2010/0226134 A1 | 9/2010 | Capasso et al. |
| 2010/0232017 A1 | 9/2010 | Mccarthy et al. |
| 2010/0255428 A1 | 10/2010 | Chen et al. |
| 2010/0259804 A1 | 10/2010 | Buschbeck et al. |
| 2011/0012807 A1 | 1/2011 | Sorvala |
| 2011/0019180 A1 | 1/2011 | Kruglick |
| 2011/0102877 A1 | 5/2011 | Parriaux |
| 2011/0149251 A1 | 6/2011 | Duelli |
| 2011/0187577 A1 | 8/2011 | Fuller et al. |
| 2011/0206291 A1 | 8/2011 | Kashani et al. |
| 2011/0261441 A1 | 10/2011 | Zheludev et al. |
| 2012/0008133 A1 * | 1/2012 | Silny .................. G01J 4/04 356/73 |
| 2012/0068347 A1 | 3/2012 | Isobayashi et al. |
| 2012/0092735 A1 | 4/2012 | Futterer et al. |
| 2012/0140235 A1 | 6/2012 | Lee et al. |
| 2012/0258407 A1 | 10/2012 | Sirat |
| 2012/0269483 A1 | 10/2012 | Mossberg et al. |
| 2012/0293854 A1 | 11/2012 | Zheludev et al. |
| 2012/0327666 A1 | 12/2012 | Liu et al. |
| 2012/0328240 A1 | 12/2012 | Ma et al. |
| 2013/0016030 A1 | 1/2013 | Liu et al. |
| 2013/0032949 A1 | 2/2013 | Lin et al. |
| 2013/0037873 A1 | 2/2013 | Suzuki et al. |
| 2013/0050285 A1 | 2/2013 | Takahashi et al. |
| 2013/0058071 A1 | 3/2013 | Ben |
| 2013/0194537 A1 | 8/2013 | Mao et al. |
| 2013/0194787 A1 | 8/2013 | Geske et al. |
| 2013/0208332 A1 | 8/2013 | Yu et al. |
| 2014/0009823 A1 | 1/2014 | Park et al. |
| 2014/0043846 A1 | 2/2014 | Yang et al. |
| 2014/0085693 A1 | 3/2014 | Mosallaei et al. |
| 2014/0210835 A1 | 7/2014 | Hong et al. |
| 2014/0263982 A1 | 9/2014 | Shkunov et al. |
| 2014/0277433 A1 | 9/2014 | Pugh et al. |
| 2015/0011073 A1 | 1/2015 | Lei et al. |
| 2015/0017466 A1 | 1/2015 | Ayon et al. |
| 2015/0018500 A1 | 1/2015 | Gerber et al. |
| 2015/0055745 A1 | 2/2015 | Holzner et al. |
| 2015/0068599 A1 | 3/2015 | Chou et al. |
| 2015/0090862 A1 | 4/2015 | Matsui et al. |
| 2015/0092139 A1 | 4/2015 | Eguchi |
| 2015/0098002 A1 | 4/2015 | Wang |
| 2015/0116721 A1 | 4/2015 | Kats et al. |
| 2015/0125111 A1 | 5/2015 | Orcutt et al. |
| 2015/0185413 A1 | 7/2015 | Greiner et al. |
| 2015/0219497 A1 | 8/2015 | Johs et al. |
| 2015/0219806 A1 | 8/2015 | Arbabi et al. |
| 2015/0241608 A1 | 8/2015 | Shian et al. |
| 2015/0316717 A1 | 11/2015 | Astratov |
| 2016/0025914 A1 | 1/2016 | Brongersma et al. |
| 2016/0037146 A1 | 2/2016 | Mcgrew |
| 2016/0077261 A1 | 3/2016 | Arbabi et al. |
| 2016/0133762 A1 | 5/2016 | Blasco Claret et al. |
| 2016/0161826 A1 | 6/2016 | Shen et al. |
| 2016/0195705 A1 | 7/2016 | Betzig et al. |
| 2016/0253551 A1 | 9/2016 | Pezzaniti et al. |
| 2016/0254638 A1 | 9/2016 | Chen et al. |
| 2016/0276979 A1 | 9/2016 | Shaver et al. |
| 2016/0299337 A1 | 10/2016 | Arbabi et al. |
| 2016/0299426 A1 | 10/2016 | Gates et al. |
| 2016/0306079 A1 | 10/2016 | Arbabi et al. |
| 2016/0306157 A1 | 10/2016 | Rho et al. |
| 2016/0318067 A1 | 11/2016 | Banerjee et al. |
| 2016/0331457 A1 | 11/2016 | Varghese et al. |
| 2016/0341859 A1 | 11/2016 | Shvets et al. |
| 2016/0359235 A1 | 12/2016 | Driscoll et al. |
| 2016/0361002 A1 | 12/2016 | Palikaras et al. |
| 2016/0370568 A1 | 12/2016 | Toussaint et al. |
| 2017/0003169 A1 | 1/2017 | Shaltout et al. |
| 2017/0010466 A1 | 1/2017 | Klug et al. |
| 2017/0030773 A1 | 2/2017 | Han et al. |
| 2017/0038574 A1 | 2/2017 | Zhuang et al. |
| 2017/0045652 A1 | 2/2017 | Arbabi et al. |
| 2017/0082263 A1 | 3/2017 | Byrnes et al. |
| 2017/0090221 A1 | 3/2017 | Atwater |
| 2017/0121843 A1 | 5/2017 | Plummer et al. |
| 2017/0125911 A1 | 5/2017 | Alu et al. |

(56) References Cited

U.S. PATENT DOCUMENTS

| | | |
|---|---|---|
| 2017/0131460 A1 | 5/2017 | Lin et al. |
| 2017/0146806 A1 | 5/2017 | Lin et al. |
| 2017/0176758 A1 | 6/2017 | Lerner et al. |
| 2017/0186166 A1 | 6/2017 | Grunnet-jepsen et al. |
| 2017/0201658 A1 | 7/2017 | Rosenblatt et al. |
| 2017/0212285 A1 | 7/2017 | Arbabi et al. |
| 2017/0235162 A1 | 8/2017 | Shaltout et al. |
| 2017/0250577 A1 | 8/2017 | Ho et al. |
| 2017/0293141 A1 | 10/2017 | Schowengerdt et al. |
| 2017/0299784 A1 | 10/2017 | Mikkelsen et al. |
| 2017/0310907 A1 | 10/2017 | Wang |
| 2017/0322418 A1 | 11/2017 | Lin et al. |
| 2017/0329201 A1 | 11/2017 | Arnold |
| 2017/0374352 A1 | 12/2017 | Horesh |
| 2018/0035101 A1 | 2/2018 | Osterhout |
| 2018/0044234 A1 | 2/2018 | Hokansson et al. |
| 2018/0045953 A1 | 2/2018 | Fan et al. |
| 2018/0052276 A1 | 2/2018 | Klienman et al. |
| 2018/0052320 A1 | 2/2018 | Curtis et al. |
| 2018/0107015 A1 | 4/2018 | Dümpelmann et al. |
| 2018/0109002 A1 | 4/2018 | Foo |
| 2018/0129866 A1 | 5/2018 | Hicks et al. |
| 2018/0172988 A1 | 6/2018 | Ahmed et al. |
| 2018/0184065 A1 | 6/2018 | Zhao et al. |
| 2018/0216797 A1 | 8/2018 | Khorasaninejad et al. |
| 2018/0217395 A1 | 8/2018 | Lin et al. |
| 2018/0231700 A1 | 8/2018 | Ahmed et al. |
| 2018/0231702 A1 | 8/2018 | Lin et al. |
| 2018/0236596 A1 | 8/2018 | Ihlemann et al. |
| 2018/0246262 A1 | 8/2018 | Zhan et al. |
| 2018/0248268 A1 | 8/2018 | Shvets et al. |
| 2018/0252857 A1 | 9/2018 | Glik et al. |
| 2018/0259700 A1 | 9/2018 | Khorasaninejad et al. |
| 2018/0259757 A1 | 9/2018 | Urzhumov |
| 2018/0267605 A1 | 9/2018 | Border |
| 2018/0274750 A1 | 9/2018 | Byrnes et al. |
| 2018/0292644 A1 | 10/2018 | Kamali et al. |
| 2018/0299595 A1 | 10/2018 | Arbabi et al. |
| 2018/0314130 A1 | 11/2018 | Joo et al. |
| 2018/0341090 A1 | 11/2018 | Devlin et al. |
| 2018/0364158 A1 | 12/2018 | Wang et al. |
| 2019/0003892 A1 | 1/2019 | Aieta et al. |
| 2019/0025463 A1 | 1/2019 | She et al. |
| 2019/0025477 A1 | 1/2019 | She et al. |
| 2019/0041642 A1 | 2/2019 | Haddick et al. |
| 2019/0041660 A1 | 2/2019 | Ahmed |
| 2019/0041736 A1 | 2/2019 | Grunnet-jepsen et al. |
| 2019/0044003 A1 | 2/2019 | Heck et al. |
| 2019/0049632 A1 | 2/2019 | Shin et al. |
| 2019/0049732 A1 | 2/2019 | Lee et al. |
| 2019/0057512 A1 | 2/2019 | Han et al. |
| 2019/0064532 A1 | 2/2019 | Riley, Jr. et al. |
| 2019/0079321 A1 | 3/2019 | Wu et al. |
| 2019/0086579 A1 | 3/2019 | Kim et al. |
| 2019/0086683 A1 | 3/2019 | Aieta et al. |
| 2019/0101448 A1* | 4/2019 | Lee ............... G01J 4/04 |
| 2019/0113775 A1 | 4/2019 | Jang et al. |
| 2019/0120817 A1 | 4/2019 | Anderson |
| 2019/0121004 A1 | 4/2019 | Ahmed et al. |
| 2019/0137075 A1 | 5/2019 | Aieta et al. |
| 2019/0137762 A1 | 5/2019 | Hu |
| 2019/0137793 A1 | 5/2019 | Luo et al. |
| 2019/0154877 A1 | 5/2019 | Capasso et al. |
| 2019/0155302 A1 | 5/2019 | Lukierski et al. |
| 2019/0157830 A1 | 5/2019 | Tong et al. |
| 2019/0162592 A1 | 5/2019 | Khorasaninejad et al. |
| 2019/0170655 A1 | 6/2019 | Smith |
| 2019/0191144 A1 | 6/2019 | Arbabi et al. |
| 2019/0196068 A1 | 6/2019 | Tsai et al. |
| 2019/0206136 A1 | 7/2019 | West et al. |
| 2019/0219835 A1 | 7/2019 | Skinner et al. |
| 2019/0235139 A1 | 8/2019 | Chen et al. |
| 2019/0250107 A1 | 8/2019 | Sreenivasan et al. |
| 2019/0369401 A1 | 12/2019 | Rolland et al. |
| 2019/0377084 A1 | 12/2019 | Sleasman et al. |
| 2019/0386749 A1 | 12/2019 | Lezec et al. |
| 2019/0391378 A1 | 12/2019 | Eichelkraut et al. |
| 2020/0025888 A1 | 1/2020 | Jang et al. |
| 2020/0052027 A1 | 2/2020 | Arbabi et al. |
| 2020/0076163 A1 | 3/2020 | Han et al. |
| 2020/0083666 A1 | 3/2020 | Fallahi et al. |
| 2020/0096672 A1 | 3/2020 | Yu et al. |
| 2020/0150311 A1 | 5/2020 | Zhang et al. |
| 2020/0225386 A1 | 7/2020 | Tsai et al. |
| 2020/0236315 A1 | 7/2020 | Kimura |
| 2020/0249429 A1 | 8/2020 | Han et al. |
| 2020/0271941 A1* | 8/2020 | Riley, Jr. ............... G02B 27/123 |
| 2020/0272100 A1 | 8/2020 | Yu et al. |
| 2020/0284960 A1 | 9/2020 | Ellenbogen et al. |
| 2020/0355913 A1 | 11/2020 | Park et al. |
| 2021/0010928 A1 | 1/2021 | Acher et al. |
| 2021/0028215 A1* | 1/2021 | Devlin ............... G02B 27/0988 |
| 2021/0048569 A1 | 2/2021 | Rubin et al. |
| 2021/0109364 A1 | 4/2021 | Aieta et al. |
| 2021/0112201 A1 | 4/2021 | Cho et al. |
| 2021/0149081 A1 | 5/2021 | Groever et al. |
| 2021/0190593 A1 | 6/2021 | Yao |
| 2021/0200992 A1 | 7/2021 | Padmanabhan et al. |
| 2021/0208469 A1 | 7/2021 | Didomenico |
| 2021/0263329 A1 | 8/2021 | Latawiec |
| 2021/0286188 A1 | 9/2021 | Rubin et al. |
| 2021/0288095 A1 | 9/2021 | Delga et al. |
| 2021/0302763 A1 | 9/2021 | Yao et al. |
| 2021/0311588 A1 | 10/2021 | Han et al. |
| 2021/0318466 A1 | 10/2021 | Uenoyama et al. |
| 2021/0333150 A1* | 10/2021 | McEldowney ... H01L 27/14605 |
| 2021/0333151 A1 | 10/2021 | Miyata et al. |
| 2022/0050294 A1 | 2/2022 | Fermigier et al. |
| 2022/0052093 A1 | 2/2022 | Devlin et al. |
| 2022/0086372 A1* | 3/2022 | Menon .................. H04N 25/40 |
| 2022/0091428 A1 | 3/2022 | Riley, Jr. et al. |
| 2022/0107263 A1 | 4/2022 | Biesinger et al. |
| 2022/0206186 A1 | 6/2022 | Chen et al. |
| 2022/0206205 A1 | 6/2022 | Rubin et al. |
| 2022/0214219 A1* | 7/2022 | Faraon .................. G01J 3/0229 |
| 2022/0244442 A1 | 8/2022 | Rubin et al. |
| 2022/0283411 A1 | 9/2022 | Devlin et al. |
| 2023/0194883 A1 | 6/2023 | Riley et al. |
| 2023/0196842 A1 | 6/2023 | Devlin et al. |
| 2023/0208104 A1 | 6/2023 | Tamagnone et al. |
| 2023/0280498 A1 | 9/2023 | Altuzarra et al. |
| 2023/0288716 A1 | 9/2023 | Rubin et al. |
| 2023/0314827 A1 | 10/2023 | Devlin et al. |
| 2023/0318261 A1 | 10/2023 | Tamagnone et al. |
| 2024/0012177 A1 | 1/2024 | Forouzmand et al. |
| 2024/0061219 A1 | 2/2024 | Devlin et al. |
| 2024/0142686 A1 | 5/2024 | Rubin et al. |
| 2024/0210246 A1 | 6/2024 | Rubin et al. |
| 2024/0234461 A1 | 7/2024 | Devlin et al. |

FOREIGN PATENT DOCUMENTS

| | | |
|---|---|---|
| CA | 3064764 A1 | 11/2018 |
| CN | 1044991 A | 8/1990 |
| CN | 101158727 A | 4/2008 |
| CN | 101164147 A | 4/2008 |
| CN | 100476504 C | 4/2009 |
| CN | 101546002 A | 9/2009 |
| CN | 101681095 A | 3/2010 |
| CN | 101510013 B | 6/2010 |
| CN | 101510012 B | 8/2010 |
| CN | 101510011 B | 9/2010 |
| CN | 101241173 B | 8/2011 |
| CN | 202854395 U | 4/2013 |
| CN | 103092049 A | 5/2013 |
| CN | 203799117 U | 8/2014 |
| CN | 104067171 A | 9/2014 |
| CN | 104374745 A | 2/2015 |
| CN | 204422813 U | 6/2015 |
| CN | 104932043 A | 9/2015 |
| CN | 104956491 A | 9/2015 |
| CN | 204719330 U | 10/2015 |
| CN | 105068396 A | 11/2015 |
| CN | 103869484 B | 1/2016 |

(56) References Cited

FOREIGN PATENT DOCUMENTS

| | | |
|---|---|---|
| CN | 105223689 A | 1/2016 |
| CN | 105278026 A | 1/2016 |
| CN | 105278309 A | 1/2016 |
| CN | 105655286 A | 6/2016 |
| CN | 105676314 A | 6/2016 |
| CN | 105917277 A | 8/2016 |
| CN | 105974503 A | 9/2016 |
| CN | 103257441 B | 10/2016 |
| CN | 205620619 U | 10/2016 |
| CN | 104834079 B | 4/2017 |
| CN | 106611699 A | 5/2017 |
| CN | 104834089 B | 6/2017 |
| CN | 106848555 A | 6/2017 |
| CN | 106200276 B | 10/2017 |
| CN | 104834088 B | 12/2017 |
| CN | 105676314 B | 1/2018 |
| CN | 107561857 A | 1/2018 |
| CN | 108089325 A | 5/2018 |
| CN | 108291983 A | 7/2018 |
| CN | 207623619 U | 7/2018 |
| CN | 106199997 B | 8/2018 |
| CN | 108474869 A | 8/2018 |
| CN | 108507542 A | 9/2018 |
| CN | 207923075 U | 9/2018 |
| CN | 108680544 A | 10/2018 |
| CN | 108761779 A | 11/2018 |
| CN | 109000692 A | 12/2018 |
| CN | 208270846 U | 12/2018 |
| CN | 109196387 A | 1/2019 |
| CN | 208421387 U | 1/2019 |
| CN | 106199956 B | 2/2019 |
| CN | 109360139 A | 2/2019 |
| CN | 106950195 B | 5/2019 |
| CN | 106324832 B | 7/2019 |
| CN | 106526730 B | 7/2019 |
| CN | 106485761 B | 8/2019 |
| CN | 110160685 A | 8/2019 |
| CN | 110678773 A | 1/2020 |
| CN | 108474869 B | 6/2020 |
| CN | 111316138 A | 6/2020 |
| CN | 111580190 A | 8/2020 |
| CN | 111656707 A | 9/2020 |
| CN | 111819489 A | 10/2020 |
| CN | 213092332 U | 4/2021 |
| CN | 113050295 A | 6/2021 |
| CN | 113168022 A | 7/2021 |
| CN | 110376665 B | 8/2021 |
| CN | 213902664 U | 8/2021 |
| CN | 213903843 U | 8/2021 |
| CN | 214098104 U | 8/2021 |
| CN | 113703080 A | 11/2021 |
| CN | 111580190 B | 12/2021 |
| CN | 113791524 A | 12/2021 |
| CN | 113807312 A | 12/2021 |
| CN | 113820839 A | 12/2021 |
| CN | 113834568 A | 12/2021 |
| CN | 113835227 A | 12/2021 |
| CN | 113851573 A | 12/2021 |
| CN | 215005942 U | 12/2021 |
| CN | 215010478 U | 12/2021 |
| CN | 110494771 B | 1/2022 |
| CN | 113885106 A | 1/2022 |
| CN | 113899451 A | 1/2022 |
| CN | 113900078 A | 1/2022 |
| CN | 113900162 A | 1/2022 |
| CN | 113906320 A | 1/2022 |
| CN | 113917574 A | 1/2022 |
| CN | 113917578 A | 1/2022 |
| CN | 113934004 A | 1/2022 |
| CN | 113934005 A | 1/2022 |
| CN | 113959984 A | 1/2022 |
| CN | 114002707 A | 2/2022 |
| CN | 114019589 A | 2/2022 |
| CN | 114047632 A | 2/2022 |
| CN | 114047637 A | 2/2022 |
| CN | 114112058 A | 3/2022 |
| CN | 114156168 A | 3/2022 |
| CN | 114176492 A | 3/2022 |
| CN | 215932365 U | 3/2022 |
| CN | 114280704 A | 4/2022 |
| CN | 114280716 A | 4/2022 |
| CN | 114286953 A | 4/2022 |
| CN | 114296180 A | 4/2022 |
| CN | 114325886 A | 4/2022 |
| CN | 114326163 A | 4/2022 |
| CN | 114354141 A | 4/2022 |
| CN | 114373825 A | 4/2022 |
| CN | 114384612 A | 4/2022 |
| CN | 114397092 A | 4/2022 |
| CN | 114397718 A | 4/2022 |
| CN | 114415386 A | 4/2022 |
| CN | 216345776 U | 4/2022 |
| CN | 216351311 U | 4/2022 |
| CN | 216351591 U | 4/2022 |
| CN | 216355281 U | 4/2022 |
| CN | 216361353 U | 4/2022 |
| CN | 111316138 B | 5/2022 |
| CN | 114488365 A | 5/2022 |
| CN | 114543993 A | 5/2022 |
| CN | 114545367 A | 5/2022 |
| CN | 114545370 A | 5/2022 |
| CN | 114554062 A | 5/2022 |
| CN | 114561266 A | 5/2022 |
| CN | 216593224 U | 5/2022 |
| CN | 216605227 U | 5/2022 |
| CN | 216622749 U | 5/2022 |
| CN | 114578642 A | 6/2022 |
| CN | 114593689 A | 6/2022 |
| CN | 114623960 A | 6/2022 |
| CN | 114624878 A | 6/2022 |
| CN | 114660683 A | 6/2022 |
| CN | 114660780 A | 6/2022 |
| CN | 114690387 A | 7/2022 |
| CN | 114740631 A | 7/2022 |
| CN | 114743714 A | 7/2022 |
| CN | 114779437 U | 7/2022 |
| CN | 216896898 U | 7/2022 |
| CN | 216900930 U | 7/2022 |
| CN | 216901121 U | 7/2022 |
| CN | 216901165 U | 7/2022 |
| CN | 216901317 U | 7/2022 |
| CN | 216901952 U | 7/2022 |
| CN | 216903719 U | 7/2022 |
| CN | 216933177 U | 7/2022 |
| CN | 217034311 U | 7/2022 |
| CN | 217034418 U | 7/2022 |
| CN | 217034466 U | 7/2022 |
| CN | 114859446 A | 8/2022 |
| CN | 114859447 A | 8/2022 |
| CN | 114859570 A | 8/2022 |
| CN | 114935741 A | 8/2022 |
| CN | 217276608 U | 8/2022 |
| CN | 217278911 U | 8/2022 |
| CN | 217278915 U | 8/2022 |
| CN | 217278989 U | 8/2022 |
| CN | 217279003 U | 8/2022 |
| CN | 217279087 U | 8/2022 |
| CN | 217279110 U | 8/2022 |
| CN | 217279168 U | 8/2022 |
| CN | 217279244 U | 8/2022 |
| CN | 217280797 U | 8/2022 |
| CN | 217280851 U | 8/2022 |
| CN | 217281621 U | 8/2022 |
| CN | 217281623 U | 8/2022 |
| CN | 114995038 A | 9/2022 |
| CN | 115016099 A | 9/2022 |
| CN | 115016150 A | 9/2022 |
| CN | 115032766 A | 9/2022 |
| CN | 115047432 A | 9/2022 |
| CN | 115047548 A | 9/2022 |
| CN | 115047653 A | 9/2022 |
| CN | 115061114 A | 9/2022 |
| CN | 115079415 A | 9/2022 |
| CN | 115113174 A | 9/2022 |

(56) References Cited

FOREIGN PATENT DOCUMENTS

| | | |
|---|---|---|
| CN | 217456368 U | 9/2022 |
| CN | 217465697 U | 9/2022 |
| CN | 217466052 U | 9/2022 |
| CN | 217466667 U | 9/2022 |
| CN | 217467162 U | 9/2022 |
| CN | 217467176 U | 9/2022 |
| CN | 217467177 U | 9/2022 |
| CN | 217467226 U | 9/2022 |
| CN | 217467326 U | 9/2022 |
| CN | 217467327 U | 9/2022 |
| CN | 217467336 U | 9/2022 |
| CN | 217467338 U | 9/2022 |
| CN | 217467351 U | 9/2022 |
| CN | 217467352 U | 9/2022 |
| CN | 217467353 U | 9/2022 |
| CN | 217467355 U | 9/2022 |
| CN | 217467357 U | 9/2022 |
| CN | 217467358 U | 9/2022 |
| CN | 217467363 U | 9/2022 |
| CN | 217467364 U | 9/2022 |
| CN | 217467367 U | 9/2022 |
| CN | 217467368 U | 9/2022 |
| CN | 217467395 U | 9/2022 |
| CN | 217467396 U | 9/2022 |
| CN | 217467399 U | 9/2022 |
| CN | 217467439 U | 9/2022 |
| CN | 217467452 U | 9/2022 |
| CN | 115164714 A | 10/2022 |
| CN | 115166876 A | 10/2022 |
| CN | 115166958 A | 10/2022 |
| CN | 115185082 A | 10/2022 |
| CN | 115211799 A | 10/2022 |
| CN | 115236795 A | 10/2022 |
| CN | 217639515 U | 10/2022 |
| CN | 217639519 U | 10/2022 |
| CN | 217639539 U | 10/2022 |
| CN | 217639544 U | 10/2022 |
| CN | 217639611 U | 10/2022 |
| CN | 217639612 U | 10/2022 |
| CN | 217639613 U | 10/2022 |
| CN | 217639715 U | 10/2022 |
| CN | 217639718 U | 10/2022 |
| CN | 217639719 U | 10/2022 |
| CN | 217639720 U | 10/2022 |
| CN | 217639722 U | 10/2022 |
| CN | 217639723 U | 10/2022 |
| CN | 217639724 U | 10/2022 |
| CN | 217639725 U | 10/2022 |
| CN | 217639726 U | 10/2022 |
| CN | 217639763 U | 10/2022 |
| CN | 217639765 U | 10/2022 |
| CN | 217639767 U | 10/2022 |
| CN | 217639768 U | 10/2022 |
| CN | 217639769 U | 10/2022 |
| CN | 217639770 U | 10/2022 |
| CN | 217639771 U | 10/2022 |
| CN | 217639772 U | 10/2022 |
| CN | 217639773 U | 10/2022 |
| CN | 217639774 U | 10/2022 |
| CN | 217639776 U | 10/2022 |
| CN | 217639777 U | 10/2022 |
| CN | 217639778 U | 10/2022 |
| CN | 217639903 U | 10/2022 |
| CN | 217639920 U | 10/2022 |
| CN | 115268058 A | 11/2022 |
| CN | 115327865 A | 11/2022 |
| CN | 115332917 A | 11/2022 |
| CN | 115343795 A | 11/2022 |
| CN | 115390176 A | 11/2022 |
| CN | 217809433 U | 11/2022 |
| CN | 217818613 U | 11/2022 |
| CN | 217819022 U | 11/2022 |
| CN | 217820828 U | 11/2022 |
| CN | 217820829 U | 11/2022 |
| CN | 217820831 U | 11/2022 |
| CN | 217820834 U | 11/2022 |
| CN | 217820838 U | 11/2022 |
| CN | 217820839 U | 11/2022 |
| CN | 217820840 U | 11/2022 |
| CN | 217820943 U | 11/2022 |
| CN | 217820944 U | 11/2022 |
| CN | 217820945 U | 11/2022 |
| CN | 217820971 U | 11/2022 |
| CN | 217821058 U | 11/2022 |
| CN | 217821068 U | 11/2022 |
| CN | 217821071 U | 11/2022 |
| CN | 217821091 U | 11/2022 |
| CN | 217821110 U | 11/2022 |
| CN | 217821111 U | 11/2022 |
| CN | 217821113 U | 11/2022 |
| CN | 217821122 U | 11/2022 |
| CN | 217821160 U | 11/2022 |
| CN | 217821236 U | 11/2022 |
| CN | 217821680 U | 11/2022 |
| CN | 217821696 U | 11/2022 |
| CN | 217822825 U | 11/2022 |
| CN | 217823690 U | 11/2022 |
| CN | 217825178 U | 11/2022 |
| CN | 217885960 U | 11/2022 |
| CN | 217902220 U | 11/2022 |
| CN | 217902222 U | 11/2022 |
| CN | 115421295 A | 12/2022 |
| CN | 115453754 A | 12/2022 |
| CN | 115524768 A | 12/2022 |
| CN | 115524775 A | 12/2022 |
| CN | 115524874 A | 12/2022 |
| CN | 217981833 U | 12/2022 |
| CN | 217981857 U | 12/2022 |
| CN | 217981991 U | 12/2022 |
| CN | 217981992 U | 12/2022 |
| CN | 217982020 U | 12/2022 |
| CN | 217982038 U | 12/2022 |
| CN | 217982089 U | 12/2022 |
| CN | 217982120 U | 12/2022 |
| CN | 217983382 U | 12/2022 |
| CN | 217984044 U | 12/2022 |
| CN | 115812169 A | 3/2023 |
| CN | 116745685 A | 9/2023 |
| CN | 116940866 A | 10/2023 |
| CN | 118295056 A | 7/2024 |
| DE | 102007058558 A1 | 6/2009 |
| DE | 102009037629 A1 | 2/2011 |
| DE | 102012212753 A1 | 1/2014 |
| DE | 102015221985 A1 | 5/2017 |
| DE | 102016218996 A1 | 9/2017 |
| DE | 112018002811 T5 | 2/2020 |
| DE | 112018002670 T5 | 3/2020 |
| EP | 1251397 A2 | 10/2002 |
| EP | 1252623 B1 | 10/2004 |
| EP | 2631740 A2 | 8/2013 |
| EP | 2763519 A2 | 8/2014 |
| EP | 2338114 B1 | 3/2017 |
| EP | 3226042 A1 | 10/2017 |
| EP | 3353578 A1 | 8/2018 |
| EP | 3380876 A1 | 10/2018 |
| EP | 3385770 A1 | 10/2018 |
| EP | 3440484 A1 | 2/2019 |
| EP | 3504566 A2 | 7/2019 |
| EP | 3631533 A1 | 4/2020 |
| EP | 3676973 A1 | 7/2020 |
| EP | 3743764 A1 | 12/2020 |
| EP | 3353578 B1 | 1/2021 |
| EP | 3799626 A1 | 4/2021 |
| EP | 3825738 A2 | 5/2021 |
| EP | 3956702 A1 | 2/2022 |
| EP | 4004608 A1 | 6/2022 |
| EP | 4147311 A1 | 3/2023 |
| EP | 4268009 A1 | 11/2023 |
| EP | 4275080 A1 | 11/2023 |
| EP | 3380876 B1 | 2/2024 |
| GB | 2490895 A | 11/2012 |
| GB | 2499869 B | 3/2018 |
| GB | 2578049 A | 4/2020 |
| GB | 2578233 A | 4/2020 |

(56) References Cited

FOREIGN PATENT DOCUMENTS

| | | |
|---|---|---|
| GB | 2578236 A | 4/2020 |
| GB | 2578236 B | 11/2022 |
| HK | 40010538 | 7/2020 |
| JP | 2004302457 A | 10/2004 |
| JP | 2005017408 A | 1/2005 |
| JP | 2005274847 A | 10/2005 |
| JP | 2008046428 A | 2/2008 |
| JP | 2008299084 A | 12/2008 |
| JP | 2010085977 A | 4/2010 |
| JP | 2015502581 A | 1/2015 |
| JP | 2015092234 A | 5/2015 |
| JP | 2016511936 A | 4/2016 |
| JP | 2017062373 A | 3/2017 |
| JP | 2018536204 A | 12/2018 |
| JP | 2018537804 A | 12/2018 |
| JP | 2019516128 A | 6/2019 |
| JP | 2020522009 A | 7/2020 |
| JP | 2021511553 A | 5/2021 |
| JP | 6925358 B2 | 8/2021 |
| JP | 2022542172 A | 9/2022 |
| KR | 0144569 B1 | 11/1998 |
| KR | 20080099452 A | 11/2008 |
| KR | 20080103149 A | 11/2008 |
| KR | 20090002583 A | 1/2009 |
| KR | 20100027995 A | 3/2010 |
| KR | 101493928 B1 | 3/2015 |
| KR | 20150113041 A | 10/2015 |
| KR | 20170015109 A | 2/2017 |
| KR | 20180083885 A | 7/2018 |
| KR | 20180121309 A | 11/2018 |
| KR | 20180124106 A | 11/2018 |
| KR | 101905444 B1 | 12/2018 |
| KR | 20190038221 A | 4/2019 |
| KR | 102036640 B1 | 10/2019 |
| KR | 1020200008630 A | 1/2020 |
| KR | 1020200108901 A | 9/2020 |
| KR | 20210088520 A | 7/2021 |
| KR | 10-2363805 B1 | 2/2022 |
| KR | 1020220035971 A | 3/2022 |
| KR | 20240163162 A | 11/2024 |
| SG | 11201804346 P | 6/2018 |
| SG | 11201808772 W | 11/2018 |
| SG | 11202001717V | 2/2023 |
| SG | 11202006952X | 2/2023 |
| SG | 10202004257 W | 12/2023 |
| SG | 11202013228X | 2/2024 |
| TW | 201017338 A | 5/2010 |
| TW | 201438242 A | 10/2014 |
| TW | 201908232 A | 3/2019 |
| WO | 0043750 A2 | 7/2000 |
| WO | 2007141788 A2 | 12/2007 |
| WO | 2008019803 A1 | 2/2008 |
| WO | 2008020899 A2 | 2/2008 |
| WO | 2009067540 A1 | 5/2009 |
| WO | 2009124181 A2 | 10/2009 |
| WO | 2011106553 A2 | 9/2011 |
| WO | 2011106553 A3 | 1/2012 |
| WO | 2012122677 A1 | 9/2012 |
| WO | 2012139634 A1 | 10/2012 |
| WO | 2012144997 A1 | 10/2012 |
| WO | 2012172366 A1 | 12/2012 |
| WO | 2013033591 A1 | 3/2013 |
| WO | 2014116500 A1 | 7/2014 |
| WO | 2015021255 A1 | 2/2015 |
| WO | 2015077926 A1 | 6/2015 |
| WO | 2015112939 A1 | 7/2015 |
| WO | 2015160412 A2 | 10/2015 |
| WO | 2016049629 A1 | 3/2016 |
| WO | 2016051325 A1 | 4/2016 |
| WO | 2016086204 A1 | 6/2016 |
| WO | 2016140720 A2 | 9/2016 |
| WO | 2016140720 A3 | 10/2016 |
| WO | 2016168173 A1 | 10/2016 |
| WO | 2016178740 A2 | 11/2016 |
| WO | 2016191142 A2 | 12/2016 |
| WO | 2017005709 A1 | 1/2017 |
| WO | 2017034995 A1 | 3/2017 |
| WO | 2017040854 A1 | 3/2017 |
| WO | 2017053309 A1 | 3/2017 |
| WO | 2017079480 A1 | 5/2017 |
| WO | 2017091738 A1 | 6/2017 |
| WO | 2017176921 A1 | 10/2017 |
| WO | 2017182771 A1 | 10/2017 |
| WO | 2018063455 A1 | 4/2018 |
| WO | 2018067246 A2 | 4/2018 |
| WO | 2018063455 A9 | 5/2018 |
| WO | 2018118984 A1 | 6/2018 |
| WO | 2018134215 A1 | 7/2018 |
| WO | 2018067246 A3 | 8/2018 |
| WO | 2018142339 A1 | 8/2018 |
| WO | 2018204856 A1 | 11/2018 |
| WO | 2018218063 A1 | 11/2018 |
| WO | 2018219710 A1 | 12/2018 |
| WO | 2018222944 A1 | 12/2018 |
| WO | 2019015735 A1 | 1/2019 |
| WO | 2019039241 A1 | 2/2019 |
| WO | 2019043016 A1 | 3/2019 |
| WO | 2019046827 A1 | 3/2019 |
| WO | 2019057907 A1 | 3/2019 |
| WO | 2019075335 A1 | 4/2019 |
| WO | 2019101750 A2 | 5/2019 |
| WO | 2019103762 A2 | 5/2019 |
| WO | 2019108290 A1 | 6/2019 |
| WO | 2019113106 A1 | 6/2019 |
| WO | 2019116364 A1 | 6/2019 |
| WO | 2019118646 A1 | 6/2019 |
| WO | 2019119025 A1 | 6/2019 |
| WO | 2019103762 A3 | 7/2019 |
| WO | 2019136166 A1 | 7/2019 |
| WO | 2019103762 A9 | 8/2019 |
| WO | 2019147828 A1 | 8/2019 |
| WO | 2019148200 A1 | 8/2019 |
| WO | 2019164542 A1 | 8/2019 |
| WO | 2019164849 A1 | 8/2019 |
| WO | 2019173357 A1 | 9/2019 |
| WO | 2019198568 A1 | 10/2019 |
| WO | 2019203876 A2 | 10/2019 |
| WO | 2019204667 A1 | 10/2019 |
| WO | 2019206430 A1 | 10/2019 |
| WO | 2020001938 A1 | 1/2020 |
| WO | 2020010084 A1 | 1/2020 |
| WO | 2020101568 A1 | 5/2020 |
| WO | 2020139752 A1 | 7/2020 |
| WO | 2020176227 A1 | 9/2020 |
| WO | 2020214615 A1 | 10/2020 |
| WO | 2020214617 A1 | 10/2020 |
| WO | 2020248046 A1 | 12/2020 |
| WO | 2021021671 A1 | 2/2021 |
| WO | 2021130085 A1 | 7/2021 |
| WO | 2021226544 A1 | 11/2021 |
| WO | 2021230868 A1 | 11/2021 |
| WO | 2021234924 A1 | 11/2021 |
| WO | 2022146929 A1 | 7/2022 |
| WO | 2022150816 A1 | 7/2022 |
| WO | 2023115037 A1 | 6/2023 |
| WO | 2024205646 A2 | 10/2024 |
| WO | 2024205646 A3 | 1/2025 |

OTHER PUBLICATIONS

Extended European Search Report for European Application No. 20847649.9, Search completed Jul. 20, 2023, Mailed Aug. 1, 2023, 11 pgs.
Foreign Action other than Search Report on CN 201680077924.9 dated Aug. 30, 2019, 10 pgs.
Arbabi et al., "Full-Stokes Imaging Polarimetry Using Dielectric Metasurfaces", ACS Photonics, vol. 5, No. 8, Jul. 16, 2018, pp. 3132-3140, doi: 10.1021/acsphotonics.8b00362.
Capaldo et al., "Nano-Fabrication and Characterization of Silicon Meta-Surfaces Provided with Pancharatnam-Berry effect", Optical Materials Express, vol. 9, No. 3, Mar. 1, 2019, pp. 1015-1032.
Cofre et al., "Quantitative performance of a polarization diffraction grating polarimeter encoded onto two liquid-crystal-on-silicon dis-

(56) References Cited

OTHER PUBLICATIONS plays", Optics & Laser Technology, vol. 96, Nov. 2017, pp. 219-226, doi: 10.1016/j.optlastec.2017.05.027.
Damask, "Polarization Optics in Telecommunications", Springer, 2005, 535 pgs. (Presented in 2 Parts).
Juan et al., "Arbitrary Polarization Transformation Based on Two-Dimensional Metallic Rectangular Gratings", Acta Optica Sinica, vol. 31, No. 12, Dec. 31, 2011, 1224001-1-1224001-5, doi: 10.3788/AOS201131.1224001.
Keller, "Instrumentation for Astrophysical Spectropolarimetry", Astrophysical Spectropolarimetry, 2001, pp. 303-354.
Lim et al., "Self-Mixing Imaging Sensor Using a Monolithic VCSEL Array with Parallel Readout", Optics Express, vol. 17, No. 7, Mar. 30, 2009, pp. 5517-5525, doi: 10.1364/oe.17.005517.
Martin-Regalado et al., "Polarization Properties of Vertical-Cavity Surface-Emitting Lasers", IEEE Journal of Quantum Electronics, May 1997, vol. 33, No. 5, pp. 765-783, doi: 10.1109/3.572151.
Moreno et al., "Jones matrix treatment for polarization Fourier optics", Journal of Modern Optics, vol. 51, No. 14, Mar. 26, 2004, pp. 2031-2038, doi: 10.1080/09500340408232511.
Pors et al., "Plasmonic Metagratings for Simultaneous Determination of Stokes Parameters", Arxiv:1609.04691v1 [physics.optics], Sep. 15, 2016, 21 pgs., doi: 10.1364/OPTICA.2.000716.
Sreelal et al., "Jones Matrix Microscopy from a Single-Shot Intensity Measurement", Optics Letters, vol. 42, No. 24, Dec. 15, 2017, pp. 5194-5197, doi: 10.1364/OL.42.005194.
Su et al., "Designing LED Array for Uniform Illumination Distribution by Simulated Annealing Algorithm", Optics Express, vol. 20, No. S6, Nov. 5, 2012, pp. A843-A855, doi: 10.1364/oe.20.00a843.
Wolf, "Introduction to the Theory of Coherence and Polarization of Light", Cambridge University Press, 2007, 235 pgs.
Wu et al., "Spectrally selective chiral silicon metasurfaces based on infrared Fano resonances", Nature Communications, vol. 5, No. 3892, 2014, published online May 27, 2014, 9 pgs., doi: 10.1038/ncomms4892.
Xu et al., "Metasurface Quantum-Cascade Laser with Electrically Switchable Polarization", Optica, vol. 4, No. 4, Apr. 2017, pp. 468-475, doi: 10.1364/optica.4.000468.
Yariv et al., "Photonics: Optical Electronics in Modern Communications", 6th edition, Oxford University Press, 2006, 849 pgs. (Presented in 3 Parts).
Extended European Search Report for European Application No. 16869282.0, Search completed Nov. 8, 2019, Mailed Nov. 20, 2019, 15 pgs.
Extended European Search Report for European Application No. 17779772.7, Search completed Oct. 15, 2019, Mailed Oct. 25, 2019, 10 pgs.
Extended European Search Report for European Application No. 17858861.2, Search completed Mar. 13, 2020, Mailed Mar. 23, 2020, 9 pgs.
Extended European Search Report for European Application No. 18805669.1, Search completed Feb. 9, 2021, Mailed Feb. 18, 2021, 13 pgs.
Extended European Search Report for European Application No. 18852460.7, Search completed Mar. 25, 2021, Mailed Apr. 6, 2021, 13 pgs.
Extended European Search Report for European Application No. 19744012.6, Search completed Sep. 3, 2021, Mailed Dec. 16, 2021, 10 pgs.
Extended European Search Report for European Application No. 19830958.5, Search completed Feb. 17, 2022, Mailed Feb. 25, 2022, 8 pgs.
Extended European Search Report for European Application No. 20790964.9, Search completed Nov. 22, 2022, Mailed Dec. 2, 2022, 10 pgs.
International Preliminary Report on Patentability for International Application No. PCT/US2018/038357, Report issued Dec. 24, 2019, Mailed Jan. 2, 2020, 7 pgs.
International Preliminary Report on Patentability for International Application No. PCT/US2008/084068, Report issued May 25, 2010, 5 pgs.
International Preliminary Report on Patentability for International Application No. PCT/US2012/053434, Report issued Mar. 4, 2014, Mailed Mar. 13, 2014, 9 pgs.
International Preliminary Report on Patentability for International Application No. PCT/US2015/064930, Report issued Jun. 13, 2017, Mailed Jun. 22, 2017, 9 pgs.
International Preliminary Report on Patentability for International Application No. PCT/US2016/052685, Report issued Mar. 27, 2018, Mailed Apr. 5, 2018, 9 pgs.
International Preliminary Report on Patentability for International Application No. PCT/US2016/063617, Report issued May 29, 2018, Mailed Jun. 7, 2018, 7 pgs.
International Preliminary Report on Patentability for International Application No. PCT/US2017/026206, Report issued Oct. 9, 2018, Mailed Oct. 18, 2018, 9 pgs.
International Preliminary Report on Patentability for International Application No. PCT/US2017/036897, Report issued Dec. 11, 2018, Mailed Dec. 20, 2018, 9 pgs.
International Preliminary Report on Patentability for International Application No. PCT/US2017/048469, Report issued Feb. 26, 2019, Mailed Mar. 7, 2019, 6 pgs.
International Preliminary Report on Patentability for International Application No. PCT/US2018/031204, Report issued Nov. 5, 2019, Mailed Nov. 14, 2019, 9 pgs.
International Preliminary Report on Patentability for International Application No. PCT/US2018/034460, Report issued Nov. 26, 2019, Mailed Dec. 5, 2019, 7 pgs.
International Preliminary Report on Patentability for International Application No. PCT/US2018/035502, Report issued Dec. 3, 2019, Mailed Dec. 12, 2019, 8 pgs.
International Preliminary Report on Patentability for International Application No. PCT/US2018/046947, Report issued Feb. 18, 2020, Mailed on Feb. 27, 2020, 7 pgs.
International Preliminary Report on Patentability for International Application No. PCT/US2018/049276, Report issued on Mar. 3, 2020, Mailed on Mar. 12, 2020, 9 pgs.
International Preliminary Report on Patentability for International Application No. PCT/US2019/040302, Report issued Jan. 5, 2021, Mailed Jan. 14, 2021, 6 pgs.
International Preliminary Report on Patentability for International Application No. PCT/US2020/028157, Report issued Sep. 28, 2021, Mailed Oct. 28, 2021, 7 pgs.
International Preliminary Report on Patentability for International Application No. PCT/US2020/028159, Report issued Sep. 28, 2021, Mailed on Oct. 28, 2021, 7 pgs.
International Preliminary Report on Patentability for International Application No. PCT/US2020/043600, Report issued Feb. 1, 2022, Mailed on Feb. 10, 2022, 9 pgs.
International Preliminary Report on Patentability for International Application No. PCT/US2022/070043, Report issued Jul. 4, 2023, Mailed on Jul. 20, 2023, 10 pgs.
International Search Report and Written Opinion for International Application No. PCT/US2008/084068, Search completed Jan. 13, 2009, Mailed Feb. 2, 2009, 6 pgs.
International Search Report and Written Opinion for International Application No. PCT/US2012/053434, Search completed Oct. 17, 2012, Mailed Dec. 17, 2012, 7 pgs.
International Search Report and Written Opinion for International Application No. PCT/US2015/064930, Search completed Sep. 9, 2016, Mailed Sep. 20, 2016, 11 pgs.
International Search Report and Written Opinion for International Application No. PCT/US2016/052685, Search completed Nov. 30, 2016, Mailed Dec. 9, 2016, 12 pgs.
International Search Report and Written Opinion for International Application No. PCT/US2016/063617, Search completed Jan. 19, 2017, Mailed Mar. 31, 2017, 9 pgs.
International Search Report and Written Opinion for International Application No. PCT/US2017/026206, Search completed Jun. 10, 2017, Mailed Jun. 28, 2017, 15 pgs.

(56) References Cited

OTHER PUBLICATIONS

International Search Report and Written Opinion for International Application No. PCT/US2017/036897, Search completed Jan. 31, 2018, Mailed Feb. 21, 2018, 9 pgs.
International Search Report and Written Opinion for International Application No. PCT/US2017/048469, Search completed Apr. 20, 2018, Mailed May 4, 2018, 9 pgs.
International Search Report and Written Opinion for International Application No. PCT/US2018/031204, Search completed Jun. 29, 2018, Mailed Jul. 23, 2018, 14 pgs.
International Search Report and Written Opinion for International Application No. PCT/US2018/034460, Search completed Jul. 29, 2018, Mailed Aug. 24, 2018, 10 pgs.
International Search Report and Written Opinion for International Application No. PCT/US2018/035502, Search completed Jul. 31, 2018, Mailed Aug. 24, 2018, 13 pgs.
International Search Report and Written Opinion for International Application No. PCT/US2018/038357, Search completed Apr. 9, 2019, Mailed May 13, 2019, 12 pgs.
International Search Report and Written Opinion for International Application No. PCT/US2018/046947, Search completed Oct. 14, 2019, Mailed Oct. 25, 2019, 10 pgs.
International Search Report and Written Opinion for International Application No. PCT/US2018/049276, Search completed Oct. 26, 2018, Mailed Jan. 15, 2019, 12 pgs.
International Search Report and Written Opinion for International Application No. PCT/US2019/014975, Search completed Jun. 17, 2019, Mailed Jul. 8, 2019, 10 pgs.
International Search Report and Written Opinion for International Application No. PCT/US2019/018615, Search completed Apr. 12, 2019, Mailed May 6, 2019, 12 pgs.
International Search Report and Written Opinion for International Application No. PCT/US2019/040302, Search completed Aug. 29, 2019, Mailed Oct. 17, 2019, 6 pgs.
International Search Report and Written Opinion for International Application No. PCT/US2020/028157, Search completed Jun. 16, 2020, Mailed Sep. 4, 2020, 9 pgs.
International Search Report and Written Opinion for International Application No. PCT/US2020/028159, Search completed Jun. 15, 2020, Mailed Aug. 11, 2020, 7 pgs.
International Search Report and Written Opinion for International Application No. PCT/US2020/043600, Search completed Sep. 29, 2020, Mailed Nov. 24, 2020, 11 pgs.
International Search Report and Written Opinion for International Application No. PCT/US2021/031423, Search completed Jul. 15, 2021, Mailed Aug. 16, 2021, 7 pgs.
International Search Report and Written Opinion for International Application No. PCT/US2021/065231, Search completed Apr. 19, 2022, Mailed May 13, 2022, 14 pgs.
International Search Report and Written Opinion for International Application No. PCT/US2022/038059, Search completed Sep. 27, 2022, Mailed Oct. 27, 2022, 17 pgs.
International Search Report and Written Opinion for International Application No. PCT/US2022/070043, Search completed May 5, 2022, Mailed Jun. 9, 2022, 16 pgs.
International Search Report and Written Opinion for International Application No. PCT/US2022/081868, Search completed Mar. 23, 2023, Mailed Apr. 4, 2023, 13 pgs.
Non-Final Office Action for U.S. Appl. No. 15/778,208, issued Jul. 14, 2021, 11 pgs.
Partial European Search Report for European Application No. 19744012.6, Search completed Sep. 3, 2021, Mailed Sep. 15, 2021, 12 Pgs.
Search Report and Written Opinion for Singapore Patent Application No. SG11201808772W, Search completed Jan. 20, 2020, Mailed Jan. 28, 2020, 12 pgs.
Supplementary Partial European Search Report for European Application No. 16869282.0, Search completed Jun. 19, 2019, Mailed Jul. 2, 2019, 12 pgs.

"Elliptical Polarization", Wikipedia, XP055893535, Jan. 11, 2022, retrieved from the Internet URL: <https://en.wikipedia.org/wiki/Elliptical_polarization>, retrieved on Feb. 18, 2022, 4 pgs.
"Materials for High and Low Refractive Index Coatings", Sigma-Aldrich Inc., retrieved from the Internet URL: <www.sigmaaldrich.com/materials-science/organic-electronics/ri-coatings.html>, 2019, 3 pgs.
"These Tiny, Incredible 'Metalenses' are the Next Giant Leap in Optics", PetaPixel, retrieved from the Internet URL: <https://petapixel.com/2016/06/03/incredible-flat-metalenses-may-future-optics/>, Jun. 3, 2016, 21 pgs.
Aieta et al., "Aberration-Free Ultrathin Flat Lenses and Axicons at Telecom Wavelengths Based on Plasmonic Metasurfaces", Nano Letters, vol. 12, Aug. 15, 2012, pp. 4932-4936, doi: dx.doi.org/10.1021/nl302516v.
Aieta et al., "Aberrations of Flat Lenses and Aplanatic Metasurfaces", Optics Express, vol. 21, No. 25, Dec. 16, 2013, pp. 31530-31539, doi: 10.1364/OE.21.031530.
Aieta et al., "Multiwavelength Achromatic Metasurfaces by Dispersive Phase Compensation", Sciences, 2015, 15 pgs., doi: 10.1126/science.aaa2494.
Aieta et al., "Out-of-Plane Reflection and Refraction of Light by Anisotropic Optical Antenna Metasurfaces with Phase Discontinuities", Nano Letters, Feb. 13, 2012, pp. A-E, doi: dx.doi.org/10.1021/nl300204s.
Andreou et al., "Polarization Imaging: Principles and Integrated Polarimeters", IEEE Sensors Journal, vol. 2, No. 6, 2002, pp. 566-576.
Arbabi et al., "Dielectric Metasurfaces for Complete Control of Phase and Polarization with Subwavelength Spatial Resolution and High Transmission", Nature Nanotechnology, vol. 10, Aug. 31, 2015, pp. 937-943, doi: 10.1038/NNANO.2015.186.
Arbabi et al., "Efficient Dielectric Metasurface Collimating Lenses for Mid-Infrared Quantum Cascade Lasers", Optics Express, vol. 23, No. 26, Dec. 28, 2015, pp. 33310-33317, doi: 10.1364/OE.23.033310.
Arbabi et al., "Miniature Optical Planar Camera Based on a Wide-Angle Metasurface Doublet Corrected for Monochromatic Aberrations", Nature Communications, UK, Springer, Nov. 28, 2016, vol. 7, No. 13682, pp. 1-9, doi: 10.1038/ncomms13682.
Arbabi et al., "Subwavelength-Thick Lenses with High Numerical Apertures and Large Efficiency Based on High-Contrast Transmitarrays", Nature Communications, vol. 6, No. 7069, May 7, 2015, pp. 1-6, doi: 10.1038/ncomms8069.
Arbabi et al., "Supplementary Figures of Miniature Optical Planar Camera Based on a Wide-Angle Metasurface Doublet Corrected for Monochromatic Aberrations", Nature Communications, vol. 7, Article No. 13682, 2016, 9 pgs.
Arbabi et al., "Vectorial Holograms with a Dielectric Metasurface: Ultimate Polarization Pattern Generation", ACS Photonics, vol. 6, No. 11, Sep. 2019, pp. 2712-2718, doi: 10.1021/acsphotonics.9b00678.
Arrizon et al., "Pixelated Phase Computer Holograms for the Accurate Encoding of Scalar Complex Fields", Journal of the Optical Society of America A, vol. 24, No. 11, 2007, pp. 3500-3507.
Azadegan et al., "A Novel Approach for Miniaturization of Slot Antennas", IEEE Transactions on Antennas and Propagation, vol. 51, No. 3, Mar. 2003, pp. 421-429, doi: 10.1109/TAP.2003.809853.
Azzam, R. M. A. "Arrangement of Four Photodetectors for Measuring the State of Polarization of Light", Optics Letters, vol. 10, No. 7, Jul. 1985, pp. 309-311.
Azzam, R. M. A. "Division-of-Amplitude Photopolarimeter (DOAP) for the Simultaneous Measurement of All Four Stokes Parameters of Light", Optica Acta, vol. 29, No. 5, 1982, pp. 685-689.
Azzam, R. M. A. "Stokes-Vector and Mueller-Matrix Polarimetry [Invited]", Journal of the Optical Society of America A, vol. 33, No. 7, Jul. 2016, pp. 1396-1408.
Azzam et al., "Accurate Calibration of the Four-Detector Photopolarimeter with Imperfect Polarizing Optical Elements", Journal of the Optical Society of America A, vol. 6, No. 10, Oct. 1989, pp. 1513-1521.

(56) References Cited

OTHER PUBLICATIONS

Azzam et al., "Photopolarimeter Based on Planar Grating Diffraction", Journal of the Optical Society of America A, vol. 10, No. 6, Jun. 1993, pp. 1190-1196.
Bao et al., "Toward the Capacity Limit of 2D Planar Jones Matrix with a Single-Layer Metasurface", Science Advances, vol. 7, Jun. 18, 2021, pp. 1-6, doi: 10.1126/sciadv.abh0365.
Berry et al., "Measurement of the Stokes Parameters of Light", Applied Optics, vol. 16, No. 12, Dec. 1977, pp. 3200-3205.
Birch et al., "3D Imaging with Structured Illumination for Advanced Security Applications", Sandia Report, Sep. 2015, retrieved from the internet: URL: <https://www.osti.gov/biblio/1221516>, 64 pgs., doi: 10.2172/1221516.
Blanchard et al., "Modeling Nanoscale, V-Shaped Antennas for the Design of Optical Phased Arrays", Physical Review B, vol. 85, 2012, pp. 155457-1-155457-11, doi: 10.1103/physRevB.85.155457.
Bomzon et al., "Real-Time Analysis of Partially Polarized Light with a Space-Variant Subwavelength Dielectric Grating", Optics Letters, vol. 27, No. 3, Feb. 1, 2002, pp. 188-190.
Bomzon et al., "Spatial Fourier-Transform Polarimetry Using Space-Variant Subwavelength Metal-Stripe Polarizers", Optics Letters, vol. 26, No. 21, Nov. 1, 2001, pp. 1711-1713.
Buralli et al., "Optical Performance of Holographic Kinoforms", Applied Optics, vol. 28, No. 5, Mar. 1, 1989, pp. 976-983, doi: 10.1364/AO.28.000976.
Byrnes et al., "Designing Large, High-Efficiency, High-Numerical-Aperture, Transmissive Meta-Lenses for Visible Light", Optics Express, Mar. 7, 2016, vol. 24, No. 5, pp. 5110-5124, doi: 10.1364/OE.24.005110.
Campione et al., "Tailoring Dielectric Resonator Geometries for Directional Scattering and Huygens' Metasurfaces", Optics Express, vol. 23, No. 3, Feb. 9, 2015, pp. 2293-2307, doi: 10.1364/OE.23.002293.
Chen et al., "A Broadband Achromatic Metalens for Focusing and Imaging in the Visible", Nature Nanotechnology, 2018, 8 pgs., doi: 10.1038/s41565-017-0034-6.
Chen et al., "A Review of Metasurfaces: Physics and Applications", Reports on Progress in Physics, vol. 79, No. 076401, Jun. 16, 2016, 40 pgs., doi: 10.1088/0034-4885/79/7/076401.
Chen et al., "Broadband Achromatic Metasurface-Refractive Optics", Nano Letters, vol. 18, No. 12, Nov. 13, 2018, pp. 7801-7808.
Chen et al., "Dual-Polarity Plasmonic Metalens for Visible Light", Nature Communications, vol. 3, No. 1198, Nov. 13, 2012, pp. 1-6, doi: 10.10388/ncomms2207.
Chen et al., "Engineering the Phase Front of Light with Phase-Change Material Based Planar Lenses", Scientific Reports, vol. 5, No. 8660, Mar. 2, 2015, pp. 1-7.
Chen et al., "High-Efficiency Broadband Meta-Hologram with Polarization-Controlled Dual Images", Nano Letters, 2013, pp. A-F, doi: dx.doi.org.10.1021/nl403811d.
Chen et al., "Immersion Meta-Lenses at Visible Wavelengths for Nanoscale Imaging", Nano Letters, Apr. 7, 2017, pp. A-G, doi: 10.1021/acs.nanolett.7b00717.
Chen et al., "Integrated Plasmonic Metasurfaces for Spectropolarimetry", Nanotechnology, Apr. 26, 2016, vol. 27, No. 22, pp. 1-7, doi: 10.1088/0957-4484/27/22/224002.
Chen et al., "Phase and Dispersion Engineering of Metalenses: Broadband Achromatic Focusing and Imaging in the Visible", Arxiv, 2017, retrieved from the Internet: URL: https://arxiv.org/abs/1711.09343v1>, 30 pgs.
Chen et al., "Supplementary Information of Engineering the Phase Front of Light with Phase-Change Material Based Planar Lenses", Scientific Reports, 2015, 4 pgs.
Chipman et al., "Polarized Light and Optical Systems", CRC Press, 2019, 106 pgs.
Chou et al., "Imprint Lithography with 25-Nanometer Resolution", Science, vol. 272, Apr. 5, 1996, pp. 85-87.
Chou et al., "Subwavelength Amorphous Silicon Transmission Gratings and Applications in Polarizers and Waveplates", Applied Physics Letters, vol. 67, No. 6, Aug. 7, 1995, pp. 742-744.
Cincotti, "Polarization Gratings: Design and Applications", IEEE Journal of Quantum Electronics, vol. 39, No. 12, Dec. 2003, pp. 1645-1652.
Cloude, Shane "Conditions for the Physical Realisability of Matrix Operators in Polarimetry", Proceedings of SPIE, vol. 1166, 1989, pp. 177-185, doi: 10.1117/12.962889.
Cui et al., "Sixteen-Beam Grating-Based Division-of-Amplitude Photopolarimeter", Optics Letters, vol. 21, No. 1, Jan. 1, 1996, pp. 89-91.
Cumme et al., "From Regular Periodic Micro-Lens Arrays to Randomized Continuous Phase Profiles", Advanced Optical Technologies, 2015, vol. 4, No. 1, pp. 47-61, doi: 10.1515/aot-2014-0062.
Davis et al., "Diffraction Gratings Generating Orders with Selective States of Polarization", Optics Express, vol. 24, No. 2, 2016, pp. 907-917, doi: 10.1364/OE.24.000907.
Davis et al., "Polarization Beam Splitters Using Polarization Diffraction Gratings", Optics Letters, vol. 26, No. 9, May 1, 2001, pp. 587-589.
Dayal et al., "Polarization Control of 0.85 μm Vertical-cavity Surface-Emitting Lasers Integrated with Gold Nanorod Arrays", Applied Physics Letters, vol. 91, Sep. 12, 2007, pp. 111107-1-111107-3, doi: 10.1063/1.2783281.
Decker et al., "High-Efficiency Light-Wave Control with All-Dielectric Optical Huygens' Metasurfaces", Advanced Optical Materials, arXiv:1405.5038, 2014, 17 pgs., doi: 10.1002/adom.201400584.
Deng et al., "Diatomic Metasurface for Vectorial Holography", Nano Letters, vol. 18, No. 5, Mar. 28, 2018, pp. A-H.
Deschapms et al., "The Polder Mission: Instrument Characteristics and Scientific Objectives", IEEE Transactions on Geoscience and Remote Sensing, vol. 32, No. 3, May 1994, pp. 598-615.
Devlin et al., "Arbitrary Spin-to-Orbital Angular Momentum Conversion of Light", Science, vol. 358, Nov. 17, 2017, pp. 896-901, doi: 0.1126/science.aao5392.
Devlin et al., "Broadband High-Efficiency Dielectric Metasurfaces for the Visible Spectrum", PNAS, Sep. 6, 2016, vol. 113, No. 38, pp. 10473-10478, XP055955541, US, ISSN: 0027-8424, www.pnas.org/cgi/doi/10.1073/pnas.1611740113.
Devlin et al., "High Efficiency Dielectric Metasurfaces at Visible Wavelengths", Arxiv, retrieved from the Internet: URL: <https://arxiv.org/ftp/arxiv/papers/1603/1603.02735.pdf>, Mar. 8, 2016, pp. 1-18.
Ding et al., "Beam-Size-Invariant Spectropolarimeters Using Gap-Plasmon Metasurfaces", ACS Photonics, vol. 4, No. 4, Feb. 28, 2017, pp. 943-949.
Ding et al., "Gradient Metasurfaces: Fundamentals and Applications", ArXiv:1704:03032v1 [physics.optics], Apr. 10, 2017, 83 pgs.
Ding et al., "Versatile Polarization Generation and Manipulation Using Dielectric Metasurfaces", Laser & Photonics Review, vol. 14, No. 11, Sep. 23, 2020, pp. 2000116-1-2000116-7.
Dong et al., "Zero-Index Photonic Crystal as Low-Aberration Optical Lens (Conference Presentation)", Proceedings of SPIE 9918, Metamaterials, Metadevices, and Metasystems, Nov. 9, 2016, 2 pgs., doi: 10.1117/12.2237137.
Engelberg et al., "Near-IR Wide Field-of-View Huygens Metalens for Outdoor Imaging Applications", Nanophotonics, 2020, vol. 9, No. 2, pp. 361-370.
Evlyukhin et al., "Optical Response Features of Si-Nanoparticle Arrays", Physical Review B, vol. 82, 2010, pp. 045404-1-045404-11, doi: 10.1103/PhysRevB.82.045404.
Fattal et al., "Flat Dielectric Grating Reflectors with Focusing Abilities", Nature Photonics, May 2, 2010, pp. 1-5, doi: 10.1038/nphoton.2010.116.
Fienup, J. R. "Phase Retrieval Algorithms: A Comparison", Applied Optics, vol. 21, No. 15, Aug. 1, 1982, pp. 2758-2769.
Genevet et al., "Breakthroughs in Photonics 2013: Flat Optics: Wavefronts Control with Huygens' Interfaces", IEEE Photonics Journal, vol. 6, No. 2, Apr. 2014, 4 pgs., doi: 10.1109/JPHOT.2014.2308194.
Genevet et al., "Recent Advances in Planar Optics: From Plasmonic to Dielectric Metasurfaces", Optica, vol. 4, No. 1, Jan. 2017, pp. 139-152, doi: 10.1364/OPTICA.4.000139.

(56) References Cited

OTHER PUBLICATIONS

Gerchberg et al., "A Practical Algorithm for the Determination of Phase from Image and Diffraction Plane Pictures", Optik, vol. 35, No. 2, 1972, pp. 1-6.
Goldberg, D. E. "Genetic Algorithms in Search, Optimization, and Machine Learning", Addison Wesley, 1989, 432 pgs., (presented in 2 parts).
Gori, Franco "Measuring Stokes Parameters by Means of a Polarization Grating", Optics Letters, vol. 24, No. 9, May 1, 1999, pp. 584-586.
Groever et al., "Meta-Lens Doublet in the Visible Region", Nano Letters, Jun. 29, 2017, pp. A-F, doi: 10.1021/acs.nanolett.7b01888.
Gutiérrez-Vega, Julio C. "Optical Phase of Inhomogeneous Jones Matrices: Retardance and Ortho-Transmission States", Optics Letters, vol. 45, No. 7, Apr. 1, 2020, pp. 1639-1642, doi: 10.1364/OL.387644.
Hartwig et al., "Challenges for Reducing the Size of Laser Activated Remote Phosphor Light Engines for DLP Projection", Proceedings of SPIE, International Optical Design Conference, vol. 9293, Dec. 17, 2014, pp. 929313-1-929313-6, doi: 10.1117/12.2073275.
Hasman et al., "Chapter 4: Space-Variant Polarization Manipulation", Progress in Optics, vol. 47, 2005, pp. 215-289, doi: 10.1016/S0079-6638(05)47004-3.
Herrera-Fernandez et al., "Double Diffractive Optical Element System for Near-Field Shaping", Applied Optics, vol. 50, No. 23, Aug. 10, 2011, pp. 4587-4593.
Hidber et al., "Microcontact Printing of Palladium Colloids: Micron-Scale Patterning by Electroless Deposition of Copper", Langmuir, vol. 12, No. 5, 1996, pp. 1375-1380.
Horie et al., "Reflective Optical Phase Modulator Based on High-Contrast Grating Mirrors", Conference on Lasers and Electro-Optics (CLEO)—Laser Science to Photonic Applications, IEEE, 2014, 2 pgs.
Hsiao et al., "Fundamentals and Applications of Metasurfaces", Small Methods, Mar. 24, 2017, vol. 1, No. 4, pp. 1600064-1-1600064-20.
Jang et al., "Wavefront Shaping with Disorder-Engineered Metasurfaces", Nature Photonics, 2018, 8 pgs.
Jin et al., "Waveforms for Optimal Sub-keV High-Order Harmonics with Synthesized Two- or Three-Colour Laser Fields", Nature Communications, vol. 5, No. 4003, May 30, 2014, pp. 1-6.
Karagodsky et al., "Monolithically Integrated Multi-Wavelength VCSEL Arrays Using High-Contrast Gratings", Optics Express, vol. 18, No. 2, Jan. 18, 2010, pp. 694-699, doi: https://doi.org/10.1364/OE.18.000694.
Kats et al., "Giant Birefringence in Optical Antenna Arrays with Widely Tailorable Optical Anisotropy", PNAS, vol. 109, No. 31, Jul. 31, 2012, pp. 12364-12368, doi: 10.1073/pnas.1210686109.
Khorasaninejad et al., "Achromatic Metalens over 60 nm Bandwidth in the Visible and Metalens with Reverse Chromatic Dispersion", Nano Letters, Jan. 26, 2017, pp. A-F, doi: 10.1021/acs.nanolett.6b05137.
Khorasaninejad et al., "Achromatic Metasurface Lens at Telecommunication Wavelengths", Nanno Letters, Jul. 2, 2015, pp. A-E, doi: 10.1021/acs.nanolett.5b01806.
Khorasaninejad et al., "Broadband and Chiral Binary Dielectric Meta-Holograms", Science Advances, vol. 2, No. e1501258, May 13, 2016, pp. 1-6, doi:10.1126/sciadv.1501258.
Khorasaninejad et al., "Broadband Multifunctional Efficient Meta-Gratings Based on Dielectric Waveguide Phase Shifters", Nano Letters, Sep. 11, 2015, pp. A-G, doi: 10.1021/acs.nanolett.5b02524.
Khorasaninejad et al., "Metalenses at Visible Wavelengths: Diffraction-Limited Focusing and Subwavelength Resolution Imaging", Science, Jun. 3, 2016, vol. 352, No. 6290, pp. 1190-1194, XP055490038, US, ISSN: 0036-8075, doi: 10.1126/science.aaf6644.
Khorasaninejad et al., "Multispectral Chiral Imaging with a Metalens", Nano Letters, vol. 16, Jun. 7, 2016, pp. 4595-4600, doi: 10.1021/acs.nanolett.6b01897.
Khorasaninejad et al., "Planar Lenses at Visible Wavelengths", Arxiv, May 7, 2016, 17 pgs.
Khorasaninejad et al., "Polarization-Insensitive Metalenses at Visible Wavelengths", Nano Letters, Oct. 24, 2016, pp. A-F, doi: 10.1021/acs.nanolett.6b03626.
Khorasaninejad et al., "Silicon Nanofin Grating as a Miniature Chirality-Distinguishing Beam-Splitter", Nature Communications, vol. 5, No. 5386, Nov. 12, 2014, pp. 1-6, doi: 10.1038/ncomms6386.
Khorasaninejad et al., "Super-Dispersive Off-Axis Meta-Lenses for Compact High Resolution Spectroscopy", Nano Letters, May 3, 2016, vol. 16, No. 6, pp. 3732-3737, XP055430440, US, ISSN: 1530-6984, doi: 10.1021/acs.nanolett.6b01097.
Khorasaninejad et al., "Visible Wavelength Planar Metalenses Based on Titanium Dioxide", IEEE Journal of Selected Topics in Quantum Electronics, vol. 23, No. 3, May/Jun. 2017, 16 pgs.
Kildishev et al., "Planar Photonics with Metasurfaces", Science, vol. 339, No. 6125, Mar. 15, 2013, pp. 1232009-1-1232009-6, doi: 10.1126.science.1232009.
Kokkoris et al., "Nanoscale Roughness Effects at the Interface of Lithography and Plasma Etching: Modeling of Line-Edge-Roughness Transfer During Plasma Etching", IEEE Transactions on Plasma Science, vol. 37, No. 9, Sep. 2009, pp. 1705-1714, doi: 10.1109/TPS.2009.2024117.
Kominami et al., "Dipole and Slot Elements and Arrays on Semi-Infinite Substrates", IEEE Transactions on Antennas and Propagation, vol. AP33, No. 6, Jun. 1985, pp. 600-607.
Krasnok et al., "All-Dielectric Optical Nanoantennas", Optics Express, vol. 20, No. 18, Aug. 27, 2012, pp. 20599-20604.
Kress et al., "Applied Digital Optics from Micro-Optics to Nanophotonics", Applied Digital Optics, Wiley, 2009, 30 pgs.
Lalanne et al., "Interaction Between Optical Nano-objects at Metallodielectric Interfaces", Nature Physics, vol. 2, Aug. 2006, pp. 551-556, doi: 10.1038/nphys364.
Lee et al., "Giant Nonlinear Response from Plasmonic Metasurfaces Coupled to Intersubband Transitions", Nature, vol. 511, Jul. 3, 2014, pp. 65-69.
Leveque et al., "Transient Behavior of Surface Plasmon Polaritons Scattered at a Subwavelength Groove", Physical Reviews B, vol. 76, Oct. 18, 2007, pp. 155418-1-155418-8, doi: 10.1103/PhysRevB.76.155418.
Lezec et al., "Beaming Light from a Subwavelength Aperture", Science, vol. 297, Aug. 2, 2002, pp. 820-822, doi: 10.1126/science.1071895.
Li et al., "Achromatic Flat Optical Components via Compensation between Structure and Material Dispersions.", Scientific Reports, vol. 6, No. 19885, Jan. 22, 2016, pp. 1-7, doi: 10.1038/srep19885.
Li et al., "All-Silicon Nanorod-Based Dammann Gratings", Optics Letters, vol. 40, No. 18, Sep. 15, 2015, pp. 4285-4288.
Li et al., "Broadband Diodelike Asymmetric Transmission of Linearly Polarized Light in Ultrathin Hybrid Metamaterial", Applied Physics Letters, vol. 105, Nov. 19, 2014, pp. 201103-1-201103-5, doi: 10.1063/1.4902162.
Li et al., "Dispersion Controlling Meta-Lens at Visible Frequency", Optics Express, vol. 25, No. 18, Sep. 4, 2017, pp. 21419-21427.
Li et al., "Flat Metasurfaces to Focus Electromagnetic Waves in Reflection Geometry", Optics Letters, vol. 37, No. 23, Dec. 1, 2012, pp. 4940-4942.
Li et al., "Metalens-Based Miniaturized Optical Systems", Micromachines, vol. 10, No. 310, May 8, 2019, pp. 1-21, doi: 10.3390/mi10050310.
Lin et al., "Dielectric Gradient Metasurface Optical Elements", Science, vol. 345, No. 6194, Jul. 18, 2014, pp. 298-302, doi: 10.1126/science.1253213.
Liu et al., "Realization of Polarization Evolution on Higher-Order Poincare Sphere with Metasurface", Applied Physics Letters, vol. 104, 2014, pp. 191110-1-191101-4, doi: 10.1063/1.4878409.
Liu et al., "Single-Pixel Computational Ghost Imaging with Helicity-Dependent Metasurface Hologram", Science Advances, vol. 3, No. E1701477, Sep. 8, 2017, pp. 1-6.
Liu et al., "SSD: Single Shot Multibox Detector", European Conference on Computer Vision, Springer, 2016, pp. 21-37, doi: 10.1007/978-3-319-46448-0_2.
Lizana et al., "Arbitrary State of Polarization with Customized Degree of Polarization Generator", Optics Letters, vol. 40, No. 16, Aug. 15, 2015, pp. 3790-3793.

(56) References Cited

OTHER PUBLICATIONS

Lo et al., "New Architecture for Space Telescopes Uses Fresnel Lenses", SPIE Newsroom, 2006, 2 pgs., doi: 10.1117/2.1200608. 0333.

Lohmann, A. W. "Reconstruction of Vectorial Wavefronts", Applied Optics, vol. 4, No. 12, 1965, pp. 1667-1668.

Lu et al., "Homogeneous and Inhomogeneous Jones Matrices", Journal of the Optical Society of America A, 1994, vol. 11, No. 2, pp. 766-773.

Lu et al., "Interpretation of Mueller Matrices Based on Polar Decomposition", Journal of the Optical Society of America A, vol. 13, No. 5, May 1996, pp. 1106-1113.

Lu et al., "Planar High-Numerical-Aperture Low-Loss Focusing Reflectors and Lenses Using Subwavelength High Contrast Gratings", Optics Express, vol. 18, No. 12, Jun. 7, 2010, pp. 12606-12614, doi: 10.1364/OE.18.012606.

Luk et al., "Dielectric Resonator Antennas", Research Studies Press Ltd., Hertfordshire, 2003, 404 pgs., (presented in 2 parts).

Mackus et al., "The Use of Atomic Layer Deposition in Advanced Nanopatterning", Nanoscale, Jul. 25, 2014, vol. 6, pp. 10941-10960.

Maguid et al., "Multifunctional Interleaved Geometric-Phase Dielectric Metasurfaces", Light: Science & Applications, vol. 6, No. E17027, Aug. 11, 2017, pp. 1-7, doi: 10.1038/lsa.2017.27.

Maguid et al., "Photonic Spin-Controlled Multifunctional Shared-Aperture Antenna Array", Science, vol. 352, No. 6290, Apr. 21, 2016, pp. 1202-1206.

Mao et al., "Nanopatterning Using a Simple Bi-Layer Lift-Off Process for the Fabrication of a Photonic Crystal Nanostructure", Nanotechnology, vol. 24, No. 085302, Feb. 1, 2013, pp. 1-6, doi: 10.1088/0957-4484/24/8/085302.

Mao et al., "Surface Patterning of Nonscattering Phosphors for Light Extraction", Optics Letters, vol. 38, No. 15, Aug. 1, 2013, pp. 2796-2799, doi: 10.1364/OL.38.002796.

Martin-Moreno, L. "Theory of Highly Directional Emission from a Single Subwavelength Aperture Surrounded by Surface Corrugations", Physical Review Letters, vol. 90, No. 16, Apr. 25, 2003, pp. 167401-1-167401-4, doi: 10.1103/PnysRevLett.9.167401.

McLeod, J. "Thin-Film Optical Filters", Third Edition, Institute of Physics Publishing, Adam Hilger, 1986, 667 pgs., (presented in 2 parts).

Meng et al., "A Novel Nanofabrication Technique of Silicon-Based Nanostructures", Nanoscale Research Letters vol. 11, No. 504, pp. 1-9, doi: 10.1186/s11671-016-1702-4.

Menzel et al., "Advanced Jones Calculus for the Classification of Periodic Metamaterials", Physical Review A, vol. 82, Nov. 15, 2010, pp. 053811-1-053811-9, doi: 10.1103/PhysRevA.82.053811.

Mirsalehi, Mir M. "Optical Information Processing", Encyclopedia of Physical Science and Technology, 3rd edition, 2001, pp. 335-340.

Miyazaki et al., "Ultraviolet-Nanoimprinted Packaged Metasurface Thermal Emitters for Infrared CO2 Sensing", Science and Technology of Advanced Materials, vol. 16, No. 035005, May 20, 2015, pp. 1-5, doi: 10.1088/1468-6996/16/3/035005.

Monticone et al., "Full Control of Nanoscale Optical Transmission with a Composite Metascreen", Physical Review Letters, vol. 110, May 17, 2013, pp. 203903-1-203903-5, doi: 10.1103/PhysRevLett. 110.203903.

Moreno et al., "Jones Matrix Treatment for Optical Fourier Processors with Structured Polarization", Optics Express, vol. 19, No. 5, Feb. 28, 2011, pp. 4583-4594.

Mueller et al., "Metasurface Polarization Optics: Independent Phase Control of Arbitrary Orthogonal States of Polarization", Physical Review Letters, Mar. 14, 2017, vol. 118, No. 11 pp. 113901-1-113901-5.

Mueller et al., "Ultracompact Metasurface In-Line Polarimeter", Optica, vol. 3, No. 1, Jan. 8, 2016, pp. 42-47.

Ni et al., "Broadband Light Bending with Plasmonic Nanoantennas", Sciencexpress, Dec. 22, 2011, 3 pgs., doi: 10.1126/science. 1214686.

Ni et al., "Ultra-Thin, Planar, Babinet-Inverted Plasmonic Metalenses", Light: Science & Applications, vol. 2, No. e72, Apr. 26, 2013, pp. 1-6, doi: 10.1038/lsa.2013.28.

Nordin et al., "Micropolarizer Array for Infrared Imaging Polarimetry", Journal of the Optical Society of America A, vol. 16, No. 5, May 1999, pp. 1168-1174.

Novikova et al., "Polarimetric Imaging for Cancer Diagnosis and Staging", Optics and Photonics News, Oct. 2012, 8 pgs.

Oh et al., "Achromatic Diffraction from Polarization Gratings with High Efficiency", Optic Letters, vol. 33, No. 20, Oct. 15, 2008, pp. 2287-2289.

Okaya et al., "The Dielectric Microwave Resonator", Proceedings of the IRE, Oct. 1962, pp. 2081-2092, doi: 10.1109/JRPROC.1962. 288245.

Orazbayev et al., "Tunable Beam Steering Enabled by Graphene Metamaterials", Optics Express, vol. 24, No. 8, Apr. 18, 2016, pp. 8848-8861, doi: 10.1364/OE.24.008848.

Otten et al., "Vector Apodizing Phase Plate Coronagraph: Prototyping, Characterization and Outlook", Advances in Optical and Mechanical Technologies for Telescopes and Instrumentation, Proceedings of SPIE, vol. 9151, 2014, pp. 91511R-1-91511R-10.

Pacheco-Peña et al., "Epsilon-Near-Zero Metalenses Operating in the Visible", Optics & Laser Technology, 2016, pp. 1-18.

Peinado et al., "Optimization and Performance Criteria of a Stokes Polarimeter Based on Two Variable Retarders", Optics Express, vol. 18, No. 10, May 10, 2010, pp. 9815-9530.

Petosa et al., "An Overview of Tuning Techniques for Frequency-Agile Antennas", IEEE Antennas and Propagation Magazine, vol. 54, No. 5, Oct. 2012, pp. 271-296.

Pfeiffer et al., "Cascaded Metasurfaces for Complete Phase and Polarization Control", Applied Physics Letters, vol. 102, Jun. 11, 2013, pp. 231116-1-231116-4, doi: 10.1063/1.4810873.

Pfeiffer et al., "Metamaterial Huygens' Surface: Tailoring Wave Fronts with Reflectionless Sheets", Physical Review Letters, vol. 110, May 10, 2013, pp. 197401-1-197401-5, doi: 10.1103/PhysRevLett. 110.197401.

Pierangelo et al., "Polarimetric Imaging of Uterine Cervix: A Case Study", Optics Express, vol. 21, No. 12, Jun. 17, 2013, pp. 14120-14130.

Pors et al., "Broadband Focusing Flat Mirrors Based on Plasmonic Gradient Metasurfaces", Nano Letters, vol. 13, Jan. 23, 2013, pp. 829-834, doi: https://doi.org/10.1021/nl304761m.

Pors et al., "Plasmonic Metagratings for Simultaneous Determination of Stokes Parameters", Optica, vol. 2, No. 8, Aug. 2015, pp. 716-723.

Pors et al., "Waveguide Metacouplers for In-Plane Polarimetry", Physical Review Applied, vol. 5, 2016, pp. 064015-1-064015-9.

Ramos et al., "Error Propagation in Polarimetric Demodulation", Applied Optics, vol. 47, No. 14, May 10, 2008, pp. 2541-2549.

Redding et al., "Full-Field Interferometric Confocal Microscopy Using a VCSEL Array", Optics Letters, vol. 39, No. 15, Aug. 1, 2014, 11 pgs.

Reichelt et al., "Capabilities of Diffractive Optical Elements for Real-Time Holographic Displays", Proceedings of SPIE, vol. 6912, Feb. 2008, pp. 69120-69130, doi: 10.1117/12.762887.

Romero et al., "Theory of Optimal Beam Splitting by Phase Gratings. II. Square and Hexagonal Gratings", Journal of the Optical Society of America A, vol. 24, No. 8, Aug. 2007, pp. 2296-2312.

Rosales-Guzman et al., "How to Shape Light with Spatial Light Modulators", SPIE, 2017, 58 pgs.

Roy et al., "Sub-Wavelength Focusing Meta-Lens", Optics Express, vol. 21, No. 6, Mar. 25, 2013, pp. 7577-7582.

Rubin et al., "Matrix Fourier Optics Enables a Compact Full-Stokes Polarization Camera", Science, vol. 365, No. 43, Jul. 5, 2019, pp. 1-10, doi: 10.1126/science.aax1839.

Rubin et al., "Polarization State Generation and Measurement with a Single Metasurface", Optics Express, vol. 26, No. 17, Aug. 20, 2018, pp. 21455-21478, doi: 10.1364/OE.26.021455.

Sabatke et al., "Optimization of Retardance for a Complete Stokes Polarimeter", Optics Letters, vol. 25, No. 11, Jun. 1, 2000, pp. 802-804.

(56) References Cited

OTHER PUBLICATIONS

Saeidi et al., "Wideband Plasmonic Focusing Metasurfaces", Applied Physics Letters, vol. 105, Aug. 2014, pp. 053107-1-053107-4, doi: http://dx.doi.org/10.1063/1.4892560.
Sales et al., "Diffractive-Refractive Behavior of Kinoform Lenses", Applied Optics, vol. 36, No. 1, Jan. 1, 1997, pp. 253-257, doi: 10.1364/AO.36.000253.
Sancho-Parramon et al., "Optical Characterization of HfO2 by Spectroscopic Ellipsometry: Dispersion Models and Direct Data Inversion", Thin Solid Films, vol. 516, 2008, pp. 7990-7995, doi: 10.1016/j.tsf.2008.04.007.
Sayyah et al., "Two-Dimensional Pseudo-Random Optical Phased Array Based on Tandem Optical Injection Locking of Vertical Cavity Surface Emitting Lasers", Optics Express, vol. 23, No. 15, Jul. 27, 2015, pp. 19405-19416, doi: 10.1364/OE.23.019405.
Schulz et al., "Quantifying the Impact of Proximity Error Correction on Plasmonic Metasurfaces", Optical Materials Express, vol. 5, No. 12, Dec. 1, 2015, pp. 2798-2803, doi: 10.1364/OME.5.002798.
Sell et al., "Periodic Dielectric Metasurfaces with High-Efficiency, Multiwavelength Functionalities", Advanced Optical Materials, 2017, 7 pgs., doi: 10.1002/adom.201700645.
Seurin et al., "High-Efficiency VCSEL Arrays for Illumination and Sensing in Consumer Applications", Proceedings of SPIE, vol. 9766, 2016, pp. 97660D-1-97660D-9, doi: 10.1117/12.2213295.
She et al., "Large Area Metalenses: Design, Characterization, and Mass Manufacturing", Optics Express, vol. 26, No. 2, Jan. 22, 2018, pp. 1573-1585, doi: 10.1364/OE.26.001573.
Shi et al., "Continuous Angle-Tunable Birefringence with Freeform Metasurfaces for Arbitrary Polarization Conversion", Science Advances, vol. 6, No. eaba3367, Jun. 3, 2020, pp. 1-7, doi: 10.1126/sciadv.aba3367.
Shim et al., "Hard-Tip, Soft-Spring Lithography", Nature, vol. 469, Jan. 27, 2011, pp. 516-521.
Silvestri et al., "Robust Design Procedure for Dielectric Resonator Metasurface Lens Array", Optics Express, vol. 24, No. 25, Dec. 12, 2016, pp. 29153-29169.
Snik et al., "An Overview of Polarimetric Sensing Techniques and Technology with Applications to Different Research Fields", Proceedings of SPIE, vol. 9099, 2014, pp. 90990B-1-90990B-20.
Sokolov, A. L. "Polarization of Spherical Waves", Optics and Spectroscopy, vol. 92, No. 6, 2002, pp. 936-942.
Song et al., "Vividly-Colored Silicon Metasurface Based on Collective Electric and Magnetic Resonances", IEEE, Jan. 11, 2016, 2 pgs.
Stenflo, J. O. "Chapter 13: Instrumentation for Solar Polarimetry", Solar Magnetic Fields: Polarized Radiation Diagnostics, Springer Netherlands, Dordrecht, 1994, pp. 312-350.
Sun et al., "High-Efficiency Broadband Anomalous Reflection by Gradient Meta-Surfaces", Nano Letters, vol. 12, Nov. 28, 2012, pp. 6223-6229, doi: dx.doi.org/10.1021/nl3032668.
Tervo et al., "Paraxial-Domain Diffractive Elements with 100% Efficiency Based on Polarization Gratings", Optics Letters, vol. 25, No. 11, Jun. 1, 2000, pp. 785-786.
Todorov et al., "Polarization Holography. 1: A New High-Efficiency Organic Material with Reversible Photoinduced Birefringence", Applied Optics, vol. 23, No. 23, Dec. 1, 1984, pp. 4309-4312.
Todorov et al., "Spectrophotopolarimeter: Fast Simultaneous Real-Time Measurement of Light Parameters", Optics Letters, vol. 17, No. 5, Mar. 1, 1992, pp. 358-359.
Trebino et al., "The Autocorrelation, the Spectrum, and Phase Retrieval", Frequency-Resolved Optical Gating: The Measurement of Ultrashort Laser Pulses, Springer, 2000, pp. 61-99.
Tyo, Scott J. "Noise Equalization in Stokes Parameter Images Obtained by Use of Variable-Retardance Polarimeters", Optics Letters, vol. 25, No. 16. Aug. 15, 2000, pp. 1198-1200.
Tyo et al., "Review of Passive Imaging Polarimetry for Remote Sensing Applications", Applied Optics, vol. 45, No. 22, Aug. 1, 2006, pp. 5453-5469.

Vo et al., "Sub-Wavelength Grating Lenses with a Twist", IEEE Photonics Technology Letters, vol. 26, No. 13, Jul. 1, 2014, pp. 1375-1378, doi: 10.1109/LPT.2014.2325947.
Voelkel et al., "Laser Beam Homogenizing: Limitations and Constraints", DPIE, Europe, Optical Systems Design, 2008, 12 pgs.
Voelz, "Chapter 6: Transmittance Functions, Lenses, and Gratings", 2011, pp. 89-111.
Walther et al., "Spatial and Spectral Light Shaping with Metamaterials", Advanced Materials, vol. 24, 2012, pp. 6300-6304, doi: 10.1002/adma.201202540.
Wang et al., "Broadband Achromatic Optical Metasurface Devices", Nature Communications, vol. 8, No. 187, Aug. 4, 2017, pp. 1-9, doi: 10.1038/s41467-017-00166-7.
Wang et al., "Generation of Steep Phase Anisotropy with Zero-Backscattering by Arrays of Coupled Dielectric Nano-Resonators", Applied Physics Letters, vol. 105, Sep. 25, 2014, pp. 121112-1-21112-5, doi: https://doi.org/10.1063/1.4896631.
Wang et al., "Information Authentication Using an Optical Dielectric Metasurface", Journal of Physics D: Applied Physics, Institute of Physics Publishing, Bristol, vol. 50, No. 36, Aug. 17, 2017, pp. 1-5.
Wei et al., "Design of Ultracompact Polarimeters based on Dielectric Metasurfaces", Optics Letters, vol. 42, No. 8, Apr. 11, 2017, pp. 1580-1583, doi: 10.1364/OL.42.001580.
Wen et al., "Metasurface for Characterization of the Polarization State of Light", Optics Express, vol. 23, No. 8, 2015, pp. 10272-10281, doi: 10.1364/OE.23.010272.
Wiktorowicz et al., "Toward the Detection of Exoplanet Transits with Polarimetry", The Astrophysical Journal, vol. 795, No. 12, Nov. 1, 2014, 6 pgs., doi: 10.1088/0004-637X/795/1/12.
Xu et al., "Metasurface External Cavity Laser", Applied Physics Letters, vol. 107, No. 221105, 2015, pp. 221105-1-221105-5, doi: 10.1063/1.4936887.
Yang et al., "Design of Ultrathin Plasmonic Quarter-Wave Plate based on Period Coupling", Optics Letters, vol. 38, No. 5, 2013, pp. 679-681, doi: https://doi.org/10.1364/OL.38.000679.
Yang et al., "Generalized Hartmann-Shack Array of Dielectric Metalens sub-arrays for Polarimetric Beam Profiling", Nature Communications, vol. 9, No. 4607, Nov. 2, 2018, pp. 1-7, doi: 10.1038/s41467-018-07056-6.
Yao et al., "Wide Wavelength Tuning of Optical Antennas on Graphene with Nanosecond Response Time", Nano Letters, vol. 14, No. 1, 2014, Dec. 3, 2013, pp. A-F, doi: 10.1021/nl403751p.
Yu et al., "A Broadband, Background-Free Quarter-Wave Plate Based on Plasmonic Metasurfaces", Nano Letters, vol. 12, No. 12, Nov. 3, 2012, pp. A-F, doi: dx.doi.org/10.1021/nl303445u.
Yu et al., "Flat Optics with Designer Metasurfaces", Nature Materials, vol. 13, Feb. 2014, pp. 139-150, doi :10.1038/NMAT3839.
Yu et al., "Flat optics: Controlling Wavefronts with Optical Antenna Metasurfaces", IEEE Journal of Selected Topics, vol. 19, No. 3, May/Jun. 2013, 23 pgs.
Yu et al., "High-Transmission Dielectric Metasurface with 2π Phase Control at Visible Wavelengths", Laser & Photonics Reviews, vol. 9, No. 4, Jun. 26, 2015, pp. 412-418, doi: 10.1002/lpor.201500041.
Yu et al., "Light Propagation with Phase Discontinuities: Generalized Laws of Reflection and Refraction", Science, vol. 334, No. 6054, Oct. 21, 2011, pp. 333-337, doi: 10.1126/science.1210713.
Yu et al., "Optical Metasurfaces and Prospect of their Applications Including Fiber Optics", Journal of Lightwave Technology, vol. 33, No. 12, 2015, pp. 2344-2358.
Yu et al., "Quantum Cascade Lasers with Integrated Plasmonic Antenna-Array Collimators", Optics Express, vol. 16, No. 24, Nov. 24, 2008, pp. 19447-19461.
Yu et al., "Small Divergence Edge-Emitting Semiconductor Lasers with Two-Dimensional Plasmonic Collimators", Applied Physics Letters, vol. 93, 2008, pp. 181101-1-181101-3, doi: 10.1063/1.3009599.
Yu et al., "Small-Divergence Semiconductor Lasers by Plasmonic Collimation", Nature Photonics, vol. 2, Sep. 2008, pp. 564-570, doi: 10.1038/nphoton.2008.052.
Yun et al., "Skew Aberration: a Form of Polarization Aberration", Optics Letters, vol. 36, No. 20, pp. 4062-4064, doi: 10.1364/OL.36.004062.

(56) References Cited

OTHER PUBLICATIONS

Zhan et al., "Low-Contrast Dielectric Metasurface Optics", ACS Photonics, vol. 3, No. 2, 2016, pp. A-F, doi: 10.1021/acsphotonics.5b00660.

Zhang et al., "High Efficiency all-Dielectric Pixelated Metasurface for Near-Infrared Full-Stokes Polarization Detection", Photonics Research, vol. 9, No. 4, Apr. 2021, pp. 583-589, doi: https://doi.org/10.1364/PRJ.415342.

Zhao et al., "Mie Resonance-Based Dielectric Metamaterials", Materials Today, vol. 12, No. 12, Dec. 2009, pp. 60-69.

Zhao et al., "Multichannel Vectorial Holographic Display and Encryption", Light Science & Applications, vol. 7, No. 95, 2018, 9 pgs., doi: 10.1038/s41377-018-0091-0.

Zhao et al., "Recent Advances on Optical Metasurfaces", Journal of Optics, Institute of Physics Publishing, vol. 16, No. 12, 2014, 14 pgs., doi: 10.1088/2040489781/16/12/123001.

Zhao et al., "Tailoring the Dispersion of Plasmonic Nanorods to Realize Broadband Optical Meta-Waveplates", Nano Letter, vol. 13, No. 3, Feb. 5, 2013, pp. 1086-1091, doi: 10.1021/nl304392b.

Zhao et al., "Twisted Optical metamaterials for planarized ultrathin broadband circular polarizers", Nature Communications, vol. 3, No. 870, 2012, pp. 1-7, doi: 10.1038/ncomms1877.

Zhou et al., "Characteristic Analysis of Compact Spectrometer Based on Off-Axis Meta-Lens", Applied Sciences, vol. 8, No. 321, 2018, 11 pgs., doi: 10.3390/app8030321.

Zhou et al., "Plasmonic Holographic Imaging with V-shaped Nanoantenna Array", Optics Express, vol. 21, No. 4, Feb. 25, 2013, pp. 4348-4354.

Zhou et al., "Progress on Vertical-Cavity Surface-Emitting Laser Arrays for Infrared Illumination Applications", Proc. SPIE 9001, Vertical-Cavity Surface-Emitting Lasers XVIII, 90010E, Feb. 27, 2014, 11 pgs.

Zhu et al., "Ultra-Compact Visible Chiral Spectrometer with Meta-Lenses", APL Photonics, vol. 2, Feb. 7, 2017, pp. 036103-1-036103-12, doi: https://doi.org/10.1063/1.4974259.

Zou et al., "Dielectric Resonator Nanoantennas at Visible Frequencies", Optics Express, vol. 21, No. 1, Jan. 14, 2013, pp. 1344-1352.

International Preliminary Report on Patentability for International Application PCT/US2023/065232, Report issued Nov. 7, 2024, Mailed Dec. 12, 2024, 8 Pgs.

\* cited by examiner

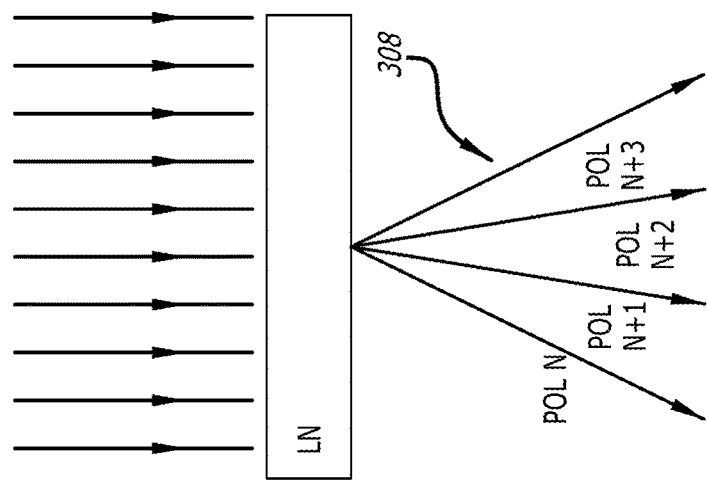
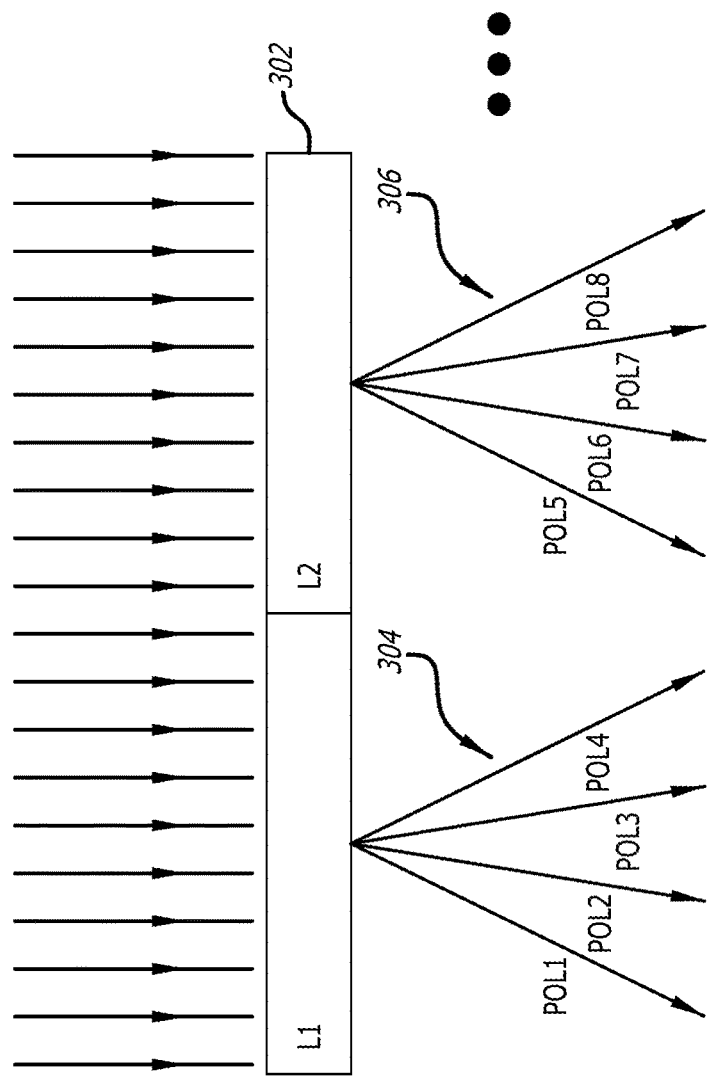
FIG. 3A

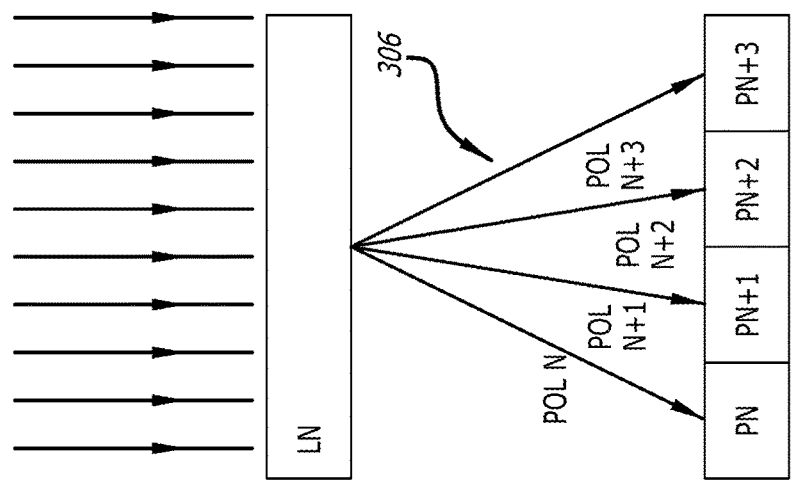
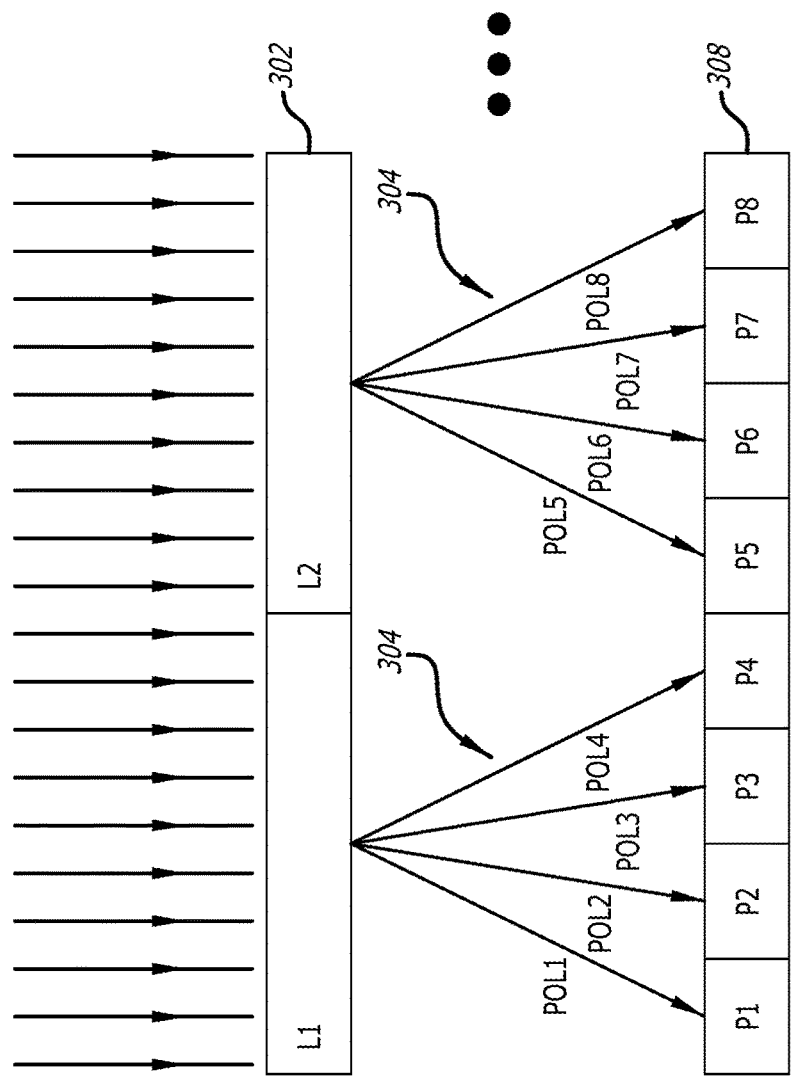
FIG. 3B

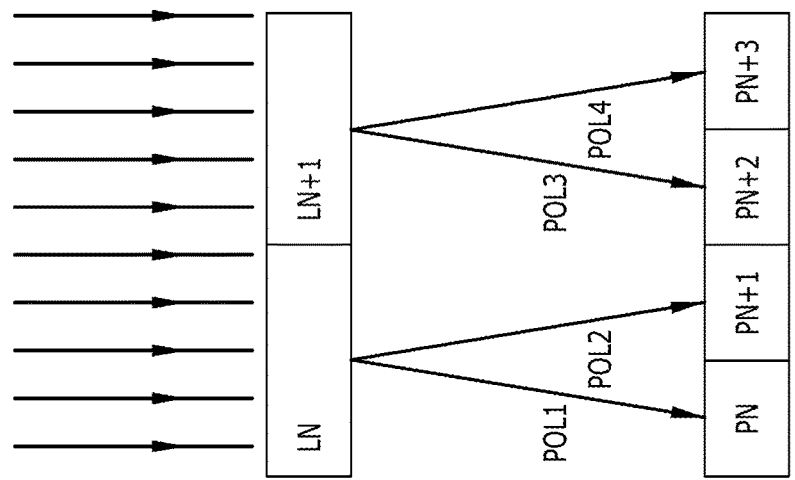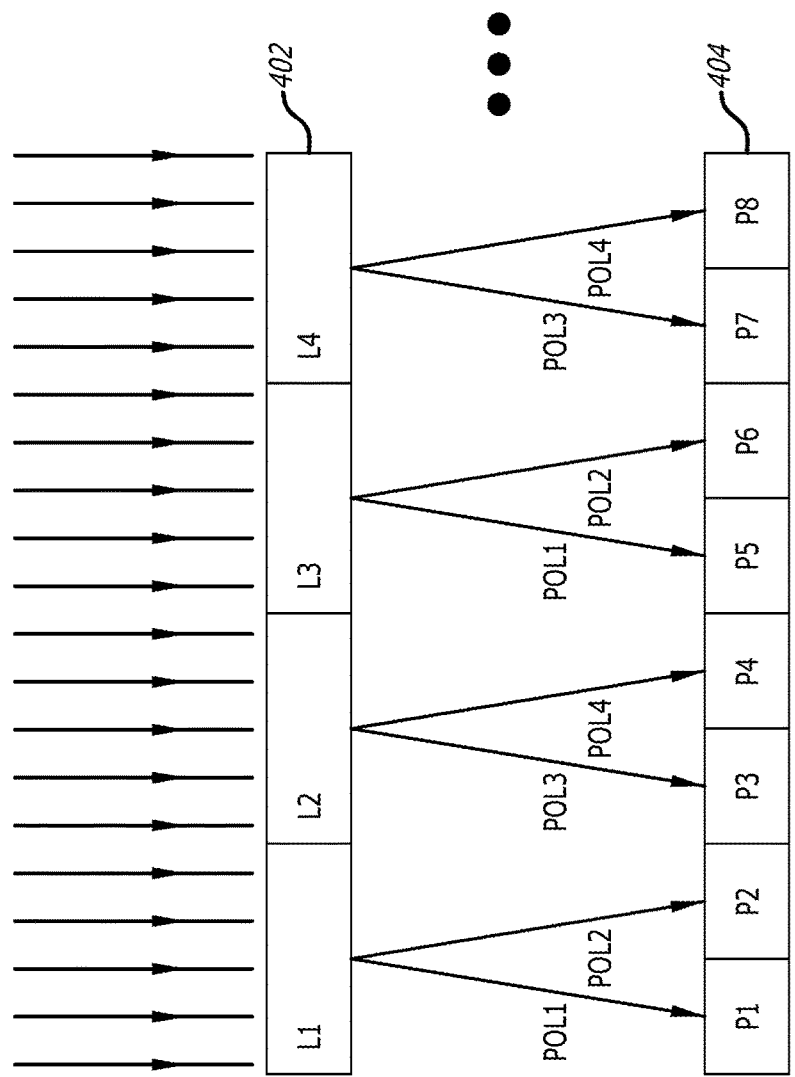
FIG. 4A

FIG. 9B

Grid 1 (4 columns × 6 rows):

| POL1 | 0 | POL1 | 0 |
|------|------|------|------|
| POL4 | POL2 | POL4 | POL2 |
| 0 | POL3 | 0 | POL3 |
| POL1 | 0 | POL1 | 0 |
| POL4 | POL2 | POL4 | POL2 |
| 0 | POL3 | 0 | POL3 |

Grid 2 (5 columns × 4 rows):

| POL1 | 0 | POL3 | POL1 | 0 | POL3 |
|------|---|------|------|---|------|
| POL2 | 0 | POL4 | POL2 | 0 | POL4 |
| POL3 | 0 | POL1 | POL3 | 0 | POL1 |
| POL4 | 0 | POL2 | POL4 | 0 | POL2 |

Grid 3 (4 columns × 6 rows):

| POL1 | POL3 | POL1 | POL3 |
|------|------|------|------|
| 0 | 0 | 0 | 0 |
| POL2 | POL4 | POL2 | POL4 |
| POL3 | POL1 | POL3 | POL1 |
| 0 | 0 | 0 | 0 |
| POL4 | POL2 | POL4 | POL2 |

FIG. 10B

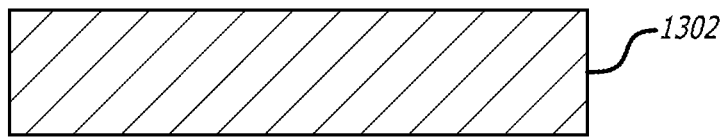
FIG. 13A
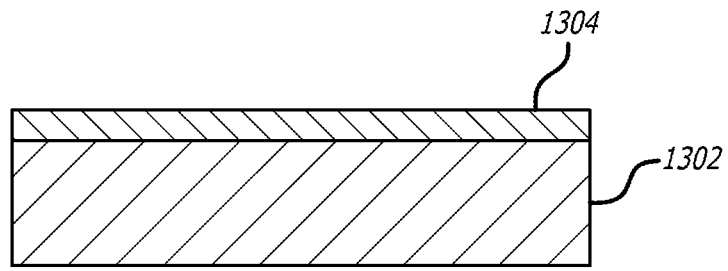
FIG. 13B
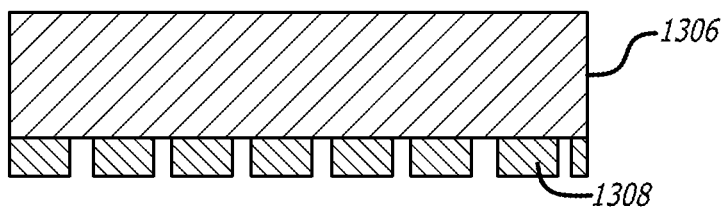
FIG. 13C
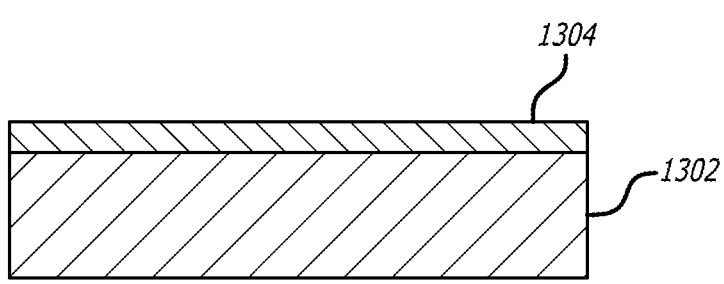
FIG. 13D
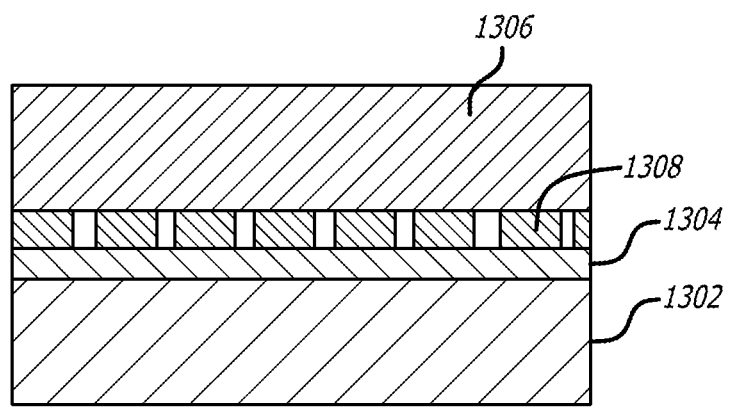

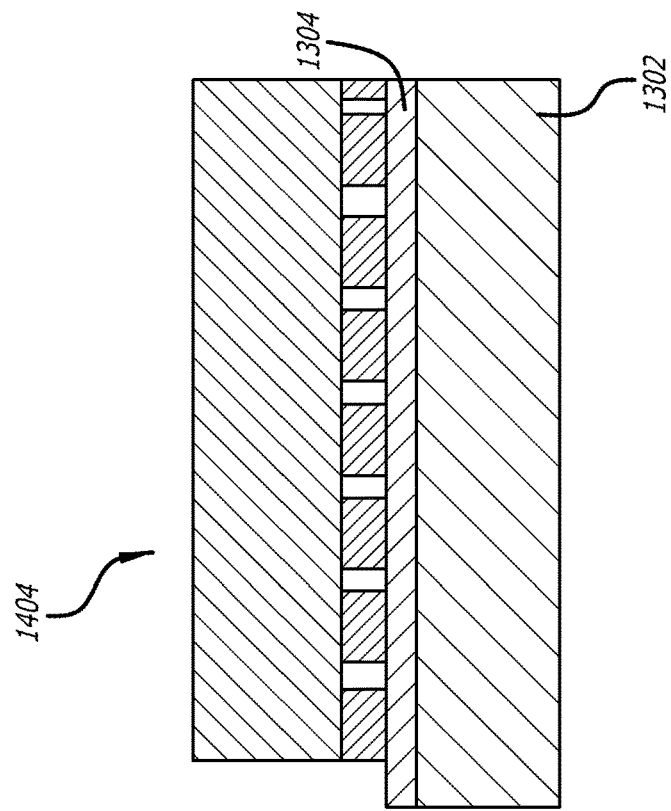
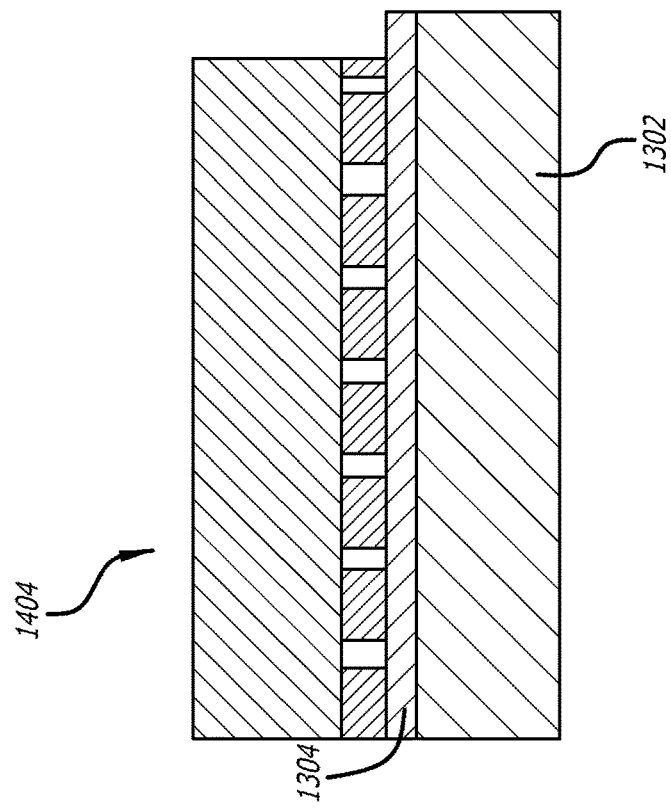
FIG. 14B

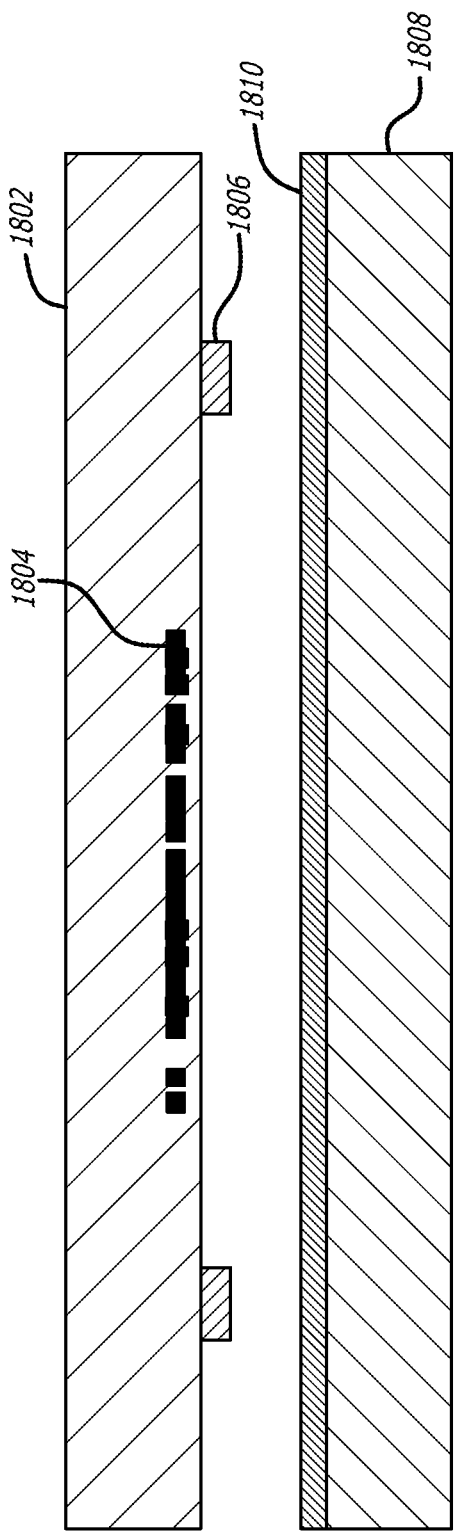
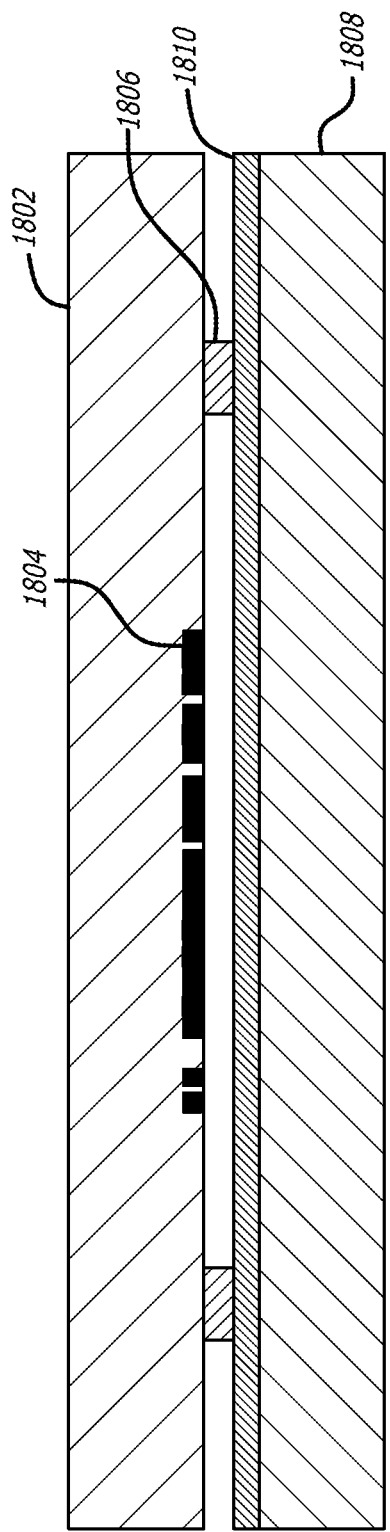
FIG. 18A
FIG. 18B

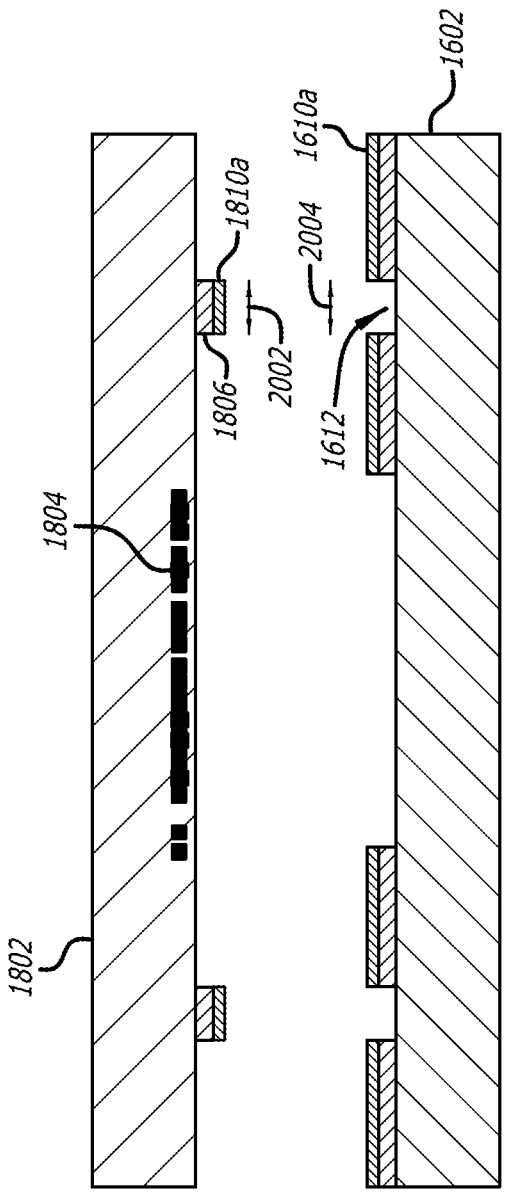
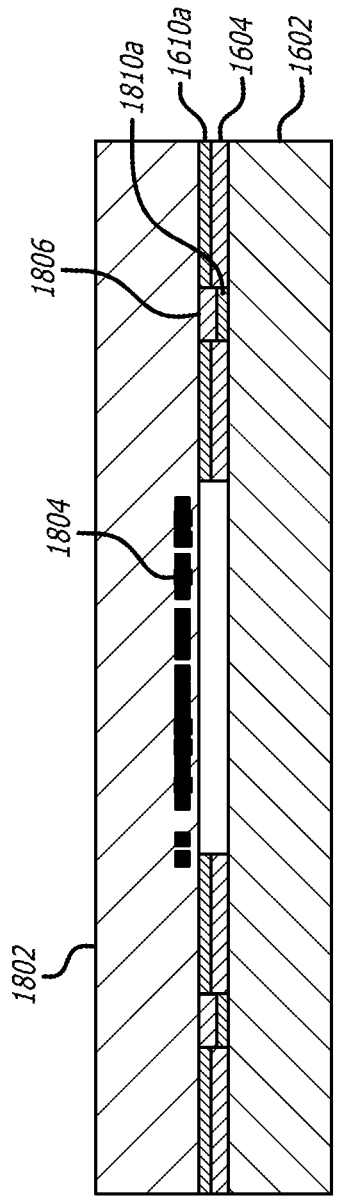
FIG. 20A
FIG. 20B

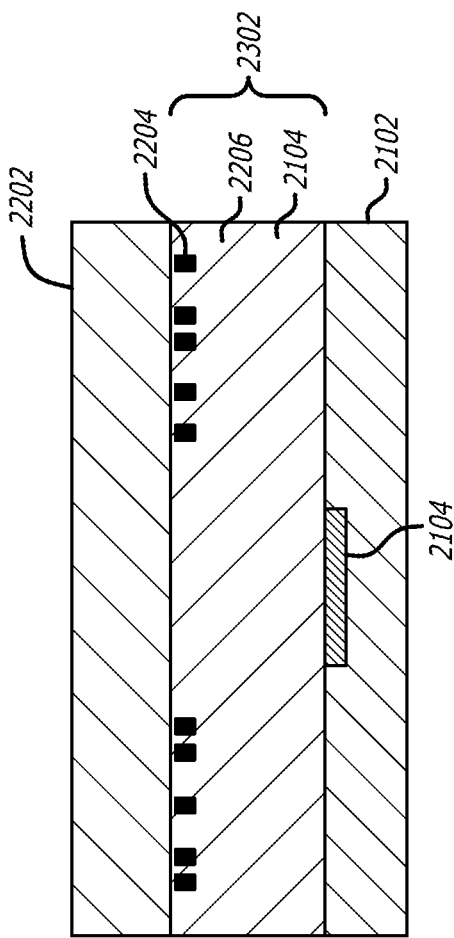
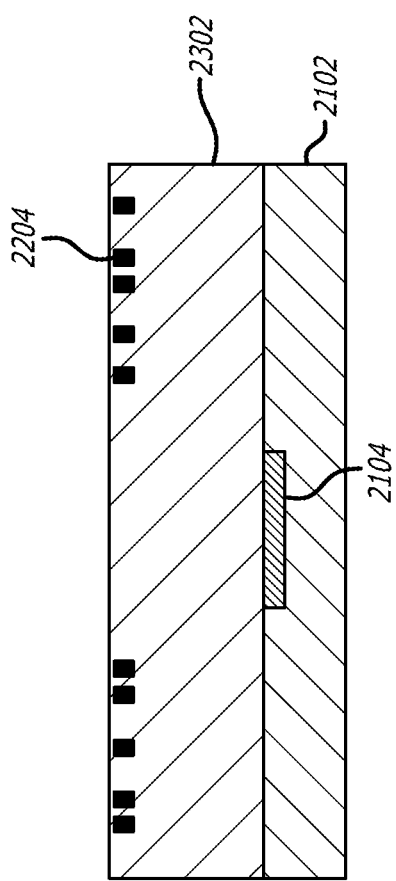
FIG. 23A
FIG. 23B

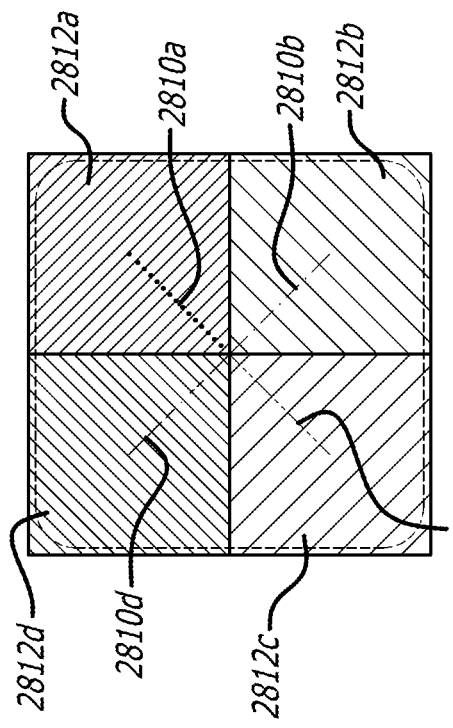
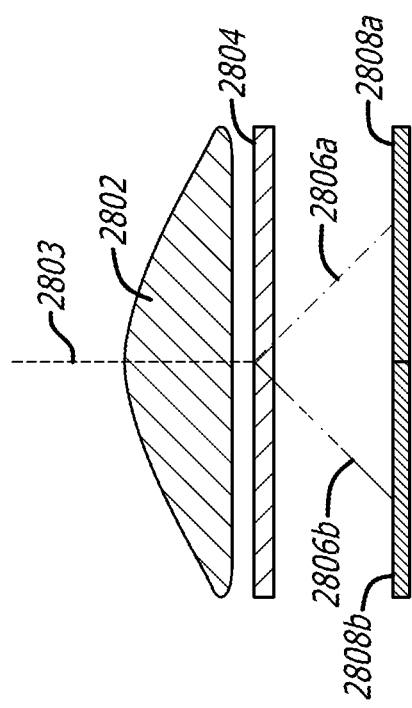
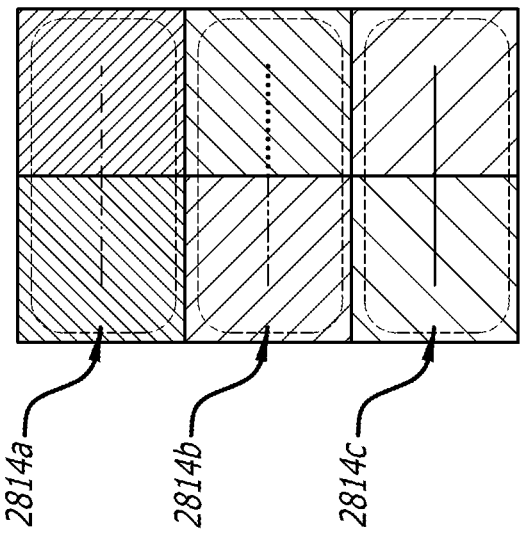
FIG. 28A
FIG. 28B
FIG. 28C

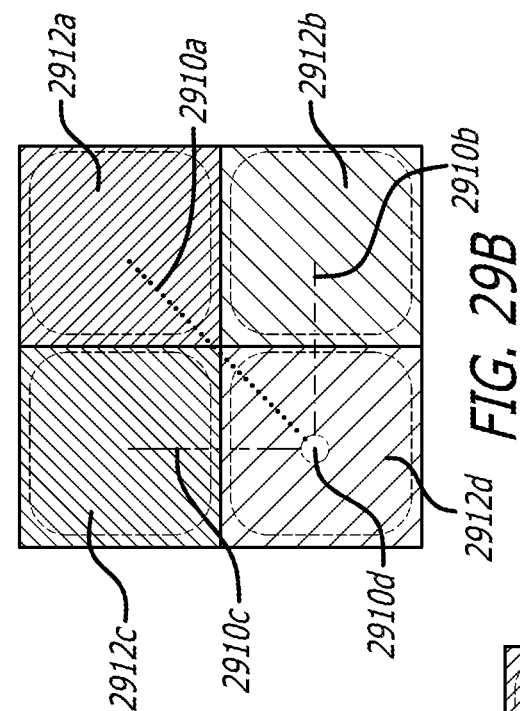
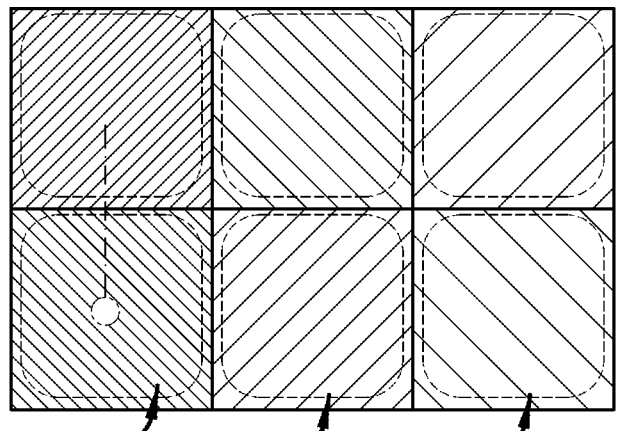
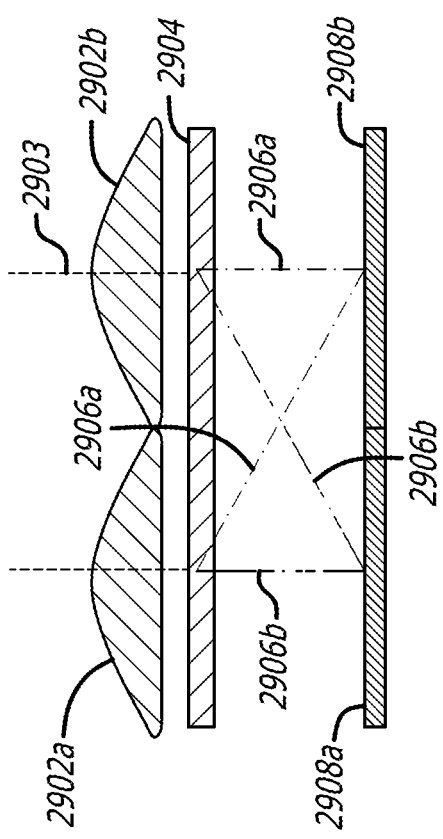
FIG. 29A
FIG. 29B
FIG. 29C

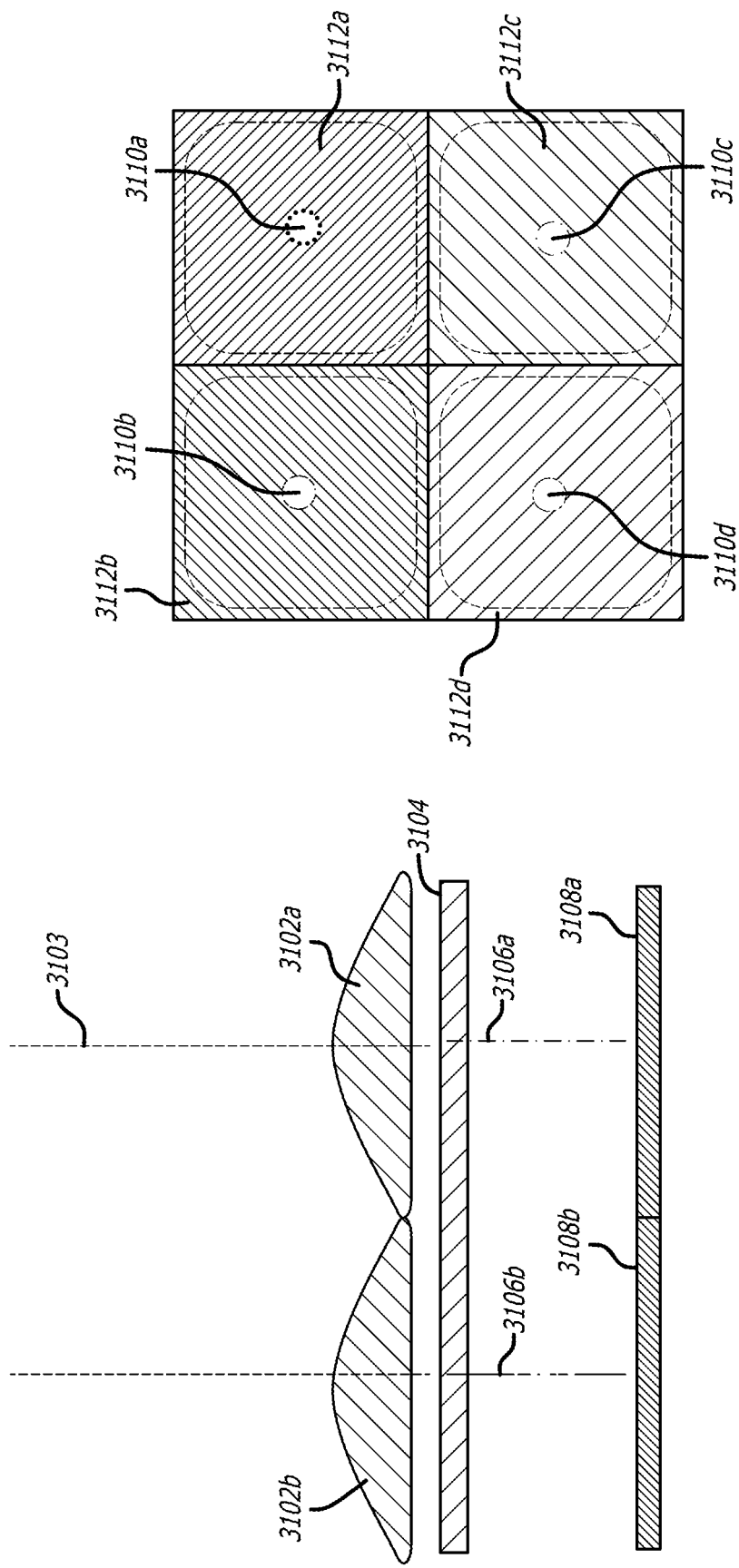

POLARIZATION SORTING METASURFACE MICROLENS ARRAY DEVICE

CROSS-REFERENCE TO RELATED APPLICATIONS

The current application is a continuation of U.S. patent application Ser. No. 18/194,359 filed Mar. 31, 2023 entitled "Polarization Sorting Metasurface Microlens Array Device", which claims the benefit of and priority under 35 U.S.C. § 119(e) to U.S. Provisional Patent Application No. 63/362,285 filed Mar. 31, 2022 entitled "Polarization Sorting Metasurface Microlens Array Device", the disclosures of which are hereby incorporated by reference their entirety for all purposes.

FIELD OF THE INVENTION

The present invention generally relates to a polarization sorting device. More specifically, the present invention relates to a polarization sorting device including a polarization sorting metasurface microlens arrays and methods of manufacturing the polarization sorting device.

BACKGROUND

Metasurface elements are diffractive optical elements in which individual waveguide elements have subwavelength spacing and typically have a planar profile. Metasurface elements have recently been developed for application in the UV-IR bands (300-10,000 nm). Compared to traditional refractive optics, metasurface elements abruptly introduce phase shifts onto light field. This enables metasurface elements to have thicknesses on the order of the wavelength of light at which they are designed to operate, whereas traditional refractive surfaces have thicknesses that are 10-100 times (or more) larger than the wavelength of light at which they are designed to operate. Additionally, metasurface elements may have no variation in height in the constituent elements and thus are able to shape light without any curvature, as is required for refractive optics. Compared to traditional diffractive optical elements (DOEs), for example binary diffractive optics, metasurface elements have the ability to impart a range of phase shifts on an incident light field. At a minimum the metasurface elements can have phase shifts between 0-2π with at least 5 distinct values from that range, whereas binary DOEs are only able to impart two distinct values of phase shift and are often limited to phase shifts of either 0 or 1π. Compared to multi-level DOE's, metasurface elements do not require height variation of its constituent elements along the optical axis, only the in-plane geometries of the metasurface element features vary.

SUMMARY OF THE DISCLOSURE

In some aspects, the techniques described herein relate to a polarization imaging device including: a metasurface lenslet array including a plurality of metasurface lenslets, wherein the plurality of metasurface lenslets include a plurality of first metasurface lenslets configured to diffract an image light with intensity proportional with a first polarization light in a first direction and intensity proportionality with a second polarization in a second direction; and an image sensor positioned in the optical path of the first polarization and the second polarization, and wherein the image sensor includes a plurality of image sensing units including a first image sensing unit positioned to sense the first polarization and a second image sensing unit positioned to sense the second polarization.

In some aspects, the plurality of image sensing units are different pixels and/or regions of the image sensor.

In some aspects, the plurality of image sensing units are different pixels and/or regions of multiple image sensors.

In some aspects, the plurality of metasurface lenslets further includes a plurality of second metasurface lenslets interspersed among the first metasurface lenslets and configured to diffract the image light with intensity proportional with a third polarization in a third direction and intensity proportional with a fourth polarization in a fourth direction, and wherein the plurality of image sensing units further includes a third image sensing unit positioned to sense the third polarization and a fourth image sensing unit positioned to sense the fourth polarization.

In some aspects, the first polarization and the third polarization are the same polarization and wherein the second polarization and the fourth polarization light are the same polarization.

In some aspects, the first metasurface lenslets are further configured to diffract the image light with intensity proportional with a third polarization in a third direction and intensity proportional with a fourth polarization in a fourth direction, and wherein the plurality of image sensing units further includes a third image sensing unit positioned to sense the third polarization and a fourth image sensing unit positioned to sense the fourth polarization.

In some aspects, the first metasurface lenslets are further configured to pass a zero order light in a third direction.

In some aspects, the third direction is different from the first direction and the second direction.

In some aspects, the plurality of image sensing units further includes a third image sensing unit configured to sense the zero order light.

In some aspects, the third direction is the same as the first direction.

In some aspects, the polarization imaging device, further includes one or more refractive lenses, wherein the metasurface lenslet array is positioned between the refractive lenses and the image sensor.

In some aspects, the first polarization and the second polarization are different polarizations, and wherein the first polarization and the second polarization are selected from the group consisting of: linearly polarized light, diagonally polarized light, elliptically polarized light, and circularly polarized light.

In some aspects, the polarization imaging device, further includes a microlens array and wherein the metasurface lenslet array includes a polarization metasurface.

In some aspects, the microlens array is configured to separate the image light into different pixels and the polarization metasurface is configured to diffract the first polarization in the first direction and the second polarization light in the second direction.

In some aspects, the polarization metasurface overlaps microlenses in the microlens array, and wherein microlenses are not overlapped by the polarization metasurface in the microlens array pass undiffracted light to the image sensor, wherein the image sensor is configured to sense the undiffracted light to measure the intensity of the undiffracted light.

In some aspects, the microlens array is a planar microlens array layer.

In some aspects, the microlens array and the polarization metasurface are positioned on a single substrate.

In some aspects, a primary image plane is configured above a surface of the single substrate opposite to the image sensor.

In some aspects, a primary image plane is configured within the single substrate.

In some aspects, the microlens array includes metasurface elements.

In some aspects, the metasurface elements are configured to accept varying chief ray angles across an imaging pupil of the polarization imaging device and collimate the light passing through each microlens.

In some aspects, the metasurface elements of the microlens array are configured to provide refractive microlens effect.

In some aspects, microlens array includes a traditional refractive microlens array.

In some aspects, the microlens array includes a combination of at least one traditional refractive microlens and at least one metasurface element.

In some aspects, the polarization imaging device, further includes a color filter positioned above or below the metasurface lenslet array.

In some aspects, the color filter is positioned above the metasurface lenslet array and filters light into different colors each of which correspond to the different metasurface lenslets of the plurality of first metasurface lenslets, and wherein the metasurface lenslets receive the color filtered light from the color filter.

In some aspects, the color filter is positioned below the metasurface lenslet array and filters the diffracted first polarization light and the second polarization light.

In some aspects, the color filter includes different regions that filter different wavelengths of light.

In some aspects, the plurality of first metasurface lenslets are spaced on a cover substrate.

In some aspects, the spaced first metasurface lenslets are configured to output light onto regions of the color filter that output the same color of light.

In some aspects, the spaced first metasurface lenslets output light onto regions of the color filter that output green light and gaps between the regions of the color filter that output green light output red or blue light.

In some aspects, the color filter includes different regions that output red, green, or blue light and regions that output monochrome or near infrared light, wherein the plurality of first metasurface lenslets are spaced on a cover substrate, and the spaced first metasurface lenslets output light onto the regions of the color filter that output monochrome or near infrared light.

In some aspects, the polarization imaging device, further includes a microlens array including a plurality of separate microlenses that output collimated light into the metasurface lenslet array.

In some aspects, the plurality of separated microlenses are positioned between adjacent image sensing units such that the light from the light from the plurality of separate microlenses is diffracted by the plurality of first metasurface lenslets in opposite oblique directions into the adjacent image sensing units.

In some aspects, the plurality of repeating metasurface lenslets further includes a plurality of second metasurface lenslets the configured to diffract the first polarization in the second direction and the second polarization in the first direction, and wherein the first image sensing unit is further positioned to sense the first polarization diffracted from the plurality of second metasurface lenslets.

In some aspects, the plurality of separated microlenses are each centered with one of the plurality of first metasurface lenslets such that the first polarization is transmitted through the one of the plurality of first metasurface lenslets onto the first image sensing unit, and wherein the second polarization is diffracted in the second direction onto the second image sensing unit.

In some aspects, the first polarization and the second polarization are orthogonal linear polarizations, circular polarizations, elliptical polarizations, or arbitrary polarizations.

In some aspects, the plurality of first metasurface lenslets are spaced with non-diffractive section between adjacent first metasurface lenslets.

In some aspects, wherein the plurality of metasurface lenslets the plurality of image sensing units configured to sense the first polarization and the second polarization are positioned between image sensing units of the image sensor configured to sense red, green, or blue light.

In some aspects, the plurality of first metasurface lenslets are configured to diffract light into the plurality of image sensing units configured to sense the first polarization and the second polarization and the image sensing units configured to sense red, green, or blue light.

In some aspects, the plurality of image sensing units configured to sense the first polarization and the second polarization are further configured to sense monochrome or near-infrared light.

In some aspects, the image sensor is a complimentary metal-oxide-semiconductor (CMOS) image sensor, a charged-coupled device sensor, a silicon diode sensor, a cadmium-sulfide sensor diode, an RGB sensor, an indirect time of flight (iToF) sensor, a direct time of flight (dToF) sensor.

In some aspects, the techniques described herein relate to a method of manufacturing a polarization imaging device, the method including: providing an image sensor wafer; depositing a spacer layer over the imaging sensor wafer; depositing a metasurface layer on the spacer layer; and patterning the metasurface layer to form individual metasurfaces on the spacer layer.

In some aspects, the method, further includes depositing an encapsulation layer directly on the individual metasurfaces.

In some aspects, the method, further includes planarizing the encapsulation layer such that the encapsulation layer is on the same level as the individual metasurfaces.

In some aspects, the method, further includes forming one or more top layers on the encapsulation layer and/or the individual metasurfaces.

In some aspects, the techniques described herein relate to a method of manufacturing a polarization imaging device, the method including: providing an image sensor wafer; providing a metasurface substrate including individual metasurfaces; and depositing a spacer layer on the imaging sensor wafer and/or the individual metasurfaces on the metasurface substrate.

In some aspects, the method, further includes bonding the metasurface substrate to the image sensor wafer.

In some aspects, the metasurface substrate includes a transparent substrate.

In some aspects, the method, further includes removing the metasurface substrate such that the individual metasurfaces remain attached on the image sensor wafer.

In some aspects, removing the metasurface substrate includes grinding, lapping, wet chemical etching, and/or dry chemical etching the metasurface substrate.

In some aspects, the method, further includes singulating the metasurface substrate into separate metasurface dies, bonding at least one of the metasurface dies on the image sensor wafer, and singulating the image sensor wafer into image sensor dies each with a bonded metasurface die.

In some aspects, the techniques described herein relate to a method of manufacturing a polarization imaging device, the method including: providing a CMOS image sensor (CIS) wafer; positioning a first plurality of spacers on the CIS wafer; providing a first carrier wafer; positioning a first adhesive layer on the first carrier wafer; contacting the first plurality of spacers with the first adhesive layer such that adhesive is applied to the tops of the first plurality of spacers; providing a nanopillar substrate with a plurality of nanopillars; positioning a second plurality of spacers on the nanopillar substrate; providing a second carrier wafer; positioning a second adhesive layer on the second carrier wafer; contacting the second plurality of spacers with the second adhesive layer such that adhesive is applied to the tops of the second plurality of spacers; and simultaneously contacting the adhesive on the second plurality of spacers with the CIS wafer and the adhesive on the first plurality of spacers with the nanopillar substrate to adhere the CIS wafer and the nanopillar substrate together.

In some aspects, after contacting the first plurality of spacers with the first adhesive layer such that adhesive is applied to the tops of the first plurality of spacers, the adhesive only resides on the tops of the first plurality of spacers and not on the areas between the first plurality of spacers.

In some aspects, after contacting the second plurality of spacers with the second adhesive layer such that adhesive is applied to the tops of the second plurality of spacers, the adhesive only resides on the tops of the second plurality of spacers and not on the areas between the second plurality of spacers.

In some aspects, the first plurality of spacers includes pairs of spacers that form channels which are sized to accommodate a spacer of the second plurality of spacers.

In some aspects, the first plurality of spacers and the second plurality of spacers interlock with each other such that one of the second plurality of spacers is positioned within one of the channels formed by the pairs of spacers.

In some aspects, the first plurality of spacers form a plurality of rectangular shapes on the CIS wafer.

In some aspects, the interior of the rectangular shapes forms the imaging area.

In some aspects, the second plurality of spacers form a grid pattern on the nanopillar substrate.

In some aspects, the first plurality of spacers and the second plurality of spacers forms an air gap between the plurality of nanopillars and the CIS wafer.

In some aspects, the techniques described herein relate to a method of manufacturing a polarization imaging device, the method including: providing a CMOS image sensor (CIS) wafer with a bonding pad; depositing a first dielectric layer over the CIS wafer and the bonding pad; planarizing the first dielectric layer; providing a nanopillar substrate with a plurality of nanopillars; depositing a second dielectric layer over the plurality of nanopillars; planarizing the second dielectric layer; contacting the first dielectric layer with the second dielectric layer such that they bond together to form a combined dielectric layer; removing the nanopillar substrate to expose the plurality of nanopillars; partially etching the combined dielectric layer to expose the bonding pad; and forming a conductive layer that is electrically connected to the bonding pad through the combined dielectric layer.

In some aspects, the first dielectric layer and the second dielectric layer are silicon dioxide layers.

In some aspects, depositing the first dielectric layer and the second dielectric layer is performed by a tetraethylorthosilicate (TEOS) process.

In some aspects, the TEOS process is a plasma enhanced TEOS (PETEOS) process.

In some aspects, the planarizing the first dielectric layer and the second dielectric layer is performed by a chemical mechanical polishing (CMP) process.

In some aspects, removing the nanopillar substrate is performed by grinding, etching, or a chemical mechanical polishing (CMP) process.

In some aspects, partially etching the combined dielectric layer includes: patterning the combined dielectric layer; and etching the combined dielectric layer to expose the bonding pad.

In some aspects, the method, further including growing a barrier seed layer on the bonding pad, sidewalls of the combined dielectric layer, and the nanopillars.

In some aspects, the techniques described herein relate to a polarization imaging device including: a microlens array with at least two microlenses; a polarization filtering metasurface with two or more polarization filtering regions; and an imaging sensor with at least two regions, wherein an imaging light including one or more polarization states is directed by a microlens onto the polarization filtering metasurface and the polarization filtering metasurface is configured to direct one or more polarization states onto one or more regions of the imaging sensor.

In some aspects, the microlens array includes a refractive microlens.

In some aspects, the microlens array further includes a metasurface configured to provide refractive microlens effect.

In some aspects, the microlens array includes a metasurface configured to provide refractive microlens effect.

In some aspects, each of the at least two microlenses are over a single region of the one or more regions of the imaging sensor.

In some aspects, each of the at least two microlenses are over two or more sensor regions of the one or more regions of the imaging sensor.

In some aspects, each of the at least two microlenses are over a single polarization region of the one or more regions of two or more polarization filtering regions.

In some aspects, each of the at least two microlenses are over two or more polarization filtering regions of the two or more polarization filtering regions.

BRIEF DESCRIPTION OF THE DRAWINGS

The description will be more fully understood with reference to the following figures, which are presented as exemplary embodiments of the invention and should not be construed as a complete recitation of the scope of the invention, wherein:

FIGS. 3A and 3B illustrate a schematic of a PSOMMA in accordance with an embodiment of the invention.

FIG. 3C-1 conceptually illustrates the optical path for a single layer metasurface utilizing a blazed grating approach in accordance with an embodiment of the invention.

FIG. 3C-2 conceptually illustrates the optical path for a single layer metasurface serving as a PSOMMA and collimation lens in accordance with an embodiment of the invention.

FIG. 3C-3 conceptually illustrated the optical path for a two separate layers of metasurface serving as a PSOMMA and a collimation lens in accordance with an embodiment of the invention.

FIG. 4A illustrates a PSOMMA with two polarizations at each lenslet in accordance with an embodiment of the invention.

FIG. 5A-1 illustrates an optical system incorporating a PSOMMA in accordance with an embodiment of the invention.

FIGS. 5A-2 and 5A-3 illustrate examples of an optical system incorporating a PSOMMA in accordance with various embodiments of the invention.

FIGS. 5C-1, 5C-2, and 5C-3 illustrate optical systems incorporating a PSOMMA in accordance with various embodiments of the invention.

FIGS. 9A and 9B illustrate various high fidelity pixel architectures in accordance with embodiments of the invention.

FIGS. 10A and 10B illustrate various hybrid intensity/polarization architectures in accordance with embodiments of the invention.

FIGS. 13A-13D illustrate various steps of the wafer bonding method in accordance with an embodiment of the invention.

FIG. 14B illustrates the image sensor dies 1404 after the image sensor wafer 1302 has ben singulated in accordance with an embodiment of the invention.

FIGS. 18A-18C illustrate an example method for producing the nanopillar wafer in accordance with an embodiment of the invention.

FIGS. 20A and 20B illustrate an example method for fabricating a PSOMMA sensor in accordance with an embodiment of the invention.

FIGS. 23A-23H is a fabrication process for fabricating an imaging sensor utilizing the CIS wafer fabricated using the process described in FIGS. 21A and 21B and the nanopillar wafer fabricated using the process described in FIGS. 22A and 22B in accordance with an embodiment of the invention.

FIG. 28A is a cross-sectional view of an imaging device including polarization splitting capability in accordance with an embodiment of the invention.

FIG. 28B is a plan view of an imaging device including polarization splitting capability in accordance with an embodiment of the invention.

FIG. 28C is a plan view of an imaging device including polarization splitting capability in accordance with an embodiment of the invention.

FIG. 29A is a cross-sectional view of an imaging device including polarization splitting capability in accordance with an embodiment of the invention.

FIG. 29B is a plan view of an imaging device including polarization splitting capability in accordance with an embodiment of the invention.

FIG. 29C is a plan view of an imaging device including polarization splitting capability in accordance with an embodiment of the invention.

FIG. 31A illustrates a cross-sectional view of an imaging device including a polarization filtering capability in accordance with an embodiment of the invention.

FIG. 31B illustrates a plan view of an imaging device including a polarization filtering capability in accordance with an embodiment of the invention.

DETAILED DESCRIPTION

Disclosed herein are optical devices including individual lenslets that sort polarization so as the resulting polarization information of a scene can be reconstructed. Specifically, the invention described herein includes optical devices including a metasurface microlens array including lensets, which may be coupled to an image sensor. The phase and polarization splitting at each lenslet can be uniquely specified. The individual lenslets may split the incoming light into at least two polarizations directed to specific underlying pixels of the imaging sensor. Independent of the polarization control at each lenslet, the phase of each lenslet can also be uniquely specified. The phase response of each lenslet may be customized such that it accommodates a certain angle of incidence to the lenslet. In some embodiments, the polarization sorting metasurface microlens array may also be customized for a certain optical system and directly integrated with an image sensor. In some embodiments, the image sensor may include a complimentary metal-oxide-semiconductor (CMOS) image sensor, a charged-coupled device sensor, a silicon diode, a cadmium-sulfide sensor diode, an RGB sensor, an indirect time of flight (iToF) sensor, a direct time of flight (dToF) sensor, and/or various other types of sensors.

The polarization sorting metasurface may include a super-cell or superpixel repeating structure and/or non-polar open spaces between to create a sparse effect.

Most traditional polarization imaging systems work by absorption of a specific polarization state while allowing the unabsorbed state to pass through to a photosensitive sensor. By knowing which polarization state is absorbed and which polarization state passes, a polarization image of a scene may be constructed. However, such designs may be inefficient because the light being absorbed is dissipated as heat rather than diverted and sensed which may provide valuable polarization information. This design may have poor efficiency or signal to noise ratio. This configuration still preserves the polarization information, but because light is absorbed there is a loss of efficiency. Additionally, a common technology which implements this type of polarization measurement (e.g. wire grid polarizers) can only select linear polarization states, so elliptical polarization states may be inaccessible.

Figure 1:
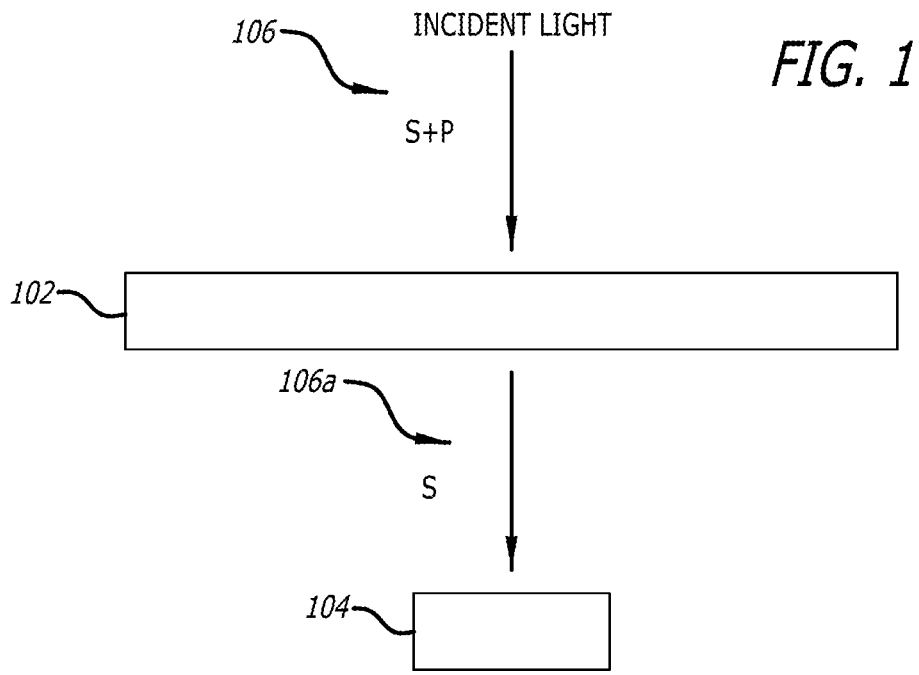
FIG. 1 illustrates a schematic of a conventional polarization imaging system by way of example.

FIG. 1 illustrates a schematic of a conventional polarization imaging system by way of example. As illustrated, incident light 106 may include multiple polarizations such as S polarized light and P polarized light. The incident light passes through a polarizer 102 which may pass through only one polarization of light. In the case of the incident light 106 including S polarized light and P polarized light, the polarizer 102 may pass through only the S polarized light 106a and absorb the P polarized light. The amount of the S polarized light 106a may be measured by a photosensitive sensor 104 which may provide data regarding the amount of S polarized light 106a. Disadvantageously, the P polarized light is absorbed by the polarizer 102 which may unwanted byproducts such as heat or scattered light from reflections.

Embodiments of the invention relate to metasurface polarization imaging systems which, in contrast to traditional polarizers, split the polarization spatially by sending each of a designed polarization to a specific diffraction angle. Examples of metasurface optical elements including geometries and orientations that deflects light in a direction dependent on the polarization of the light is disclosed in U.S. Pat. App. Pub. No. 2021/0286188, entitled "Arbitrary polarization-switchable metasurfaces" and filed Feb. 22, 2019, which is hereby incorporated by reference in its entirety for all purposes. Also, examples of a grating configured to perform parallel polarization analysis of multiple polarization orders of incident light of arbitrary polarization is disclosed in Int. Pub. No. WO 2020214615, entitled "System and method for parallel polarization analysis" and filed Apr. 14, 2020, which is hereby incorporated by reference in its entirety for all purposes. Further, examples of a polarimeter including elements of metasurfaces that provide different responses based on polarization of incident light is disclosed in U.S. Pat. App. Pub. No. 2021/0048569, entitled "Polarization state generation with a metasurface" and filed Jul. 22, 2020 which is hereby incorporated by reference in its entirety for all purposes. The designs in these references may all be incorporated in the present disclosure to split incident light into different polarizations which are directed in different directions.

Figure 2:
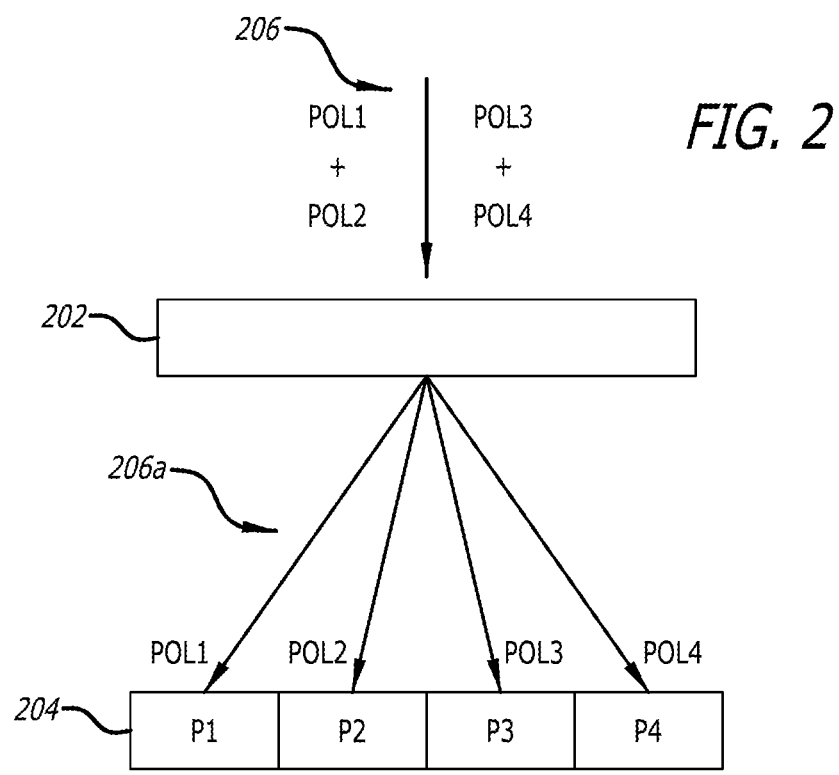
FIG. 2 illustrates a schematic of a polarization imaging system by way of example.

In such systems, the efficiency can be as much as 2× higher than a traditional polarization grating because light is not absorbed but instead different polarizations of light are diffracted in different directions to be detected by different image sensors. However, for these systems, the metasurface elements divide the aperture of the imaging system and result in the formation of images with a specific polarization in separate regions of an image sensor. For example, if the metasurface is designed to split incident light into four polarization states, the metasurface imaging system may form four separate images of a single object where each of the four images is formed in a separate spatial domains (e.g. quadrants) of an image sensor and a specific polarization state is associated with each image. FIG. 2 illustrates a schematic of a polarization imaging system by way of example. The polarization imaging system includes metasurface elements 202 which split incident light 206 into different polarizations. As illustrated, the incident light 206 may include a single mixed polarization state. The incident light 206 may be completely unpolarized or it may be a single pure polarization state or some mixed state. The incident light 206 may include four polarizations: Pol1, Pol2, Pol3, Pol4. In more mathematical terms, the incident light is represented by a Stokes vector S. Each outgoing diffracted direction is associated with another Stokes vector $M_i$ which may correspond to a row of a Mueller matrix. Each outgoing direction may be associated with the Mueller matrix $U_i$. When light is captured by the image sensor, the total intensity of the light may be measured. The Mueller matrix $U_i$ multiplied by the incident Stokes vector S gives an outgoing Stokes vector $O_i$ in each direction, $O_i=U_i*S$. When the light is captured by the image sensor, the first entry of the Stokes vector $O_i$ corresponds to the intensity of the light. Since there are four indices 0, 1, 2, 3, this corresponds to $O_i[0]=(U_i*S)[0]$. [x] denotes the x'th element in a vector, starting count from 0. This is equivalent to taking the first row of the Mueller matrix $U_i$ and calculating its dot product with the Stokes vector S $((U_i*S)[0]=sum_j(U_{\{i,\ (0,j)\}}*S_j))$. This first row of the Mueller matrix $U_i$ may be considered a Stokes vector $M_i$, since it also obeys the same algebra as the Stokes vector. The intensity in each outgoing diffracted direction is proportional to the dot product between $M_i$ and S. The diffracted orders may not necessarily be the same polarization state that is being selected.

The metasurface elements 202 may split the incident light 206 into diffracted light 206a where each of the four polarizations are directed in different directions. The diffracted light 206a in each direction has an intensity which is proportional to the projection of that particular light's polarization state onto the incident state. The diffracted light 206a may go into a set of four different image sensors 204. In some embodiments, the diffracted light 206a may go into four different regions of a single image sensor, or two regions of two image sensors, or other combination of regions and sensors. While these image sensors 204 and the diffracted light 206a are illustrated in different horizontal positions, this is merely exemplary and the image sensors 204 may actually be at different quadrants with the diffracted light 206a sending each of the polarizations into the different quadrants.

The incident light 206 may be in an arbitrary polarization state. The metasurface elements may split the incident light into diffracted light where each of the four directions correspond to a different target polarization state, with intensity in that direction dictated by the overlap of the incident polarization state with the target polarization state.

While the metasurface elements 202 overcome the absorption loss and/or complexity of traditional polarization imaging systems including the polarizer 102 discussed in connection with FIG. 1, some embodiments may benefit from an aperture or an illumination source of a specific field of view to keep the sub images from overlapping on the image sensor 204.

Various embodiments of the invention utilize a polarization sorting optical metasurface microlens array (PSOMMA) in order to intermix the polarization states spatially, across an image sensor. In some embodiments, a PSOMMA may be the last element before the image sensor and each lenslet including a PSOMMA may direct a set of designed polarization states to individual subpixels or imaging units or regions of a sensor. In addition, there may be no need for using the field of view of the illumination source or additional apertures in order to keep sub images from overlapping on the image sensor. Finally, the image sensor and PSOMMA can be incorporated with any existing optical imaging system which may include refractive optical elements as illustrated in and described in connection with FIGS. 5A-1 to 5-3.

FIGS. 3A and 3B illustrate a schematic of a PSOMMA in accordance with an embodiment of the invention. In FIG. 3A, a PSOMMA includes individual metasurface lenslets 302. The number of individual lenslets may depend on the optical system but in general can be any number of lenslets. Each lenslet may split the incident light into individual polarizations for each diffraction angle. Each lenslet may split light into at least two polarizations but in general can split light into any number of polarizations. As illustrated, a first lenslet L1 may split the incident light into four different polarizations 304: pol1, pol2, pol3, and pol4. Further, a second lenslet L2 may split the incident light into four different polarizations 306: pol5, pol6, pol7, pol8. The light may be split into four different directions proportionally in each direction to that direction's selected polarization state. Similarly, an nth lenslet Ln may split the incident light into four different polarizations 308: pol n, pol n+1, pol n+2, and pol n+3. As shown here the specific polarization states can be unique (labeled pol1, pol2 . . . pol n) for each lenslet but the same two or more polarization states could be utilized at each lenslet. For example, the first lenslet L1 and the second lenslet L2 may both split the incident light into the same four different polarizations: pol1, pol2, pol3, pol4. In addition, the phase function of each lenslet can be uniquely specified.

As illustrated in FIG. 3B, the PSOMMA can be coupled with an image sensor 308 that has any number of pixels (labeled p1, p2, p3 . . . pn). The pixels may be a plurality of image sensing units. In such a case the action of the PSOMMA may be to diffract each polarization state to a specific pixel. The complete polarization state of a scene can be reconstructed on a pixel-by-pixel basis by designing the polarization state a pixel readout corresponds to. While the drawings here are shown in one dimension, it is understood that the same principle applies to a two dimensional lenslet and pixel array. The incident light illustrated has a 0 degree chief ray angle (CRA) but the CRA of the incident light could be any angle or even vary across the lens. Thus, the incident light may be collimated but may also be incident on the metasurface lenslets at other angles. In some embodiments, a metasurface may be used to provide the microlens array functionality and designed such that the lenslets may be optimized to accept different incoming light angles (e.g. non-zero CRA) across the image sensor field and minimize the effects that would otherwise be caused for a lens designed for zero-CRA functionality. In some embodiments, a physical microlens shift may be provided. This is an approach which matches the CRA of the microlens and the image sensor. In this approach, the periodicity of microlens array is decreased all over the sensor and can partially cancel the microlens CRA.

In some embodiments, the microlens array may provide microlens functionality (e.g., focusing light at image sensor) using a metasurface in a manner which provides a microlens shift as with the physical microlens shift. The metasurfaces may be locally designed in such a way that they can match both the azimuth and elevation angles of the primary refractive lens so to produce CRA matching across the sensor or with different incoming imaging light angles. This is complicated for conventional physical microlenses but may be achieved by leveraging metasurfaces with microlens functionality. In some embodiments, the metasurfaces may be utilized to provide collimation functionality to make the received light from a primary refractive lens or entrance pupil collimated and/or directed to the center of a sensor region.

Figures 1, 3C:
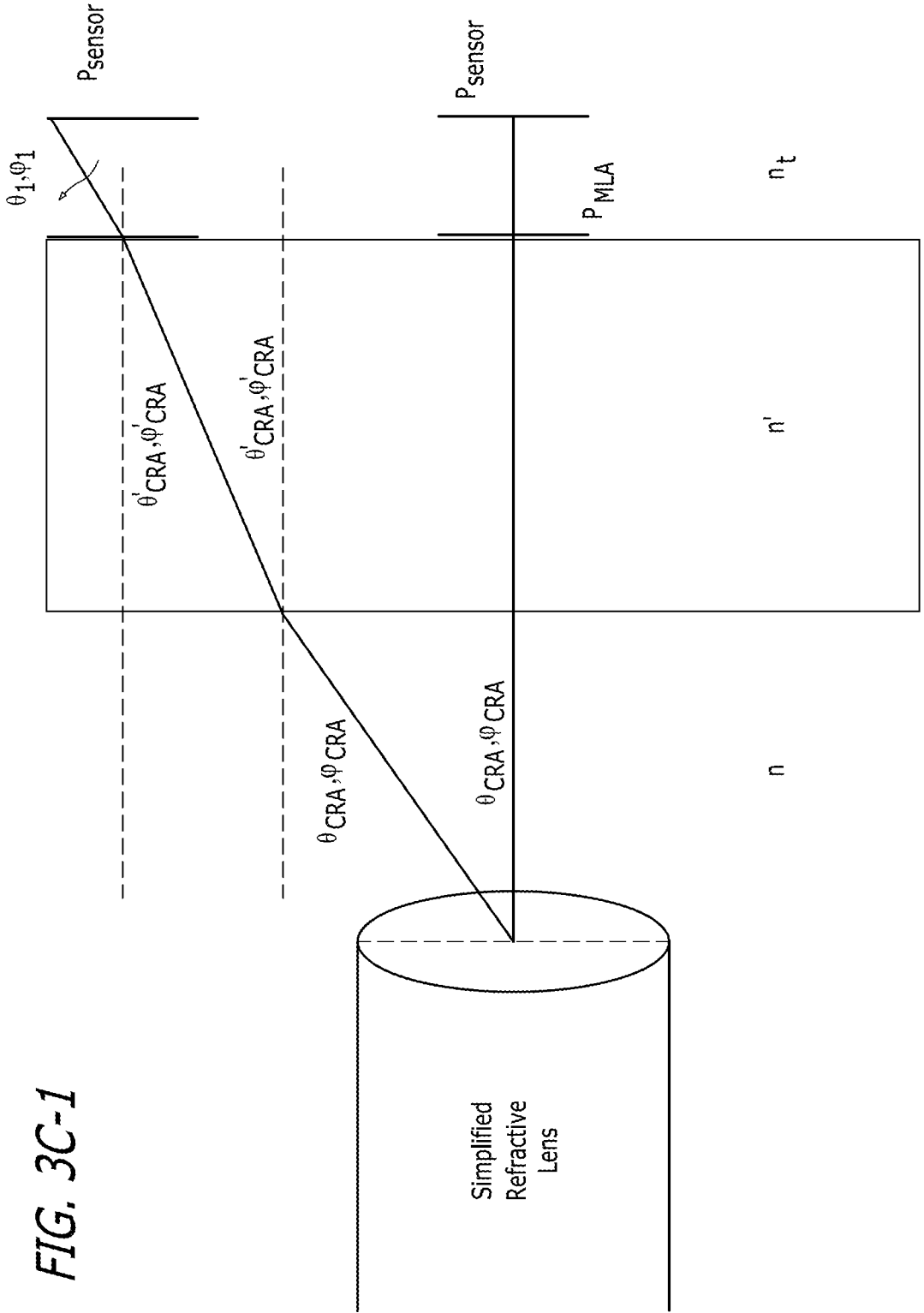
Figures 2, 3C:
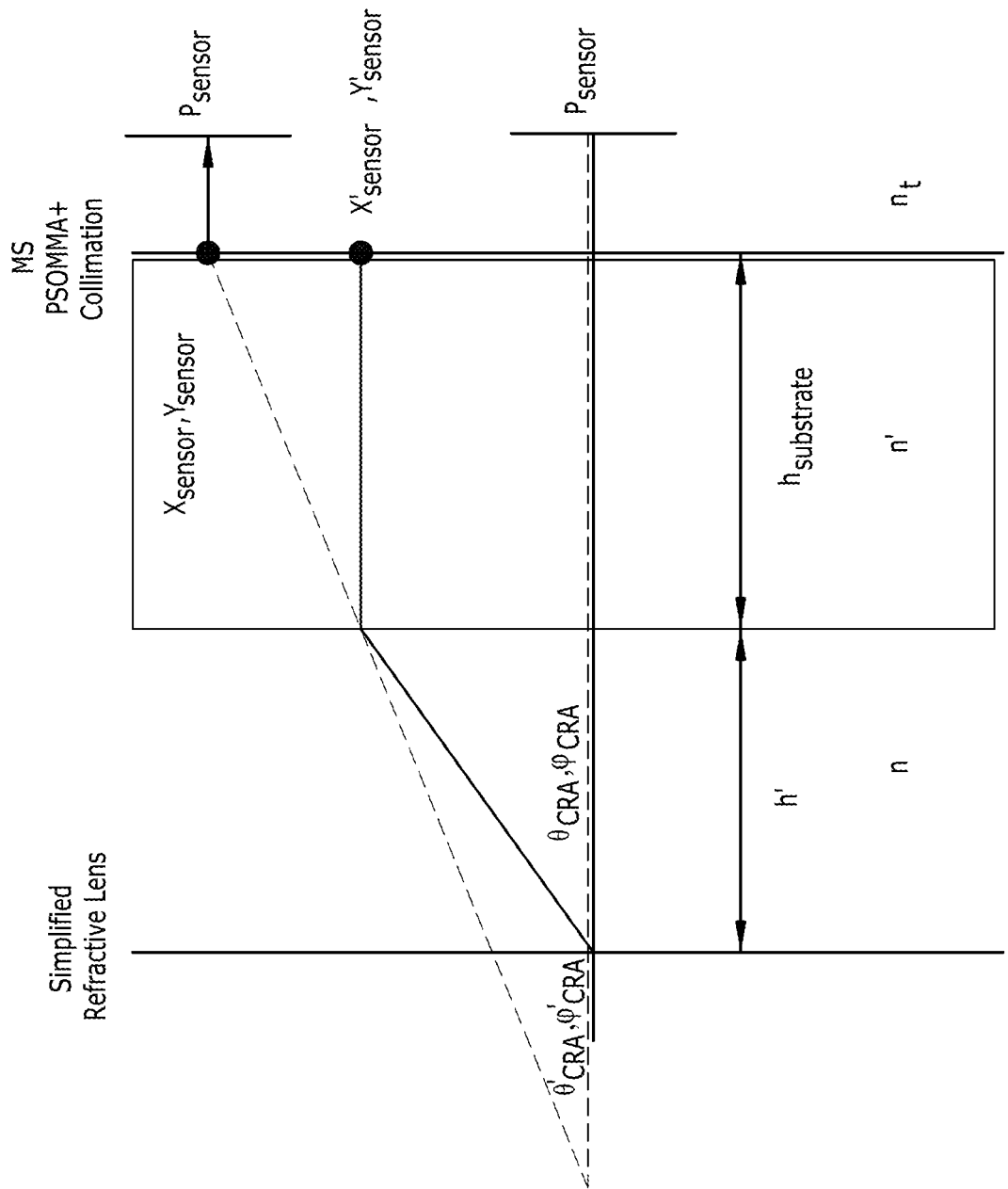

FIG. 3C-1 conceptually illustrates the optical path for a single layer metasurface utilizing a blazed grating approach in accordance with an embodiment of the invention. Based on a generalized Snell's law, the relation may be written between the phase gradient, the transmitted azimuth, and elevation angles as follows:

$$n_t \sin \theta_t \cos \phi_t - n'_i \sin \theta'_{CRA} \cos \phi'_{CRA} = \frac{1}{k_0} \frac{d\phi(x,y)}{dx}; \quad (1)$$

$$n_t \sin \theta_t \cos \phi_t - n'_i \sin \theta'_{CRA} \cos \phi'_{CRA} = \frac{1}{k_0} \frac{d\phi(x,y)}{dy}$$

The phase function of the interface in the case of a PSOMMA with CRA matching includes a blazed grating for CRA matching and PSOMMA phase function. As a result Eq. (1) can be re-written as:

$$n_t \sin \theta_t \cos \phi_t - n'_i \sin \theta'_{CRA} \cos \phi'_{CRA} = \quad (2)$$
$$\frac{1}{k_0}\left(\frac{d\phi_{Blazed-Grating}(x,y)}{dx} + \frac{d\phi_{PSOMMA}(x,y)}{dx}\right);$$
$$n_t \sin \theta_t \cos \phi_t - n'_i \sin \theta'_{CRA} \cos \phi'_{CRA} =$$
$$\frac{1}{k_0}\left(\frac{d\phi_{Blazed-Grating}(x,y)}{dy} + \frac{d\phi_{PSOMMA}(x,y)}{dy}\right)$$

In order to simplify the problem, the blazed grating phase can be defined in absence of PSOMMA functionality when CRA matching is fully satisfied, $\theta_t = \phi_t = 0°$ as follows:

$$-n'_i \sin \theta'_{CRA} \cos \phi'_{CRA} = \frac{1}{k_0}\left(\frac{d\phi_{Blazed-Grating}(x,y)}{dx}\right); \quad (3)$$
$$-n'_i \sin \theta'_{CRA} \cos \phi'_{CRA} = \frac{1}{k_0}\left(\frac{d\phi_{Blazed-Grating}(x,y)}{dy}\right)$$

The actual phase function of blazed grating in Eq. (3) can be calculated as:

$$\phi_{Blazed-Grating}(x,y) = \quad (4)$$
$$-k_0 n'_i \cdot x \cdot \sin \theta'_{CRA} \cos \phi'_{CRA} - k_0 n'_i \cdot y \cdot \sin \theta'_{CRA} \sin \phi'_{CRA};$$
$$\phi_{Blazed-Grating}(x,y) = -k_0 n'_i \cdot \sin \theta'_{CRA}(x \cdot \cos \phi'_{CRA} + y \cdot \sin \phi'_{CRA})$$

If the metasurface locally satisfies Eq. (5), it can fully cancel refractive lens CRA and bring it back to the target sensor pixel:

$$\phi_{Blazed-Grating}(x,y) = -k_{eff} \cdot \sin \theta'_{CRA}(x \cdot \cos \phi'_{CRA} + y \cdot \sin \phi'_{CRA}) \quad (5)$$

FIG. 3C-2 conceptually illustrates the optical path for a single layer metasurface serving as a PSOMMA and collimation lens in accordance with an embodiment of the invention. Illustrated is a formulation for a 2D scenario in which the metasurface is located along y-axis. Eq. (6) describes the trigonometric functions which may be utilized to calculate the equivalent effective focal length (EFL) for the collimation functionality:

$$\theta_{CRA} = \tan^{-1}\left(\frac{y'_{sensor}}{h'}\right) \quad (6)$$
$$n \cdot \sin \theta_{CRA} = n' \sin \theta'_{CRA}$$
$$EFL = h_{substrate} + \frac{y'_{sensor}}{\tan \theta'_{CRA}}$$

This can be simplified to calculate the collimation phase by using the target EFL as follows:

$$\phi_{collimation} = \quad (7)$$
$$-k_0 \cdot n' \cdot \left(\sqrt{EFL^2 + y^2 + x^2} - EFL\right) = -k_{eff} \cdot \left(\sqrt{EFL^2 + y^2 + x^2} - EFL\right)$$
OR
$$\phi_{collimation} = -\frac{k_{eff}(x^2 + y^2)}{2EFL}$$

$y'_{sensor}$ can be the quarter of the physical dimension of sensor. This is an approximation instead of optimizing the collimation phase over all the received CRAs at metasurface. Another estimation of EFL can be:

$$EFL = h_{substrate} + h' \cdot n' \quad (8)$$

Figures 3, 3C:
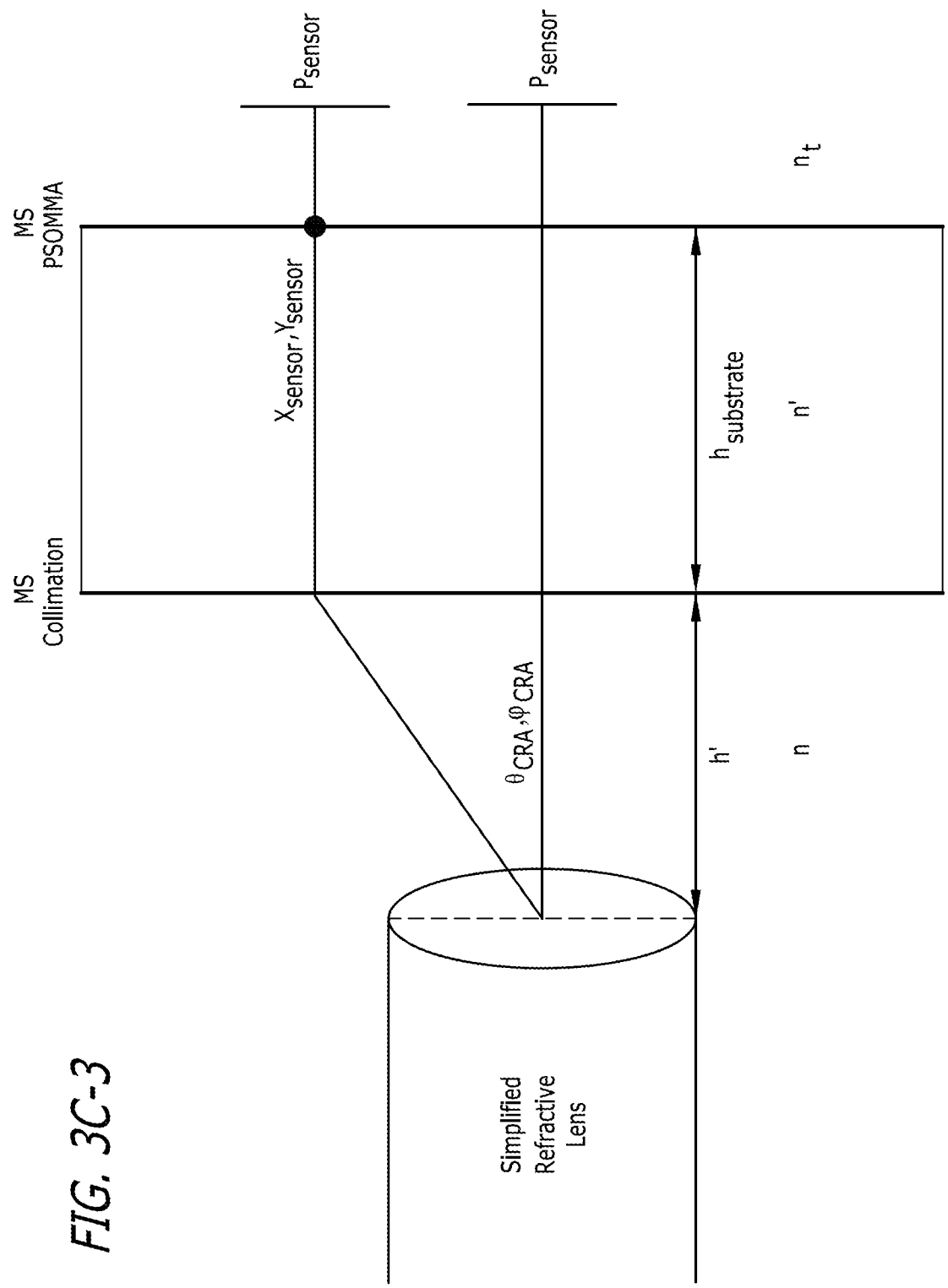

FIG. 3C-3 conceptually illustrated the optical path for a two separate layers of metasurface serving as a PSOMMA and a collimation lens in accordance with an embodiment of the invention. One metasurface (MS) layer serves as a collimation lens and one MS layer servers as a PSOMMA.

FIG. 4A illustrates a PSOMMA with two polarizations at each lenslet in accordance with an embodiment of the invention. The PSOMMA includes multiple lenslets 402 (L1, L2 . . . LN, LN+1), each of the lenslets may split the incoming light into two polarizations (pol). Examples include, as illustrated, L1 may split the incident light into pol1 in one direction and pol2 in another direction. Also, L2 may split the incident light into pol3 and pol4. Each lenslet may be over just two pixels. For example, as illustrated, L1 may be over pixels p1 and p2, directing the pol1 light into p1 and pol2 light into p2. In some embodiments, the polarization for a set of two lenslets may be repeated across the image sensor 404. For example, L1 may split the light into pol1 and pol2, L2 splits the light into pol3 and pol4 and that pattern may repeat over the entire image sensor 404 or a portion or several portions of the image sensor 404, such that LN splits the light into pol1 and pol2 and LN+1 splits the light into pol3 and pol4. In some embodiments, the polarization is split into only two states across the image sensor 404. For example, in a PSOMMA described in connection with FIG. 4A, pol1 may equal pol3 and pol2 may equal pol4. Thus L1 and L2 may both split light into the same polarizations, pol1 and pol2. Finally it is understood that the polarization states for each lenslet may be completely unique and independent and not just limited to linear polarization states. For example, pol1 may be right hand circularly polarized light and pol2 may be left hand circularly polarized light. Furthermore, pol1 may be S polarized light while pol2 may be P polarized light.

Figure 4B:
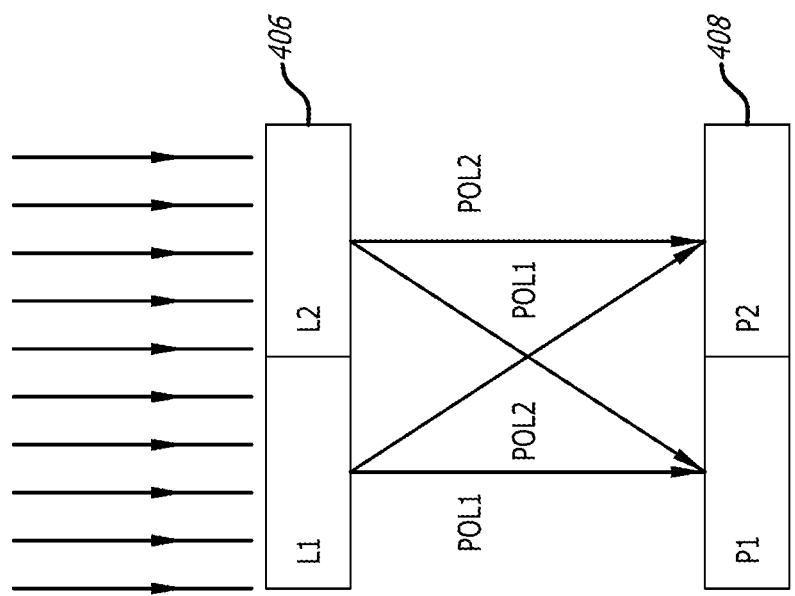
FIG. 4B illustrates a PSOMMA with two polarizations at each lenslet in accordance with an embodiment of the invention.

FIG. 4B illustrates a PSOMMA with two polarizations at each lenslet in accordance with an embodiment of the invention. This configuration is similar to the configuration described in connection with FIG. 4A. However, in this configuration, a PSOMMA 406 includes a first lenslet L1 which directs a first polarization light pol1 into a first imaging unit p1 of an image sensor 408 and a second polarization light pol2 into a second imaging unit p2 of the image sensor 408. Similarly, the PSOMMA 406 includes a second lenslet L2 which directs a first polarization light pol1 into the first imaging unit p1 and a second polarization light pol2 into the second imaging unit p2. Thus, the same imaging units p1, p2 may be shared by the first lenslet L1 and the second lenslet L2.

Figures 1, 5A:
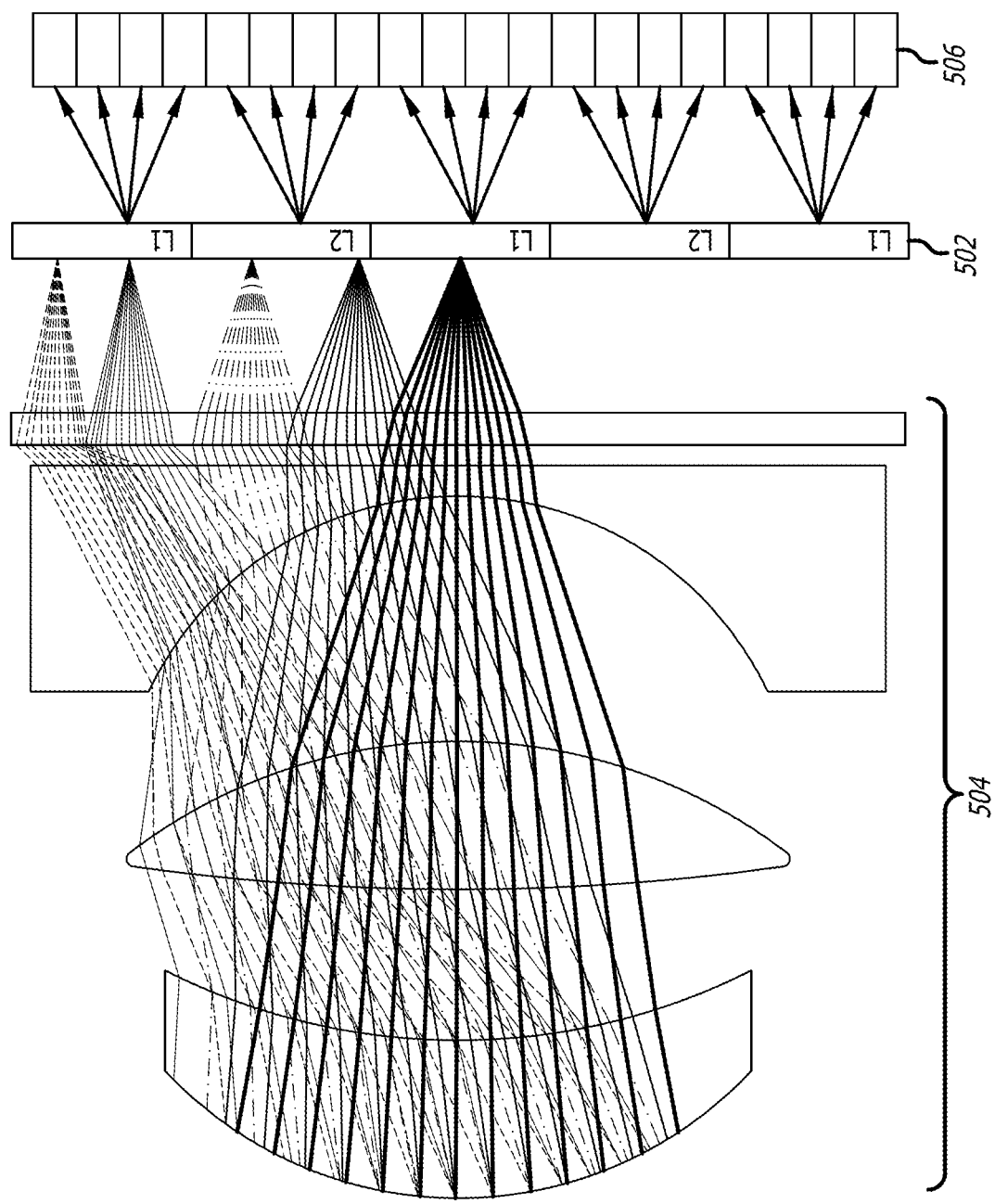
Figures 2, 5A:
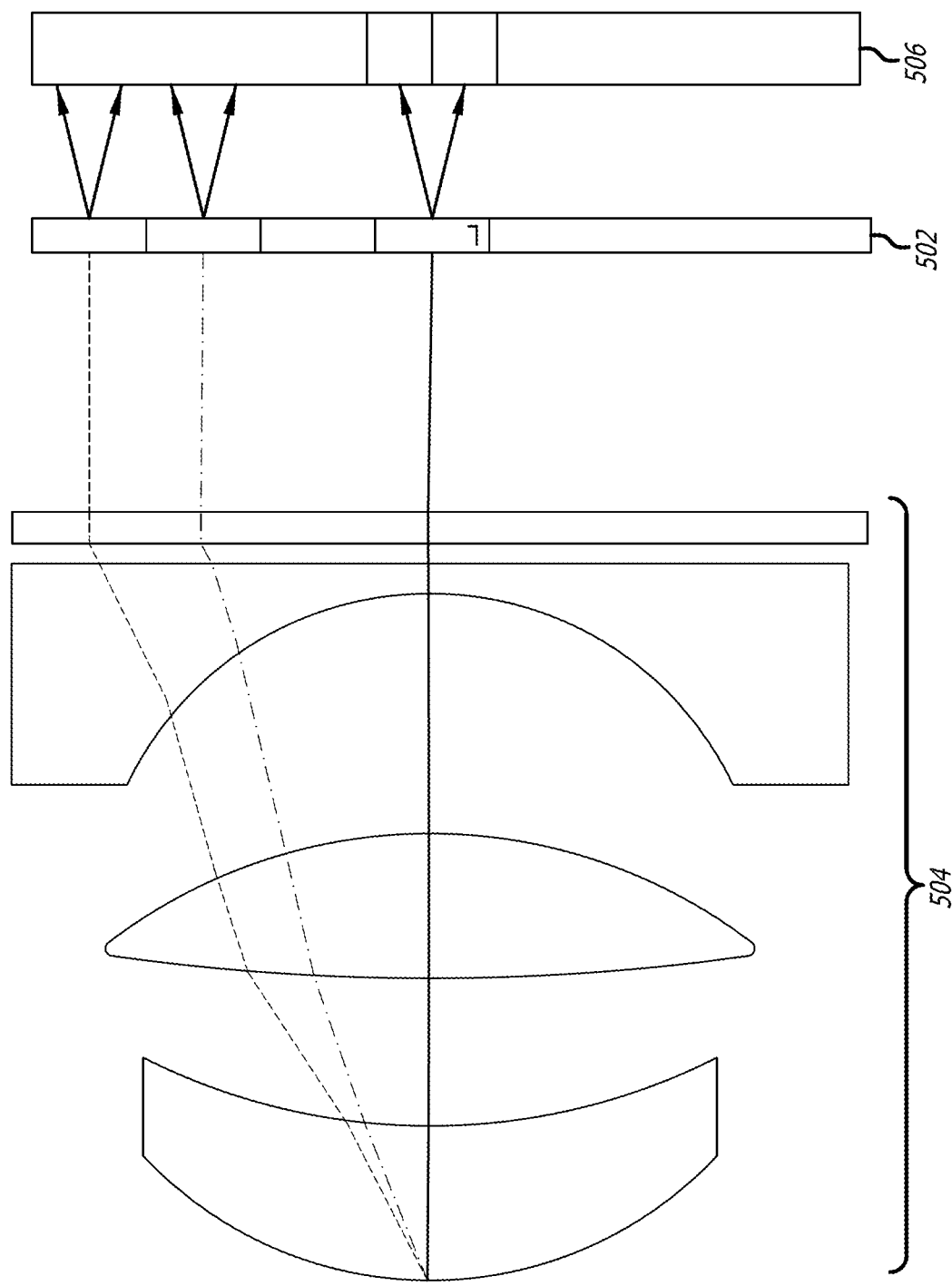
Figures 3, 5A:
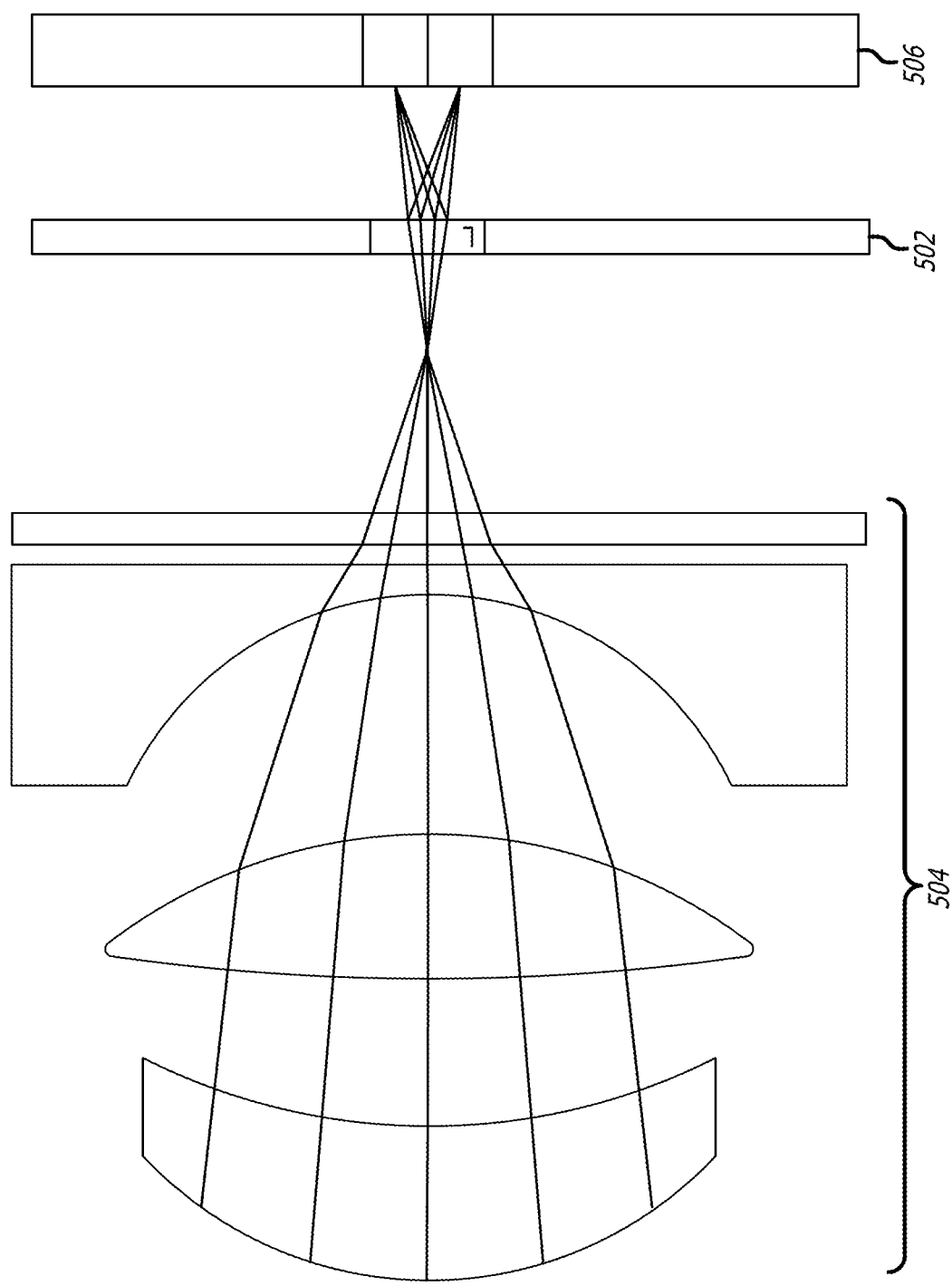

FIG. 5A-1 illustrates an optical system incorporating a PSOMMA in accordance with an embodiment of the invention. As illustrated, the PSOMMA 502 can be coupled with one or more refractive lenses 504 in an optical system to provide a complete polarization imaging system. The PSOMMA 502 may be the last element of the imaging system before an image sensor 506. In some embodiments, each lenslet of the PSOMMA 502 may be customized for a certain polarization response. In some embodiments, each lenslet of the PSOMMA 502 may be customized for a certain unique phase function. The unique phase function can be used to improve the performance of the PSOMMA 502 performance for varying chief ray angle of an optical system. In some embodiments, each lenslet of the PSOMMA 502 may be customized for both a certain unique phase function and a certain polarization response. There may be some distance offset between the image sensor 506 and the PSOMMA 502. The material between the image sensor 506 and the PSOMMA 502 in the offset distance may be air or a solid state material such as glass, quartz, $SiO_2$, $Si_3N_4$, or polymers. Many optical imaging systems have a microlens array (MLA) before the image sensor to couple the light into individual pixels. In these systems, the microlens array may not be able to distinguish polarization and may not provide a unique, arbitrary phase function at each pixel. The PSOMMA 502 may diffract different polarizations within the incident light in different directions as discussed previously and provide a certain unique phase function to the different polarizations of the incident light.

In some embodiments, the PSOMMA 502 may be positioned to re-image the image plane from the optics. The one or more refractive lenses 504 of FIG. 5A-1 are merely exemplary. FIGS. 5A-2 and 5A-3 illustrate examples of an optical system incorporating a PSOMMA in accordance with various embodiments of the invention. In FIG. 5A-2, a 0P trace is provided with a few different fields of view, but just the center rays which diffract through the PSOMMA 502 into the image sensor 506. In FIG. 5A-3, a 0F trace is provided with a normal field of view, with a few rays traced across the pupil which diffract through the PSOMMA 502 into the image sensor 506.

Figure 5B:
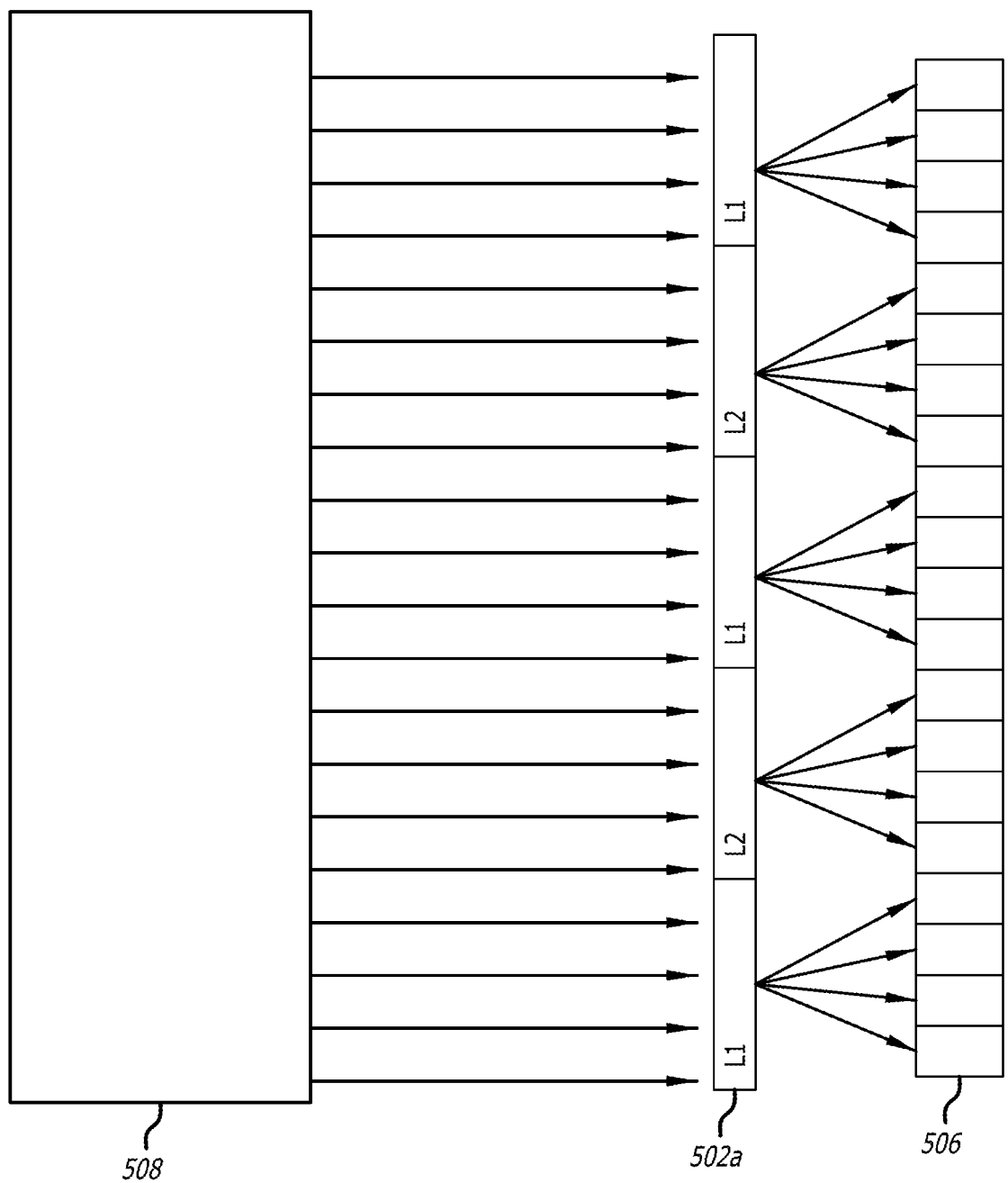
FIG. 5B illustrates an optical system incorporating a PSOMMA in accordance with an embodiment of the invention.

FIG. 5B illustrates an optical system incorporating a PSOMMA in accordance with an embodiment of the invention. As illustrated, a light source 508 may output optical light towards the PSOMMA 502a. While the light from the light source 508 is illustrated to be collimated, the light may also have different incident angles which are not completely collimated. The PSOMMA 502a may include all of the functionalities of the PSOMMA 502 described in connection with FIG. 5A. However, PSOMMA 502 may also have at least some of the functionality of the one or more refractive lenses 504 described in connection with FIG. 5A, or it may include the microlens array function. In FIG. 5B, while the one or more refractive lenses 504 are not illustrated to be present, a portion of the one or more refractive lenses 504 may be present to perform some of the functionality of the one or more refractive lenses 504 while the PSOMMA 502a may be incorporated to perform the rest of the functionality. The PSOMMA 502a may be the last element of the imaging system before an image sensor 506.

Figures 1, 5C:
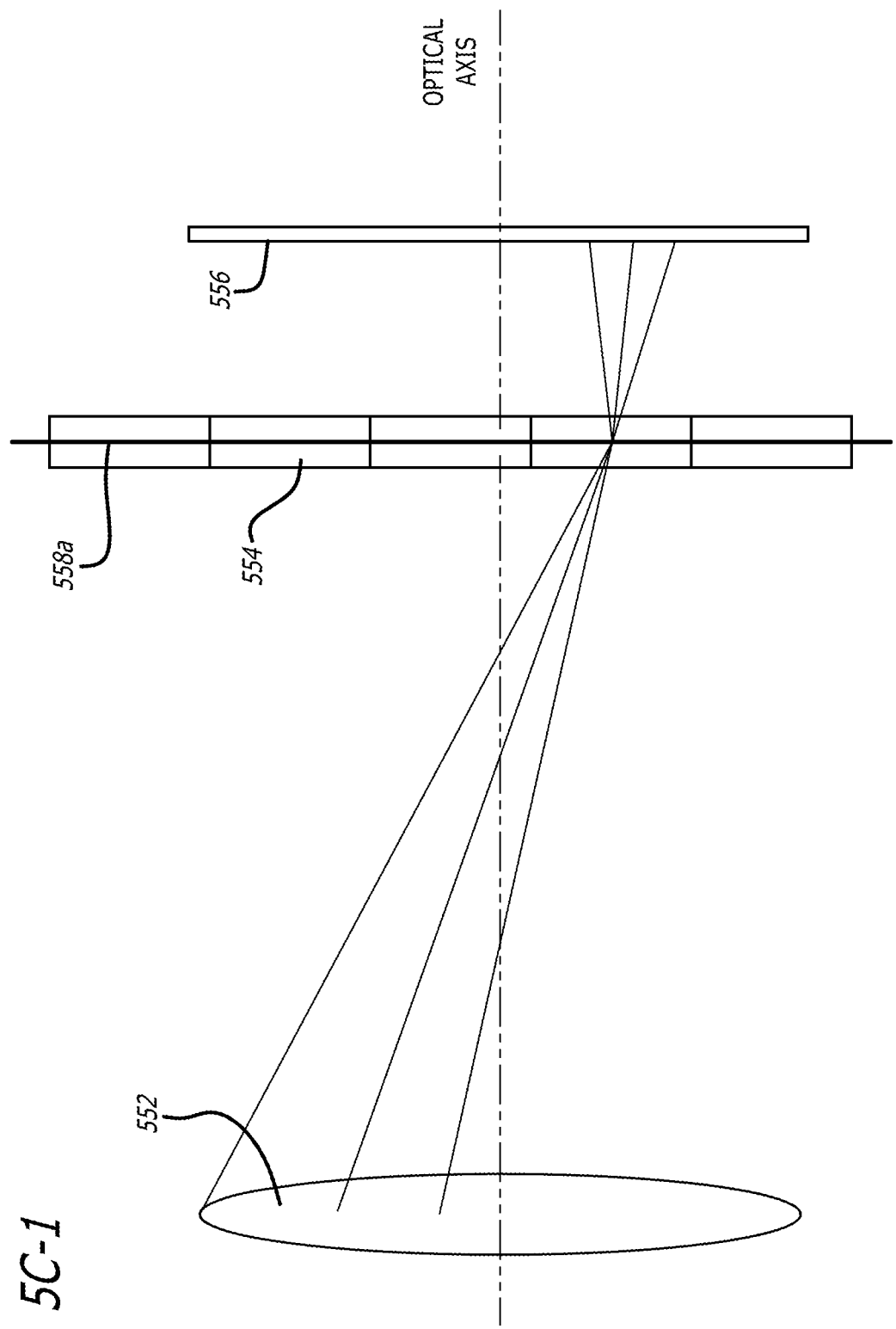
Figures 2, 5C:
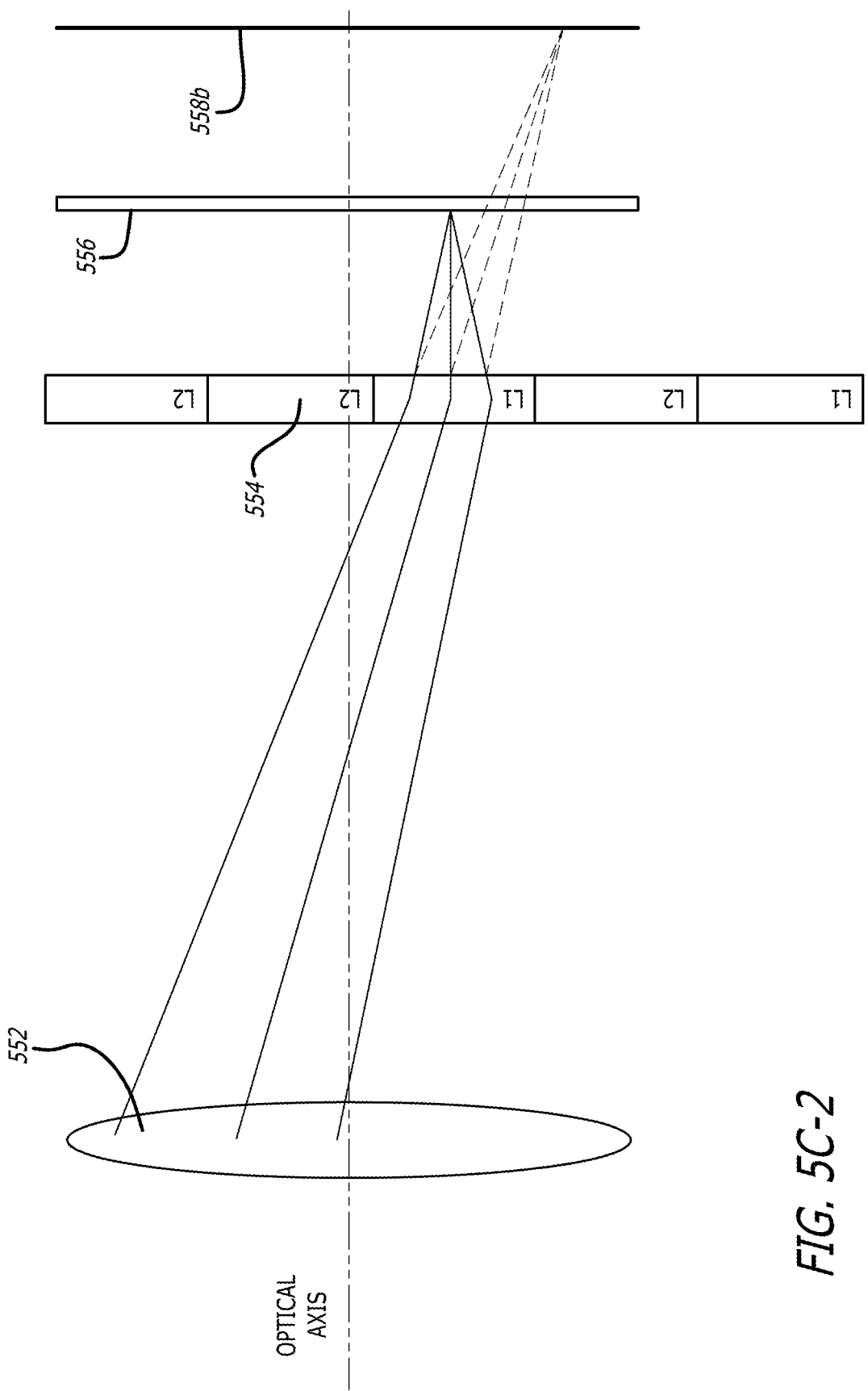
Figures 3, 5C:
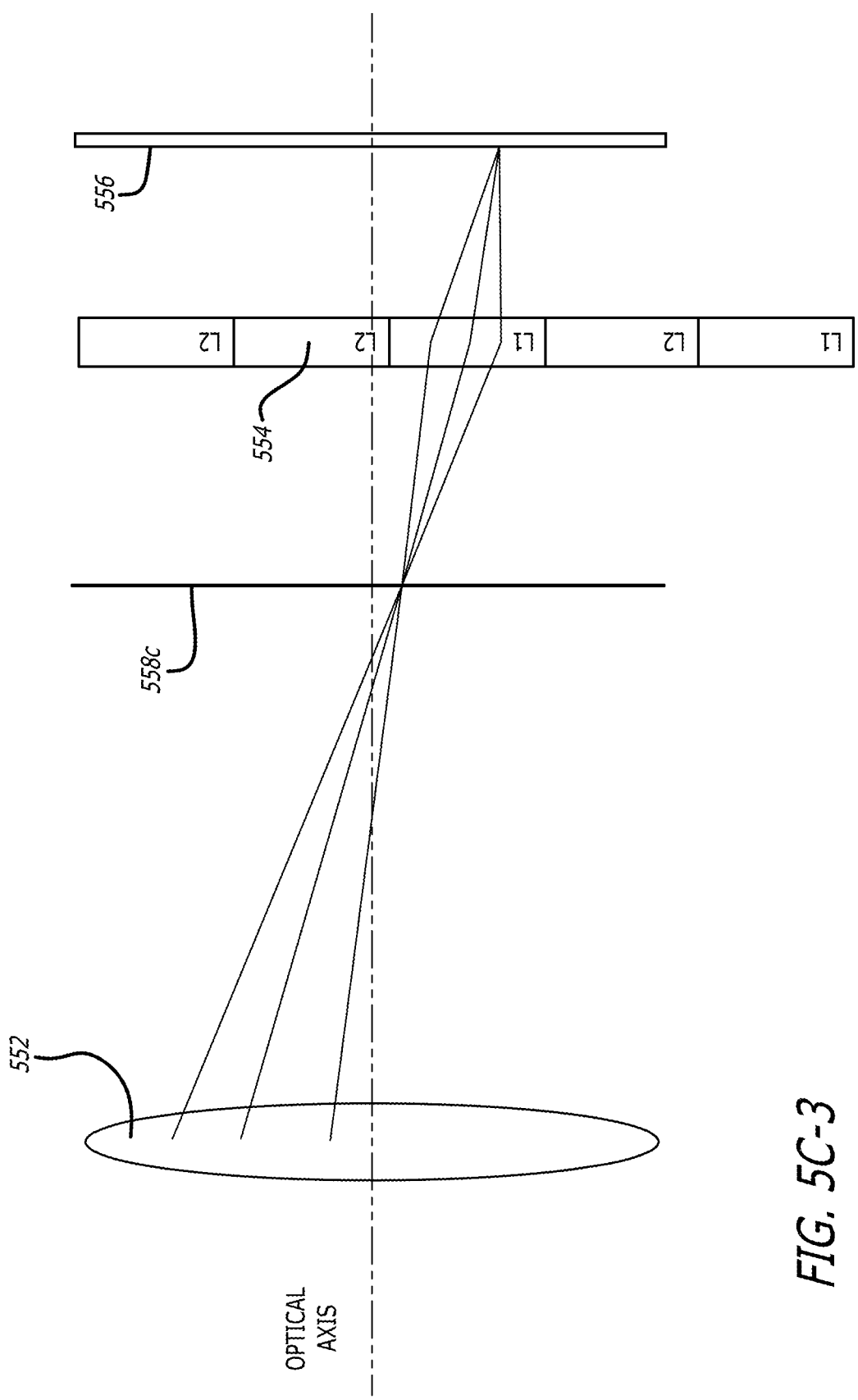

The light source may be a fixed near infrared source, a vertical-cavity surface emitting laser (VCSEL), LED, edge-emitting laser (EEL), sunlight, and/or other environmental lighting. In some embodiments, the light source may be designed to have a specific, fixed polarization across the field of illumination or may be designed to have a point-by-point polarization pattern across the field of illumination. For example, the illumination pattern projected onto the scene may be have a fixed circular polarization, e.g. left-hand or right hand circular. In some embodiments, it may be a fixed linear or elliptical polarization illumination. In some cases, two different fixed polarizations may be used simultaneously or sequentially. FIGS. 5C-1, 5C-2, and 5C-3 illustrate optical systems incorporating a PSOMMA in accordance with various embodiments of the invention. The optical system includes a main lens 552 which refracts light towards a PSOMMA 554. The PSOMMA 554 distributes the refracted light from the main lens 552 onto an image sensor 556. In FIG. 5C-1, a main lens image plane 558a of the main lens 552 overlaps with the PSOMMA 554 such that the main lens 552 is focused on the PSOMMA 554.

In FIG. 5C-2, the main lens image plane 558b of the main lens 552 is behind the PSOMMA 554 and the image sensor 556 such that the PSOMMA 554 is focused on the image plane. In FIG. 5C-3, the main lens image plane 558c of the main lens 552 is between the main lens 552 and the PSOMMA 554. Thus, in FIG. 5C-2, the image plane 558b of the main lens 552 lies behind the image sensor 556, whereas the image plane 558c in FIG. 5C-3 lies before the image sensor 556. The arrangement of FIG. 5C-3 allows for more flexible in physical configuration.

In some embodiments, the main lens 552 is a bi-convex lens. In some embodiments, the main lens 552 may be a piano-convex lens. In some embodiments, the main lens 552 may be a multi-refractive lens configuration. In some embodiments, the PSOMMA 554 may be replaced with a combination of a polarization-dependent metasurface next to a microlens array. The microlens array may be a bi-convex lens array or a piano-convex lens array. Any of the configurations disclosed in FIGS. 5C-1 to 5C-3 may be utilized which may provide different benefits such as higher spatial resolution, larger angle of view, better accuracy of directional sampling.

Figure 6A:
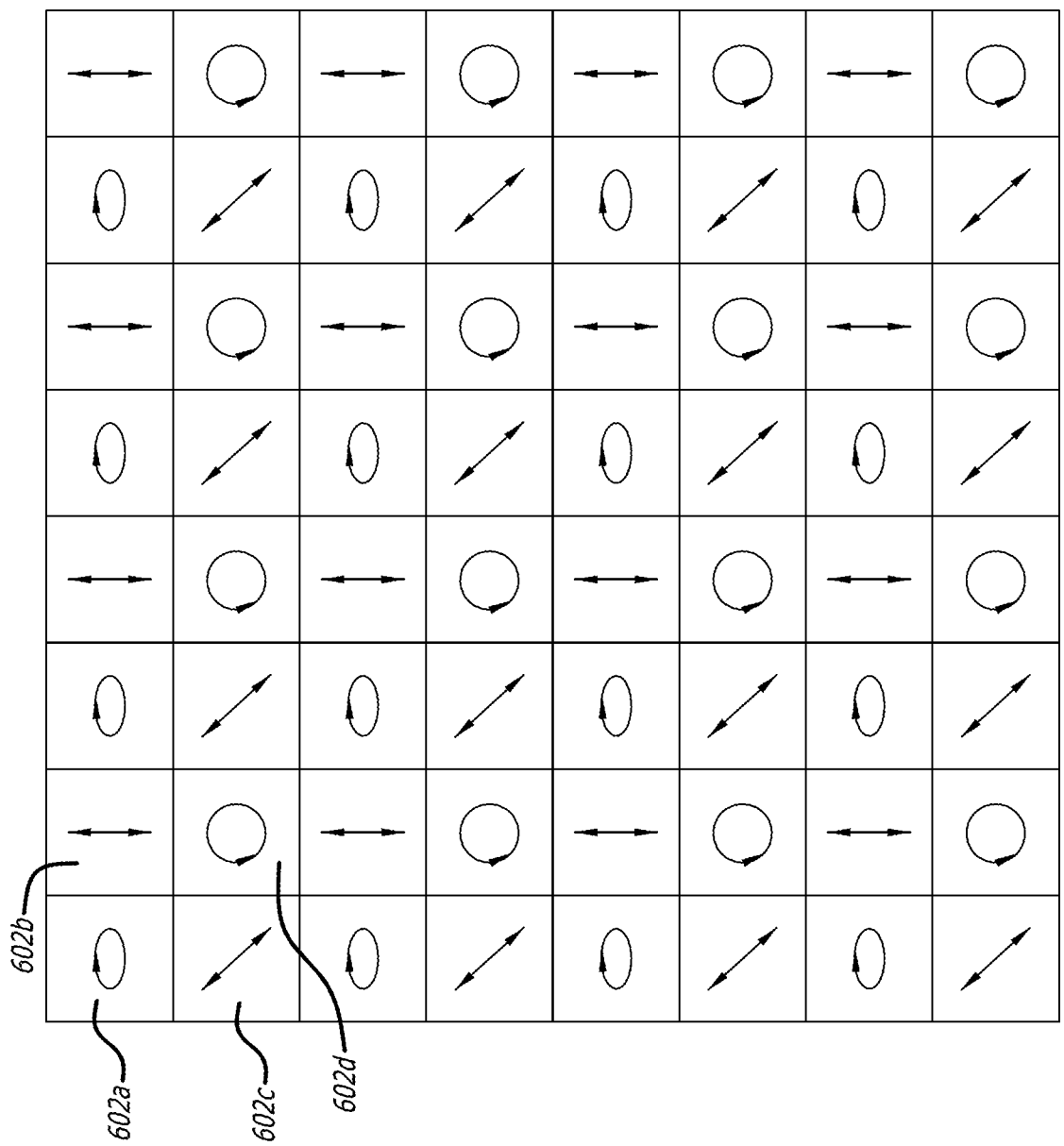
FIGS. 6A and 6B illustrate an example polarization distribution on an image sensor in accordance with an embodiment of the invention.
Figure 6B:
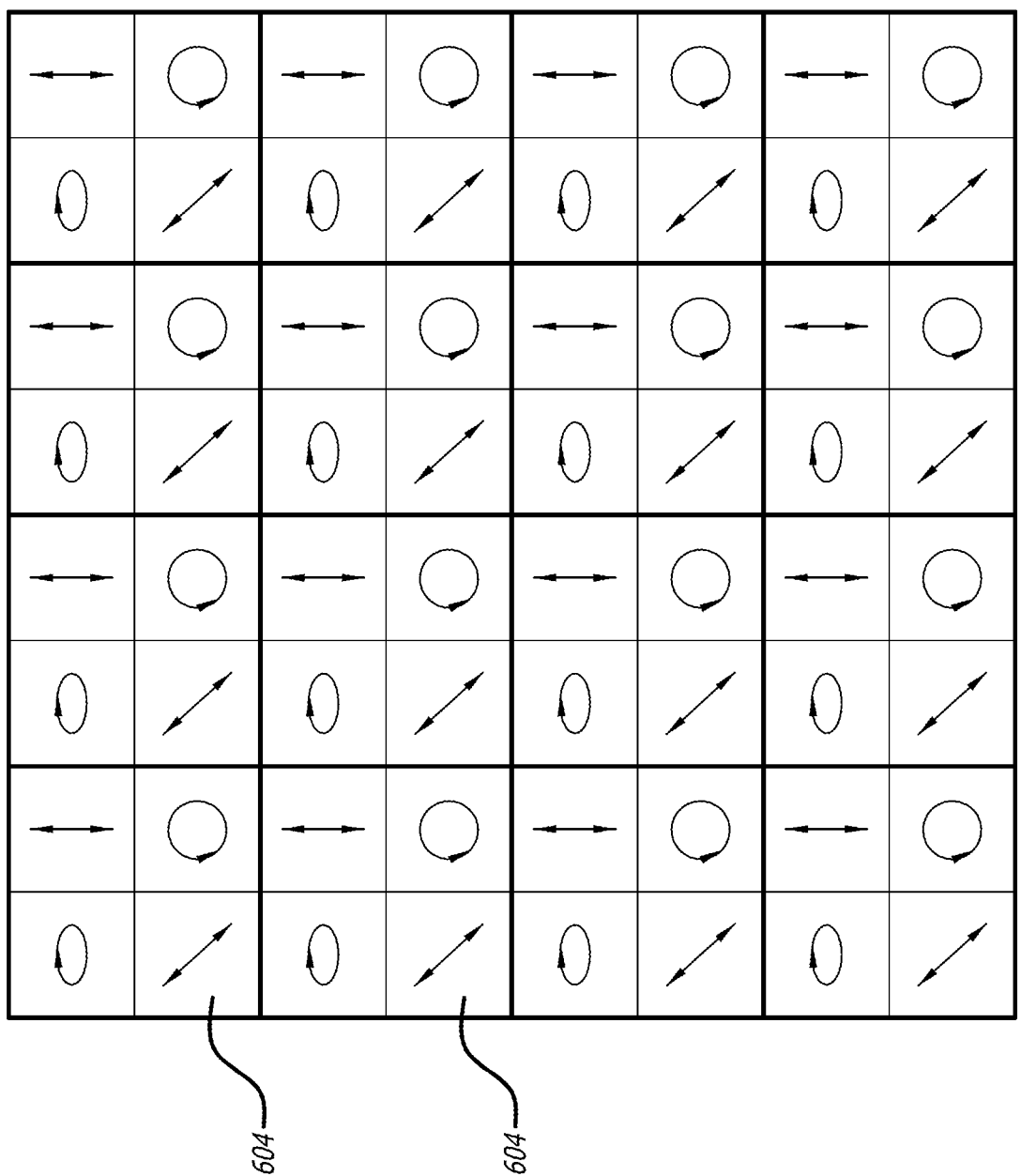

FIGS. 6A and 6B illustrate an example polarization distribution on an image sensor in accordance with an embodiment of the invention. FIG. 6A is a top view of an exemplary polarization state at each pixel on an image sensor after the light has passed through the PSOMMA. As illustrated, each lenslet 604 may split the intensity of incident light proportional to its polarization content of four separate states: right handed elliptical 602a, vertical 602b, diagonal 602c, and left handed circular 602d. These four pixels with unique states may form a super pixel of the imaging system and may be repeated N times across the whole image sensor. Although four repeating polarization states are illustrated, the PSOMMA may be used to specify a unique polarization state at each one of the pixels on the image sensor, and it may be two, three or more unique polarization states repeating. Advantageously, the light may not be filtered (e.g. absorbed) before arriving at the image sensor and the PSOMMA is not limited to only linear polarization states. FIG. 6B illustrates superpixels of complete polarization where the positioning of individual lenslets 604 is outlined in the bold lines. Each lenslet 604 may sort the incoming light into four sub pixels each with a different polarization state.

The image sensor may be a CMOS sensor, time of flight (ToF) sensor, indirect time of flight (iToF) sensor, and/or RGB sensor. Timing and method of readout and frame rates of image sensors may include binning. For example, in a 2×2 pixel configuration, readout without polarization, and then readout with polarization which may provide efficient information capture. In other words, bin the polarization pixels together in terms of signal capture and processing. Different pixels may be sampled at different times or more or less frequently for imaging or energy purposes. For iToF sensors, most pixels can be CMOS-type, and some smaller % can be iToF pixels (e.g. 10% or 20%); and iToF could be in 2D mode without polarization. Some configurations could have the sparse concept on the sensor (e.g., only some pixels are 3D mode vs. 2D mode) which may save energy.

In some embodiments, diffractive optical elements (DOEs) may be used for some splitting aspects. For example, a traditional DOE might be applied for some of the lenslets in an PSOMMA instead of a metasurface.

Example Polarization Imaging Systems Including a Microlens Array

Figure 7:
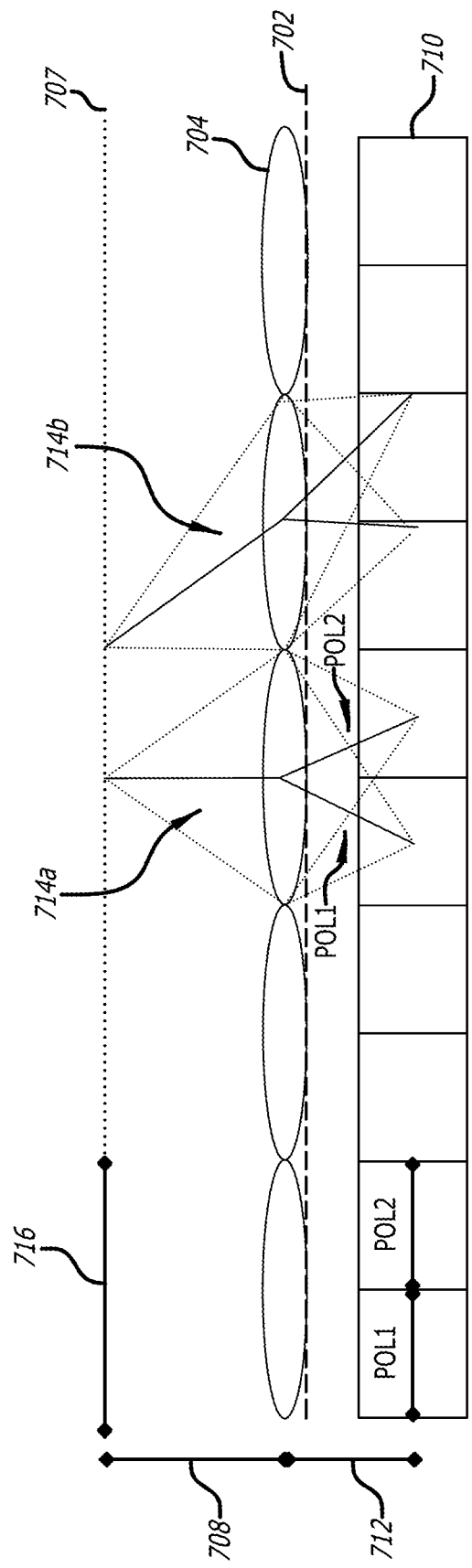
FIG. 7 schematically illustrates an example of a functionality of an example polarization imaging system including an MLA integrated with a PSOMMA in accordance with an embodiment of the invention.

In some embodiments, the polarization imaging system may include two separate components: a refractive microlens array (MLA) and a PSOMMA. The MLA may tile the projected image. FIG. 7 schematically illustrates an example of a functionality of an example polarization imaging system including an MLA integrated with a PSOMMA in accordance with an embodiment of the invention. The polarization imaging system may include a separate refractive MLA 704 and a PSOMMA 702. The PSOMMA 702 may be a polarization meta-grating. In some embodiments, the refractive MLA 704 may be implemented within the same layer as the PSOMMA 702. In some embodiments, as illustrated, the MLA 704 may be implemented as a separate planar layer than the PSOMMA 702. In some embodiments, the MLA 704 may be a traditional refractive MLA and thus the polarization imaging system may include a traditional refractive MLA and a PSOMMA 702. In some embodiments, the MLA 704 may be integrated with the PSOMMA 702 such that metasurfaces may be used to manufacture both a layer including a MLA and a layer including a PSOMMA on a single substrate. The layer including the MLA 704 may include meta-surface elements.

The MLA 704 may be adjusted relative to the image plane of the imaging system so that it demagnifies the incident light by a factor of greater than 2, so that upon tiling, the separated images do not overlap. Examples of tiling are illustrated in FIG. 6B. It may be preferable to bring the PSOMMA 702 as close to the MLA 704 as possible, or in some embodiments may include combining the MLA 704 and PSOMMA 702 in a single layer. The pixels are shown schematically as adjacent boxes. The active area of the pixels may be smaller than what is shown schematically here, and the magnification may be greater than 2 in order to only illuminate the active area.

The MLA 704 includes a focal length. A distance 708 from a primary image plane 707 may be greater than two times the focal length of the MLA 704. An imaging of a region 716 in primary image plane 707 to the pixels may overlap each microlens of the MLA 704. The PSOMMA 702 outputs light into an image sensor 710 including a pixel grid. A distance 712 from the PSOMMA 702 to the image sensor 710 may be less than the focal length of the MLA 704. A schematic ray trace 714a is illustrated at 0F including chief (solid) and marginal (dotted) rays. A schematic ray trace 714b at 1F including chief (solid) and marginal (dotted) rays.

Figure 8B:
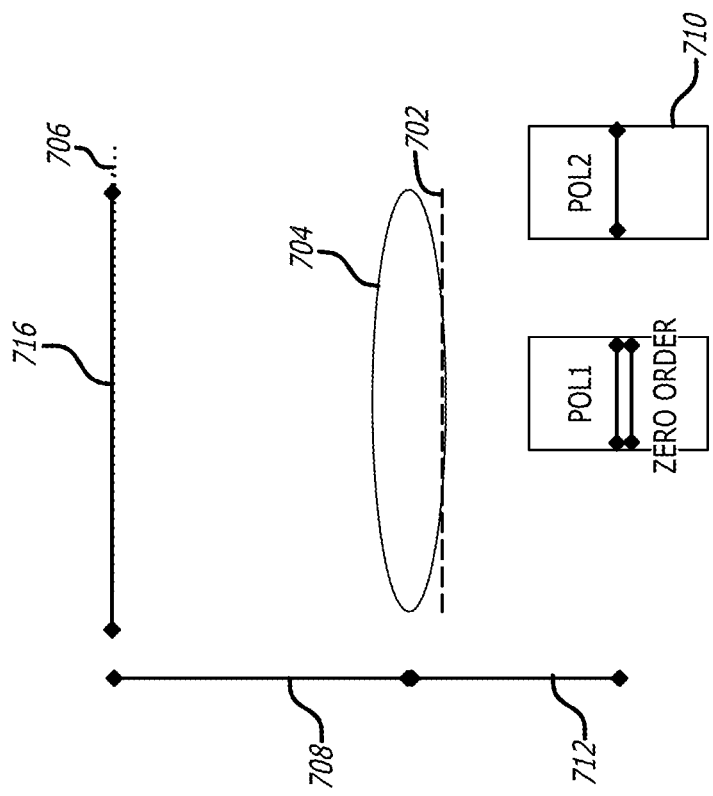
FIGS. 8A and 8B illustrate various offset pixel architecture according to various embodiments of the invention.
Figure 8A:
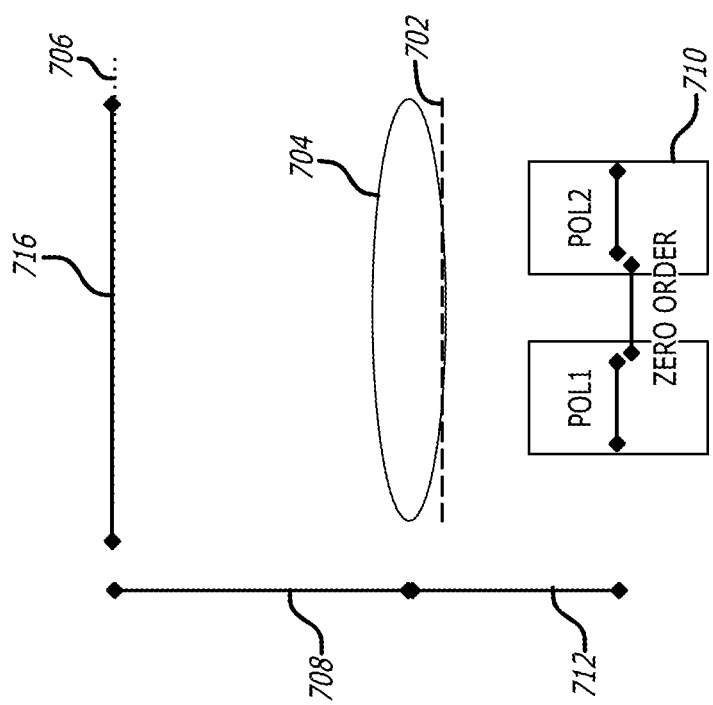

FIGS. 8A and 8B illustrate various offset pixel architecture according to various embodiments of the invention. Instead of targeting diffraction orders so that the diffraction is symmetric around an undiffracted image, the undiffracted image may be chosen as one of the diffraction orders (e.g. the zero order). These architectures share many identically numbered features with the architecture of FIG. 7 and the description is applicable in these architectures. The description will not be repeated in detail.

As illustrated in FIG. 8A, the center of each lenslet of the microlens array may be aligned directly over the zero order light between the pol1 light and the pol2 light. The zero order light can have a negative impact on the fidelity of the reconstructed polarization. Thus, it may be advantageous to have the zero order light go through the center of the light sensor between the pol1 light and pol2 light. The active area of the pixel (the photo-sensitive region which generates an electron charge upon incident light) may be smaller than the microlens pitch divided by the number of pixels it is split into. The zero order light from the PSOMMA may not be incident on the active area of the pixel because the active region of the underlying pixel array of the light sensor may be offset from where the zero order light is incident. The zero order light may be coincident with the diffracted light. Because the zero order light is "uncontrolled", it does not effectively parse the incident polarization and does not carry the polarization signal. Thus, the zero order light may be considered noise. Thus, by directing it into a non-photosensitive region, the noise can be alleviated.

In some embodiments, the zero order light may be at least partially spread among the pol1 light and the pol2 light. If the active area of the image sensor overlaps with the zero order light, then some of the zero order light may be shared as noise among the pixels of the image sensor.

In some instances, it may be difficult to align the zero order light with an inactive region of the pixel array of the image sensor. In this case, it may be better for the zero order light to be diffracted in the same direction as one of the polarizations of light. FIG. 8B illustrates an offset pixel architecture with the zero order light being diffracted in the same direction as the pol1 light to the side of the pol2 light. The target pixels may be offset relative to the lens center. Only one of the pixels experiences the noise from the zero order, which may make the subsequent polarization recovery easier. The zero order image is shown offset in the vertical axis. Mathematically, the lenslet of FIG. 8A may shorten all the analyzer Stokes vectors on the Poincare sphere which may decrease the degree of polarization of the pol1 light and the pol2 light. Whereas, in lenslet of FIG. 8B, only the vector which includes the pol1 light and zero order light may be shortened and not the pol2 light.

Figure 9A:
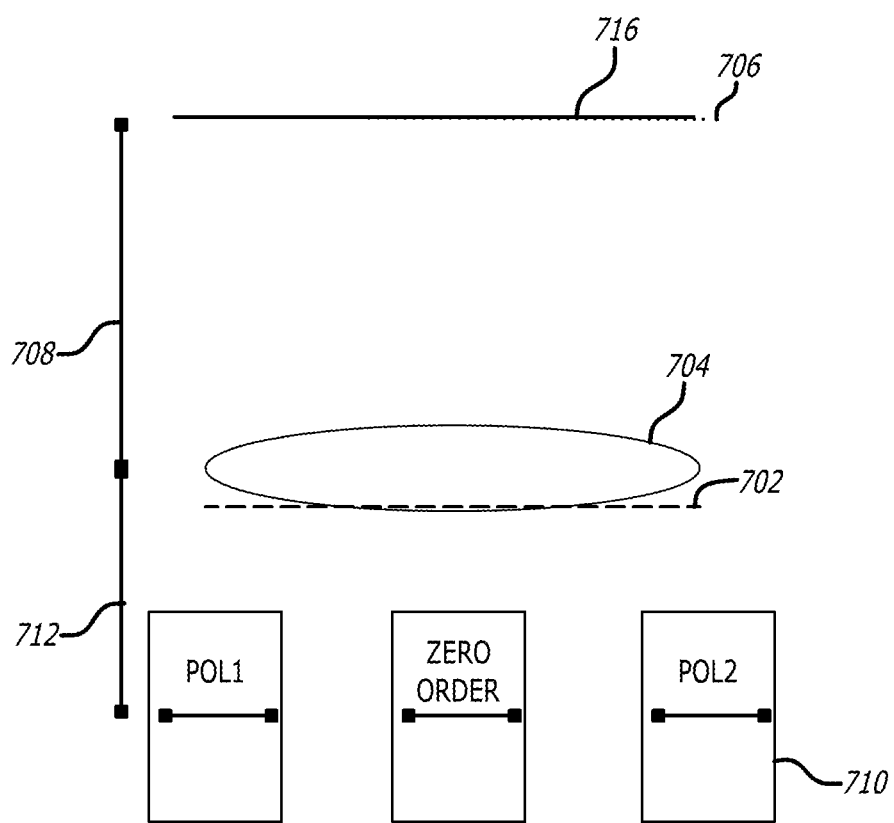

FIGS. 9A and 9B illustrate various high fidelity pixel architectures in accordance with embodiments of the invention. These architectures share many identically numbered features with the architecture of FIGS. 7 and 8 and the description is applicable in these architectures. The description will not be repeated in detail. As illustrated in FIG. 9A, the zero order light may be undiffracted and thus pass through the middle of the microlens (e.g. lenslet). The undiffracted zero order light can be imaged onto a separate pixel on the image sensor where no diffracted order is directed. In this case, none of the analyzer Stokes vectors may be shortened and thus the degree of polarization may not be decreased. The zero order light may not impact the fidelity of the reconstructed polarization imaging. Furthermore, the zero order light may be an additional signal for the reconstructed intensity image, instead of being noise for the reconstructed polarization. The zero order light may not have a preferential polarization and just provides intensity information. In this configuration, the amount of light going into the zero order does not need to be minimized, and can be optimized by design so as to increase the overall optical efficiency. This configuration is beneficial in applications where a trade-off between efficiency and signal to noise ratio (SNR) and angular resolution can be made. FIG. 9B illustrates various top sensor views of implementations of exemplary superpixels with separate zero order pixels, in combination with a pixel offset. Pixel offset refers to a spatial translation of the underlying pixel array with the microlens array. In some embodiments, pol3 may equal pol1 and pol4 may equal pol2. The illustrated combinations are not limiting and other combinations of positioning of sub-pixels are contemplated.

Figure 10A:
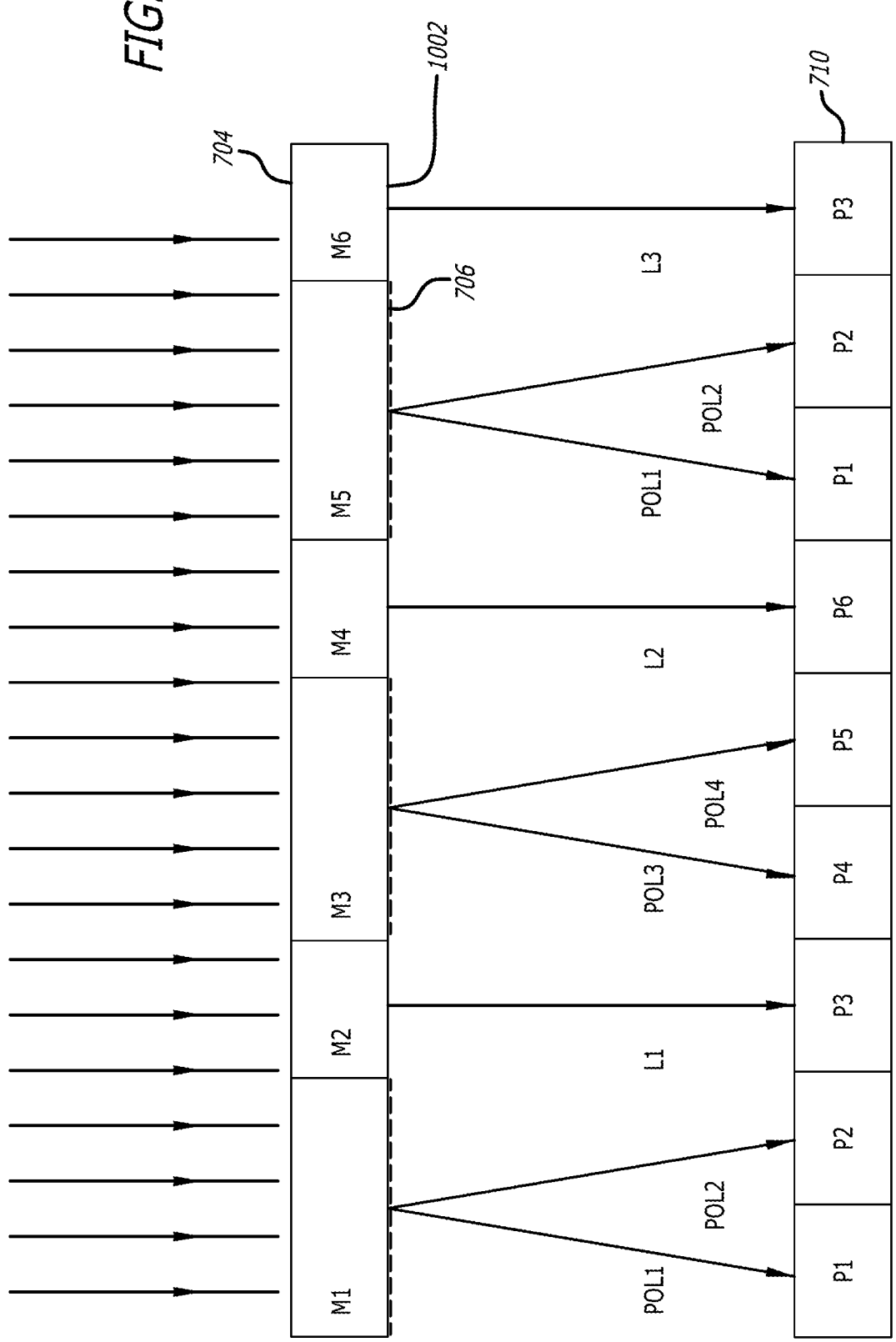
Figure 10B:
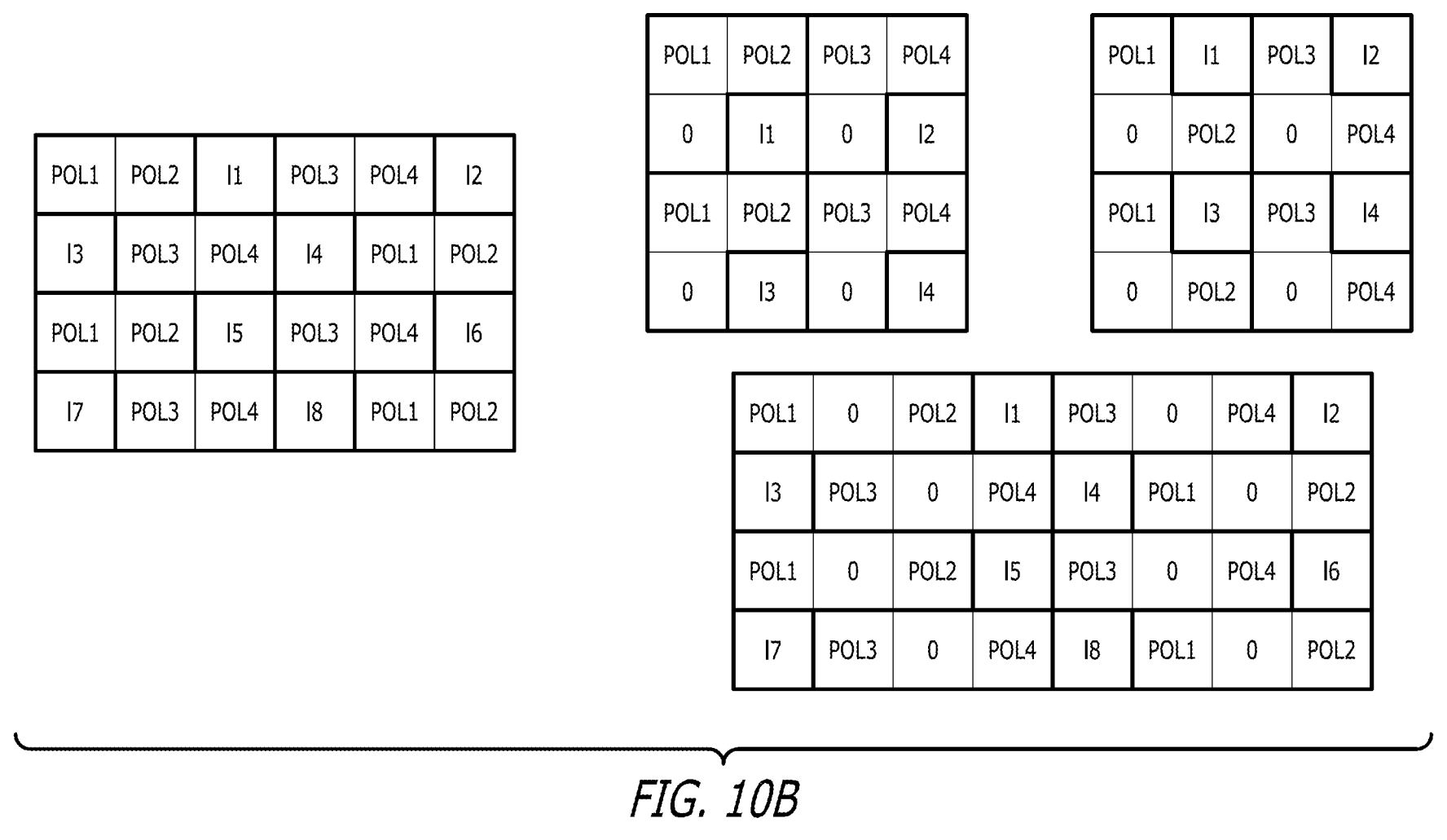

FIGS. 10A and 10B illustrate various hybrid intensity/polarization architectures in accordance with embodiments of the invention. These architectures share many identically numbered features with the architecture of FIG. 7 and the description is applicable in these architectures. The description will not be repeated in detail. In these architectures, the PSOMMA 706 may not be applied to all the lenslets of the MLA 704 such that a subset of pixels may be imaged directly by the lenslets without the PSOMMA 706, and another subset of pixels is imaged by the lenslets of the MLA 704 plus the PSOMMA 706. This can be achieved by patterning clear windows 1002 in the PSOMMA 706, or selectively patterning the back surface of an MLA 704 with the PSOMMA 706, or other methods suited for various hybrid MLA-polarization meta-grating constructions. Offset pixel and high fidelity architectures as discussed above can further be applied to the subset of pixels including the PSOMMA 706. This hybrid configuration may be beneficial to the balancing of trade-offs between resolution, optical efficiency, fidelity of the polarization, and image sensor size. This includes implementing extrapolation schemes between the pixels receiving undiffracted light and those receiving diffracted light from the PSOMMA 706.

FIG. 10A illustrates a hybrid intensity/polarization architecture, where poln (e.g. pol1, pol2, pol3, pol4) is a polarization state of diffracted light from the PSOMMA 706 and ln (e.g. l1, l2, l3) is light not passing through the PSOMMA 706. The lenslets of the MLA 704 are labeled M1, M2 . . . Mn. As illustrated, Poln may be at least 2 distinct polarizations. The light not passing through the PSOMMA 706 may be used to measure intensity, time of flight (ToF), range to target, depth, depth-to-focus, defocus, and/or colors while the polarization separated light diffracted by the PSOMMA 706 may be used to measure various degrees of polarization. FIG. 10B illustrates various exemplary hybrid intensity/polarization sub-pixel configurations. The bold lines illustrate the pixels with each square representing a sub-pixel. Poln may include 2 or more distinct polarizations, 0 is the undiffracted zero order pixel exiting the PSOMMA 706, and In is light not passing through the PSOMMA 706. Advantageously, capturing intensity of the light may increase the resolution of the image intensity without increasing the sensor size. Capturing intensity can also be used as reference intensity in an interpolation scheme to retrieve some resolution for the intensity image, and manage the noise coming from the zero order light. The resolution of the polarization image may decrease when dedicating some of the sub-pixels to capturing image intensity.

Figure 11A:
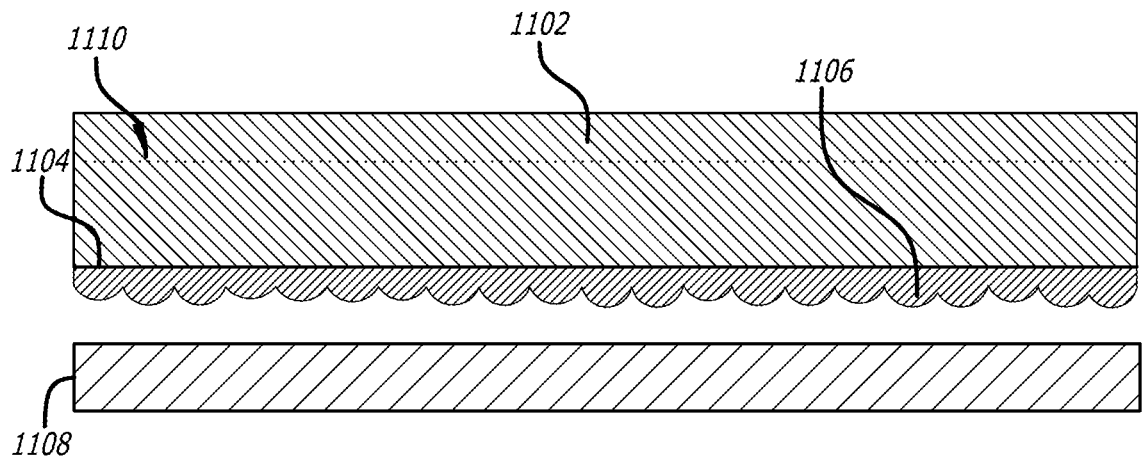
FIGS. 11A-11C illustrate various hybrid architectures including an MLA and a PSOMMA in accordance with various embodiments of the invention.
Figure 11B:
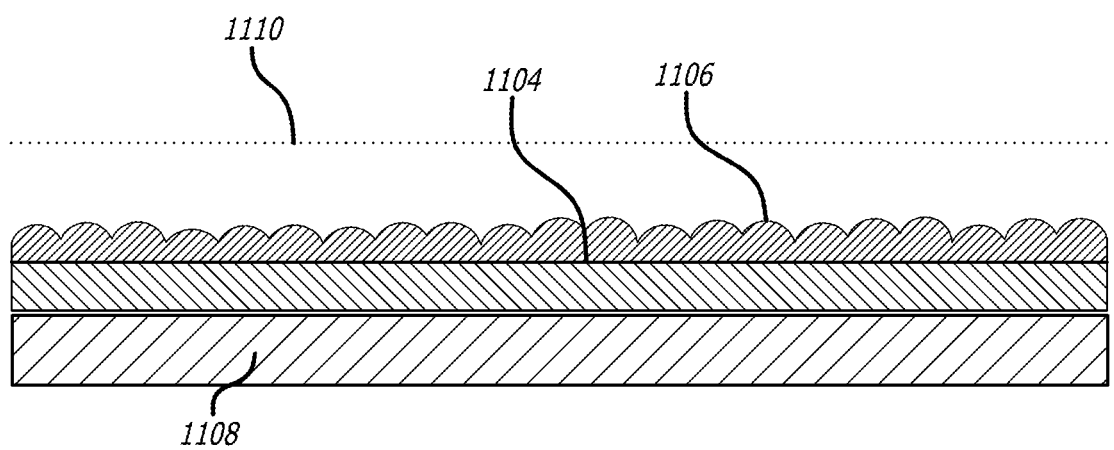
Figure 11C:
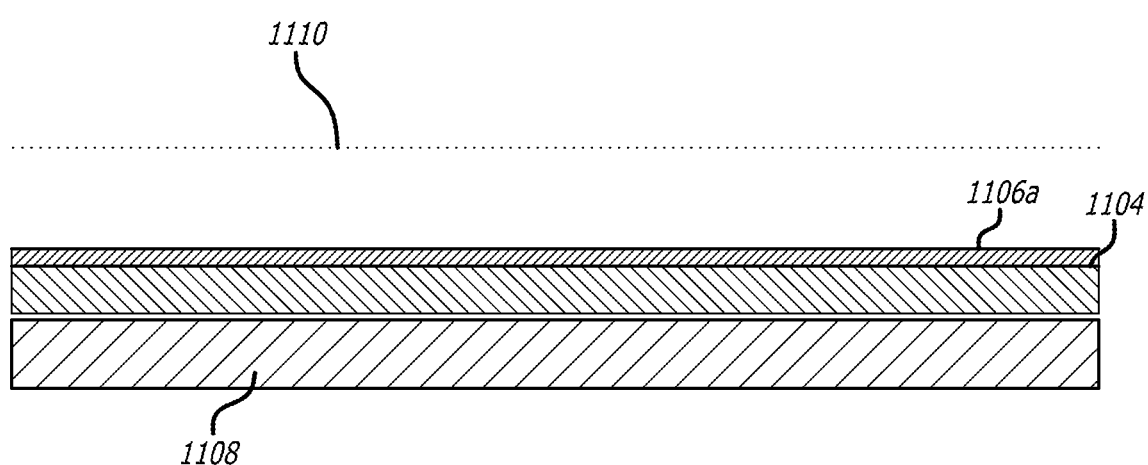

FIGS. 11A-11C illustrate various hybrid architectures including an MLA and a PSOMMA in accordance with various embodiments of the invention. In FIG. 11A, a substrate 1102 includes a PSOMMA 1104 positioned above a MLA 1106. The MLA 1106 is positioned directly above an image sensor 1108 with an air gap between. The PSOMMA 1104 may be embedded in a layer directly above the MLA 1106 within the substrate 1102. A primary image plane 1110 may reside within the substrate 1102. In some embodiments, the different microlenses of the MLA 1106 may have a different sagittas (SAGs) and different focal lengths or aspheric aspects. In some embodiments, the MLA 1106 may be implemented as a metasurface which may be used to customize various properties of the MLA 1106. In some embodiments, a metasurface lens may be used to customize aspherics on top of the MLA 1106, or to decrease aberrations from the MLA 1106.

In some embodiments, the MLA 1106 may include variable focus with different focal points across the image. The MLA 1106 may include phase-detection autofocus where part of the pupil is obscured. The MLA 1106 may have a depth from defocus in the open windows in a sparse format, or other autofocus, for example, using different MLA lenslets per color to separate different foci for autofocus calculation.

In FIG. 11B, the MLA 1106 and PSOMMA 1104 are integrated into the substrate 1102 with the MLA 1106 positioned on a surface opposite to the image sensor 1108. The primary image plane 1110 may be located above the substrate 1102. The MLA 1106 integrated with image sensor 1108 works by directing light from the primary image plane 1110 onto the underlying image sensor 1108. The primary image plane 1110 may be formed by optical components such as optical system lenses. In one configuration, the MLA 1106 takes the primary image plane 1110 and demagnifies it so that the primary object is imaged onto the active area of pixels within the image sensor 1108. The primary image plane 1110 may be the image plane formed by the optical system. The primary image plane 1110 may be distinguished from the image plane formed by the MLA 1106 within the image sensor.

The hybrid architecture of FIG. 11C, is similar to FIG. 11B however the MLA 1106a may be a planar MLA layer which may fulfill the same optical role as the MLA layer. The planar MLA layer may be a MLA including a metasurface. Further examples of polarization imaging systems including an MLA are discussed in connection with FIGS. 28A-28C, 29A-29C, 30A-30C, 31A-31B, and 32A-32C.

Example Methods of Fabrication of PSOMMA and Integration with Image Sensor

Various methods of fabrication for a PSOMMA integrated with an image sensor are have been contemplated with three specific methods described below.

Figure 12A:
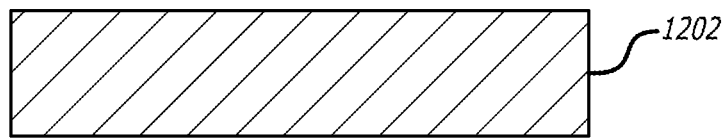
FIGS. 12A-12G illustrate various steps of the direct fabrication method in accordance with an embodiment of the invention.
Figure 12B:
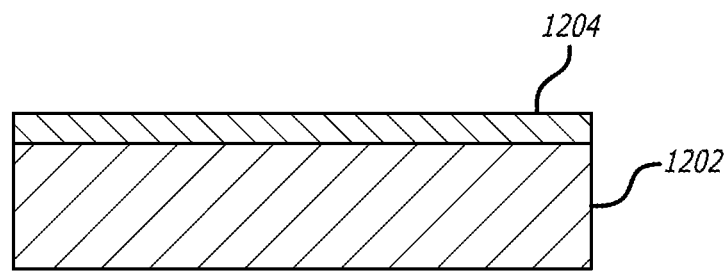
Figure 12C:
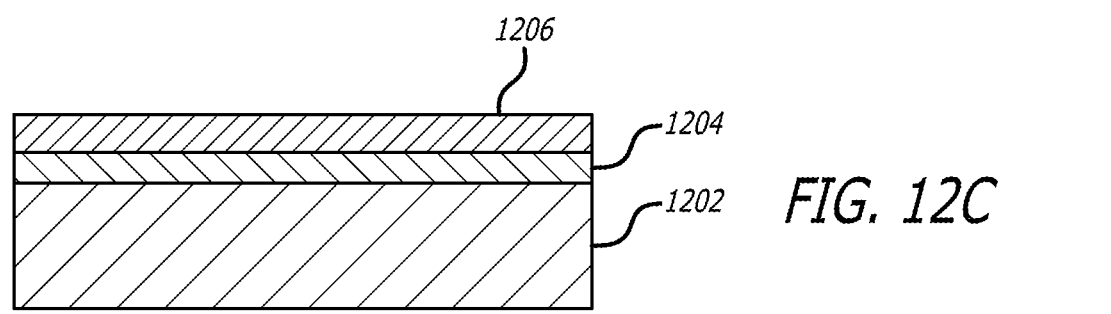
Figure 12D:
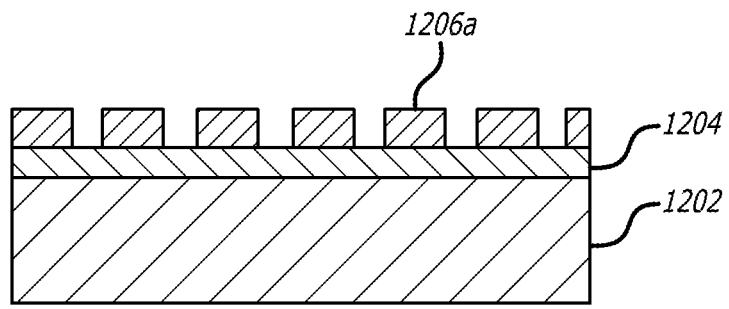
Figure 12E:
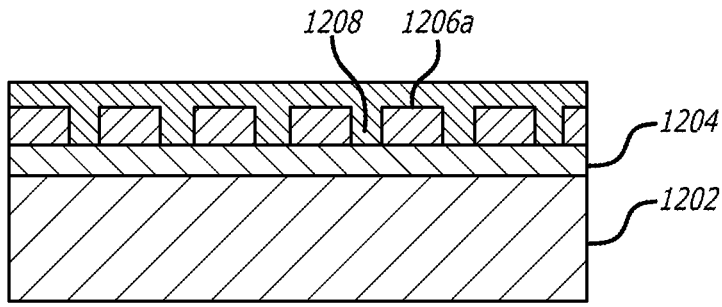
Figure 12F:
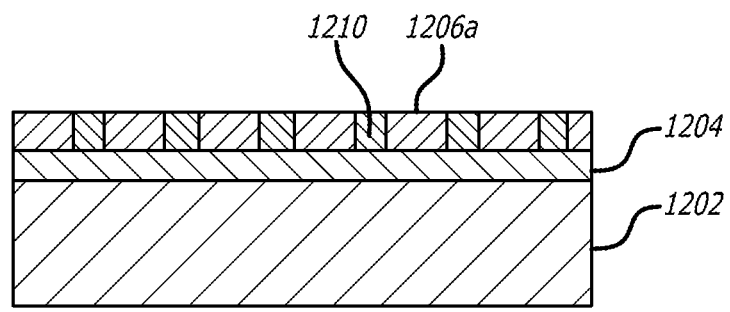
Figure 12G:
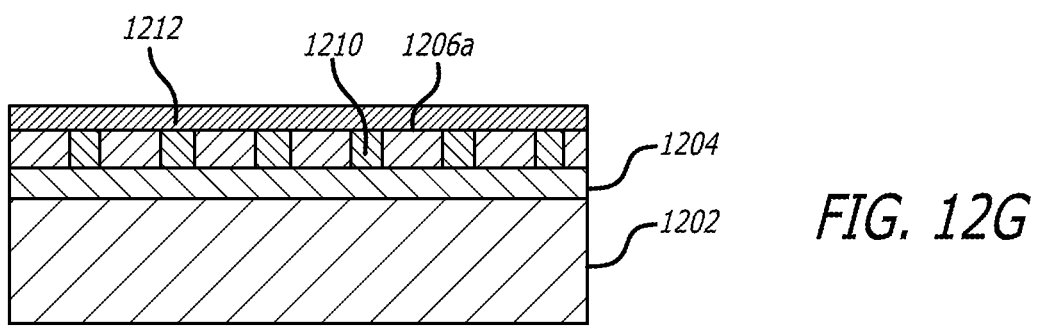

A first method is a direct fabrication of the PSOMMA on top of an image sensor. FIGS. 12A-12G illustrate various steps of the direct fabrication method in accordance with an embodiment of the invention. In FIG. 12A, an image sensor wafer 1202 with a planarized or largely planarized surface is provided. The image sensor wafer 1202 may include image sensors. In FIG. 12B, a spacer layer 1204 is deposited on the planarized surface of the image sensor wafer 1202. The thickness of the spacer layer 1204 may determine the distance between the PSOMMA and the image sensor. The spacer layer 1204 may include a dielectric material (e.g. $SiO_2$, $Si_3N_4$, etc), a polymer layer, or other suitable layer which preferably has an index of refraction less than 1.6 at the operating wavelength of the image sensor. In FIG. 12C, one or more additional layers 1206 are deposited on top of the spacer layer 1204. In FIG. 12D, the one or more additional layers 1206 are patterned and/or etched to form nanoscale pillars 1206a. Examples of nanoscale pillars are described in U.S. Pat. App. Pub. No. 2018/0341090, entitled "Atomic layer deposition process for fabricating dielectric metasurfaces for wavelengths in the visible spectrum" and filed May 22, 2018, which is hereby incorporated by reference in its entirety for all purposes. The patterning and/or etching may be performed using a photolithography process. The patterning and/or etching may include a wet or dry etching process. The nanoscale pillars 1206a may be metasurface pillars. In FIG. 12E, the nanoscale pillars 1206a may be encapsulated by an encapsulating layer 1208. In FIG. 12F, the encapsulating layer 1208 may be planarized to form a layer 1210 level with the nanoscale pillars 1206a. In FIG. 12G, one or more top layers 1212 may be deposited on the encapsulated nanoscale pillars 1206a.

A second method of PSOMMA fabrication and integration is to bond the PSOMMA metasurface to an image sensor by a wafer bonding method. FIGS. 13A-13D illustrate various steps of the wafer bonding method in accordance with an embodiment of the invention. In FIG. 13A, an image sensor wafer 1302 with a planarized or largely planarized surface is provided. In FIG. 13B, a spacer layer 1304 is deposited on the planarized surface of the image sensor wafer 1302. The thickness of the spacer layer 1304 may determine the distance between the PSOMMA and the image sensor. The spacer layer 1304 may include a dielectric material (e.g. $SiO_2$, $Si_3N_4$, etc), a polymer layer, or other suitable layer which preferably has an index of refraction less than 1.6 at the operating wavelength of the image sensor. In FIG. 13C, a second wafer 1306 including nanoscale pillars 1308 including the PSOMMA is provided. The nanoscale pillars 1308 on the second wafer 1306 may be fabricated using methods such as photolithography and/or wet or dry etching. The illustrated second wafer 1306 including nanoscale pillars 1308 is merely exemplary and other configurations are contemplated. For example, there may be layers between the second wafer 1306 and the nanoscale pillars 1308. Examples of nanoscale pillars fabricated on a substrate are described in U.S. Pat. App. Pub. No. 2019/0064532, entitled "Transmissive Metasurface Lens Integration" and filed Aug. 31, 2018, which is hereby incorporated by reference in its entirety for all purposes. The disclosed fabrication methods and various configurations of nanoscale pillars on substrates may be utilized to produce the nanoscale pillars 1308 on the second separate wafer 1306. The second wafer 1306 may include silicon, glass, polymer, and/or another suitable material. The second wafer 1306 may also have a spacer layer disposed on the front surface, either in lieu of the spacer on the first wafer, or in addition to the spacer on the image sensor wafer 1302.

After separately fabricating the image sensor wafer 1302 and second wafer 1306, the two wafers may be bonded together, using a wafer bonding method. The wafer bonding method may include adhesive bonding, direct oxide bonding, eutectic, and/or thermocompression bonding. FIG. 13D illustrates the image sensor wafer 1302 and the second wafer 1306 after the wafer bonding method. The wafers 1302, 1306 may be aligned to each other such that the individual metasurface lenslets may be aligned to the corresponding pixel on an image sensor on the image sensor wafer 1302. The alignment tolerance of the lenslets to the pixel may be a small fraction of (or equal to) the pixel size. In some embodiments the alignment tolerance of the lenslets to the pixels may be less than 10% of the pixel size. In some embodiments, the second wafer substrate 1306 may be transparent. In some embodiments the second wafer substrate 1306 may be a transparent material such as glass. In cases where the second wafer substrate 1306 is transparent, the second wafer substrate 1306 may be part of the final integrated device.

In some embodiments, the second wafer 1306 may be opaque. Examples of opaque second wafer substrates include Silicon. The second wafer substrate 1306 may be removed using methods including grinding, lapping, wet chemical etching, and/or dry chemical etching. After removal of the second wafer substrate 1306, the nanoscale pillars 1308 are transferred from the second wafer 1306 to the image sensor wafer 1302.

Figure 14A:
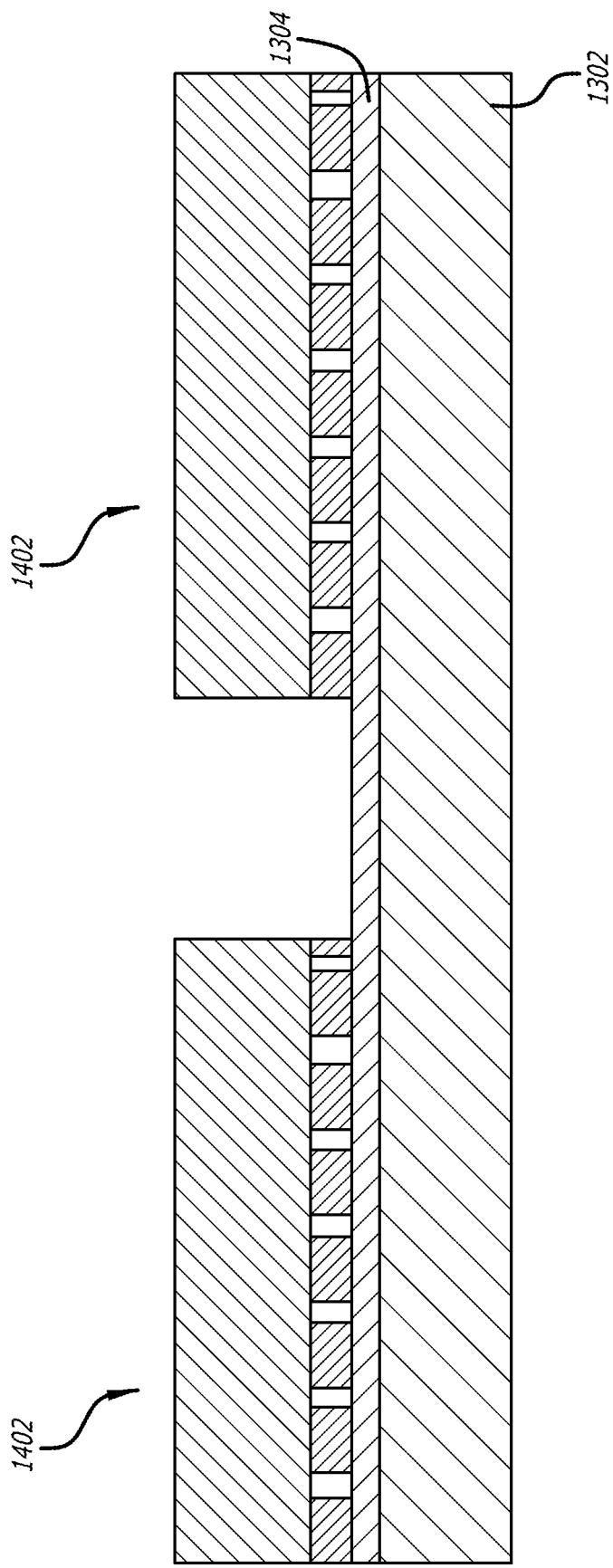
FIG. 14A illustrates multiple second wafer dies bonded to the image sensor wafer in accordance with an embodiment of the invention.

A third method of PSOMMA fabrication and integration with an image sensor is a die attach method. The steps of the die attach method begin with the same as the steps illustrated above with reference to the wafer bonding method described in connection with FIGS. 13A-13C. After fabrication of the image sensor wafer 1302 and second wafer 1306, the second wafer may be singulated into individual die. The individual singulated die may then be bonded to the image sensor wafer 1302, using a die-to-wafer bonding process. FIG. 14A illustrates multiple second wafer dies 1402 bonded to the image sensor wafer 1302 in accordance with an embodiment of the invention. Each individual second wafer die 1402 may be aligned to the appropriate features on the image sensor wafer 1302. The alignment tolerance of the lenslet to the pixel may be a small fraction of the pixel size or equal to one pixel. In some embodiments, the alignment tolerance of the lenslet to the pixel may be less than 10% of the pixel size. After bonding of the individual die to the image sensor wafer 1302, the image sensor wafer 1302 may be singulated into individual image sensor dies, resulting in fully integrated image sensor—PSOMMA sensors. FIG. 14B illustrates the image sensor dies 1404 after the image sensor wafer 1302 has ben singulated in accordance with an embodiment of the invention. In some embodiments, the second wafer dies 1402 may be bonded to previously formed individual image sensor dies, to form an integrated image sensor—PSOMMA sensor. These individual image sensor dies may be formed by singulating the larger image sensor wafer 1302 before bonding the second wafer dies 1402.

Figure 15:
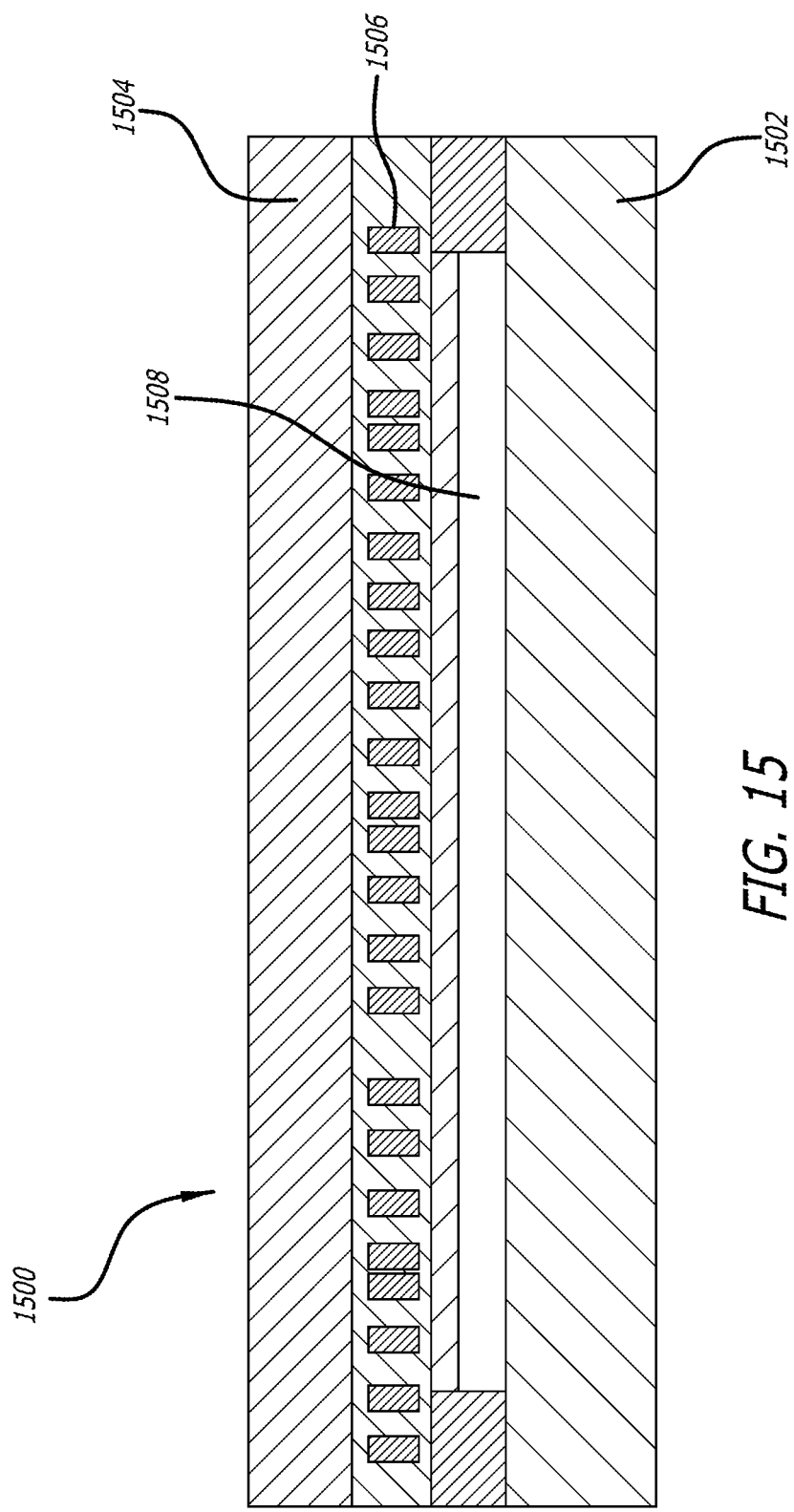
FIG. 15 illustrates an example fabricated PSOMMA sensor 1500 in accordance with an embodiment of the invention.

FIG. 15 illustrates an example fabricated PSOMMA sensor 1500 in accordance with an embodiment of the invention. The PSOMMA sensor 1500 includes a CMOS image sensor (CIS) wafer 1502. The PSOMMA sensor 1500 further includes a transparent substrate 1504. The transparent substrate 1504 may be glass. Nanopillars 1506 are positioned on the transparent substrate 1504. An air gap 1508 is positioned between the nanopillars 1506 and CIS wafer 1502 such that the nanopillars 1506 is between the air gap 1508 and the transparent substrate 1504. The air gap 1508 is between the CIS wafer 1502 and transparent substrate 1504. The air gap 1508 may include a thickness between 6 μm and 7 μm. The air gap 1508 may include a thickness between 3 μm and 4 μm. The PSOMMA sensor 1500 may include a 0.3 μm die to die or wafer to wafer overlay accuracy which may be the alignment tolerance during integration. The meta-surface lens is directing sorted polarized light to targeted image sensor pixels. Thus, the meta-surface lens needs to match/align the meta-surface lens to image sensor with a sub-pixel level accuracy. The air gap 1508 may be used to maintain planarity between the two wafers separated by less than 6 μm across the 12" distance.

In some examples, a spacer layer may be fabricated on the CIS wafer (described below in FIGS. 16A-16C). A spacer layer may also be fabricated on the nanopillars 1506 (described below in FIGS. 18A-18C). FIGS. 20A and 20B illustrate an alignment process for the CIS wafer 1602 and the nanopillars 1506.

Figure 16A:
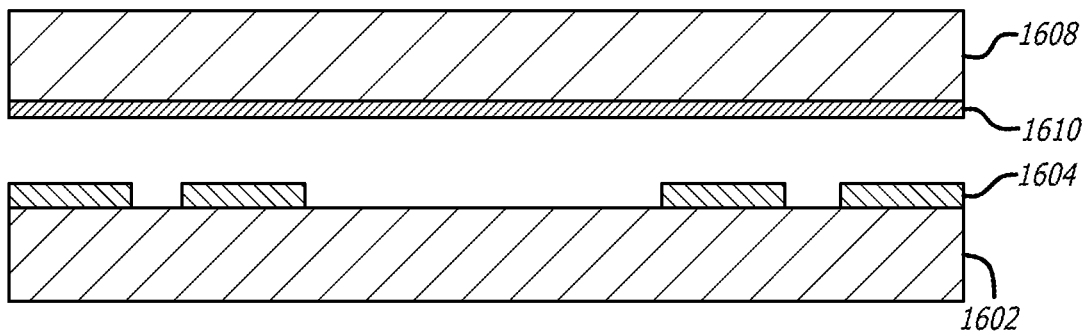
FIGS. 16A-16C illustrate an example method for producing the CIS wafer 1502 in accordance with an embodiment of the invention.
Figure 16B:
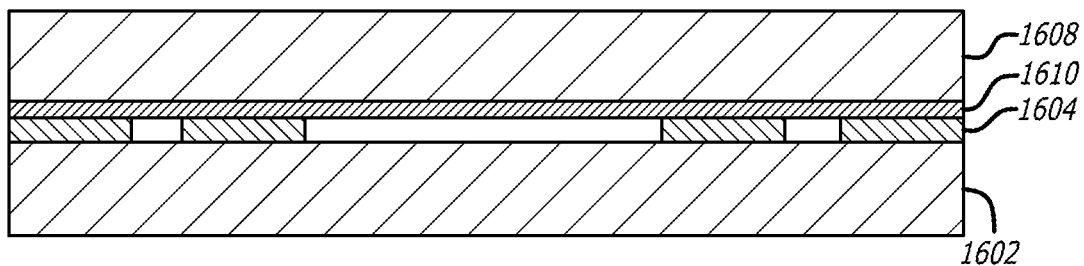
Figure 16C:
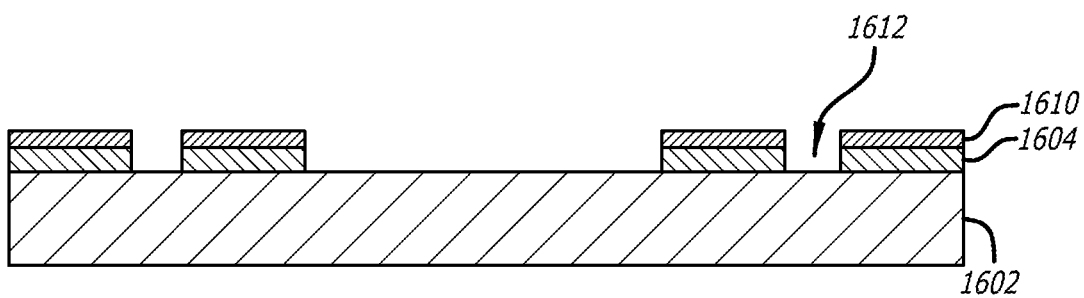

FIGS. 16A-16C illustrate an example method for producing the CIS wafer 1502 in accordance with an embodiment of the invention. In FIG. 16A, a CIS wafer 1602 is provided with a spacer layer 1604. The CIS wafer 1602 may include previously fabricated image sensors. A secondary wafer 1608 is provided with a layer of adhesive 1610. In FIG. 16B, the secondary wafer 1608 contacts the CIS wafer 1602 such that the layer of adhesive 1610 contacts the spacer layer 1604. In FIG. 16C, the secondary wafer 1608 is removed and the layer of adhesive 1610 is transferred onto the tops of the spacer layer 1604 such that the adhesive 1610a only resides on the tops of the spacer layer 1604 and not the areas between the spacer layer 1604. The spacer layer 1604 may be 6 μm thick or more. The CIS wafer 1602 may be 12 inches diameter. The secondary wafer 1608 may be 12 inches diameter. A channel 1612 may be between adjacent portions of the spacer layer 1604. The CIS wafer 1602 may include nanopillars. Examples of this adhesive transfer process is described in U.S. Pat. No. 6,669,803, entitled "Simultaneous provision of controlled height bonding material at a wafer level and associated structures" and filed Sep. 29, 2000 which is hereby incorporated by reference in its entirety for all purposes.

Figure 17:
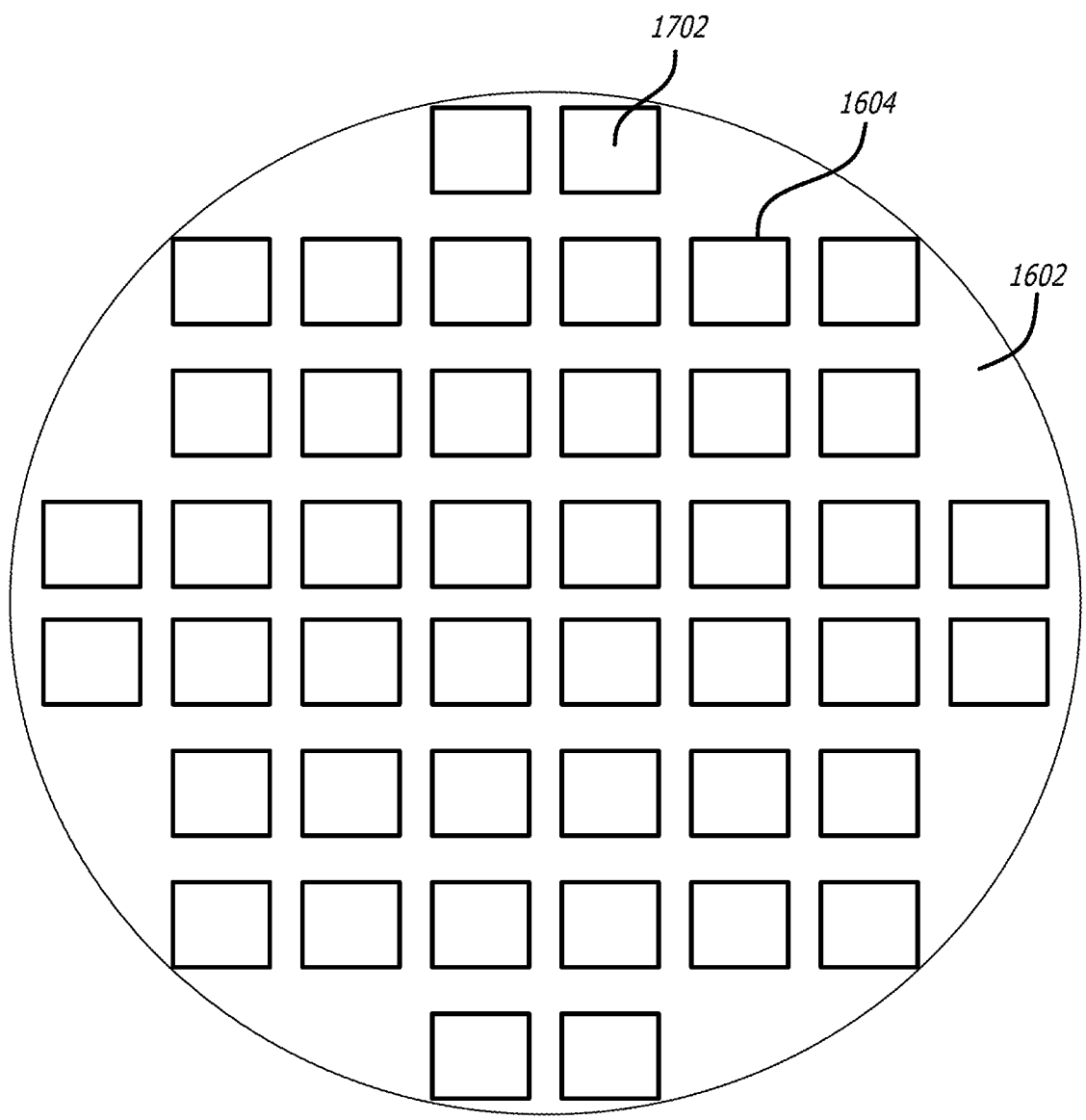
FIG. 17 illustrates a plan view of a CIS wafer 1602 in accordance with an embodiment of the invention.

FIG. 17 illustrates a plan view of a CIS wafer 1602 in accordance with an embodiment of the invention. The CIS wafer 1602 includes the spacer layer 1604. In inner portion of each of the units of the spacer layer 1604 include an imaging area 1702.

Figure 18C:
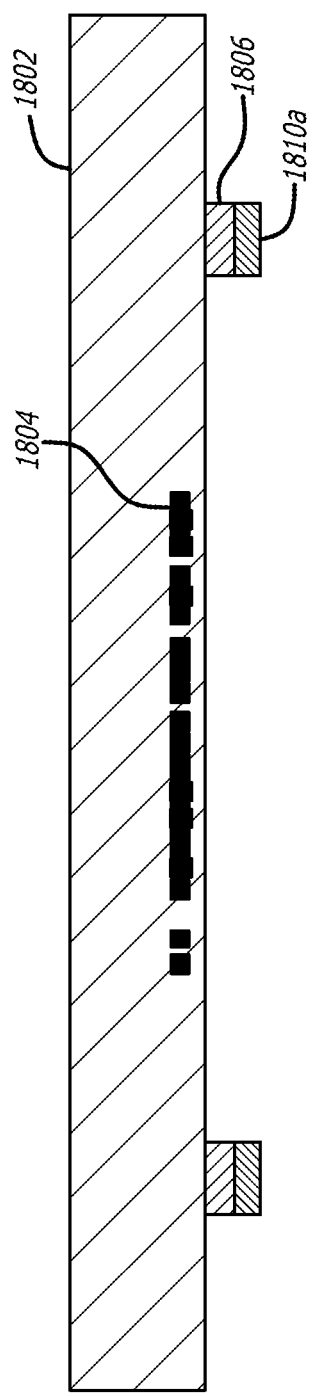

FIGS. 18A-18C illustrate an example method for producing the nanopillar wafer in accordance with an embodiment of the invention. In FIG. 18A, a nanopillar substrate 1802 includes a plurality of nanopillars 1804. A spacer layer 1806 is provided below the plurality of nanopillars 1804 such that the spacer layer 1806 is on the opposite side of the nanopillar substrate 1802. A secondary wafer 1808 is provided with a layer of adhesive 1810 directly facing the spacer layer 1806. In FIG. 18B, the secondary wafer 1808 contacts the nanopillar substrate 1802 such that the layer of adhesive 1810 contacts the spacer layer 1806. In FIG. 18C, the secondary wafer 1808 is removed and the layer of adhesive 1810 is transferred onto the tops of the spacer layer 1806 such that the adhesive 1810a only resides on the tops of the spacer layer 1806 and not the areas between the spacer layer 1806. The spacer layer 1806 may be 6 μm wide. The nanopillar substrate 1802 may be 12 inches diameter. The secondary wafer 1808 may be 12 inches diameter. The nanopillar substrate 1802 is provided with a spacer layer 1806. A secondary wafer 1808 is provided with a layer of adhesive 1810. Examples of this adhesive transfer process is described in U.S. Pat. No. 6,669,803, entitled "Simultaneous provision of controlled height bonding material at a wafer level and associated structures" and filed Sep. 29, 2000 which is hereby incorporated by reference in its entirety for all purposes.

Figure 19:
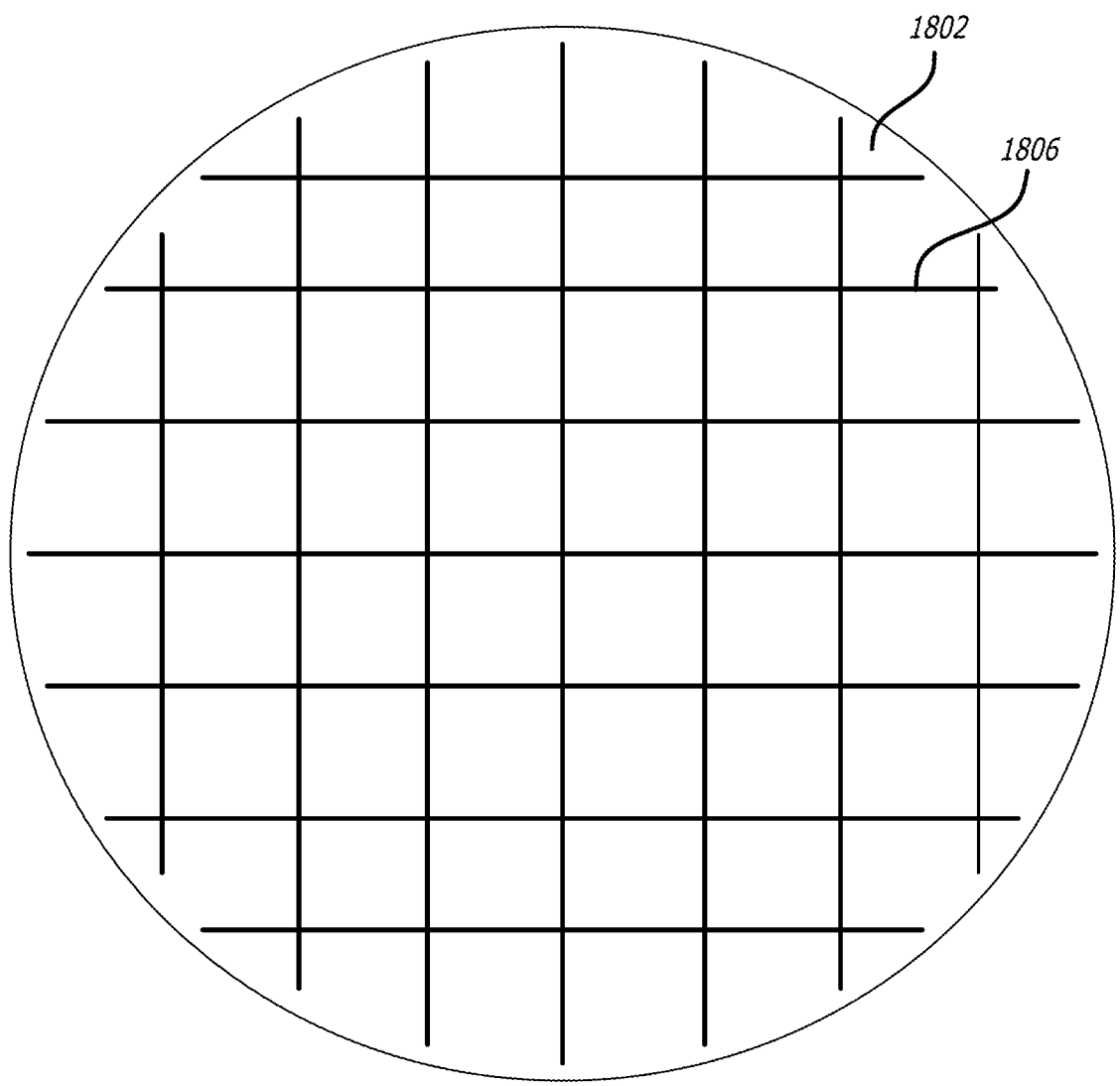
FIG. 19 illustrates a plan view of a nanopillar substrate in accordance with an embodiment of the invention.

FIG. 19 illustrates a plan view of a nanopillar substrate 1802 in accordance with an embodiment of the invention. The nanopillar substrate 1802 includes the spacer layer 1806 in a grid orientation.

FIGS. 20A and 20B illustrate an example method for fabricating a PSOMMA sensor in accordance with an embodiment of the invention. The PSOMMA sensor includes combining the nanopillar substrate 1802 of FIG. 18C with the CIS wafer 1602 of FIG. 16C. In FIG. 20A, the nanopillar substrate 1802 of FIG. 18C and the CIS wafer 1602 of FIG. 16C are positioned in proximity of each other. The spacer layer 1806 on the nanopillar substrate 1802 and the corresponding adhesive 1810a has a width 2002. the channel 1612 is between adjacent portions of the spacer layer 1604. The channel 1612 has a width 2004 larger than the width 2002 of the spacer layer 1806. In some examples, the width 2004 of the channel 1612 may be 0.6 μm larger than the width 2002 of the spacer layer 1806. In FIG. 20B the two wafers 1602 and 1802 are bonded to each other with the spacer layers 1604, 1806 interlocked precisely to achieve bonding with accurate alignment.

Figure 21A:
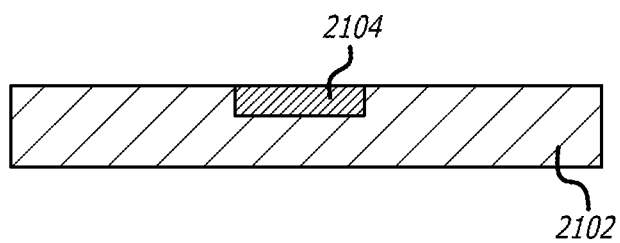
FIGS. 21A and 21B illustrate a process flow for fabricating the CIS wafer in accordance with an embodiment of the invention.
Figure 21B:
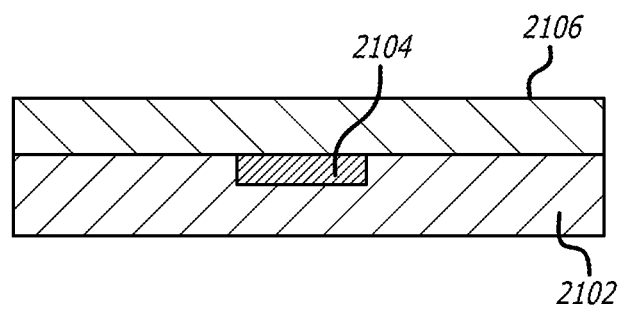

FIGS. 21A and 21B illustrate a process flow for fabricating the CIS wafer in accordance with an embodiment of the invention. In FIG. 21A, a CIS wafer 2102 including a bonding pad 2104 is provided. In FIG. 21B, a dielectric layer 2106 is deposited over the CIS wafer 2102 including the bonding pad 2104. The dielectric layer 2106 may be a $SiO_2$ layer. The dielectric layer 2106 may be deposited utilizing a plasma enhanced tetraethylorthosilicate (PETEOS) process. The dielectric layer 2106 may have a thickness of 5.5 μm. A planarization process may be utilized on the dielectric layer 2106. The planarization process may be a chemical-mechanical polishing (CMP) process.

Figure 22A:
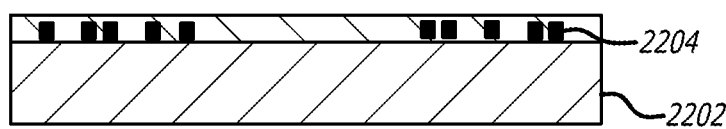
FIGS. 22A and 22B illustrate a process flow for fabricating the nanopillar wafer in accordance with an embodiment of the invention.
Figure 22B:
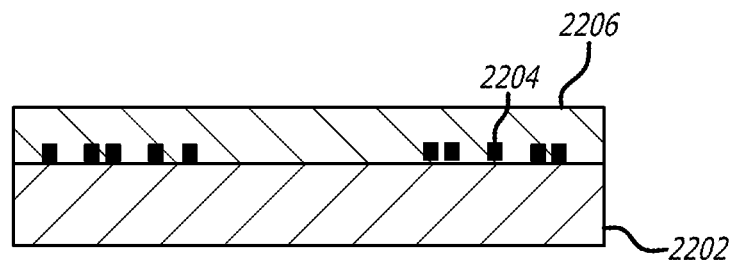

FIGS. 22A and 22B illustrate a process flow for fabricating the nanopillar wafer in accordance with an embodiment of the invention. In FIG. 22A, a nanopillar substrate 2202 is provided including nanopillars 2204. In FIG. 22B, a dielectric layer 2206 is deposited over the nanopillar substrate 2202 including the nanopillars 2204. The dielectric layer 2206 may be a $SiO_2$ layer. The dielectric layer 2206 may be deposited utilizing a plasma enhanced tetraethylorthosilicate (PETEOS) process. The dielectric layer 2206 may have a thickness of 5.5 μm. A planarization process may be utilized on the dielectric layer 2206. The planarization process may be a chemical-mechanical polishing (CMP) process.

Figure 23C:
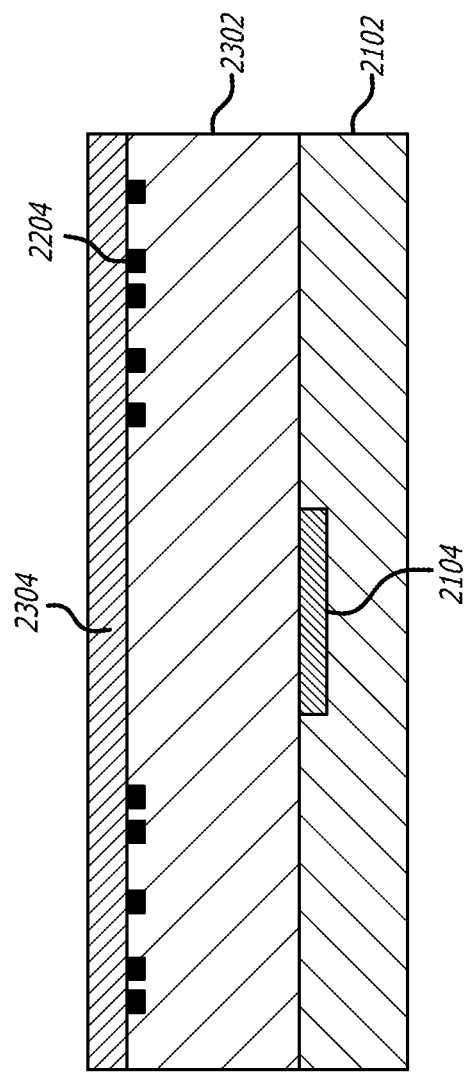

FIGS. 23A-23H is a fabrication process for fabricating an imaging sensor utilizing the CIS wafer fabricated using the process described in FIGS. 21A and 21B and the nanopillar wafer fabricated using the process described in FIGS. 22A and 22B in accordance with an embodiment of the invention. In FIG. 23A, the nanopillar substrate 2202 is bonded to the CIS wafer 2102 such that the nanopillars 2204 are separated from the bonding pad 2104 by combined dielectric layer 2302 including the dielectric layer 2106 of the CIS wafer 2102 and the dielectric layer 2206 of the nanopillar substrate 2202. Some wafer to wafer bonding machines may only handle wafers with no more than 250 μm warpage. The dielectric layer 2106 of the CIS wafer 2102 and the dielectric layer 2206 on the nanopillars 2204 deposited utilizing a tetraethylorthosilicate (TEOS) process may cause the wafers to bow which would not allow for wafer bonding. Advantageously, the planarization process on the dielectric layer 2106 of the CIS wafer 2102 and the dielectric layer 2206 on the nanopillars 2204 provides the ability to wafer bond the dielectric layer 21 the dielectric layer 2106 of the CIS wafer 2102 to the dielectric layer 2206 on the nanopillars 2204. The wafer bonding process may deliver a 200 nm alignment accuracy.

Figure 23D:
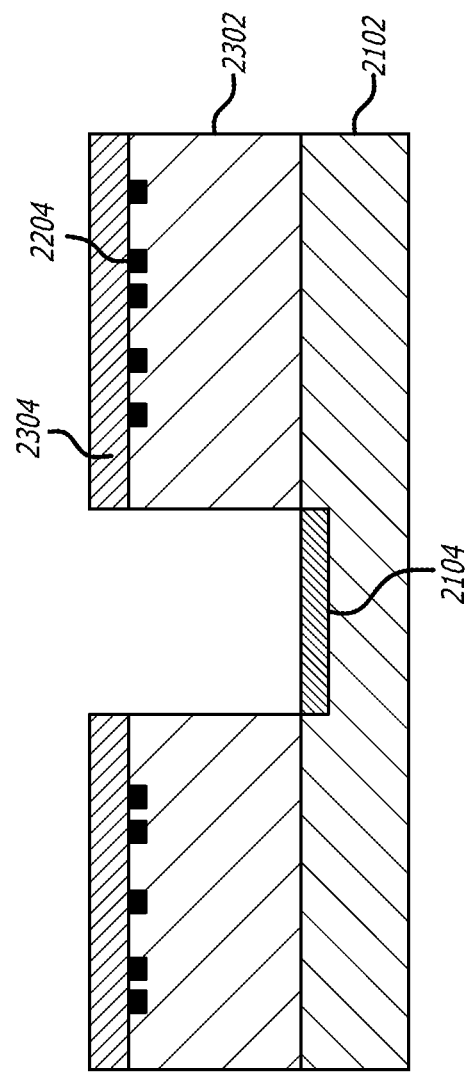
Figure 23E:
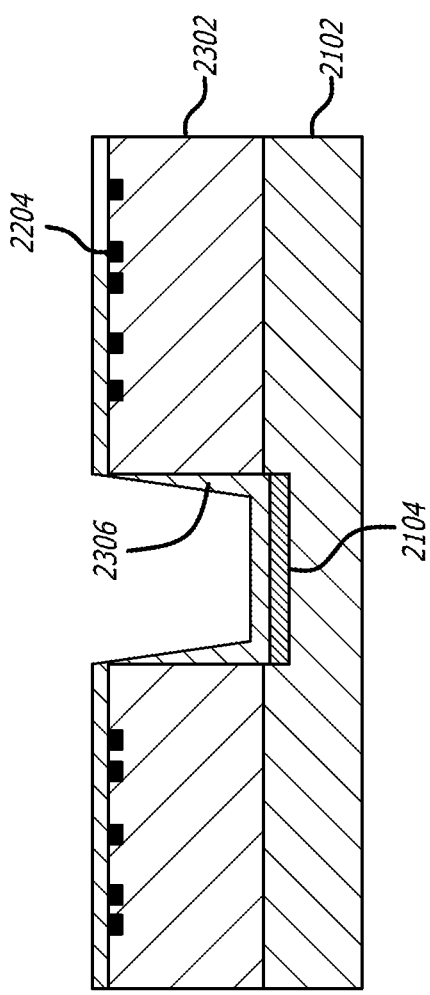
Figure 23F:
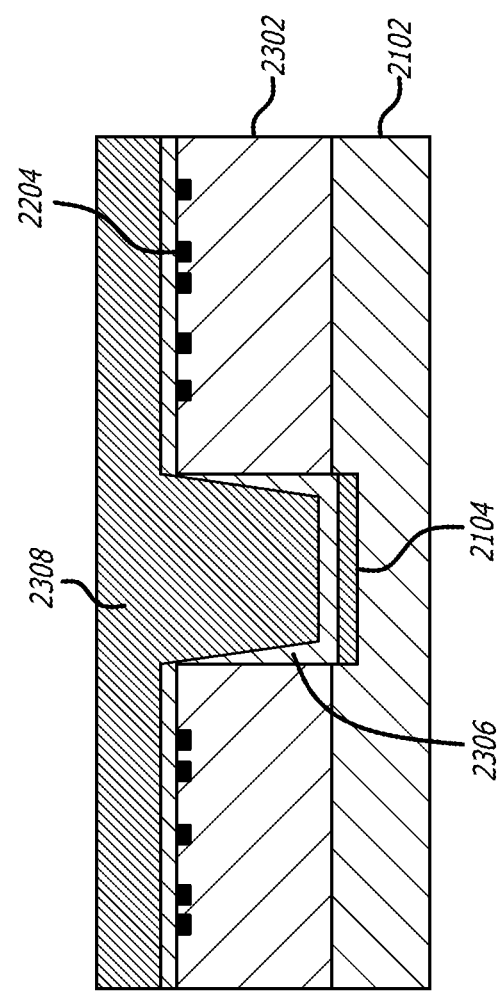
Figure 23G:
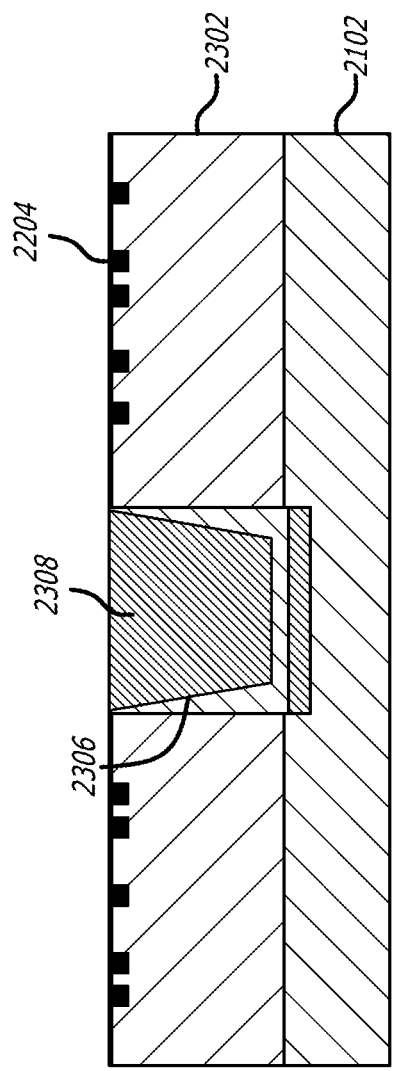
Figure 23H:
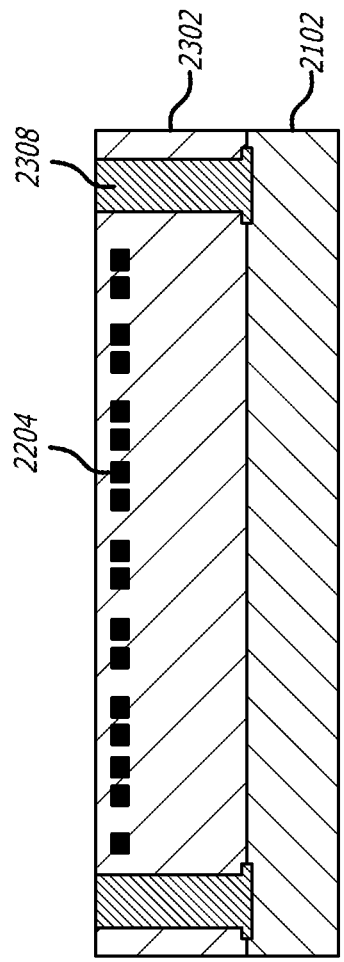

In FIG. 23B, the nanopillar substrate 2202 is removed leaving the nanopillars 2204 on the combined dielectric layer 2302. The nanopillar substrate 2202 may be removed by grinding, etching, and/or planarization (e.g. CMP). In FIG. 23C, a photoresist layer 2304 is deposited onto the nanopillars 2204. The photoresist layer may be spin coated onto the nanopillars 2204. In FIG. 23D, the photoresist layer 2304 is patterned and then the combined dielectric layer 2302 is etched exposing the bonding pad 2104. In FIG. 23E, the photoresist layer 2304 is removed and a barrier seed layer 2306 may be deposited on the bonding pad 2104, the sidewalls of the combined dielectric layer 2302, and the nanopillars 2204. In some embodiments, the barrier seed layer 2306 may be omitted. In FIG. 23F, a conductive layer 2308 is deposited over the barrier seed layer 2306. The conductive layer 2308 may be a copper (Cu) layer. The conductive layer 2308 may be deposited using a electrochemical plating (ECP) process. In FIG. 23G, the conductive layer 2308 is planarized to the nanopillars 2204. The planarization process may be a CMP process. In FIG. 23H, a chip on board (COB) process is performed. The COB process may be wire bonding the sensor directly to a printed circuit which may be a printed circuit board. The printed circuit board may be flexible.

Figure 24A:
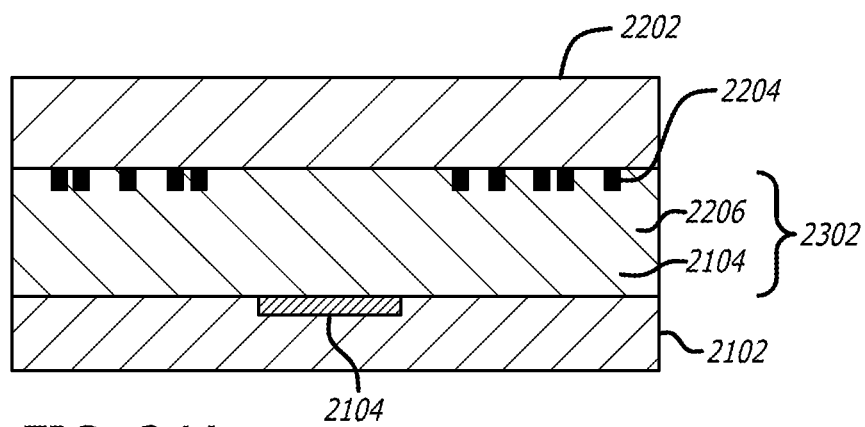
FIGS. 24A-24C is a fabrication process for fabricating an imaging sensor utilizing the CIS wafer fabricated using the process described in FIGS. 21A and 21B and the nanopillar wafer fabricated using the process described in FIGS. 22A and 22B in accordance with an embodiment of the invention.
Figure 24B:
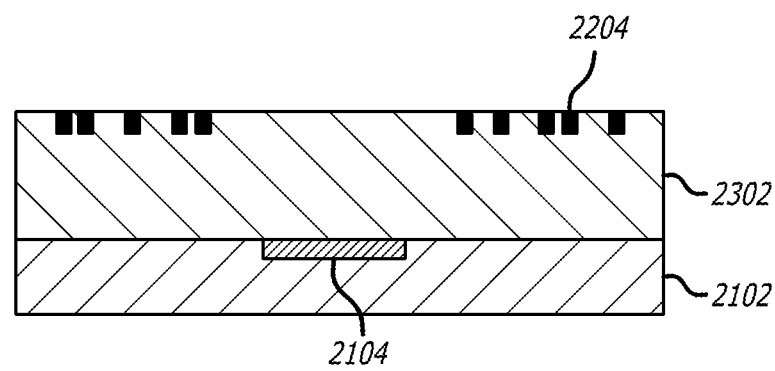
Figure 24C:
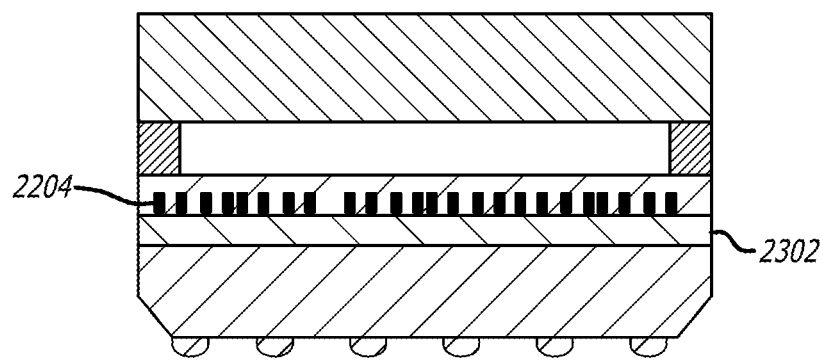

FIGS. 24A-24C is a fabrication process for fabricating an imaging sensor utilizing the CIS wafer fabricated using the process described in FIGS. 21A and 21B and the nanopillar wafer fabricated using the process described in FIGS. 22A and 22B in accordance with an embodiment of the invention. FIGS. 24A and 24B correspond to the steps of FIGS. 23A and 23B. The description of these steps in FIGS. 23A and 23B are relevant to the steps of FIGS. 24A and 24B. In FIG. 24C, a through silicon via (TSV) process is performed. Instead of wire bonding to the bond pads on the front surface of the chip, holes may be formed from the back side of the chip/wafer to reach the bond pads on the front side, and then the meta wires may be bonded directly from the hole using solder balls on the back of the wafer to achieve chip scale packaging. In this case, there may not be open bonding pads in the front.

Figure 25A:
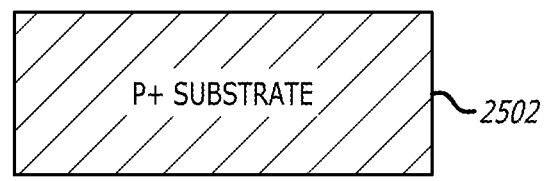
FIGS. 25A-25H is a fabrication process for fabricating an imaging sensor in accordance with an embodiment of the invention.
Figure 25B:
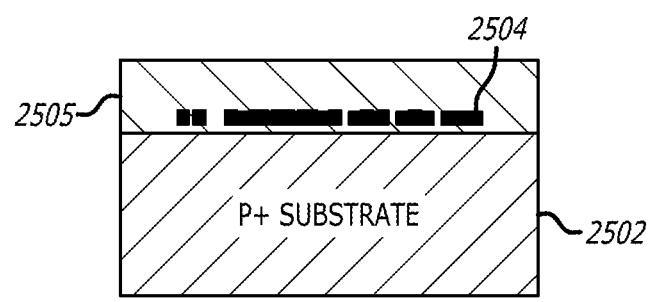
Figure 25C:
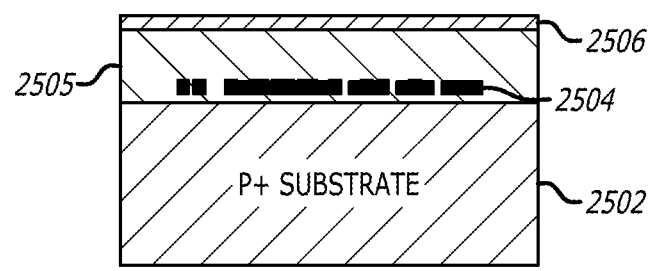

FIGS. 25A-25H is a fabrication process for fabricating an imaging sensor in accordance with an embodiment of the invention. In FIG. 25A, a P-type substrate 2502 is provided. The P-type substrate 2502 may be highly doped with a P-type dopant. In FIG. 25B, a nanopillar layer 2505 may be formed on the P-type substrate 2502. The nanopillar layer 2505 includes embedded nanopillars 2504. In FIG. 25C, a crystalline layer 2506 is grown on top of the nanopillar layer 2505. The crystalline layer 2506 may be a P-type layer including P-type dopants. The crystalline layer 2506 may be grown utilizing an epitaxial growth.

Figure 25D:
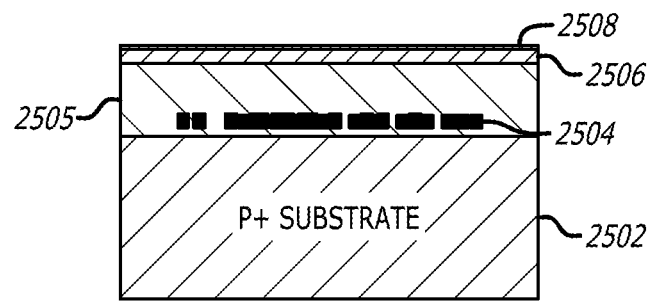
Figure 25E:
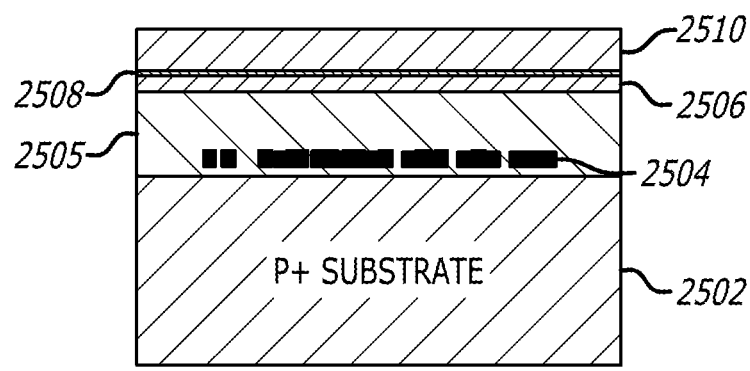
Figure 25F:
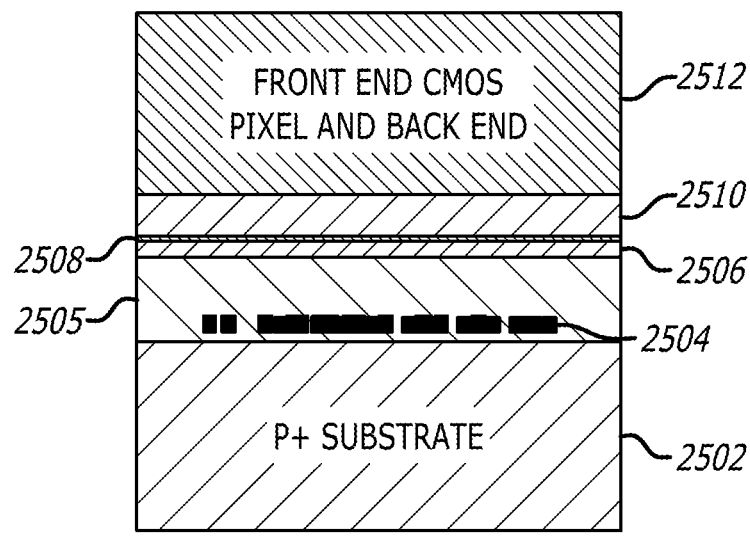
Figure 25G:
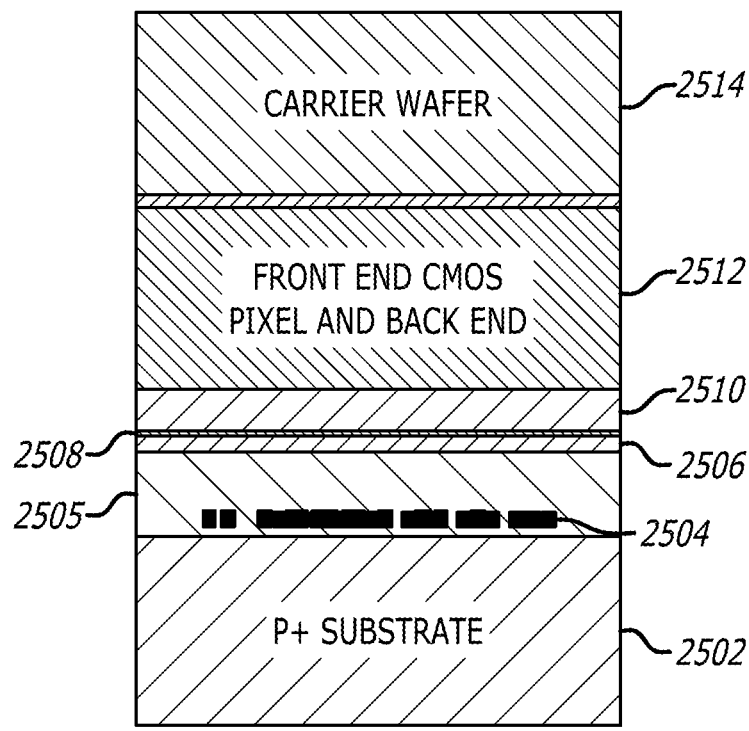
Figure 25H:
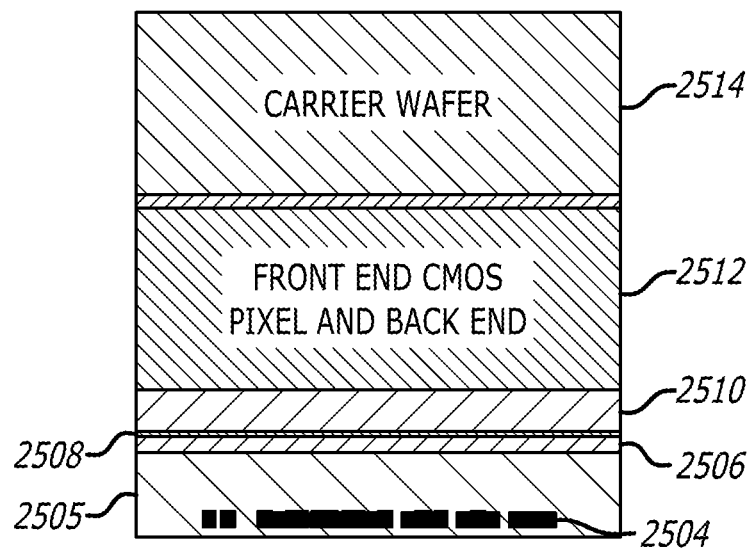

In FIG. 25D, a P-type doping process is performed which produces a highly P-type doped layer 2508 on the crystalline layer 2506. The P-type doping process may be an implant process (e.g. an ion implant process). In FIG. 25E, another crystalline layer 2510 is grown on top of the highly P-type doped layer 2508. The crystalline layer 2510 may be grown utilizing an epitaxial growth. In FIG. 25F, a CMOS layer 2512 may be formed on the crystalline layer 2510. The CMOS layer 2512 may be a front side circuitry made with a typical CMOS process. The crystalline layer 2510 may be he foundational layer for the CMOS layer 2512. In FIG. 25G, the device is bonded (e.g. wafer bonded) to a carrier wafer 2514 where the CMOS layer 2512 directly contacts the carrier wafer. In FIG. 25H, the P-type substrate 2502 is removed. The P-type substrate 2502 may be removed via grinding, lapping, wet chemical etching, and/or dry chemical etching.

Various Example PSOMMA Configurations

Figure 26:
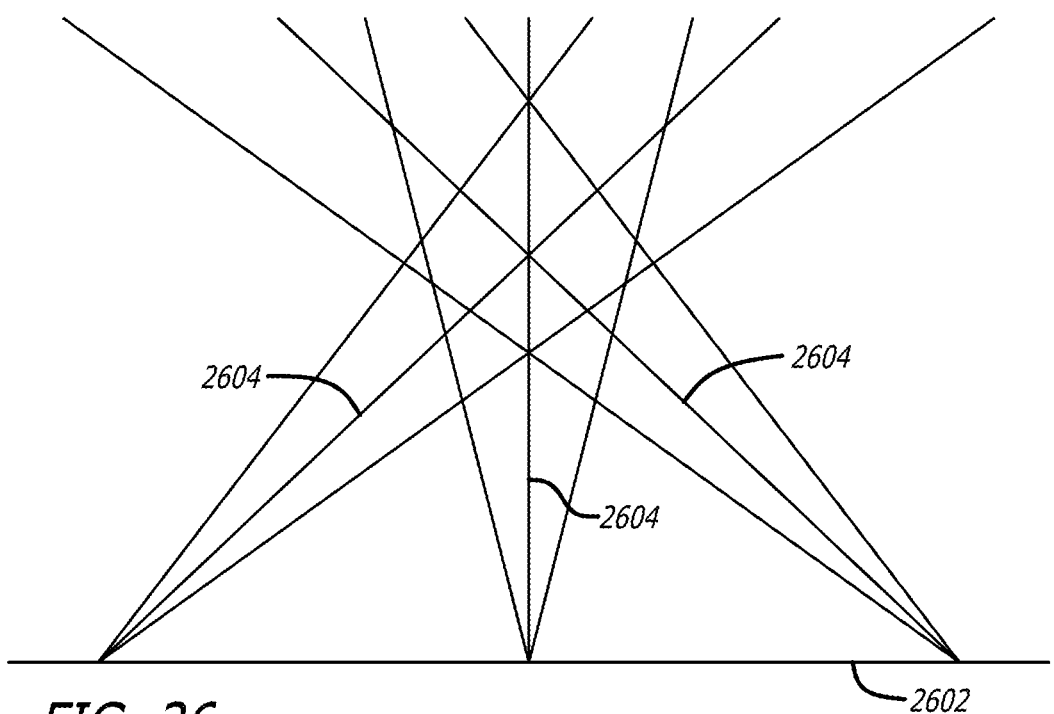
FIG. 26 illustrates an example operation for an example metasurface microlens array (MLA) in accordance with an embodiment of the invention.

FIG. 26 illustrates an example operation for an example metasurface microlens array (MLA) in accordance with an embodiment of the invention. This design accounts for variation of angle with MLA position. The light entering from the metasurface MLA 2602 includes a chief ray angle (CRA) 2604 from imaging optics or an aperture which may vary at the plane of the metasurface MLA 2602. This variation can be calculated or measured to give the CRA 2604 as a function of angle and/or location on the MLA, for example as a distance from the center of the MLA. Traditional refractive MLAs may not account for this variation in angle. The traditional refractive MLAs may be designed to only work well or efficiency optically for a CRA of zero degrees. Whereas, each metasurface lenslet of the metasurface MLA 2602 is optimized for a specific area of illumination (AOI). In traditional refractive MLAs, each lenslet may include aspheric terms or more complicated phase functions. This approach for traditional refractive MLAs would include multiple refractive lenses/prisms which would add complexity. Thus metasurface MLAs allow for a solution which includes a varied CRA 2604 which may not be easily attainable using traditional refractive MLAs.

Figure 27A:
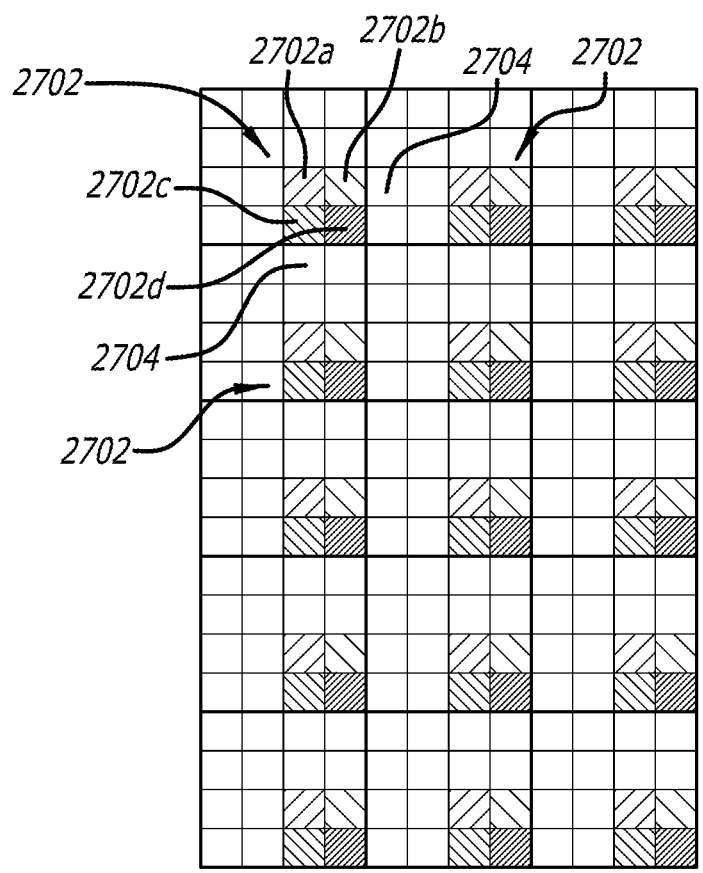
FIG. 27A illustrates an example pixel arrangement for four polarization pixels in accordance with an embodiment of the invention.

FIG. 27A illustrates an example pixel arrangement for four polarization pixels in accordance with an embodiment of the invention. The pixel arrangement includes multiple sets of polarization pixels 2702 including a first pixel 2702a, a second pixel 2702b, a third pixel 2702c, and a fourth pixel 2702d with different polarizations. There are one or more normal pixels 2704 which separate adjacent sets of polarization pixels 2702. The normal pixels 2704 are non-polar and/or non-splitting pixels which are essentially blank or simply optically powered for focus or filtering. In some embodiments, the number of normal pixels 2704 between adjacent sets of polarization pixels 2702 may be more or less than those illustrated.

Figure 27B:
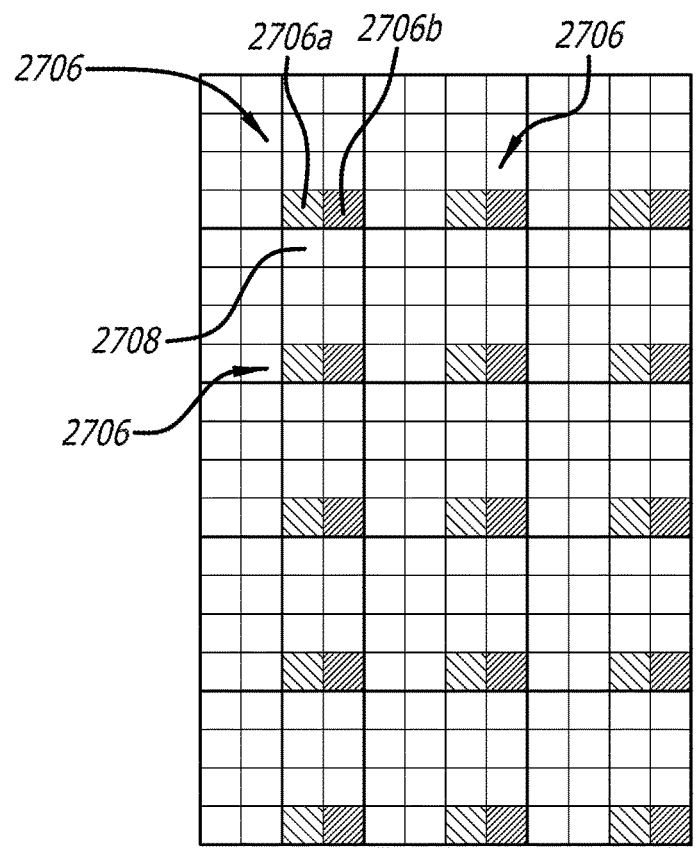
FIG. 27B illustrates an example pixel arrangement for two polarization pixels in accordance with an embodiment of the invention.

FIG. 27B illustrates an example pixel arrangement for two polarization pixels in accordance with an embodiment of the invention. The pixel arrangement includes multiple sets of polarization pixels 2706 including a first pixel 2706a and a second pixel 2706b with different polarizations. The first pixel 2706a and the second pixel 2706b may include orthogonal polarizations. The sets of polarization pixels 2706 may not be the same pairs. For example, some pairs of the sets of polarization pixels 2706 can probe S1 polarization, some can probe S2 polarization, some can probe S3 polarization. In some embodiments, depending on transmission polarization, such as a static polarization illumination or a known polarization illumination sources, the probe polarizations may be consistent with such transmission polarization source or sources. There are one or more normal pixels 2708 which separate adjacent sets of polarization pixels 2706. In some embodiments, the number of normal pixels 2708 between adjacent sets of polarization pixels 2706 may be more or less than those illustrated.

There may be a microlens arrays (MLA) including different microlens associated with each of the pixels. The microlenses of the normal pixels 2704, 2708 and for the polarization pixels within the sets of polarization pixels 2702, 2706 may have the same primary image plane. Because the aperture of the polarization pixels within the sets of polarization pixels 2702, 2706 may be different between the four polarization pixel arrangement of FIG. 27A and the two polarization pixel arrangement of FIG. 27B, the f-number may be different for different microlens arrays for the four polarization pixel arrangement of FIG. 27A and the two polarization pixel arrangement of FIG. 27B. In some embodiments, the MLA may be a metasurface or a refractive lens array. The MLA functionality can be implemented differently for the polarization pixel than for the regular pixel. There may be an open, non-polar, simple powered, or filtered optical element over the regular pixel. The MLA may include multiple different focal length lenslets for depth by defocus.

Figure 27C:
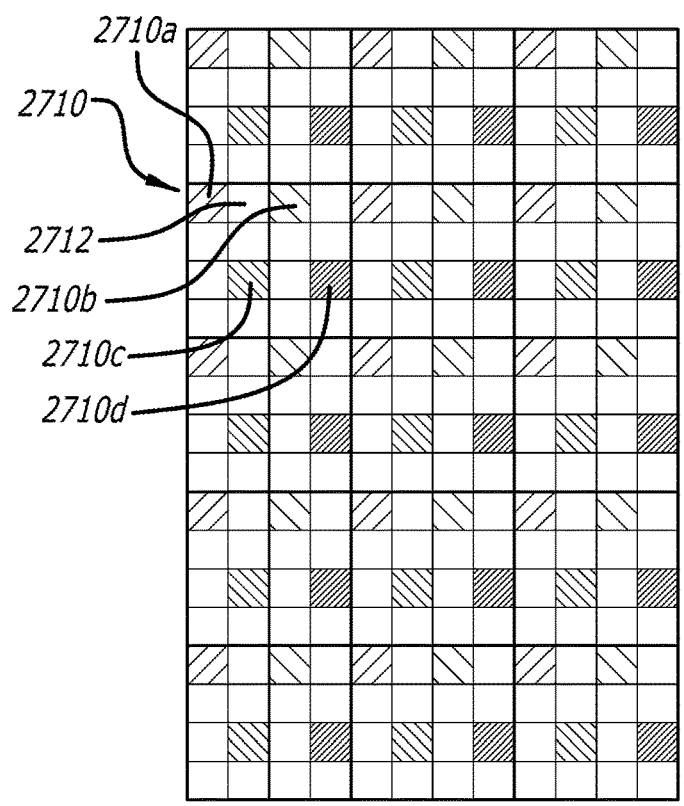
FIG. 27C illustrates an example an example pixel arrangement for four polarization pixels in accordance with an embodiment of the invention.

FIG. 27C illustrates an example an example pixel arrangement for four polarization pixels in accordance with an embodiment of the invention. The pixel arrangement includes multiple sets of polarization pixels 2710 including a first pixel 2710a, a second pixel 2710b, a third pixel 2710c, and a fourth pixel 2710d with different polarizations. There are one or more normal pixels 2712 which separate the first pixel 2710a, the second pixel 2710b, the third pixel 2710c, and the fourth pixel 2710d. In some embodiments, the number of normal pixels 2712 between adjacent sets of polarization pixels 2702 may be more or less than those illustrated. The sets of polarization pixels 2710 may be also separated by one or more normal pixels 2712.

The designs described in connection with FIGS. 27A-27C may be utilized in a sorting or filtering implementation as described below.

FIG. 28A is a cross-sectional view of an imaging device including polarization splitting capability in accordance with an embodiment of the invention. As illustrated, the imaging device includes a microlens 2802 which directs light 2803 into a polarization splitting metasurface 2804. The microlens 2802 may be part of a microlens array. The polarization splitting metasurface 2804 splits the light 2803 into a first polarization light 2806a and a second polarization light 2806b. The first polarization light 2806a and the second polarization light 2806b may have orthogonal polarizations. An image sensor including a first region 2808a and a second region 2808b is positioned below the polarization splitting metasurface 2804. The first polarization light 2806a is directed into the first region 2808a and the second polarization light 2806b is directed into the second region 2808b. The microlens 2802 is offset from the first region 2808a and the second region 2808b such that the center of the microlens 2802 is between the first region 2808a and the second region 2808b.

Each microlens 2802 may cover at least half of the first region 2808a and the second region 2808b with the overlapping metasurface lenslet 2804 between to diffract the first polarization light 2806a into the first direction into the first region and the second polarization light 2806b into the second direction into the second region. The first polarization light 2806a may be an orthogonal polarization to the second polarization light 2806b.

FIG. 28B is a plan view of an imaging device including polarization splitting capability in accordance with an embodiment of the invention. The imaging device includes the microlens and the polarization splitting metasurface described in connection with FIG. 28A. The polarization splitting metasurface splits light into a first polarization light 2810a, a second polarization light 2810b, a third polarization light 2810c, and a fourth polarization light 2810d. The imaging device includes an image sensor including a first region 2812a, a second region 2812b, a third region 2812c, and a fourth region 2812d. The first polarization light 2810a is directed into the first region 2812a, the second polarization light 2810b is directed into the second region 2812b, the third polarization light 2810c is directed into the third region 2812c, and the fourth polarization light 2810d is directed into the fourth region 2812d.

FIG. 28C is a plan view of an imaging device including polarization splitting capability in accordance with an embodiment of the invention. The imaging device includes a first polarization splitting portion 2814a, a second polarization splitting portion 2814b, and a third polarization splitting portion 2814c which are each structured similarly to the imaging device described in connection with FIG. 28A. As illustrated, in each of the first polarization splitting portion 2814a, the second polarization splitting portion 2814b, and the third polarization splitting portion 2814c, split light such that different polarizations are split into different directions. Each of the first polarization splitting portion 2814a, the second polarization splitting portion 2814b, and the third polarization splitting portion 2814c may operate on different polarizations. For example, the first polarization splitting portion 2814a may split light into a first polarization and a second polarization whereas the second polarization splitting portion 2814b into a third polarization and a fourth polarization.

FIG. 29A is a cross-sectional view of an imaging device including polarization splitting capability in accordance with an embodiment of the invention. As illustrated, the imaging device includes an array of microlens 2902a, 2902b which directs light 2903 into a polarization splitting metasurface 2904. The polarization splitting metasurface 2904 splits the light 2903 into a first polarization light 2906a and a second polarization light 2906b. The first polarization light 2906a and the second polarization light 2906b may have orthogonal polarizations. An image sensor including a first region 2908a and a second region 2908b is positioned below the polarization splitting metasurface 2904. The first polarization light 2906a is directed into the first region 2908a and the second polarization light 2906b is directed into the second region 2908b. The light from multiple metalenses 2902a, 2902b may be split in different portions of the polarization splitting metasurface 2904 such that the first polarization light 2906a is directed into the first region 2908a and the second polarization light 2906b is directed into the second region 2908b. As illustrated, in some portions of the polarization splitting metasurface 2904, the first polarization light 2906a may be zero-order light which passes through the polarization splitting metasurface 2904 and the second polarization light 2906b may be diffracted light which is redirected in a different direction. In other portions of the polarization splitting metasurface 2904, the second polarization light 2906b may be zero-order light which passes through the polarization splitting metasurface 2904 and the first polarization light 2906a may be diffracted light which is redirected in a different direction. One microlens 2902a is centered with the first region 2908a. One microlens 2902b is centered with the second region 2908b.

FIG. 29B is a plan view of an imaging device including polarization splitting capability in accordance with an embodiment of the invention. The imaging device includes the microlens and the polarization splitting metasurface described in connection with FIG. 29A. However, the polarization splitting metasurface splits light into a first polarization light 2910a, a second polarization light 2910b, a third polarization light 2910c, and a fourth polarization light 2910d (vertical direction). As illustrated, the polarization splitting metasurface splits each polarization light in a different direction with the fourth polarization light 2910d being zero-order light which passes through the polarization splitting metasurface 2904. The imaging device includes an image sensor including a first region 2912a, a second region 2912b, a third region 2912c, and a fourth region 2912d. Different portions of the polarization splitting metasurface split light such that the all of the first polarization light 2910a goes into the first region 2912a, the second polarization light 2910b goes into the second region 2912b, the third polarization light 2910c goes into the third region 2912c, and the fourth polarization light 2910d goes into the fourth region 2912d.

FIG. 29C is a plan view of an imaging device including polarization splitting capability in accordance with an embodiment of the invention. The imaging device includes a first polarization splitting portion 2914a, a second polarization splitting portion 2914b, and a third polarization splitting portion 2914c which are each structured similarly to the imaging device described in connection with FIG. 29A. As illustrated, in each of the first polarization splitting portion 2914a, the second polarization splitting portion 2914b, and the third polarization splitting portion 2914c, the light is split such that different polarizations are split into different directions. Each of the first polarization splitting portion 2914a, the second polarization splitting portion 2914b, and the third polarization splitting portion 2914c may operate on different polarizations. For example, the first polarization splitting portion 2914a may split light into a first polarization and a second polarization whereas the second polarization splitting portion 2914b into a third polarization and a fourth polarization.

Figure 30B:
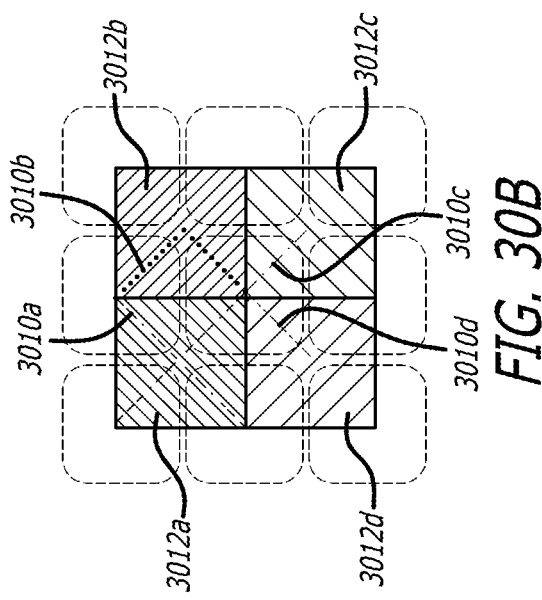
FIG. 30B illustrates a plan view of an imaging device including polarization splitting capability in accordance with an embodiment of the invention.
Figure 30A:
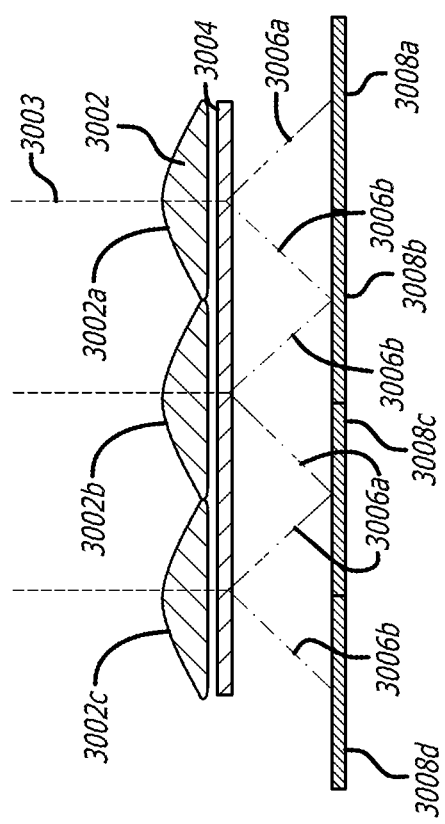
FIG. 30A illustrates a cross-sectional view of an imaging device including polarization splitting capability in accordance with an embodiment of the invention.

FIG. 30A illustrates a cross-sectional view of an imaging device including polarization splitting capability in accordance with an embodiment of the invention. The device functions similar to the device described in connection with FIG. 28A. As illustrated, the imaging device includes an array of microlens 3002a, 3002b, 3002c which directs light 3003 into a polarization splitting metasurface 3004. The polarization splitting metasurface 3004 splits the light 3003 into a first polarization light 3006a and a second polarization light 3006b. The first polarization light 3006a and the second polarization light 3006b may have orthogonal polarizations. An image sensor including a first region 3008a, a second region 3008b, a third region 3008c, and a fourth region 3008d is positioned below the polarization splitting metasurface 3004. The first polarization light 3006a is directed into the first region 3008a and the second polarization light 3006b is directed into the second region 3008b. Adjacent portions of the polarization splitting metasurface 3004 have opposite oriented splitting capabilities such that the second polarization light 3006b from the adjacent portions of the polarization splitting metasurface 3004 are directed into the second region 3008b. The polarization splitting metasurface 3004 continues to repeat such that the first polarization light 3006a is directed into the third region 3008c and the second polarization light 3006b is directed into the fourth region 3008d. One microlens 3002a is offset from the first region 3008a and the second region 3008b such that the center of the microlens 3002a is between the first region 3008a and the second region 3008b. One microlens 3002b is offset from the second region 3008b and the third region 3008c such that the center of the microlens 3002b is between the second region 3008b and the third region 3008c. One microlens 3002c is offset from the third region 3008c and the fourth region 3008d such that the center of the microlens 3002 is between the third region 3008c and the fourth region 3008d.

FIG. 30B illustrates a plan view of an imaging device including polarization splitting capability in accordance with an embodiment of the invention. The imaging device includes the microlens and the polarization splitting metasurface described in connection with FIG. 30A. However, the polarization splitting metasurface splits light into a first polarization light 3010a, a second polarization light 3010b, a third polarization light 3010c, and a fourth polarization light 3010d. The imaging device includes an image sensor including a first region 3012a, a second region 3012b, a third region 3012c, and a fourth region 3012d. The first polarization light 3010a is directed into the first region 3012a, the second polarization light 3010b is directed into the second region 3012b, the third polarization light 3010c is directed into the third region 3012c, and the fourth polarization light 3010d is directed into the fourth region 3012d.

Figure 30C:
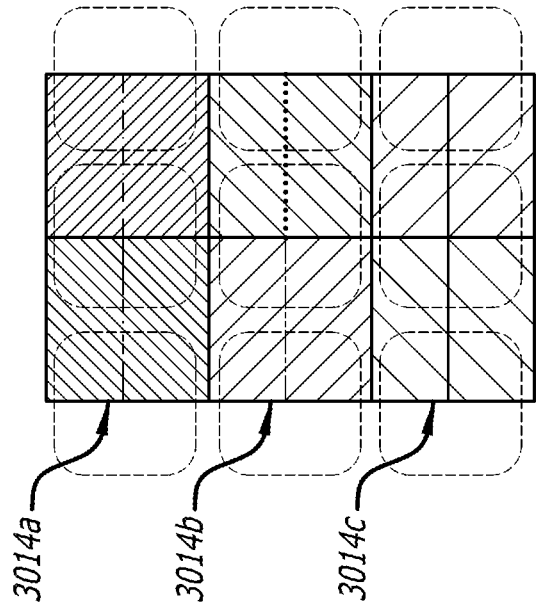
FIG. 30C is a plan view of an imaging device including polarization splitting capability in accordance with an embodiment of the invention.

FIG. 30C is a plan view of an imaging device including polarization splitting capability in accordance with an embodiment of the invention. The imaging device includes a first polarization splitting portion 3014a, a second polarization splitting portion 3014b, and a third polarization splitting portion 3014c which are each structured similarly to the imaging device described in connection with FIG. 30A. As illustrated, in each of the first polarization splitting portion 3014a, the second polarization splitting portion 3014b, and the third polarization splitting portion 3014c, split light such that different polarizations are split into different directions. Each of the first polarization splitting portion 3014a, the second polarization splitting portion 3014b, and the third polarization splitting portion 3014c may operate on different polarizations. For example, the first polarization splitting portion 3014a may split light into a first polarization and a second polarization whereas the second polarization splitting portion 3014b into a third polarization and a fourth polarization.

FIG. 31A illustrates a cross-sectional view of an imaging device including a polarization filtering capability in accordance with an embodiment of the invention. As illustrated, the imaging device includes an array of microlens 3102a, 3102b which directs light 3103 into a polarization filtering metasurface 3104. A portion of the polarization filtering metasurface 3104 is configured to transmit a first polarization light 3106a. A portion of the polarization filtering metasurface 3104 is configured to transmit a second polarization light 3106b. An image sensor including a first region 3108a and a second region 3108b is positioned below the polarization splitting metasurface 3104. The first polarization light 3106a is directed into the first region 3108a and the second polarization light 3106b is directed into the second region 3108b. One microlens 3102a is aligned with the first region 3108a and one microlens 3102b is aligned with the second region 3108b.

FIG. 31B illustrates a plan view of an imaging device including a polarization filtering capability in accordance with an embodiment of the invention. The imaging device includes the microlens and the polarization filtering metasurface described in connection with FIG. 30A. However, different portions of the polarization filtering metasurface splits light into a first polarization light 3110a, a second polarization light 3110b, a third polarization light 3110c, and a fourth polarization light 3110d. The imaging device includes an image sensor including a first region 3112a, a second region 3112b, a third region 3112c, and a fourth region 3112d. The first polarization light 3110a is directed into the first region 3112a, the second polarization light 3110b is directed into the second region 3112b, the third polarization light 3110c is directed into the third region 3112c, and the fourth polarization light 3110d is directed into the fourth region 3112d.

Figure 32B:
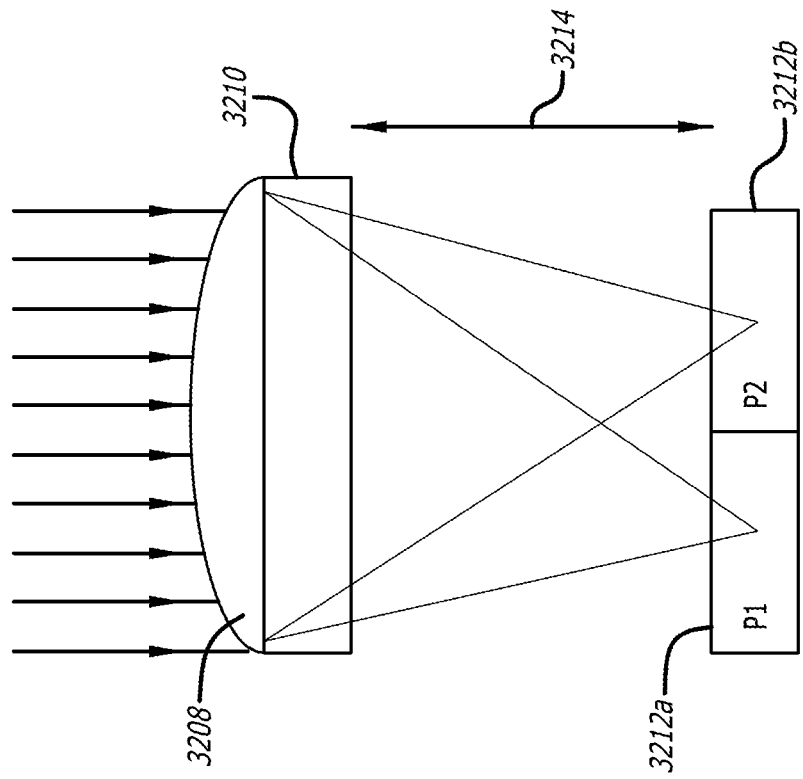
FIG. 32B illustrates a cross-sectional view of an imaging device including a polarization sorting capability in accordance with an embodiment of the invention.
Figure 32A:
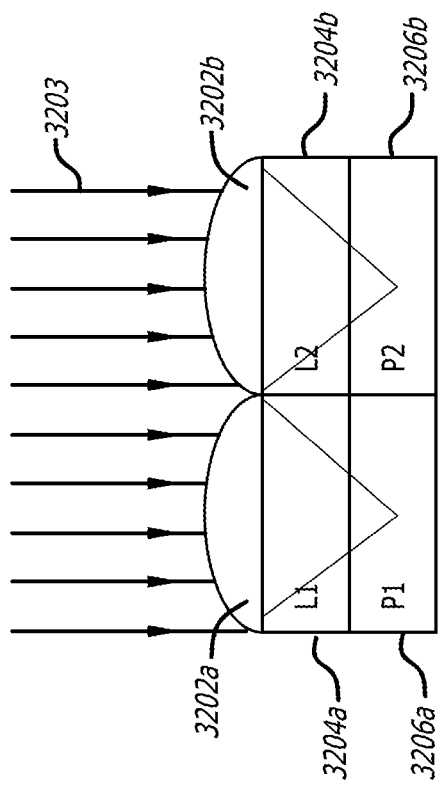
FIG. 32A illustrates a cross-sectional view of an imaging device including a polarization filtering capability in accordance with an embodiment of the invention.

FIG. 32A illustrates a cross-sectional view of an imaging device including a polarization filtering capability in accordance with an embodiment of the invention. The imaging device share many features with the imaging device described in connection with FIG. 31A. The imaging device includes an array of microlenses 3202a, 3202b which directs light 3203 into a polarization filtering metasurface. The polarization filtering metasurface includes a first region 3204a which transmits a first polarization of light and a second region 3204b which transmits a second polarization of light. The first region 3204a filters all of the polarizations out of the light 3203 except for the first polarization of light and the second region 3204b filters all the polarizations out of the light 3203 except for the second polarization of light. Below the polarization filtering metasurface is an image sensor including a first pixel 3206a and a second pixel 3206b. The first region 3204a corresponds to the first pixel 3206a such that the first polarization of light is detected by the first pixel 3206a and the second region 3204b corresponds to the second pixel 3206b such that the second polarization of light is detected by the second pixel 3206b.

FIG. 32B illustrates a cross-sectional view of an imaging device including a polarization sorting capability in accordance with an embodiment of the invention. The imaging device shares many features with the imaging device described in connection with FIG. 28A. The imaging device includes an array of microlenses 3208 which directs light into a polarization sorting metasurface 3210. The polarization sorting metasurface 3210 sorts the light into a first polarization of light and a second polarization of light. The polarization sorting metasurface is separated from a light sensor by a back focal length 3214. The back focal length may be 10 μm. The light sensor includes a first pixel 3212a configured to detect the first polarization light and a second pixel 3212b configured to detect the second polarization light.

Figure 32C:
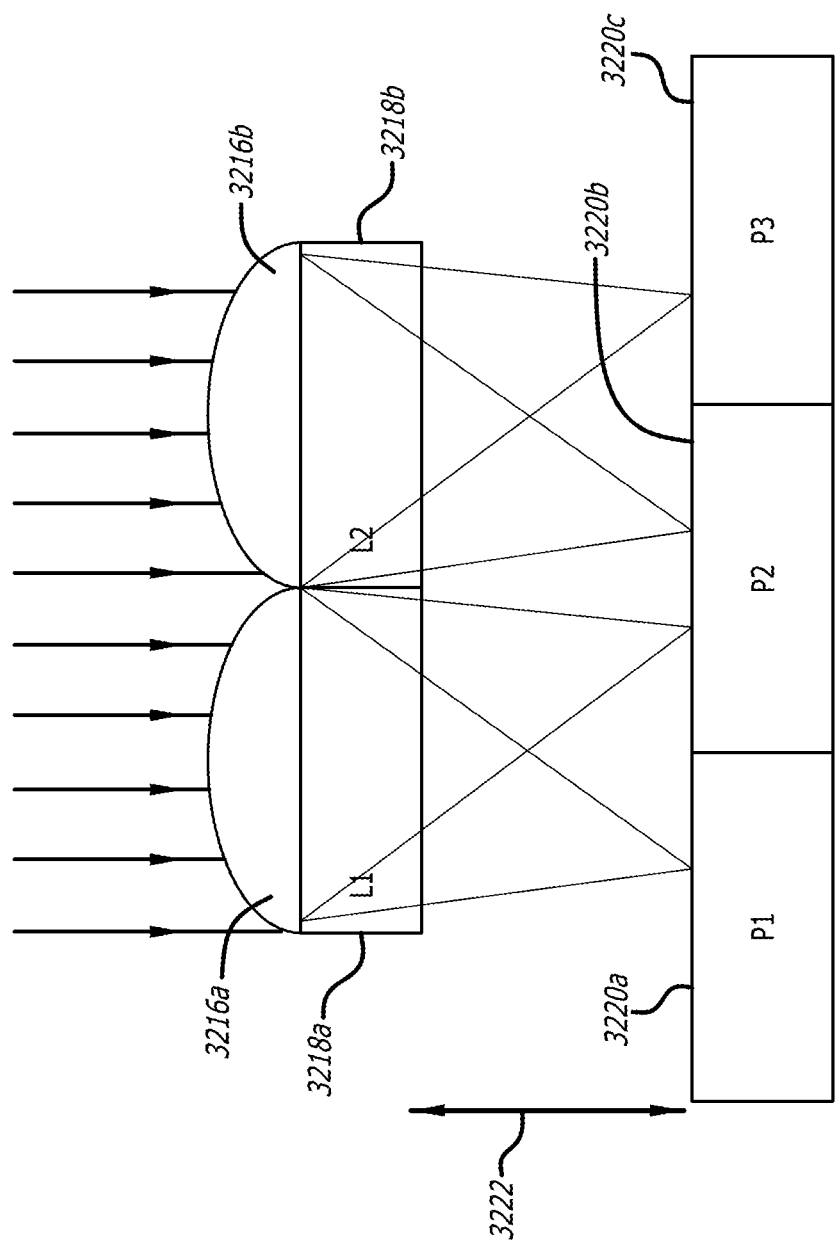
FIG. 32C illustrates a cross-sectional view of an imaging device including a polarization sorting capability in accordance with an embodiment of the invention.

FIG. 32C illustrates a cross-sectional view of an imaging device including a polarization sorting capability in accordance with an embodiment of the invention. The imaging device shares many features with the imaging device described in connection with FIG. 30A. The imaging device includes an array of microlenses 3216a, 3216b which directs light into a polarization sorting metasurface. The polarization sorting metasurface includes a first region 3218a configured to sort a first polarization light in a first direction and a second polarization light in a second direction and a second region 3218b configured to sort the second polarization light in a first direction and the first polarization light in a second direction. An image sensor is configured to receive light from the polarization sorting metasurface. The image sensor includes a first pixel 3220a configured to receive the first polarization light from the first region 3218a, a second pixel 3220b configured to receive the second polarization light from the first region 3218a and the second region 3218b and a third pixel 3220c configured to receive the first polarization light from the second region 3218b. As illustrated in FIG. 30A there may be more microlenses and regions of the polarization sorting metasurface adjacent to what is illustrated in FIG. 32C. There may be one microlens for every pixel of the image sensor. The back focal length 3222 may be shorter than the back focal length 3214 of the image sensor of FIG. 32B. For example, the back focal length 3222 may be 5 μm as compared to the back focal length 3214 of 10 μm.

Figure 33A:
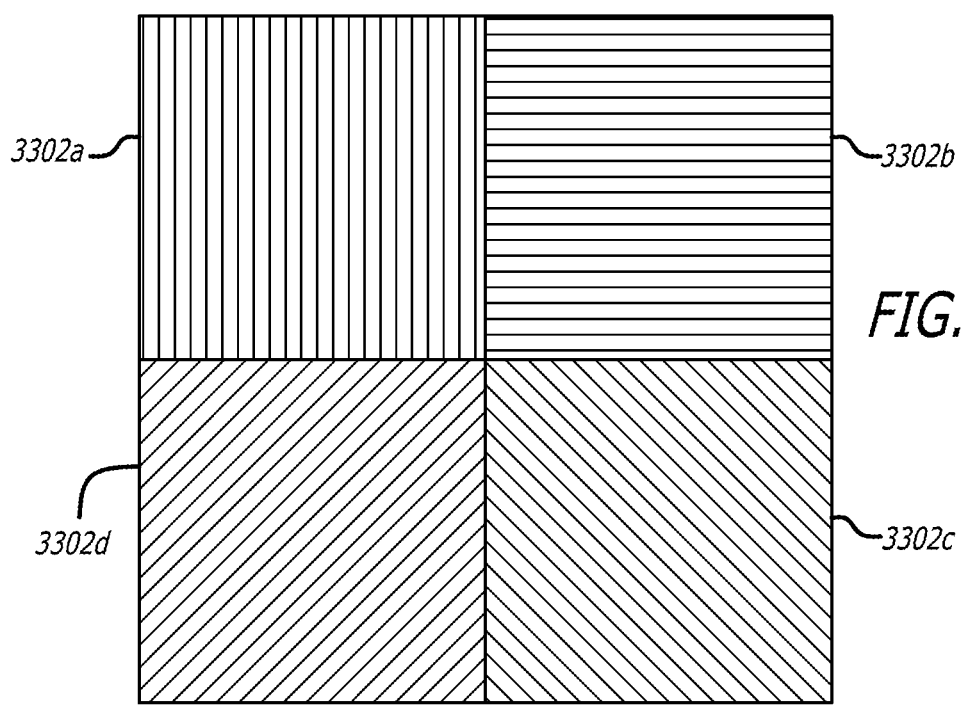
FIG. 33A illustrates a plan view of an example polarization filtering nanograting in accordance with an embodiment of the invention.

FIG. 33A illustrates a plan view of an example polarization filtering nanograting in accordance with an embodiment of the invention. In some embodiments, the polarization filtering nanograting may be interspersed with the polarization filtering metasurface described in connection with FIGS. 31A-31B and 32A. The polarization filtering nanograting includes different regions 3302a, 3302b, 3302c, 3302d which correspond to different pixels of an image sensor. Nanogratings may have some advantages of being easier to manufacture and less angularly sensitive which may make an imaging device including both PSOMMA and nanogratings on an imaging sensor advantageous. In some embodiments, the microlens array functionality for the polarization pixels may be implemented as one or more metagratings and the microlens array functionality may be implemented as one or more refractive lenses for a normal pixel.

Figure 33B:
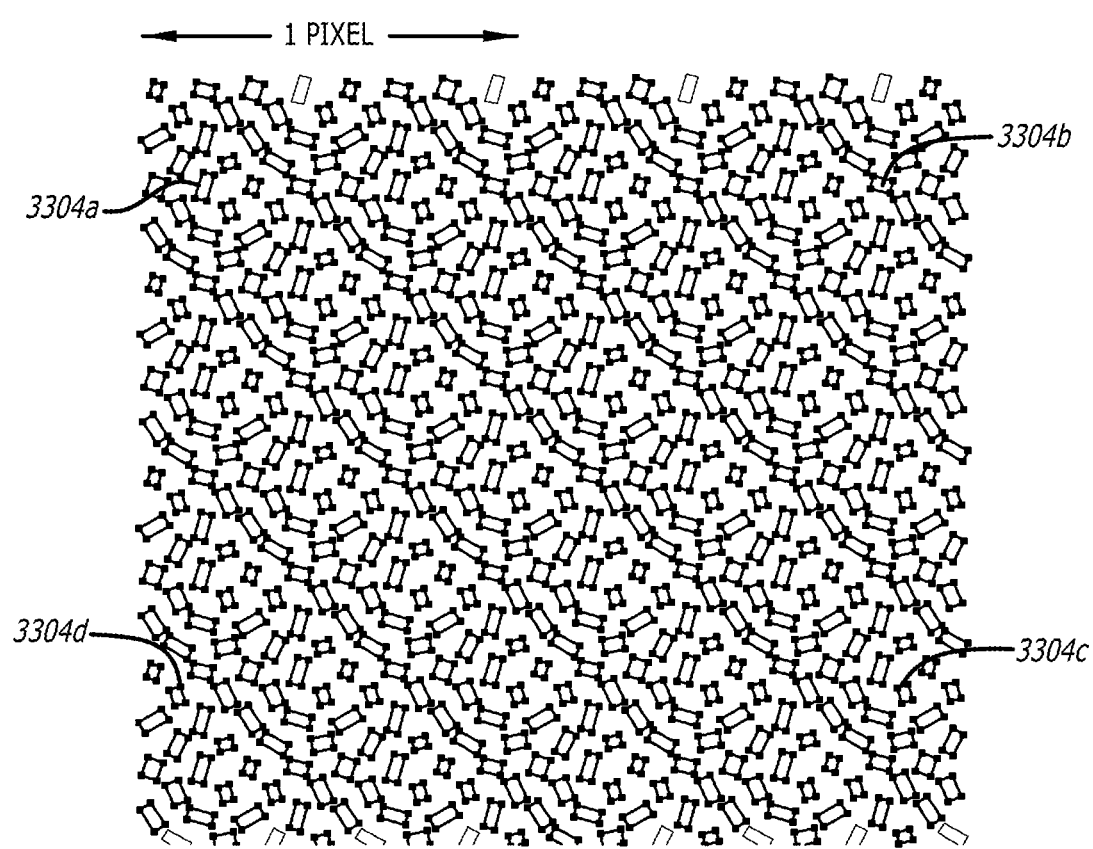
FIG. 33B illustrates a plan view of an example polarization sorting metasurface in accordance with an embodiment of the invention.

FIG. 33B illustrates a plan view of an example polarization sorting metasurface in accordance with an embodiment of the invention. The polarization sorting metasurface may be utilized as the polarization sorting metasurfaces described in connection with FIGS. 28A-28C, 29A-29C, 30A-30C, 32B, and 32C. The polarization filtering metasurface includes different regions 3304a, 3304b, 3304c, 3304d which correspond to different pixels of an image sensor.

Figure 34B:
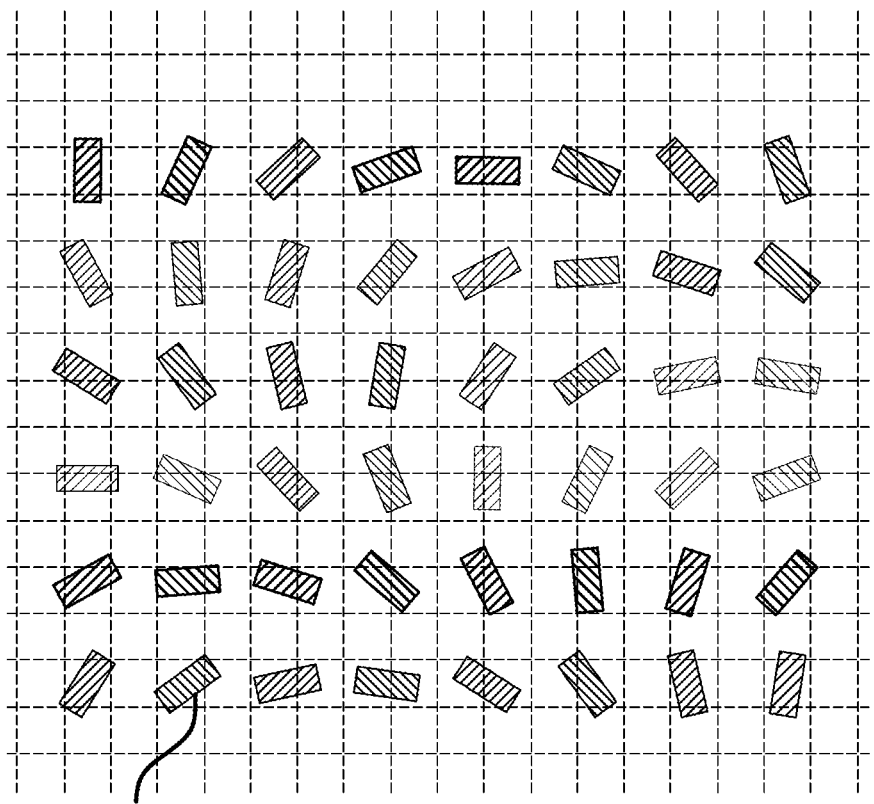
FIG. 34B illustrates a schematic plan view of an example circular polarization sorting metasurface in accordance with an embodiment of the invention.
Figure 34A:
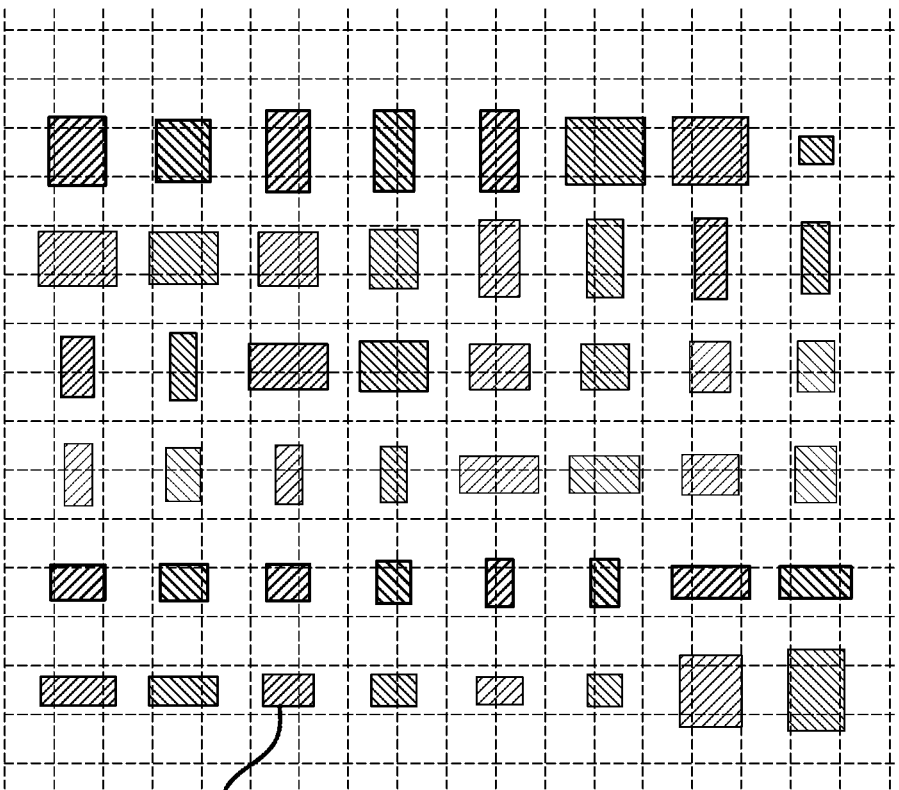
FIG. 34A illustrates a schematic plan view of an example linear polarization sorting metasurface in accordance with an embodiment of the invention.

FIG. 34A illustrates a schematic plan view of an example linear polarization sorting metasurface in accordance with an embodiment of the invention. This linear polarization sorting metasurface may be utilized in the polarization sorting metasurfaces described in connection with described in connection with FIGS. 28A-28C, 29A-29C, 30A-30C, 32B, and 32C. The polarization sorting metasurface diffracts different linear polarizations in different directions. In some embodiments, the different linear polarizations may be different orthogonal linear polarizations. As illustrated, the linear polarization sorting metasurface includes various metasurface elements 3402. The metasurface elements 3402 may have different dimensions (e.g. height and/or width). The metasurface elements 3402 may have the same orientation. The metasurface elements may be tilted with the same angle.

FIG. 34B illustrates a schematic plan view of an example circular polarization sorting metasurface in accordance with an embodiment of the invention. This circular polarization sorting metasurface may be utilized in the polarization sorting metasurfaces described in connection with described in connection with FIGS. 28A-28C, 29A-29C, 30A-30C, 32B, and 32C. The circular polarization sorting metasurface diffracts different circular polarizations in different directions. In some embodiments, the different circular polarizations may be different opposite circular polarizations. In some embodiments, the polarization sorting metasurfaces may sort different elliptical polarizations in different directions. The circular polarization sorting metasurface includes various metasurface elements 3404. The metasurface elements 3404 may have the same dimensions (e.g. height and/or width). The metasurface elements may have different tilt angles with respect to the horizontal axis and/or vertical axis.

Figure 34C:
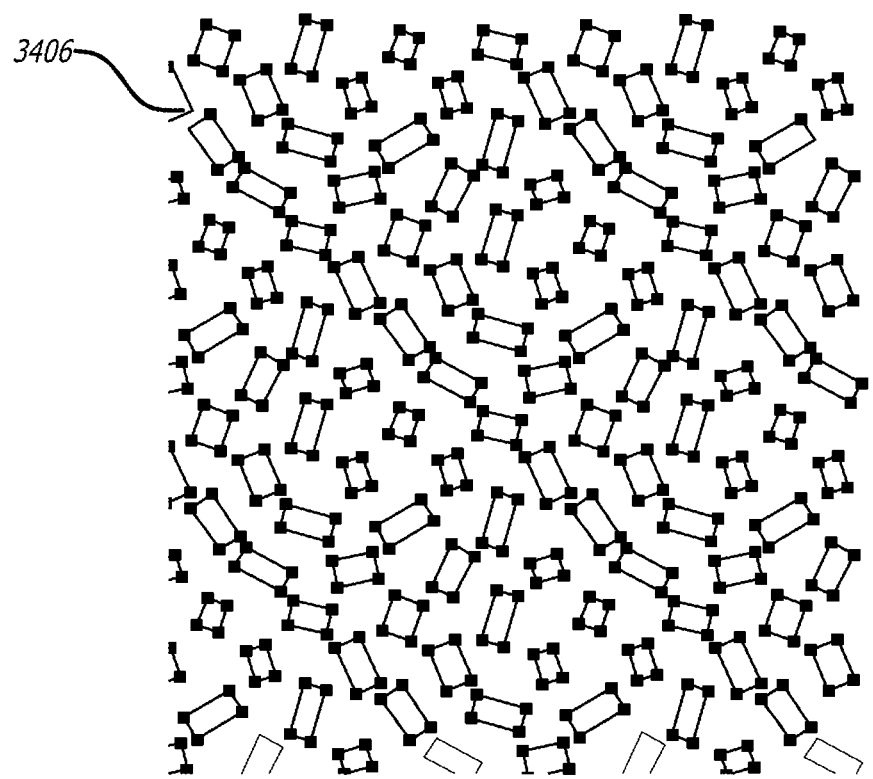
FIG. 34C illustrates a schematic plan view of an arbitrary polarization sorting metasurface in accordance with an embodiment of the invention.

FIG. 34C illustrates a schematic plan view of an arbitrary polarization sorting metasurface in accordance with an embodiment of the invention. This arbitrary polarization sorting metasurface may be utilized in the polarization sorting metasurfaces described in connection with described in connection with FIGS. 28A-28C, 29A-29C, 30A-30C, 32B, and 32C. The arbitrary polarization sorting metasurface diffracts different arbitrary polarizations in different directions. In some embodiments, the different polarizations may be different orthogonal or opposite polarizations. The arbitrary polarizations may be elliptical, circular, or linear.

The linear polarizations may be vertical and horizontal. The linear or elliptical polarization may be tilted. The circular polarizations may be right-handed and left-handed. The elliptical polarization may be right-handed and left-handed. The arbitrary polarization sorting metasurface includes various metasurface elements 3406. The metasurface elements 3406 may have the same dimensions (e.g. height and/or width). The metasurface elements 3406 may have different tilt angles with respect to the horizontal axis and/or vertical axis.

Figure 35A:
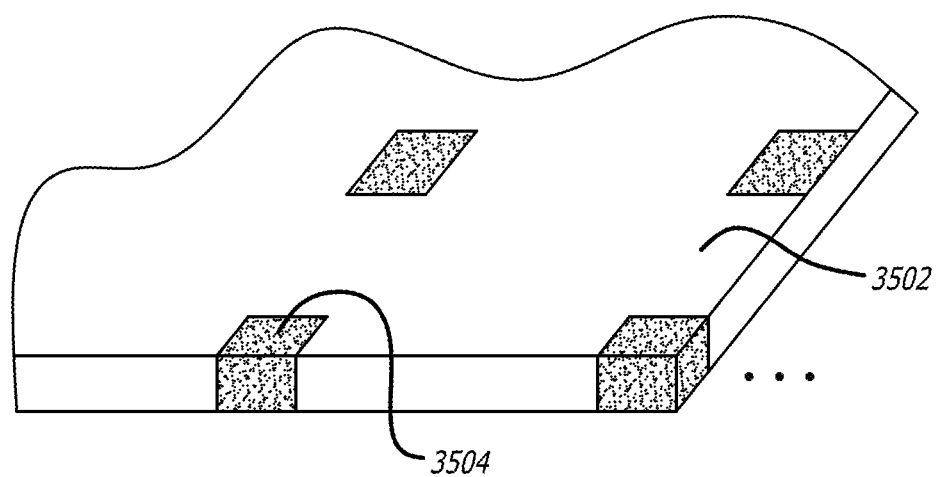
FIG. 35A illustrates a sparsely distributed PSOMMA sensor in accordance with an embodiment of the invention.

FIG. 35A illustrates a sparsely distributed PSOMMA sensor in accordance with an embodiment of the invention. Polarization splitting metasurfaces 3504 are sparsely distributed on a wafer 3502. The remaining area of the wafer 3502 may be either unpatterned or patterned with just an MLA or a meta-surface MLA without polarization sorting. The wafer 3502 may be transparent glass. In some embodiments, the remaining area of the wafer 3502 may be patterned with a metasurface MLA that does not split the polarization. Such a metasurface MLA may have the same lenslets repeating throughout, or it may include lenslets with different focal lengths, which may be used in autofocus or distance and depth measurements and/or calculations. One or more different filters may be applied to some or all of the lenslets. Sparse configurations may be asymmetric, irregular, or varied across the entire sensor space. In particular, a sparser configuration in the center might be used, or a denser central configuration might be used, for example to better capture facial points or perhaps in a location to better capture eye images. Also, different polar aspects may be used in different areas (e.g., perhaps linear polarization at the edges and circular in the center).

Figure 35B:
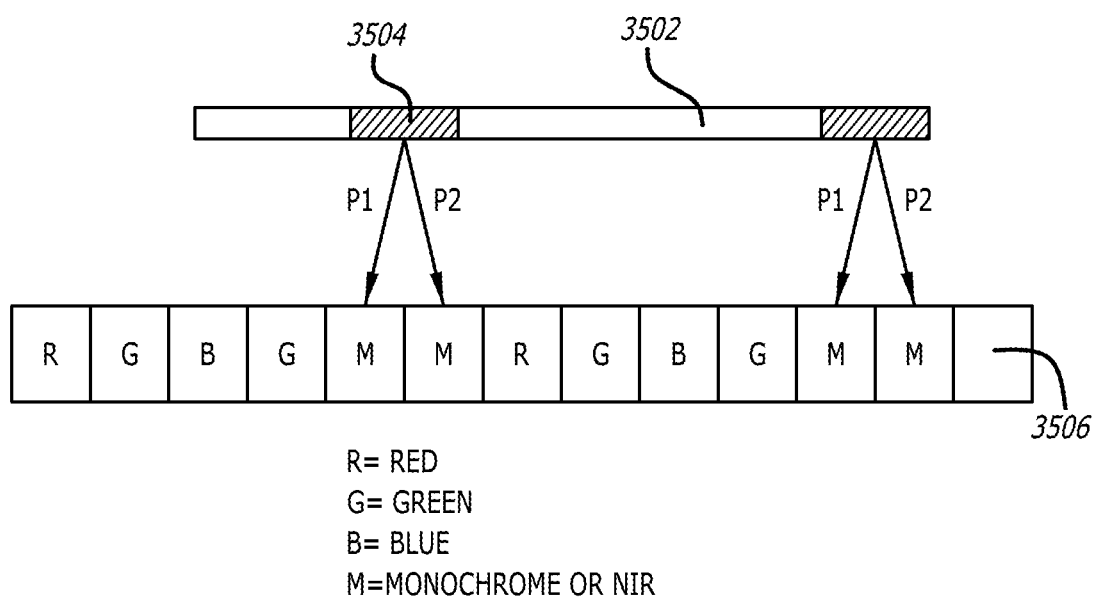
FIG. 35B illustrates a cross sectional view of a sparsely distributed PSOMMA sensor in accordance with an embodiment of the invention.

FIG. 35B illustrates a cross sectional view of a sparsely distributed PSOMMA sensor in accordance with an embodiment of the invention. A PSOMMA wafer 3502 including polarization splitting metasurfaces 3504 is integrated over an image sensor 3506. The image sensor 3506 is positioned below the polarization splitting metasurface 3504. The image sensor 3506 may include an R, G, B image sensor with R, G, B filters corresponding to their corresponding color sensor. The image sensor 3506 has some areas where the RGB filter is removed making it monochrome in that area—and then the PSOMMA wafer 3502 splits the light to pixels in that monochrome area.

The image sensor 3506 may include a color filter which may be blank, monochrome, or pass near-infrared light on portions receiving polarized light from the polarization splitting metasurface 3504. In some embodiments, the color from the sparse PSOMMA pixels can be interpolated from neighboring pixels. In this figure, there is a Bayer pattern on a portion of the pixels, and there is a subset of the pixels which are polarimetric (PSOMMA) pixels. When reconstructing an image, for pixels which are ostensibly under the PSOMMA pixels, the image may be reconstructed in full color by using the nearby RGB pixels as the value for the color at the PSOMMA pixels, even though the PSOMMA pixels do not capture color directly.

In sparse formats, the open windows or pixels may just be for intensity measurement and/or depth from defocus. Alternately, the sparse metasurface 3504 may have metasurfaces for each pixel, but only some are polarization-based metasurface pixels, and the others have other properties, such as focusing and deflection. In some cases, various different focal power lenslets may be used with spot-size differentiation to determine distances—e.g. different focal length lenses such that the image points are compared to find the most in focus spot for determination of distance or other features which is known as phase detection autofocus (PDAF).

Figure 36A:
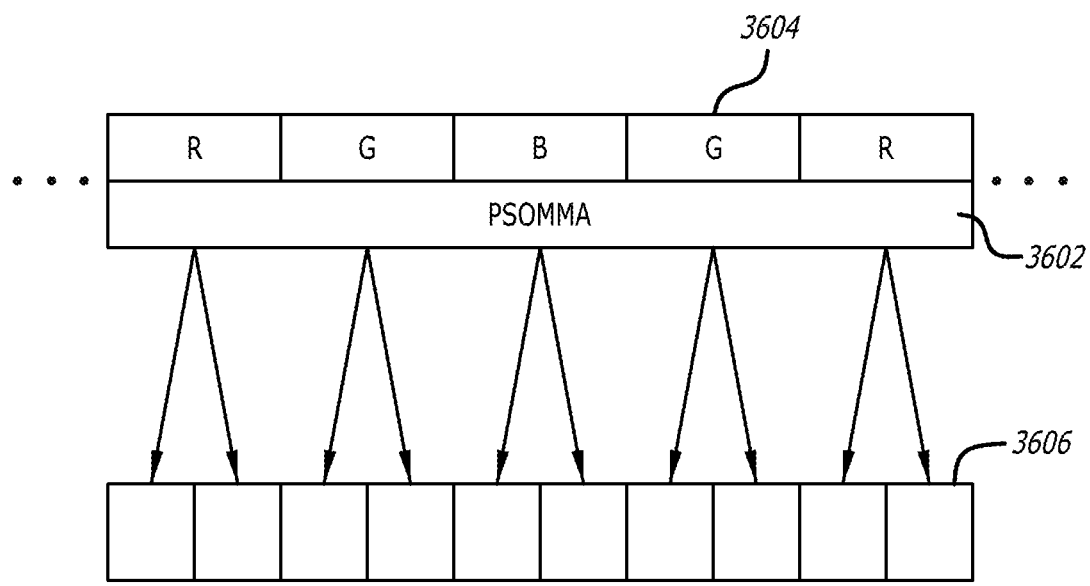
FIG. 36A illustrates an example PSOMMA sensor in accordance with an embodiment of the invention.

FIG. 36A illustrates an example PSOMMA sensor in accordance with an embodiment of the invention. A PSOMMA 3602 is positioned below a color filter 3604. Each PSOMMA lenslet of the PSOMMA 3602 has a region of the color filter 3604 on top. The PSOMMA lenslet is optimized for the color of its corresponding region of the color filter 3604. The PSOMMA 3602 directs light into different regions of an image sensor 3606 as described above. Different image aspects may be distinguished for different pixels of the image sensor 3606.

Figure 36B:
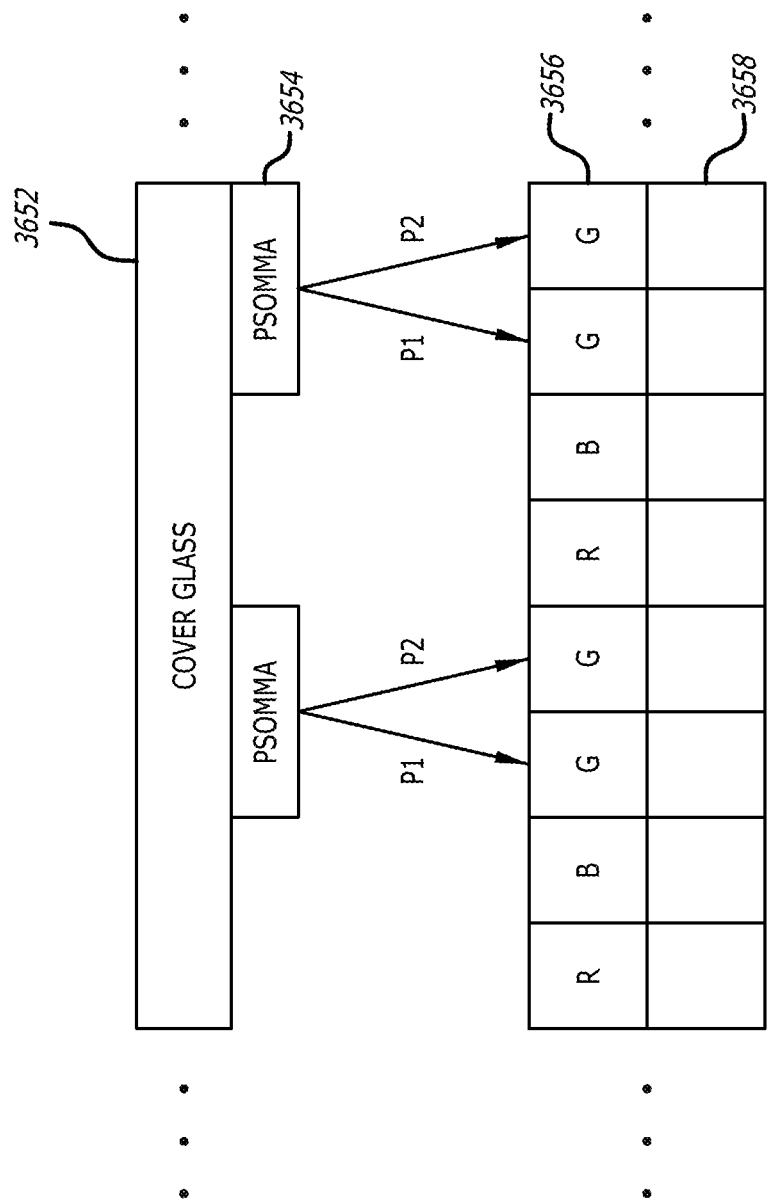
FIG. 36B illustrates an example PSOMMA sensor in accordance with an embodiment of the invention.

FIG. 36B illustrates an example PSOMMA sensor in accordance with an embodiment of the invention. A PSOMMA 3654 is positioned throughout a cover glass 3652. The PSOMMA 3654 may be positioned such that certain areas of the cover glass 3652 have a PSOMMA lenslet and most areas allow light to pass through bare cover glass. The PSOMMA 3654 directs light to a specific color of an image sensor 3658. For example, the PSOMMA 3654 may direct light into the green pixels of the image sensor 3658. The operation of the PSOMMA 3654 is described throughout the disclosure above. The image sensor 3658 may include RGB sensor pixels, which may have built in filters or may have a separate color filter 3656 added. The image sensor 3658 may be a basic RGB sensor which utilizes the RGB sensor colors. And then the portion of the cover glass 3652 not including a PSOMMA 3654 may just let the light pass through to be captured as normal in the image sensor 3658.

Although only a few embodiments of the invention have been described in detail, it should be appreciated that the invention may be implemented in many other forms without departing from the spirit or scope of the invention. For example, embodiments such as enumerated below are contemplated:

Clause 1. A polarization imaging device comprising: a metasurface lenslet array comprising a plurality of metasurface lenslets, wherein the plurality of metasurface lenslets comprise a plurality of first metasurface lenslets configured to diffract an image light with intensity proportional with a first polarization light in a first direction and intensity proportionality with a second polarization in a second direction; and an image sensor positioned in the optical path of the first polarization and the second polarization, and wherein the image sensor comprises a plurality of image sensing units including a first image sensing unit positioned to sense the first polarization and a second image sensing unit positioned to sense the second polarization.

Clause 2. The polarization imaging device of clause 1, wherein the plurality of image sensing units are different pixels and/or regions of the image sensor.

Clause 3. The polarization imaging device of clause 1, wherein the plurality of image sensing units are different pixels and/or regions of multiple image sensors.

Clause 4. The polarization imaging device of clause 1, wherein the plurality of metasurface lenslets further comprises a plurality of second metasurface lenslets interspersed among the first metasurface lenslets and configured to diffract the image light with intensity proportional with a third polarization in a third direction and intensity proportional with a fourth polarization in a fourth direction, and wherein the plurality of image sensing units further comprises a third image sensing unit positioned to sense the third polarization and a fourth image sensing unit positioned to sense the fourth polarization.

Clause 5. The polarization imaging device of clause 4, wherein the first polarization and the third polarization are the same polarization and wherein the second polarization and the fourth polarization light are the same polarization.

Clause 6. The polarization imaging device of clause 1, wherein the first metasurface lenslets are further configured to diffract the image light with intensity proportional with a third polarization in a third direction and intensity proportional with a fourth polarization in a fourth direction, and wherein the plurality of image sensing units further comprises a third image sensing unit positioned to sense the third polarization and a fourth image sensing unit positioned to sense the fourth polarization.

Clause 7. The polarization imaging device of clause 1, wherein the first metasurface lenslets are further configured to pass a zero order light in a third direction.

Clause 8. The polarization imaging device of clause 7, wherein the third direction is different from the first direction and the second direction.

Clause 9. The polarization imaging device of clause 8, wherein the plurality of image sensing units further comprises a third image sensing unit configured to sense the zero order light.

Clause 10. The polarization imaging device of clause 7, wherein the third direction is the same as the first direction.

Clause 11. The polarization imaging device of clause 1, further comprising one or more refractive lenses, wherein the metasurface lenslet array is positioned between the refractive lenses and the image sensor.

Clause 12. The polarization imaging device of clause 1, wherein the first polarization and the second polarization are different polarizations, and wherein the first polarization and the second polarization are selected from the group consisting of: linearly polarized light, diagonally polarized light, elliptically polarized light, and circularly polarized light.

Clause 13. The polarization imaging device of clause 1, further comprising a microlens array and wherein the metasurface lenslet array comprises a polarization metasurface.

Clause 14. The polarization imaging device of clause 13, wherein the microlens array is configured to separate the image light into different pixels and the polarization metasurface is configured to diffract the first polarization in the first direction and the second polarization light in the second direction.

Clause 15. The polarization imaging device of clause 14, wherein the polarization metasurface overlaps microlenses in the microlens array, and wherein microlenses are not overlapped by the polarization metasurface in the microlens array pass undiffracted light to the image sensor, wherein the image sensor is configured to sense the undiffracted light to measure the intensity of the undiffracted light.

Clause 16. The polarization imaging device of clause 13, wherein the microlens array is a planar microlens array layer.

Clause 17. The polarization imaging device of clause 13, wherein the microlens array and the polarization metasurface are positioned on a single substrate.

Clause 18. The polarization imaging device of clause 17, wherein a primary image plane is configured above a surface of the single substrate opposite to the image sensor.

Clause 19. The polarization imaging device of clause 17, wherein a primary image plane is configured within the single substrate.

Clause 20. The polarization imaging device of clause 13, wherein the microlens array comprises metasurface elements.

Clause 21. The polarization imaging device of clause 20, wherein the metasurface elements are configured to accept varying chief ray angles across an imaging pupil of the polarization imaging device and collimate the light passing through each microlens.

Clause 22. The polarization imaging device of clause 20, wherein the metasurface elements of the microlens array are configured to provide refractive microlens effect.

Clause 23. The polarization imaging device of clause 13, wherein the microlens array comprises a traditional refractive microlens array.

Clause 24. The polarization imaging device of clause 13, wherein the microlens array comprises a combination of at least one traditional refractive microlens and at least one metasurface element.

Clause 25. The polarization imaging device of clause 1, further comprising a color filter positioned above or below the metasurface lenslet array.

Clause 26. The polarization imaging device of clause 25, wherein the color filter is positioned above the metasurface lenslet array and filters light into different colors each of which correspond to the different metasurface lenslets of the plurality of first metasurface lenslets, and wherein the metasurface lenslets receive the color filtered light from the color filter.

Clause 27. The polarization imaging device of clause 25, wherein the color filter is positioned below the metasurface lenslet array and filters the diffracted first polarization light and the second polarization light.

Clause 28. The polarization imaging device of clause 27, wherein the color filter comprises different regions that filter different wavelengths of light.

Clause 29. The polarization imaging device of clause 28, wherein the plurality of first metasurface lenslets are spaced on a cover substrate.

Clause 30. The polarization imaging device of clause 29, wherein the spaced first metasurface lenslets are configured to output light onto regions of the color filter that output the same color of light.

Clause 31. The polarization imaging device of clause 30, wherein the spaced first metasurface lenslets output light onto regions of the color filter that output green light and gaps between the regions of the color filter that output green light output red or blue light.

Clause 32. The polarization imaging device of clause 27, wherein the color filter comprises different regions that output red, green, or blue light and regions that output monochrome or near infrared light, wherein the plurality of first metasurface lenslets are spaced on a cover substrate, and the spaced first metasurface lenslets output light onto the regions of the color filter that output monochrome or near infrared light.

Clause 33. The polarization imaging device of clause 1, further comprising a microlens array including a plurality of separate microlenses that output collimated light into the metasurface lenslet array.

Clause 34. The polarization imaging device of clause 33, wherein the plurality of separated microlenses are positioned between adjacent image sensing units such that the light from the light from the plurality of separate microlenses is diffracted by the plurality of first metasurface lenslets in opposite oblique directions into the adjacent image sensing units.

Clause 35. The polarization imaging device of clause 34, wherein the plurality of repeating metasurface lenslets further comprises a plurality of second metasurface lenslets the configured to diffract the first polarization in the second direction and the second polarization in the first direction, and wherein the first image sensing unit is further positioned to sense the first polarization diffracted from the plurality of second metasurface lenslets.

Clause 36. The polarization imaging device of clause 33, wherein the plurality of separated microlenses are each centered with one of the plurality of first metasurface lenslets such that the first polarization is transmitted through the one of the plurality of first metasurface lenslets onto the first image sensing unit, and wherein the second polarization is diffracted in the second direction onto the second image sensing unit.

Clause 37. The polarization imaging device of clause 1, wherein the first polarization and the second polarization are orthogonal linear polarizations, circular polarizations, elliptical polarizations, or arbitrary polarizations.

Clause 38. The polarization imaging device of clause 1, wherein the plurality of first metasurface lenslets are spaced with non-diffractive section between adjacent first metasurface lenslets.

Clause 39. The polarization imaging device of clause 38, wherein the plurality of metasurface lenslets the plurality of image sensing units configured to sense the first polarization and the second polarization are positioned between image sensing units of the image sensor configured to sense red, green, or blue light.

Clause 40. The polarization imaging device of clause 39, wherein the plurality of first metasurface lenslets are configured to diffract light into the plurality of image sensing units configured to sense the first polarization and the second polarization and the image sensing units configured to sense red, green, or blue light.

Clause 41. The polarization imaging device of clause 39, wherein the plurality of image sensing units configured to sense the first polarization and the second polarization are further configured to sense monochrome or near-infrared light.

Clause 42. The polarization imaging device of clause 1, wherein the image sensor is a complimentary metal-oxide-semiconductor (CMOS) image sensor, a charged-coupled device sensor, a silicon diode sensor, a cadmium-sulfide sensor diode, an RGB sensor, an indirect time of flight (iToF) sensor, a direct time of flight (dToF) sensor.

Clause 43. A method of manufacturing a polarization imaging device, the method comprising: providing an image sensor wafer; depositing a spacer layer over the imaging sensor wafer; depositing a metasurface layer on the spacer layer; and patterning the metasurface layer to form individual metasurfaces on the spacer layer.

Clause 44. The method of clause 43, further comprising depositing an encapsulation layer directly on the individual metasurfaces.

Clause 45. The method of clause 44, further comprising planarizing the encapsulation layer such that the encapsulation layer is on the same level as the individual metasurfaces.

Clause 46. The method of clause 44, further comprising forming one or more top layers on the encapsulation layer and/or the individual metasurfaces.

Clause 47. A method of manufacturing a polarization imaging device, the method comprising: providing an image sensor wafer; providing a metasurface substrate comprising individual metasurfaces; and depositing a spacer layer on the imaging sensor wafer and/or the individual metasurfaces on the metasurface substrate.

Clause 48. The method of clause 47, further comprising bonding the metasurface substrate to the image sensor wafer.

Clause 49. The method of clause 48, wherein the metasuface substrate comprises a transparent substrate.

Clause 50. The method of clause 48, further comprising removing the metasurface substrate such that the individual metasurfaces remain attached on the image sensor wafer.

Clause 51. The method of clause 50, wherein removing the metasurface substrate comprises grinding, lapping, wet chemical etching, and/or dry chemical etching the metasurface substrate.

Clause 52. The method of clause 47, further comprising singulating the metasurface substrate into separate metasurface dies, bonding at least one of the metasurface dies on the image sensor wafer, and singulating the image sensor wafer into image sensor dies each with a bonded metasurface die.

Clause 53. A method of manufacturing a polarization imaging device, the method comprising: providing a CMOS image sensor (CIS) wafer; positioning a first plurality of spacers on the CIS wafer; providing a first carrier wafer; positioning a first adhesive layer on the first carrier wafer; contacting the first plurality of spacers with the first adhesive layer such that adhesive is applied to the tops of the first plurality of spacers; providing a nanopillar substrate with a plurality of nanopillars; positioning a second plurality of spacers on the nanopillar substrate; providing a second carrier wafer; positioning a second adhesive layer on the second carrier wafer; contacting the second plurality of spacers with the second adhesive layer such that adhesive is applied to the tops of the second plurality of spacers; and simultaneously contacting the adhesive on the second plurality of spacers with the CIS wafer and the adhesive on the first plurality of spacers with the nanopillar substrate to adhere the CIS wafer and the nanopillar substrate together.

Clause 54. The method of clause 53, wherein after contacting the first plurality of spacers with the first adhesive layer such that adhesive is applied to the tops of the first plurality of spacers, the adhesive only resides on the tops of the first plurality of spacers and not on the areas between the first plurality of spacers.

Clause 55. The method of clause 53, wherein after contacting the second plurality of spacers with the second adhesive layer such that adhesive is applied to the tops of the second plurality of spacers, the adhesive only resides on the tops of the second plurality of spacers and not on the areas between the second plurality of spacers.

Clause 56. The method of clause 53, wherein the first plurality of spacers comprises pairs of spacers that form channels which are sized to accommodate a spacer of the second plurality of spacers.

Clause 57. The method of clause 56, wherein the first plurality of spacers and the second plurality of spacers interlock with each other such that one of the second plurality of spacers is positioned within one of the channels formed by the pairs of spacers.

Clause 58. The method of clause 53, wherein the first plurality of spacers form a plurality of rectangular shapes on the CIS wafer.

Clause 59. The method of clause 58, wherein the interior of the rectangular shapes forms the imaging area.

Clause 60. The method of clause 53, wherein the second plurality of spacers form a grid pattern on the nanopillar substrate.

Clause 61. The method of clause 53, wherein the first plurality of spacers and the second plurality of spacers forms an air gap between the plurality of nanopillars and the CIS wafer.

Clause 62. A method of manufacturing a polarization imaging device, the method comprising: providing a CMOS image sensor (CIS) wafer with a bonding pad; depositing a first dielectric layer over the CIS wafer and the bonding pad; planarizing the first dielectric layer; providing a nanopillar substrate with a plurality of nanopillars; depositing a second dielectric layer over the plurality of nanopillars; planarizing the second dielectric layer; contacting the first dielectric layer with the second dielectric layer such that they bond together to form a combined dielectric layer; removing the nanopillar substrate to expose the plurality of nanopillars; partially etching the combined dielectric layer to expose the bonding pad; and forming a conductive layer that is electrically connected to the bonding pad through the combined dielectric layer.

Clause 63. The method of clause 62, wherein the first dielectric layer and the second dielectric layer are silicon dioxide layers.

Clause 64. The method of clause 62, wherein depositing the first dielectric layer and the second dielectric layer is performed by a tetraethylorthosilicate (TEOS) process.

Clause 65. The method of clause 64, wherein the TEOS process is a plasma enhanced TEOS (PETEOS) process.

Clause 66. The method of clause 62, wherein the planarizing the first dielectric layer and the second dielectric layer is performed by a chemical mechanical polishing (CMP) process.

Clause 67. The method of clause 62, wherein removing the nanopillar substrate is performed by grinding, etching, or a chemical mechanical polishing (CMP) process.

Clause 68. The method of clause 62, wherein partially etching the combined dielectric layer comprises: patterning the combined dielectric layer; and etching the combined dielectric layer to expose the bonding pad.

Clause 69. The method of clause 62, further comprising growing a barrier seed layer on the bonding pad, sidewalls of the combined dielectric layer, and the nanopillars.

Clause 70. A polarization imaging device comprising: a microlens array with at least two microlenses; a polarization filtering metasurface with two or more polarization filtering regions; and an imaging sensor with at least two regions, wherein an imaging light including one or more polarization states is directed by a microlens onto the polarization filtering metasurface and the polarization filtering metasurface is configured to direct one or more polarization states onto one or more regions of the imaging sensor.

Clause 71. The polarization imaging device of clause 70, wherein the microlens array comprises a refractive microlens.

Clause 72. The polarization imaging device of clause 71, wherein the microlens array further comprises a metasurface configured to provide refractive microlens effect.

Clause 73. The polarization imaging device of clause 70, wherein the microlens array comprises a metasurface configured to provide refractive microlens effect.

Clause 74. The polarization imaging device of clause 70, wherein each of the at least two microlenses are over a single region of the one or more regions of the imaging sensor.

Clause 75. The polarization imaging device of clause 70, wherein each of the at least two microlenses are over two or more sensor regions of the one or more regions of the imaging sensor.

Clause 76. The polarization imaging device of clause 70, wherein each of the at least two microlenses are over a single polarization region of the one or more regions of two or more polarization filtering regions.

Clause 77. The polarization imaging device of clause 70, wherein each of the at least two microlenses are over two or more polarization filtering regions of the two or more polarization filtering regions.

Clause 78. A polarization imaging device comprising: a meta-grating array comprising a plurality of meta-grating lenslets, wherein the plurality of metasurface lenslets comprise a plurality of first meta-grating lenslets configured to filter an image light a first polarization light in a first region and a second polarization in a second region; and an image sensor positioned in the optical path of the first polarization and the second polarization, and wherein the image sensor comprises a plurality of image sensing units including a first image sensing unit positioned to sense the first polarization and a second image sensing unit positioned to sense the second polarization.

Clause 79. The polarization imaging device of clause 34, wherein the first polarization is orthogonal to the second polarization.

Clause 80. The polarization imaging device of clause 34, wherein each microlens covers half of the two image sensing units with the overlapping metasurface lenslet to diffract the first polarization into the first direction into the first image sensing unit and the second polarization into the second direction into the second image sensing unit.

Clause 81. The polarization imaging device of clause 80, wherein the first polarization is orthogonal to the second polarization.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A polarization imaging device comprising:
   a lens receiving an image light;
   a metasurface lenslet array comprising a plurality of metasurface lenslets, wherein the plurality of metasurface lenslets comprise a plurality of first metasurface lenslets configured to diffract the image light from the lens with intensity proportional with a first polarization light in a first direction and intensity proportional with a second polarization in a second direction; and
   an image sensor positioned in the optical path of the first polarization and the second polarization, and wherein the image sensor comprises a plurality of image sensing units including a first image sensing unit positioned to sense the first polarization and a second image sensing unit positioned to sense the second polarization,
   wherein the lens comprises a microlens array,
   wherein the metasurface lenslet array comprises a polarization metasurface,
   wherein the microlens array is positioned above the metasurface lenslet array such that light passes through the microlens array and is diffracted by the metasurface lenslet array into the image sensor.

2. The polarization imaging device of claim 1, wherein the plurality of image sensing units are different pixels and/or regions of the image sensor.

3. The polarization imaging device of claim 1, wherein the plurality of metasurface lenslets further comprises a plurality of second metasurface lenslets interspersed among the first metasurface lenslets and configured to diffract the image light with intensity proportional with a third polarization in a third direction and intensity proportional with a fourth polarization in a fourth direction, and
wherein the plurality of image sensing units further comprises a third image sensing unit positioned to sense the third polarization and a fourth image sensing unit positioned to sense the fourth polarization.

4. The polarization imaging device of claim 3, wherein the first polarization and the third polarization are the same polarization and wherein the second polarization and the fourth polarization light are the same polarization.

5. The polarization imaging device of claim 1, wherein the first metasurface lenslets are further configured to diffract the image light with intensity proportional with a third polarization in a third direction and intensity proportional with a fourth polarization in a fourth direction, and
wherein the plurality of image sensing units further comprises a third image sensing unit positioned to sense the third polarization and a fourth image sensing unit positioned to sense the fourth polarization.

6. The polarization imaging device of claim 1, wherein the first metasurface lenslets are further configured to pass a zero order light in a third direction.

7. The polarization imaging device of claim 6, wherein the third direction is different from the first direction and the second direction.

8. The polarization imaging device of claim 7, wherein the plurality of image sensing units further comprises a third image sensing unit configured to sense the zero order light.

9. The polarization imaging device of claim 6, wherein the third direction is the same as the first direction.

10. The polarization imaging device of claim 1, wherein the microlens array is configured to separate the image light into different pixels and the polarization metasurface is configured to diffract the first polarization in the first direction and the second polarization light in the second direction.

11. The polarization imaging device of claim 10, wherein the polarization metasurface overlaps microlenses in the microlens array, and wherein the polarization metasurface is patterned such that the microlens array is not overlapped by the polarization metasurface where undiffracted light is passed to the image sensor, wherein the image sensor is configured to sense the undiffracted light to measure the intensity of the undiffracted light.

12. The polarization imaging device of claim 1, wherein the microlens array is a planar microlens array layer.

13. The polarization imaging device of claim 1, wherein the microlens array and the polarization metasurface are positioned on a single substrate.

14. The polarization imaging device of claim 1, wherein the microlens array comprises metasurface elements.

15. The polarization imaging device of claim 1, wherein the microlens array comprises a combination of at least one traditional refractive microlens and at least one metasurface element.

16. The polarization imaging device of claim 1, wherein the microlens array includes a plurality of separate microlenses that output collimated light into the metasurface lenslet array.

17. The polarization imaging device of claim 16, wherein the plurality of separate microlenses are positioned between adjacent image sensing units such that the light from the plurality of separate microlenses is diffracted by the plurality of first metasurface lenslets in opposite oblique directions into the adjacent image sensing units.

18. The polarization imaging device of claim 16, wherein the metasurface lenslet array further comprises a plurality of second metasurface lenslets configured to diffract the first polarization in the second direction and the second polarization in the first direction, and wherein the first image sensing unit is further positioned to sense the first polarization diffracted from the plurality of second metasurface lenslets.

19. The polarization imaging device of claim 1, wherein the plurality of first metasurface lenslets are spaced with non-diffractive sections between adjacent first metasurface lenslets.

20. The polarization imaging device of claim 1, wherein the metasurface lenslet array is fixedly attached to the image sensor.

21. The polarization imaging device of claim 20, wherein the metasurface lenslet array is attached to the image sensor with an air gap separating the metasurface lenslet array from the image sensor.

22. The polarization imaging device of claim 20, wherein the metasurface lenslet array is attached to the image sensor with a spacer layer separating the metasurface lenslet array from the image sensor.

* * * * *